US012532462B2

United States Patent
(12) United States Patent
Tsutsumi

(10) Patent No.: US 12,532,462 B2
(45) Date of Patent: Jan. 20, 2026

(54) BONDED ASSEMBLY CONTAINING CONDUCTIVE VIA STRUCTURES EXTENDING THROUGH WORD LINES IN A STAIRCASE REGION AND METHODS FOR MAKING THE SAME

(71) Applicant: SANDISK TECHNOLOGIES LLC, Addison, TX (US)

(72) Inventor: Masanori Tsutsumi, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 526 days.

(21) Appl. No.: 18/062,807

(22) Filed: Dec. 7, 2022

(65) Prior Publication Data

US 2024/0074171 A1 Feb. 29, 2024

Related U.S. Application Data

(63) Continuation-in-part of application No. 17/822,182, filed on Aug. 25, 2022.

(51) Int. Cl.
*H10B 41/27* (2023.01)
*H01L 23/522* (2006.01)
(Continued)

(52) U.S. Cl.
CPC ......... *H10B 41/27* (2023.02); *H01L 23/5226* (2013.01); *H01L 23/5283* (2013.01);
(Continued)

(58) Field of Classification Search
CPC ..... H01L 25/18; H01L 25/0657; H01L 25/50; H01L 2224/05541; H01L 2924/1431;
(Continued)

(56) References Cited

U.S. PATENT DOCUMENTS 10,283,493 B1 * 5/2019 Nishida ............... H01L 25/0657
10,304,852 B1 * 5/2019 Cui ........................ H10B 41/40
(Continued)

FOREIGN PATENT DOCUMENTS

KR 10-2022-0040566 3/2022
KR 20220040566 A 3/2022
WO WO-2022020013 A1 * 1/2022 ......... H01L 25/0657

OTHER PUBLICATIONS

USPTO Office Communication, Non-Final Office Action for U.S. Appl. No. 17/822,182, mailed Mar. 3, 2025, 19pages.
(Continued)

*Primary Examiner* — Mamadou L Diallo
(74) *Attorney, Agent, or Firm* — THE MARBURY LAW GROUP PLLC

(57) ABSTRACT

A bonded assembly includes first memory die bonded to a logic die. The first memory die includes a first alternating stack of first insulating layers and first electrically conductive layers, first memory openings vertically extending through the first alternating stack, first memory opening fill structures located within the first memory openings and containing a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads. The logic die includes a peripheral circuitry configured to control operation of the first memory die, logic-side metal interconnect structures, and logic-side bonding pads that are bonded to the first memory-side bonding pads.

13 Claims, 111 Drawing Sheets

(51) Int. Cl.

| | |
|---|---|
| ***H01L 23/528*** | (2006.01) |
| ***H10B 41/10*** | (2023.01) |
| ***H10B 41/35*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |

(52) U.S. Cl.
CPC ............ *H10B 41/10* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02)

(58) Field of Classification Search
CPC ......... H01L 24/05; H01L 24/06; H01L 24/08; H01L 2224/0557; H01L 2224/08146; H01L 2225/06544; H10B 41/27; H10B 43/27; H10B 43/40
See application file for complete search history.

(56) References Cited

U.S. PATENT DOCUMENTS

| | | | | |
|---|---|---|---|---|
| 10,381,362 | B1 * | 8/2019 | Cui | H01L 23/5226 |
| 10,665,581 | B1 | 5/2020 | Zhou et al. | |
| 10,727,248 | B2 | 7/2020 | Kaminaga | |
| 10,797,035 | B1 * | 10/2020 | Sano | H01L 24/85 |
| 10,833,100 | B2 * | 11/2020 | Sugiura | H10B 43/10 |
| 10,879,260 | B2 * | 12/2020 | Uryu | H01L 25/18 |
| 10,892,267 | B2 | 1/2021 | Mushiga et al. | |
| 10,903,230 | B2 | 1/2021 | Kaminaga et al. | |
| 10,957,680 | B2 | 3/2021 | Yada et al. | |
| 10,971,507 | B2 | 4/2021 | Kaminaga | |
| 11,049,876 | B2 | 6/2021 | Kaminaga et al. | |
| 11,127,728 | B2 | 9/2021 | Zhou et al. | |
| 11,322,483 | B1 | 5/2022 | Ogawa et al. | |
| 11,367,733 | B1 | 6/2022 | Hosoda et al. | |
| 11,417,621 | B2 | 8/2022 | Hosoda et al. | |
| 2019/0252396 | A1 | 8/2019 | Mushiga et al. | |
| 2019/0252403 | A1 | 8/2019 | Kaminaga et al. | |
| 2019/0252404 | A1 * | 8/2019 | Kaminaga | H10B 43/27 |
| 2020/0035694 | A1 | 1/2020 | Kaminaga | |
| 2020/0227397 | A1 | 7/2020 | Yada et al. | |
| 2020/0279861 | A1 | 9/2020 | Uryu et al. | |
| 2021/0012840 | A1 | 1/2021 | Shim et al. | |
| 2021/0028136 | A1 | 1/2021 | Said et al. | |
| 2022/0028846 | A1 * | 1/2022 | Alsmeier | H01L 25/18 |
| 2022/0139441 | A1 | 5/2022 | Ogawa et al. | |
| 2022/0181283 | A1 | 6/2022 | Hosoda et al. | |
| 2022/0181343 | A1 | 6/2022 | Hosoda et al. | |
| 2022/0262783 | A1 | 8/2022 | Yu et al. | |

OTHER PUBLICATIONS

Endoh et al., "Novel Ultra High-Density Memory with a Stacked-Surrounding Gate Transistor (S-SGT) Structured Cell," IEDM Proc. (2001) 33-36.
U.S. Appl. No. 17/822,182, filed Aug. 25, 2022, SanDisk Technologies LLC.
Notification of Transmittal of The International Search Report and Written Opinion of the International Searching Authority for International Patent Application No. PCT/US2023/024933, mailed Sep. 22, 2023, 6 pages.
IPRP—Notification Concerning Transmittal of International Preliminary Report on Patentability and Written Opinion of the International Searching Authority for International Patent Application No. PCT/US2023/024933, mailed on Mar. 6, 2025, 5 pages.

* cited by examiner

BONDED ASSEMBLY CONTAINING CONDUCTIVE VIA STRUCTURES EXTENDING THROUGH WORD LINES IN A STAIRCASE REGION AND METHODS FOR MAKING THE SAME

RELATED APPLICATION

This application is a continuation-in-part (CIP) application of U.S. application Ser. No. 17/822,182 filed on Aug. 25, 2022, the entire contents of which are incorporated herein by reference.

FIELD

The present disclosure relates generally to the field of semiconductor devices, and particular to a bonded assembly of a logic die and at least one memory die containing conductive via structures for providing electrical connections to electrically conductive layers and methods for forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a bonded assembly includes first memory die bonded to a logic die. The first memory die includes a first alternating stack of first insulating layers and first electrically conductive layers, first memory openings vertically extending through the first alternating stack, first memory opening fill structures located within the first memory openings and containing a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads. The logic die includes a peripheral circuitry configured to control operation of the first memory die, logic-side metal interconnect structures, and logic-side bonding pads that are bonded to the first memory-side bonding pads.

According to another aspect of the present disclosure, a method of forming a bonded assembly comprises providing a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads; providing a logic die comprising a peripheral circuitry configured to control operation of the first memory die, logic-side metal interconnect structures, and logic-side bonding pads; and forming the bonded assembly by bonding the logic-side bonding pads to the first memory-side bonding pads.

According to an embodiment of the present disclosure, a bonded assembly comprises: a first memory die comprising a first alternating stack of first insulating layers and first electrically conductive layers, first memory opening fill structures located within first memory openings that vertically extend through the first alternating stack and comprising a respective vertical stack of first memory elements, a first stepped dielectric material portion contacting horizontal stepped surfaces of the first alternating stack, and first column-shaped conductive via structures comprising a respective conductive shaft portion vertically extending through a respective subset of the first electrically conductive layers, a respective conductive base portion connected to a first end of the respective conductive shaft portion, and a respective conductive capital portion connected to a second end of the respective conductive shaft portion and contacting the horizontal stepped surface of a respective one of the first electrically conductive layers; and a logic die comprising a driver circuit, logic-side metal interconnect structures embedded within logic-side dielectric material layers, and logic-side bonding pads that are bonded to the first column-shaped conductive via structures.

According to another embodiment of the present disclosure, a method for forming a bonded assembly is provided, which comprises: providing a first memory die, wherein the first memory die comprises a first alternating stack of first insulating layers and first electrically conductive layers, first memory opening fill structures located within first memory openings that vertically extend through the first alternating stack and comprising a respective vertical stack of first memory elements, a first stepped dielectric material portion contacting horizontal stepped surfaces of the first alternating stack, and first column-shaped conductive via structures comprising a respective conductive shaft portion vertically extending through a respective subset of the first electrically conductive layers, a respective conductive base portion connected to a first end of the respective conductive shaft portion, and a respective conductive capital portion connected to a second end of the respective conductive shaft portion and contacting the horizontal stepped surface of a respective one of the first electrically conductive layers; providing a logic die comprising a driver circuit, logic-side metal interconnect structures embedded within logic-side dielectric material layers, and logic-side bonding pads; and bonding the logic-side bonding pads to the conductive base portions of the first column-shaped conductive via structures.

DETAILED DESCRIPTION

Figure 1A:
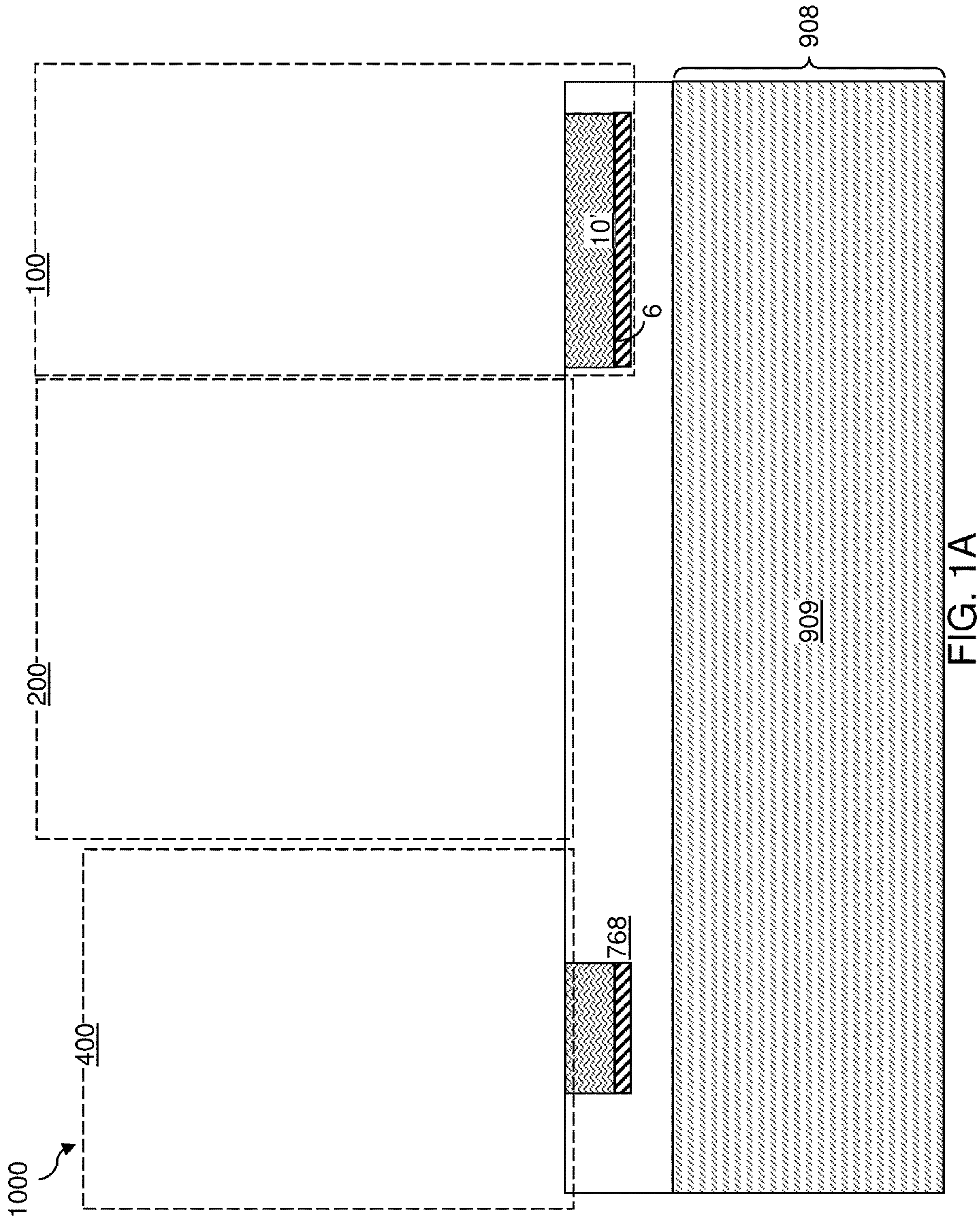
FIG. 1A is a vertical cross-sectional view of a first exemplary structure after formation of a dielectric buffer layer and in-process source-level material layers on a first carrier substrate according to an embodiment of the present disclosure.

The performance of a memory package may be enhanced by bonding at least one memory die with a logic die including a peripheral circuitry for operating the three-dimensional memory array(s) within the at least one memory die. Embodiments of the present disclosure are directed to a bonded assembly of a logic die and at least one memory die containing conductive via structures for providing electrical connections to electrically conductive layers and methods for forming the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times 10^5$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
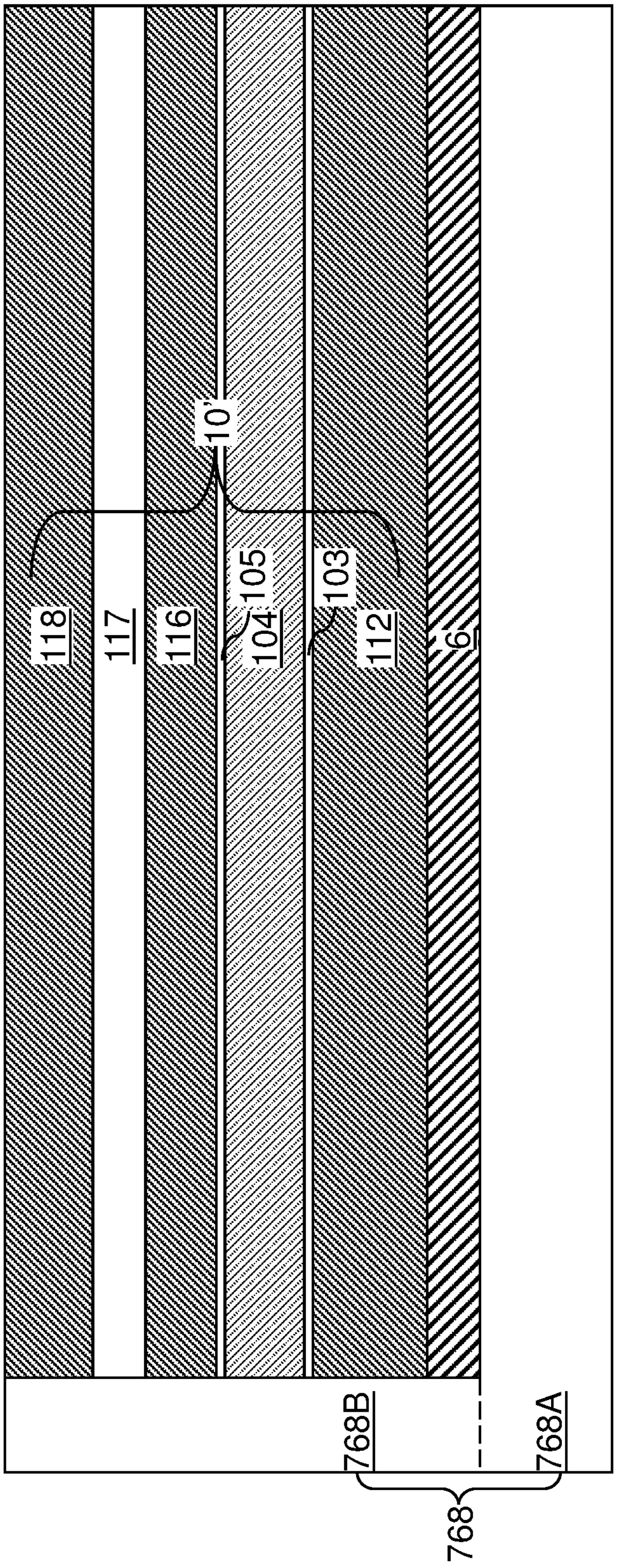
FIG. 1B is a magnified view of the in-process source-level material layers of FIG. 1A.

Referring to FIGS. 1A and 1B, a first exemplary structure according to an embodiment of the present disclosure is illustrated. FIG. 1B is a magnified view of an in-process source-level material layers 10' illustrated in FIG. 1A. The first exemplary structure includes a first carrier substrate 908 containing a substrate material layer 909, a dielectric buffer layer 768 formed on a front surface of the first carrier substrate 908, and an optional planar conductive material layer 6 and in-process source-level material layers 10'. The substrate material layer 909 may comprise a semiconductor material, an insulating material, and/or a conductive material. In one embodiment, the carrier substate 908 comprises a commercially available silicon wafer, and the substrate material layer 909 may comprise an upper portion of the silicon wafer or an epitaxial silicon layer grown on the silicon wafer. The dielectric buffer layer 768 may comprise a single dielectric material layer, or a plurality of dielectric material layers. In one embodiment, the dielectric buffer layer 768 may comprise a silicon oxide layer.

The optional planar conductive material layer 6, if present, provides a high conductivity conduction path for electrical current that flows into, or out of, the in-process source-level material layers 10'. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. The planar conductive material layer 6 may function as a special source line in the completed device. The optional planar conductive material layer 6 can include a metallic compound material such as a conductive metallic nitride (e.g., Tin) and/or a metal (e.g., W). The thickness of the optional planar conductive material layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a buried source layer that functions as a common source region for vertical field effect transistors of a three-dimensional memory device. In one embodiment, the in-process source-level material layer 10' can include, from bottom to top, a lower source layer 112, a lower sacrificial liner 103, a source-level sacrificial layer 104, an upper sacrificial liner 105, an upper source layer 116, a source-level insulating layer 117, and an optional source selective level conductive layer 118.

The lower source layer 112 and the upper source layer 116 can include a doped semiconductor material such as doped polysilicon or doped amorphous silicon. The conductivity type of the lower source layer 112 and the upper source layer 116 can be the opposite of the conductivity of vertical semiconductor channels to be subsequently formed. For example, if the vertical semiconductor channels to be subsequently formed have a doping of a first conductivity type, the lower source layer 112 and the upper source layer 116 have a doping of a second conductivity type that is the opposite of the first conductivity type. The thickness of each of the lower source layer 112 and the upper source layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source selective level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The optional planar conductive material layer 6 and the in-process source-level material layers 10' may be patterned to provide openings in areas in which through-stack contact via structures and through-dielectric contact via structures are to be subsequently formed. Patterned portions of the stack of the planar conductive material layer 6 and the in-process source-level material layers 10' are present in each memory array region 100 in which three-dimensional memory stack structures are to be subsequently formed. In one embodiment, openings in the optional planar conductive material layer 6 and the in-process source-level material layers 10' can be formed within the area of a staircase region 200 in which contact via structures contacting word line electrically conductive layers are to be subsequently formed. In one embodiment, additional openings in the optional planar conductive material layer 6 and the in-process source-level material layers 10' can be formed within the area of a memory array region 100, in which a three-dimensional memory array including memory stack structures is to be subsequently formed. An additional dielectric material may be deposited around the patterned planar conductive material layer 6 and the in-process source-level material layers 10', and can be incorporated into the dielectric buffer layer 768. An optional peripheral region 400 that is subsequently filled with a field dielectric material portion can be provided adjacent to the staircase region 200.

Figure 2:
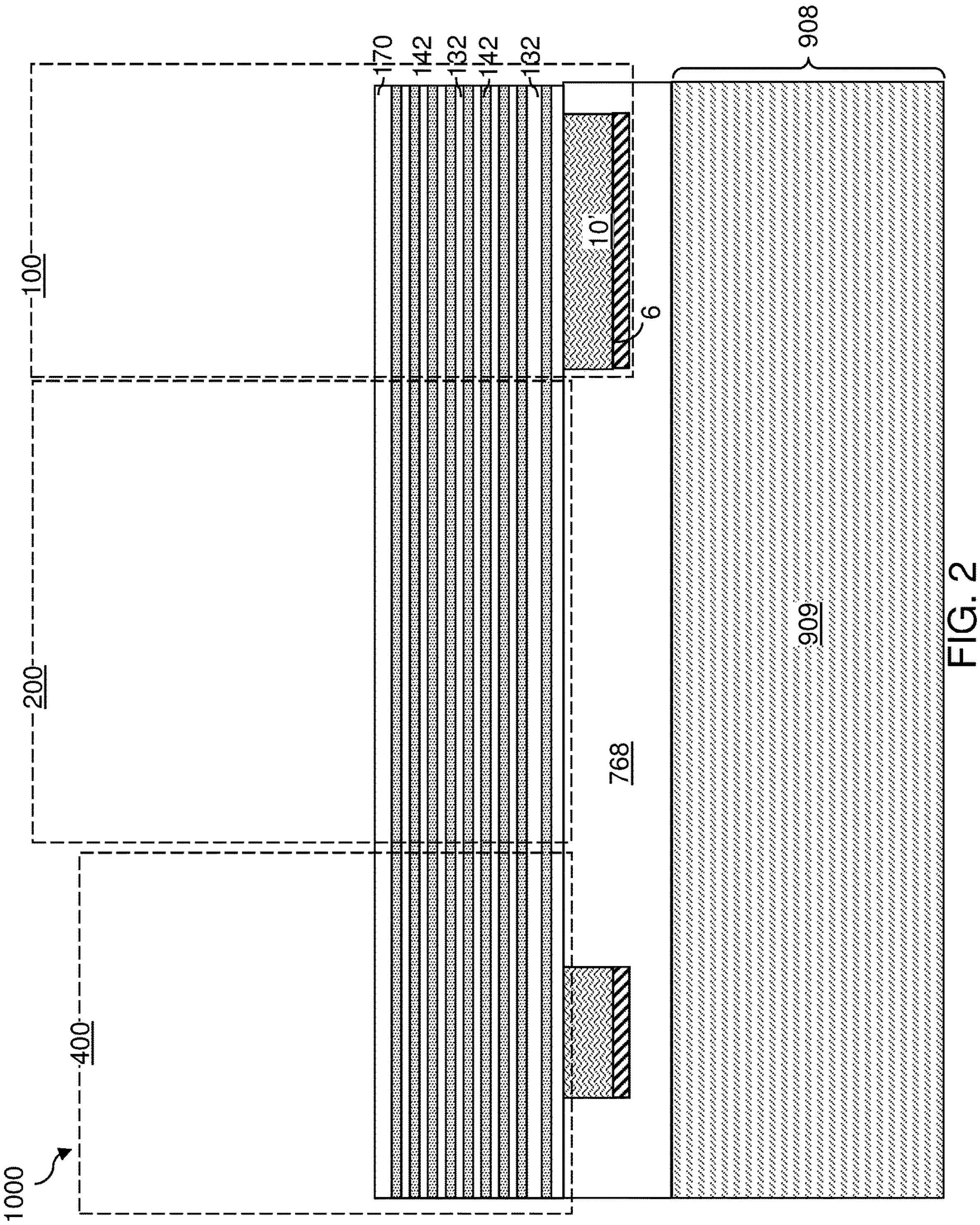
FIG. 2 is a vertical cross-sectional view of the first exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness there amongst, or may have different thicknesses. The second elements may have the same thickness there amongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organ silicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethyl orthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the alternating stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
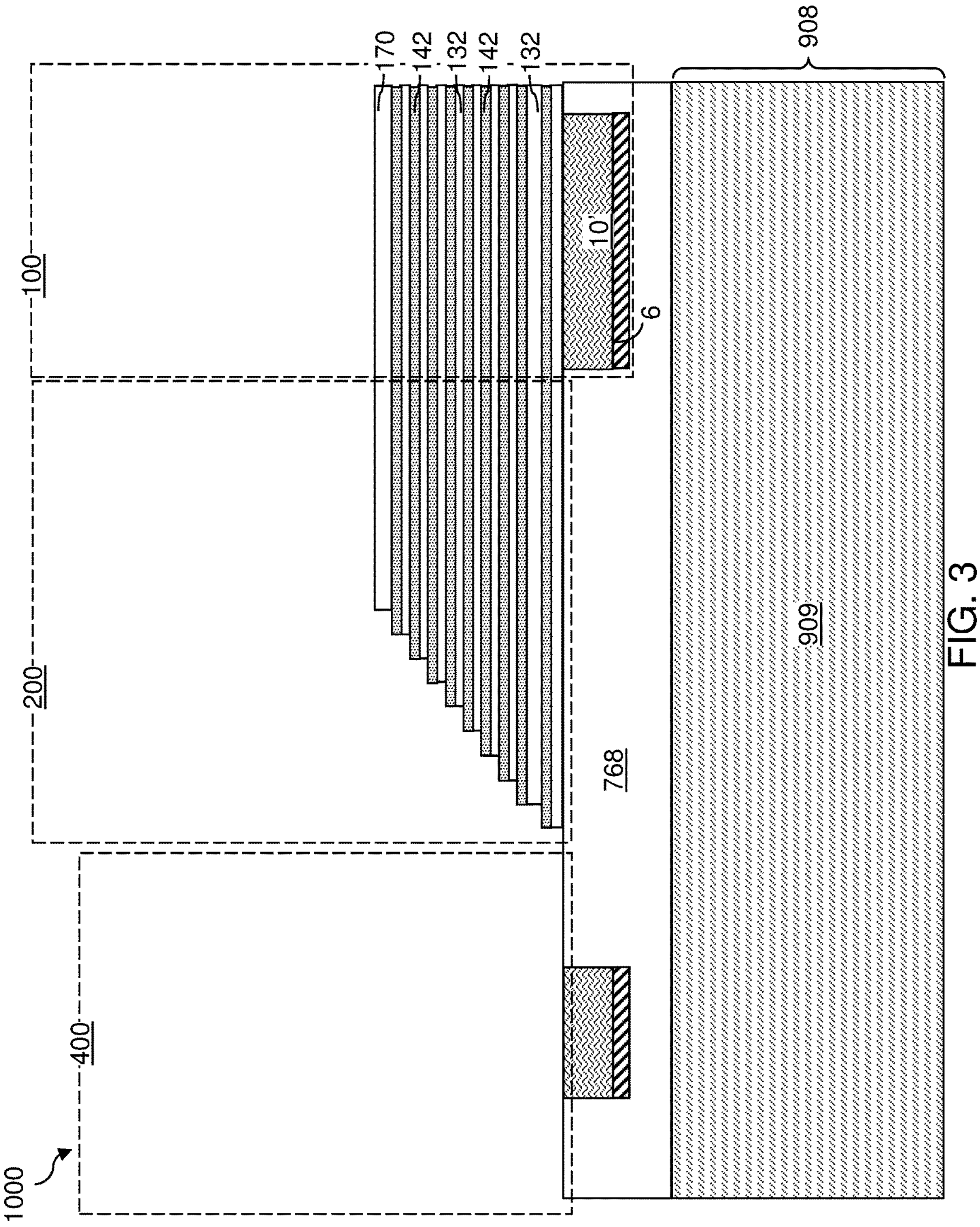
FIG. 3 is a vertical cross-sectional view of the first exemplary structure after patterning a first-tier staircase region on the first-tier alternating stack according to an embodiment of the present disclosure.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area.

Figure 4:
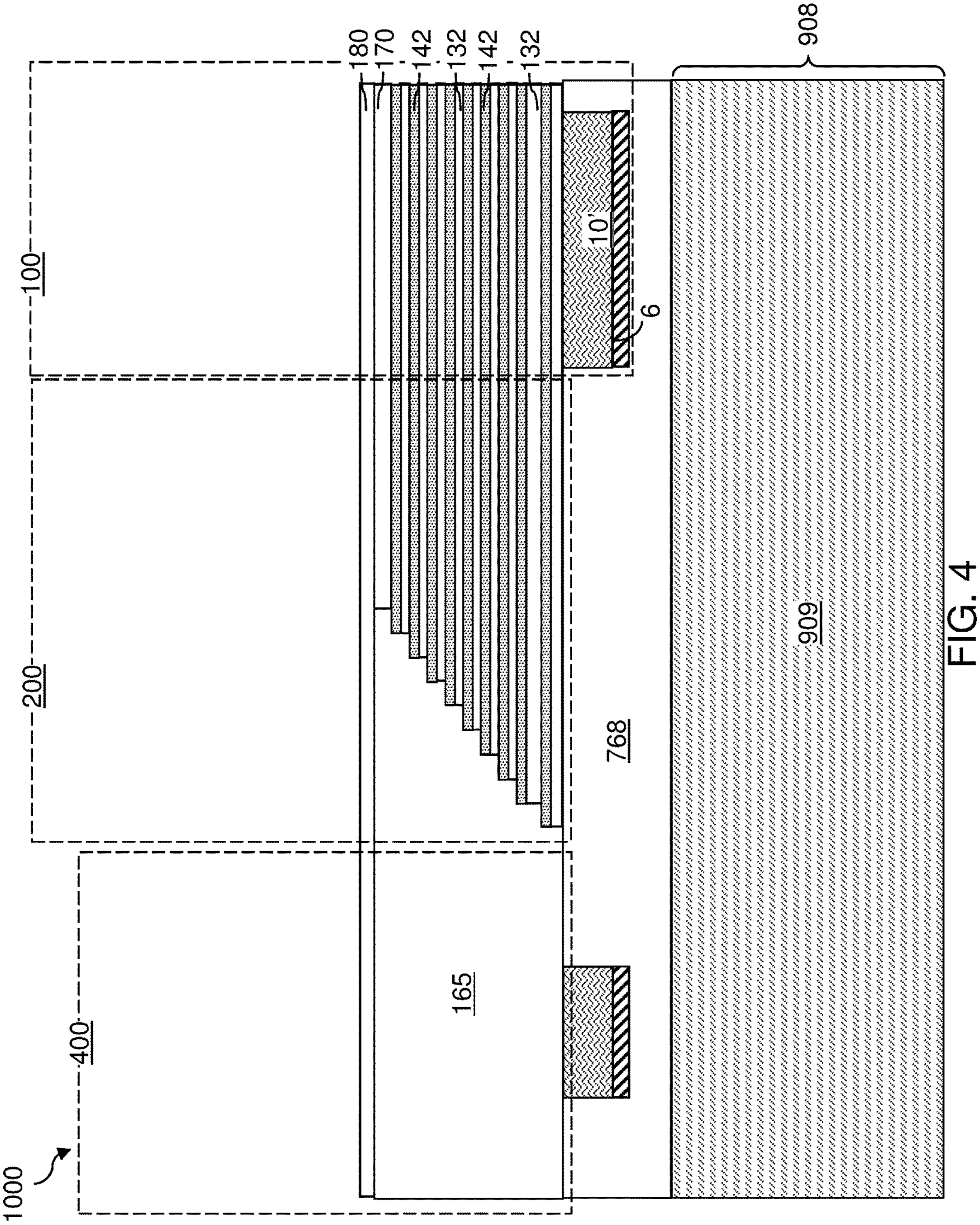
FIG. 4 is a vertical cross-sectional view of the first exemplary structure after formation of a first retro-stepped dielectric material portion and an inter-tier dielectric layer according to an embodiment of the present disclosure.

Referring to FIG. 4, a dielectric material can be deposited to fill the first stepped cavity to form a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 165, 170). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phospholipase glass. The thickness of the inter-tier dielectric layer 180 can be in a range from 30 nm to 300 nm, although lesser and greater thicknesses can also be employed.

Figure 5A:
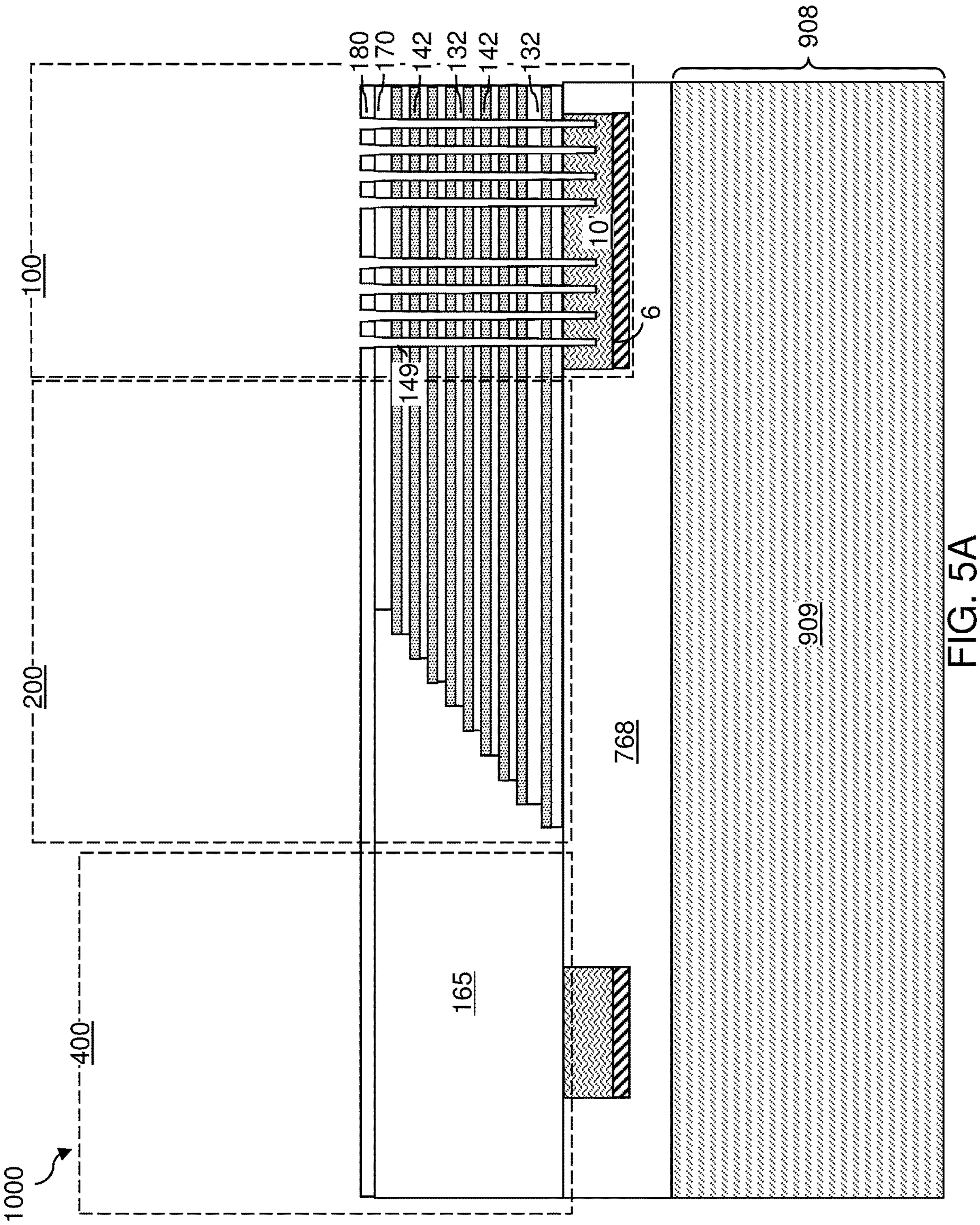
FIG. 5A is a vertical cross-sectional view of the first exemplary structure after formation of first-tier memory openings according to an embodiment of the present disclosure.
Figure 5B:
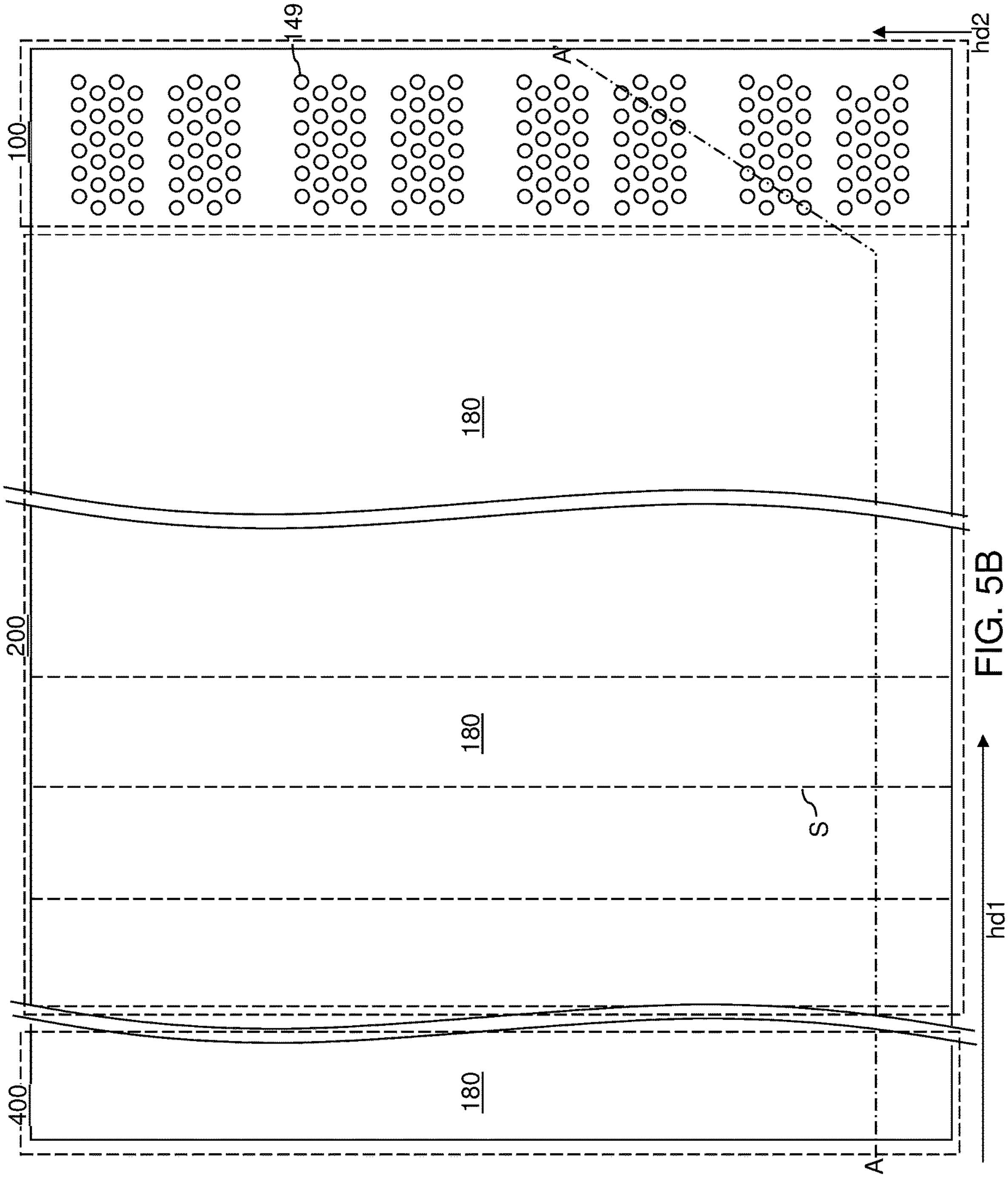
FIG. 5B is a top-down view of the first exemplary structure of FIG. 5A. The hinged vertical plane A-A' corresponds to the plane of the vertical cross-sectional view of FIG. 5A.

Referring to FIGS. 5A and 5B, first-tier memory openings 149 can be formed. Locations of steps S in the first-tier alternating stack (132, 142) are illustrated as dotted lines in FIG. 5B. The first-tier memory openings 149 extend through the first-tier alternating stack (132, 142) at least to a top surface of the in-process source-level material layers 10'. The first-tier memory openings 149 can be formed in the memory array region 100 at locations at which memory stack structures including vertical stacks of memory elements are to be subsequently formed. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149. In other words, the transfer of the pattern in the patterned lithographic material stack through the first insulating cap layer 170 and the first-tier alternating stack (132, 142) forms the first-tier memory openings 149.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 can be substantially vertical, or can be tapered. Subsequently, the patterned lithographic material stack can be subsequently removed, for example, by ashing.

Figure 6B:
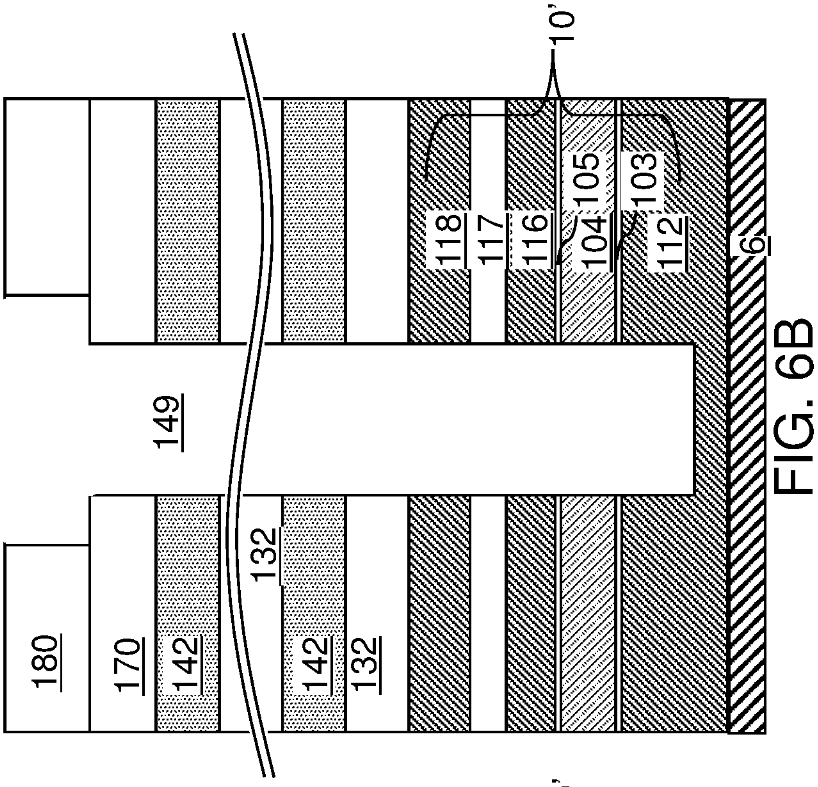
FIGS. 6A-6B illustrate a sequential vertical cross-sectional view of a first-tier memory opening during expansion of an upper region of the first-tier memory opening according to an embodiment of the present disclosure.
Figure 6A:
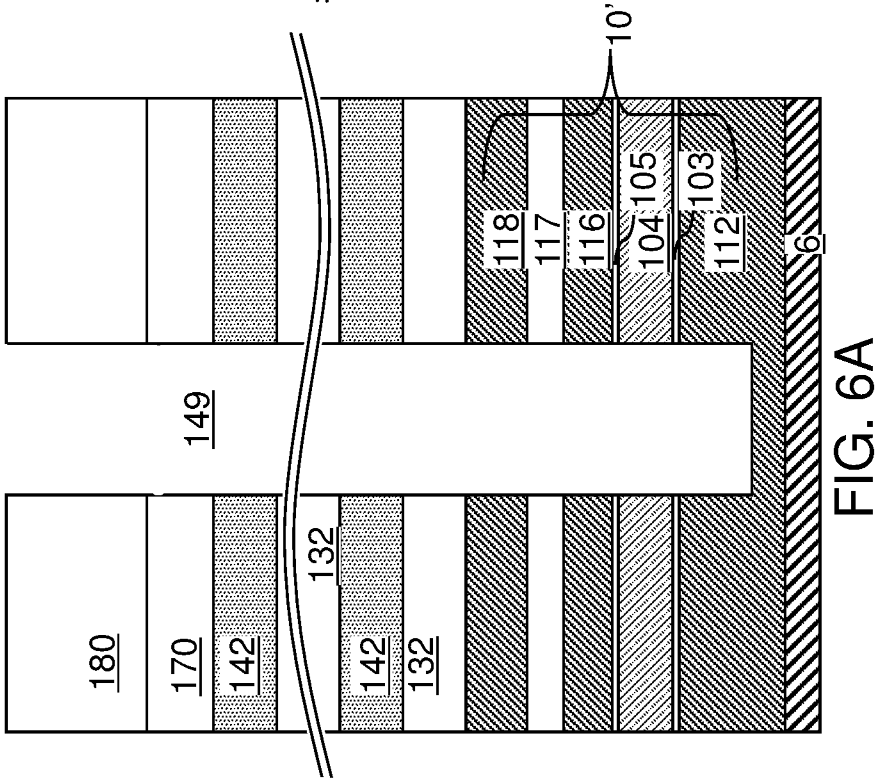

Optionally, the portions of the first-tier memory openings 149 at the level of the inter-tier dielectric layer 180 can be laterally expanded by an isotropic etch. FIGS. 6A and 6B illustrate a processing sequence for laterally expanding portions of the first-tier memory openings 149 at the level of the inter-tier dielectric layer 180. FIG. 6A illustrates a first-tier memory opening 149 immediately after the anisotropic etch that forms the first-tier memory openings 149. The anisotropic etch can terminate after each of the first-tier memory openings 149 extends to the lower source layer 112. The inter-tier dielectric layer 180 can comprise a dielectric material (such as borosilicate glass) having a greater etch rate than the first insulating layers 132 (that can include undoped silicate glass). Referring to FIG. 6B, an isotropic etch (such as a wet etch employing HF) can be employed to expand the lateral dimensions of the first-tier memory openings at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 7:
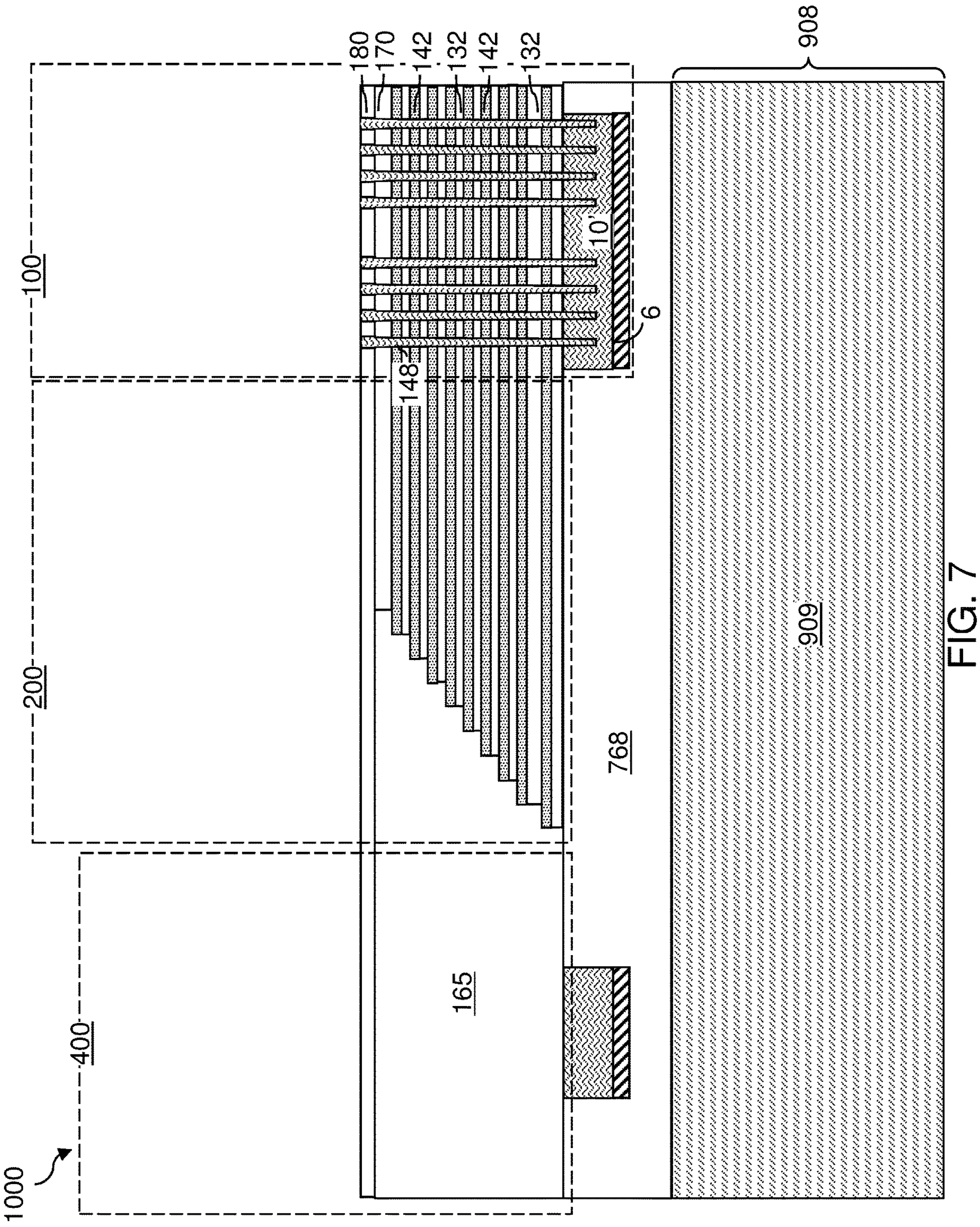
FIG. 7 is a vertical cross-sectional view of the first exemplary structure after formation of sacrificial memory opening fill portions according to an embodiment of the present disclosure.

Referring to FIG. 7, sacrificial memory opening fill portions 148 can be formed in the first-tier memory openings 149. For example, a sacrificial fill material layer is deposited in the first-tier memory openings 149. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. The top surfaces of the sacrificial memory opening fill portions 148 can be coplanar with the top surface of the inter-tier dielectric layer 180 (or the first insulating cap layer 170 if the inter-tier dielectric layer 180 is not present). The sacrificial memory opening fill portion 148 may, or may not, include cavities therein.

Figure 8A:
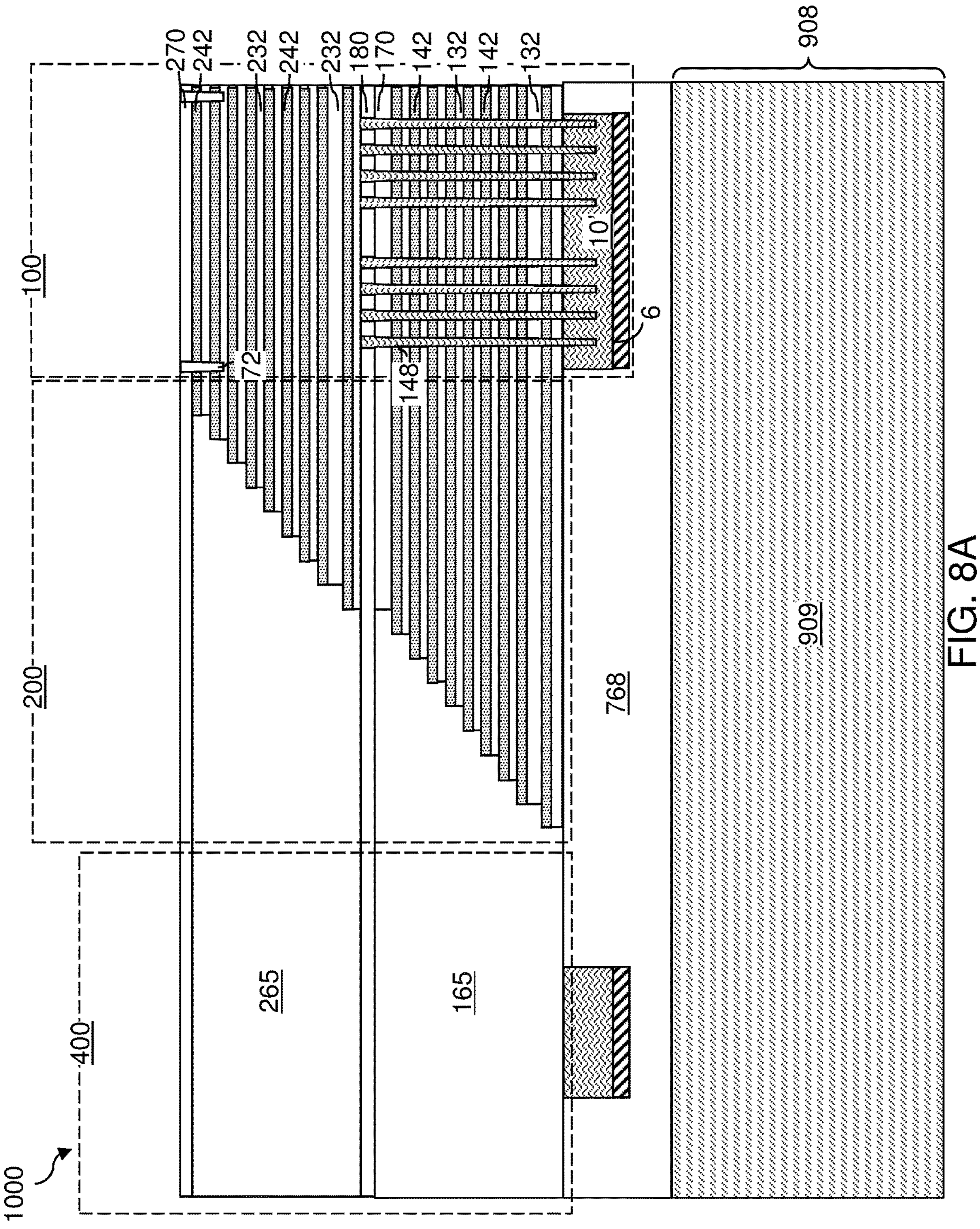
FIG. 8A is a vertical cross-sectional view of the first exemplary structure after formation of a second-tier alternating stack of second insulating layers and second spacer material layers, a second retro-stepped dielectric material portion, and a second insulating cap layer according to an embodiment of the present disclosure.
Figure 8B:
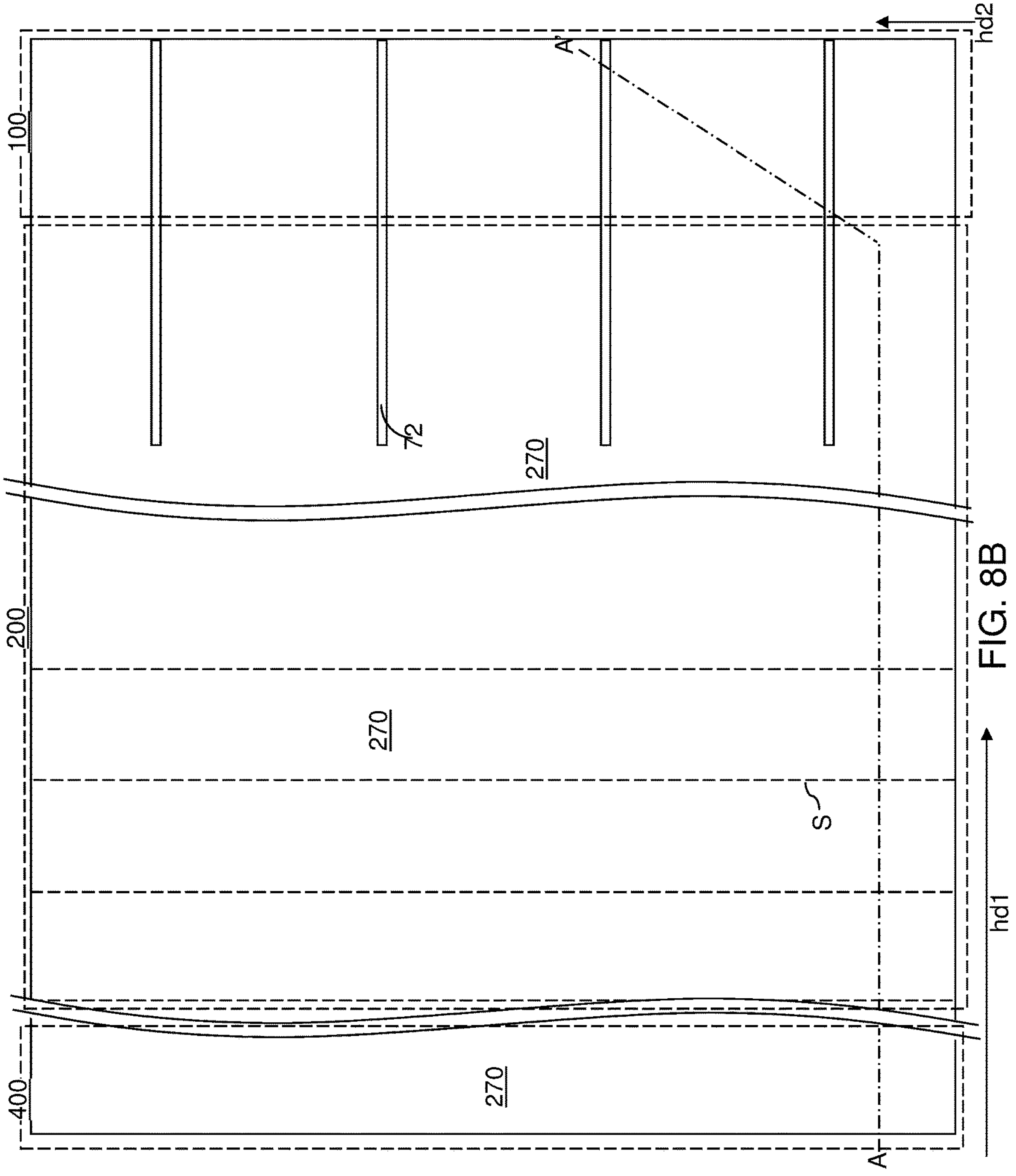
FIG. 8B is a top-down view of the first exemplary structure of FIG. 8A. The hinged vertical plane A-A' corresponds to the plane of the vertical cross-sectional view of FIG. 8A.

Referring to FIGS. 8A and 8B, a second-tier structure can be formed over the first-tier structure (132, 142, 170, 148). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Figure 9A:
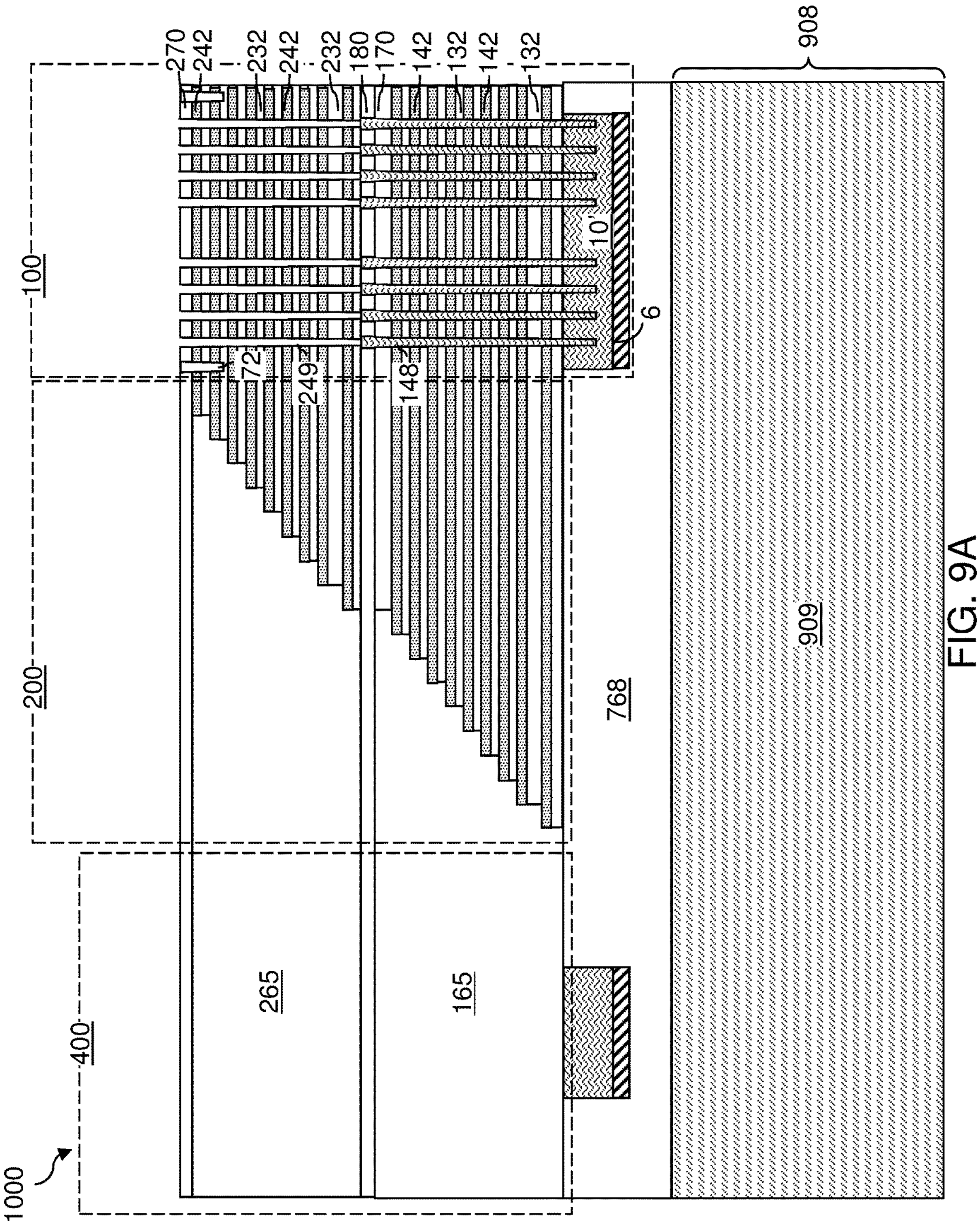
FIG. 9A is a vertical cross-sectional view of the first exemplary structure after formation of second-tier memory openings according to an embodiment of the present disclosure.
Figure 9B:
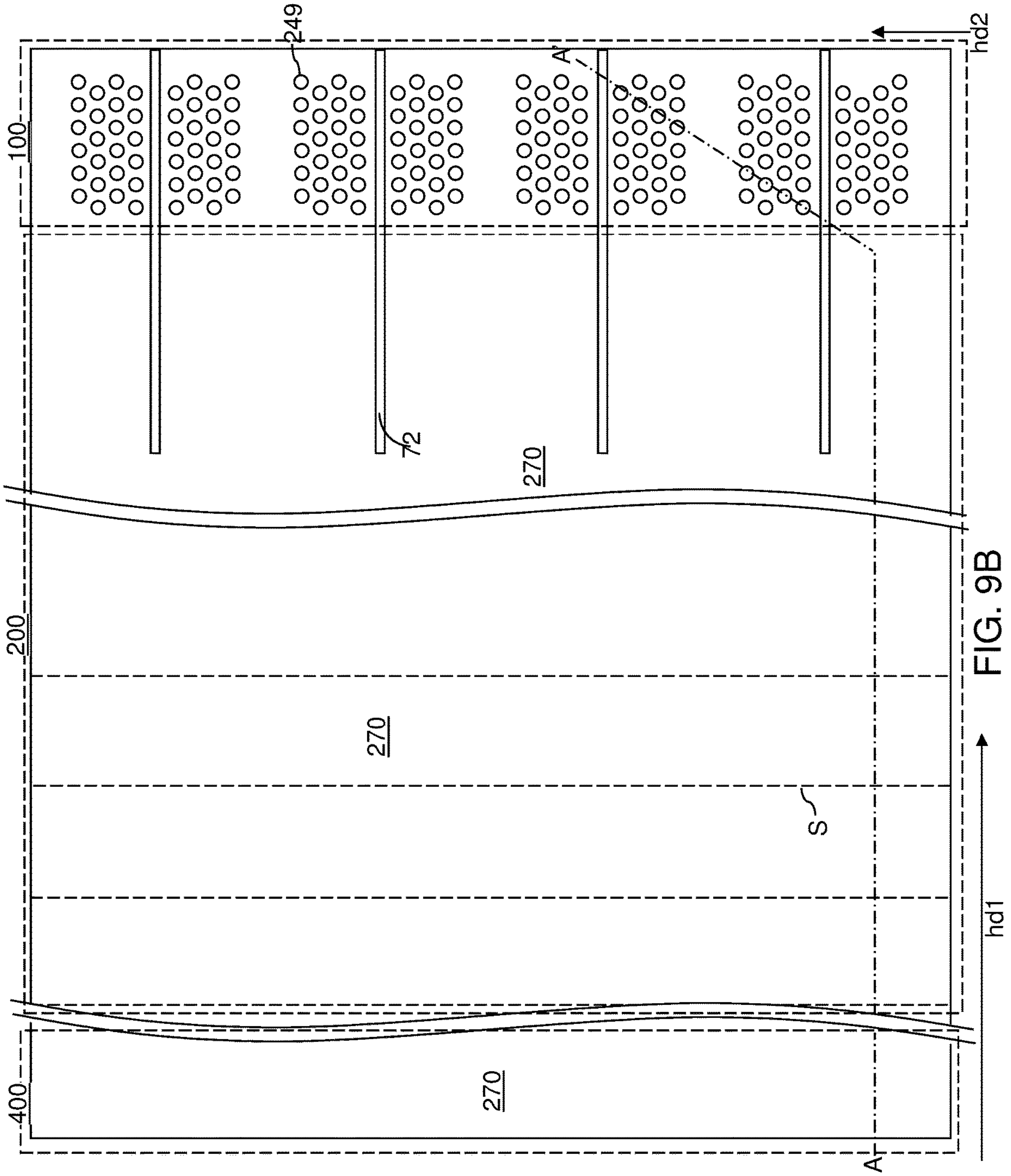
FIG. 9B is a top-down view of the first exemplary structure of FIG. 9A. The hinged vertical plane A-A' corresponds to the plane of the vertical cross-sectional view of FIG. 9A.

Referring to FIGS. 9A and 9B, second-tier memory openings 249 extending through the second-tier structure (232, 242, 270, 265) are formed in areas overlying the sacrificial memory opening fill portions 148. For example, a photoresist layer can be applied over the second-tier structure (232, 242, 270, 265), and can be lithographically patterned to form a same pattern as the pattern of the sacrificial memory opening fill portions 148, i.e., the pattern of the first-tier memory openings 149. Thus, the lithographic mask employed to pattern the first-tier memory openings 149 can be employed to pattern the second-tier memory openings 249. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process. A top surface of an underlying sacrificial memory opening fill portion 148 can be physically exposed at the bottom of each second-tier memory opening 249.

Figure 10A:
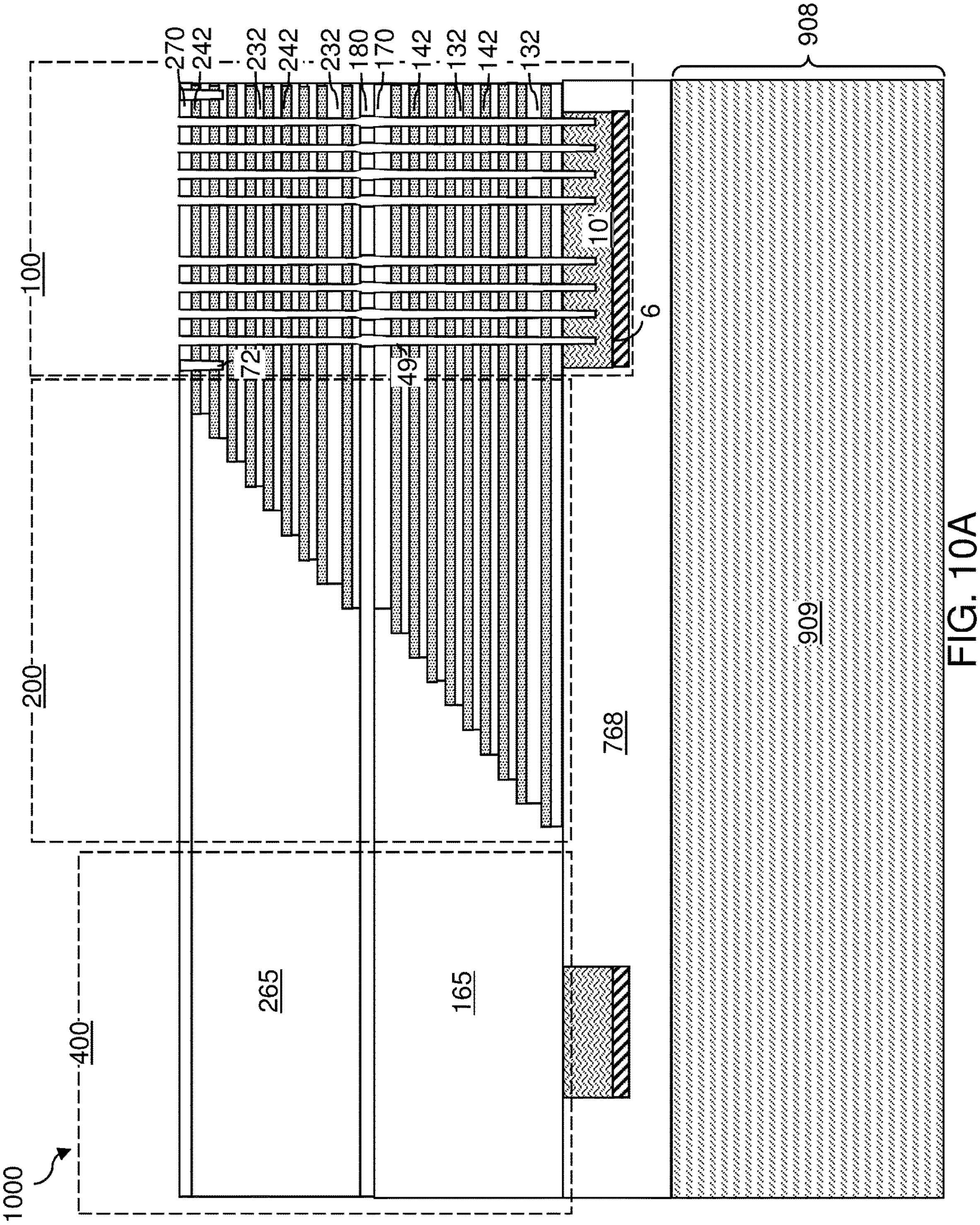
FIG. 10A is a vertical cross-sectional view of the first exemplary structure after formation of inter-tier memory openings according to an embodiment of the present disclosure.
Figure 10B:
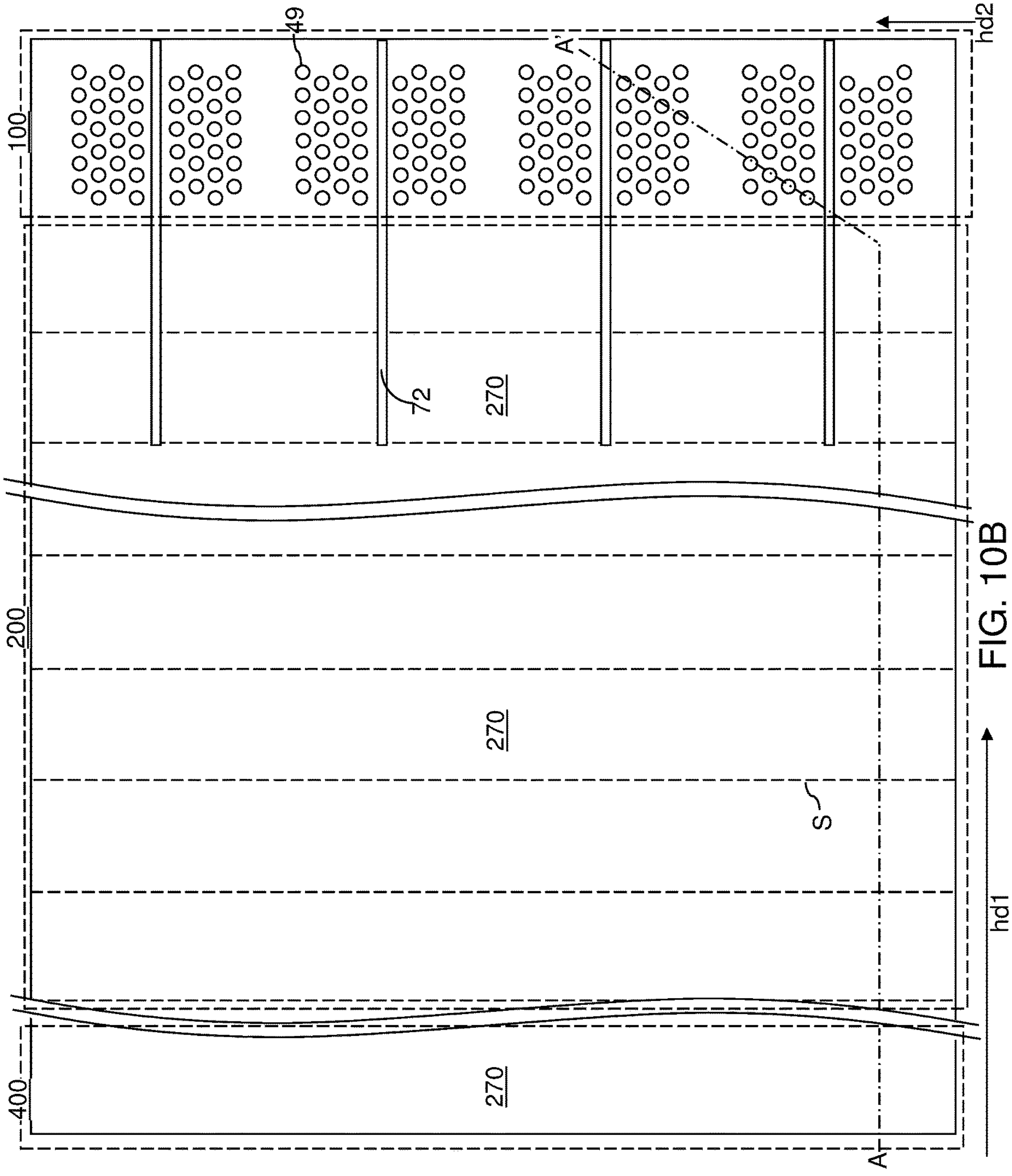
FIG. 10B is a top-down view of the first exemplary structure of FIG. 10A. The hinged vertical plane A-A' corresponds to the plane of the vertical cross-sectional view of FIG. 10A.

Referring to FIGS. 10A and 10B, an etch process can be performed to remove the sacrificial material of the sacrificial memory opening fill portions 148 selective to the materials of the second-tier alternating stack (232, 242) and the first-tier alternating stack (132, 142) (e.g., $C_4F_8/O_2/Ar$ etch). Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). The continuous cavities are herein referred to as memory openings 49 (or inter-tier memory openings). Surfaces of the in-process source-level material layers 10' can be physically exposed at the bottom of each memory opening 49. Locations of steps S in the first-tier alternating stack (132, 142) and the second-tier alternating stack (232, 242) are illustrated as dotted lines.

FIGS. 11A-11D provide sequential cross-sectional views of a memory opening 49 during formation of a memory opening fill structure 58 or a support pillar structure 20. The same structural change occurs in each memory openings 49.

Figures 11A, 11B:
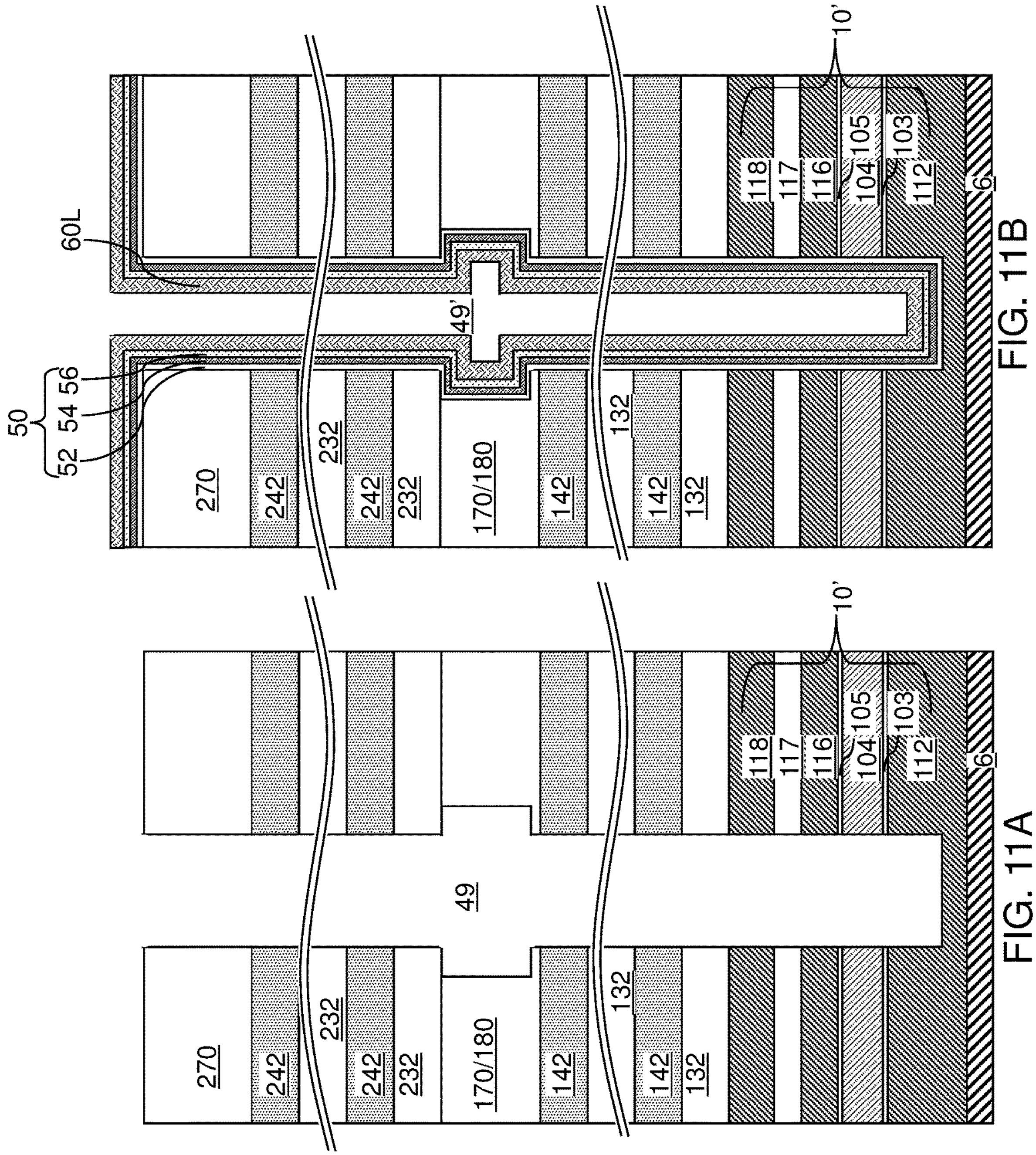
FIGS. 11A-11D are sequential vertical cross-sectional views of an inter-tier memory opening during formation of a memory opening fill structure according to an embodiment of the present disclosure.

Referring to FIG. 11A, a memory opening 49 in an exemplary device structure of FIGS. 10A and 10B is illustrated. The memory opening 49 extends through the first-tier structure and the second-tier structure.

Referring to FIG. 11B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Figure 11D:
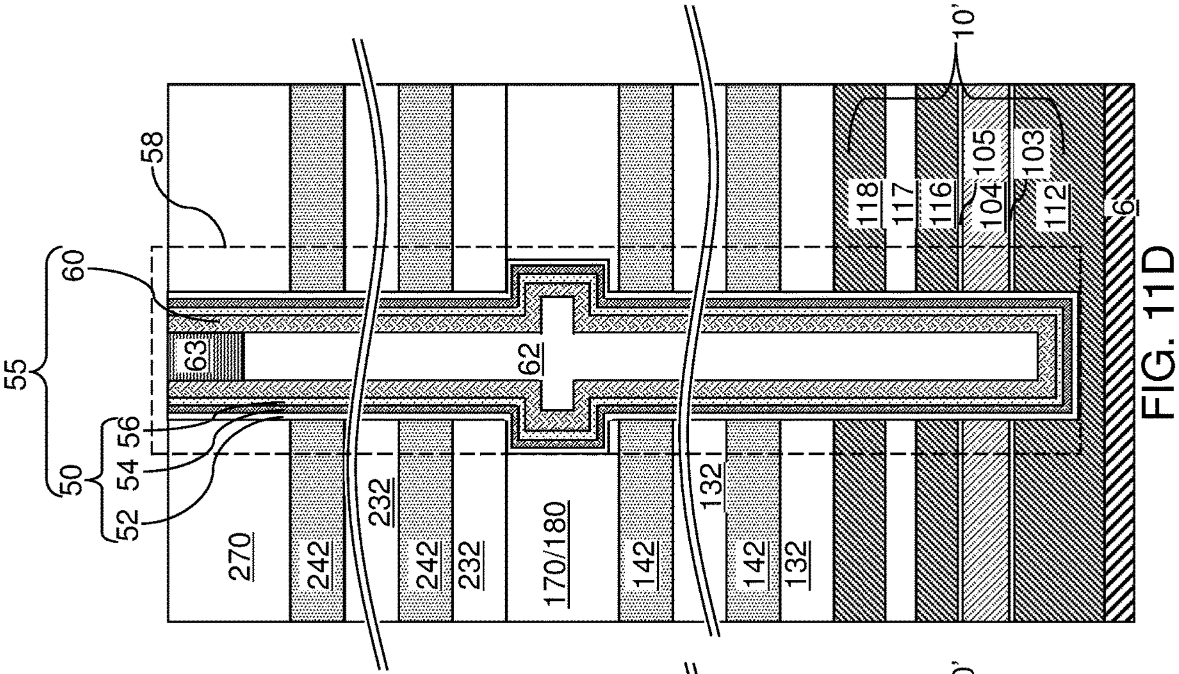
Figure 11C:
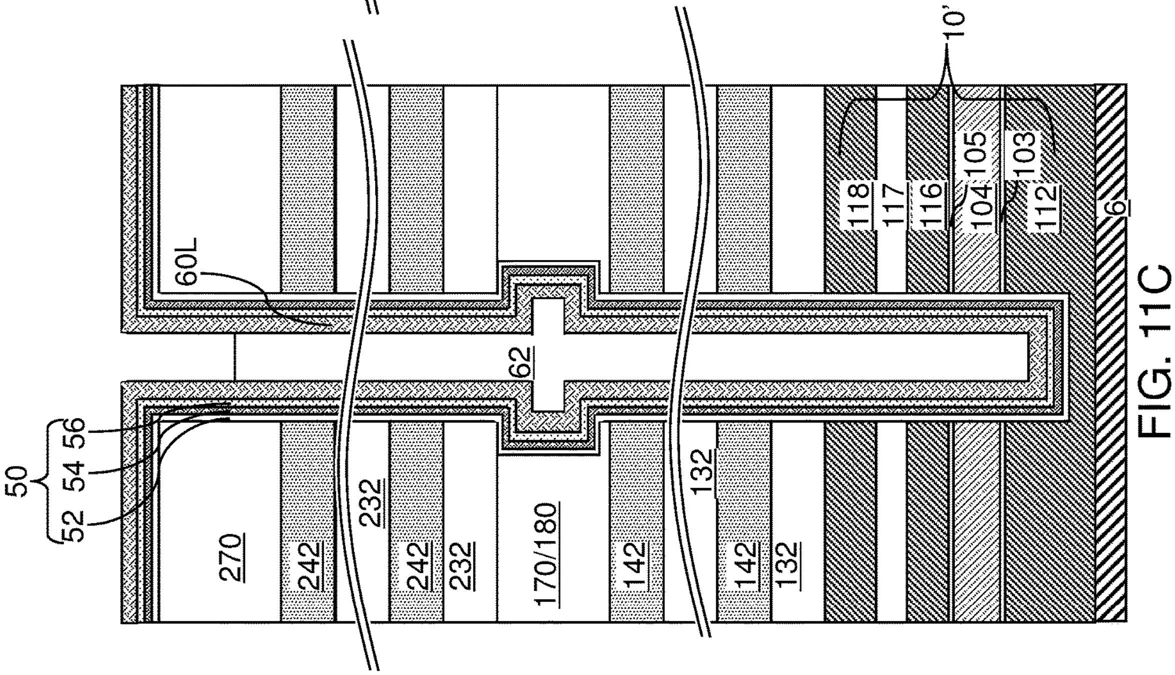

Referring to FIG. 11C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organ silicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 11D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

Figure 12A:
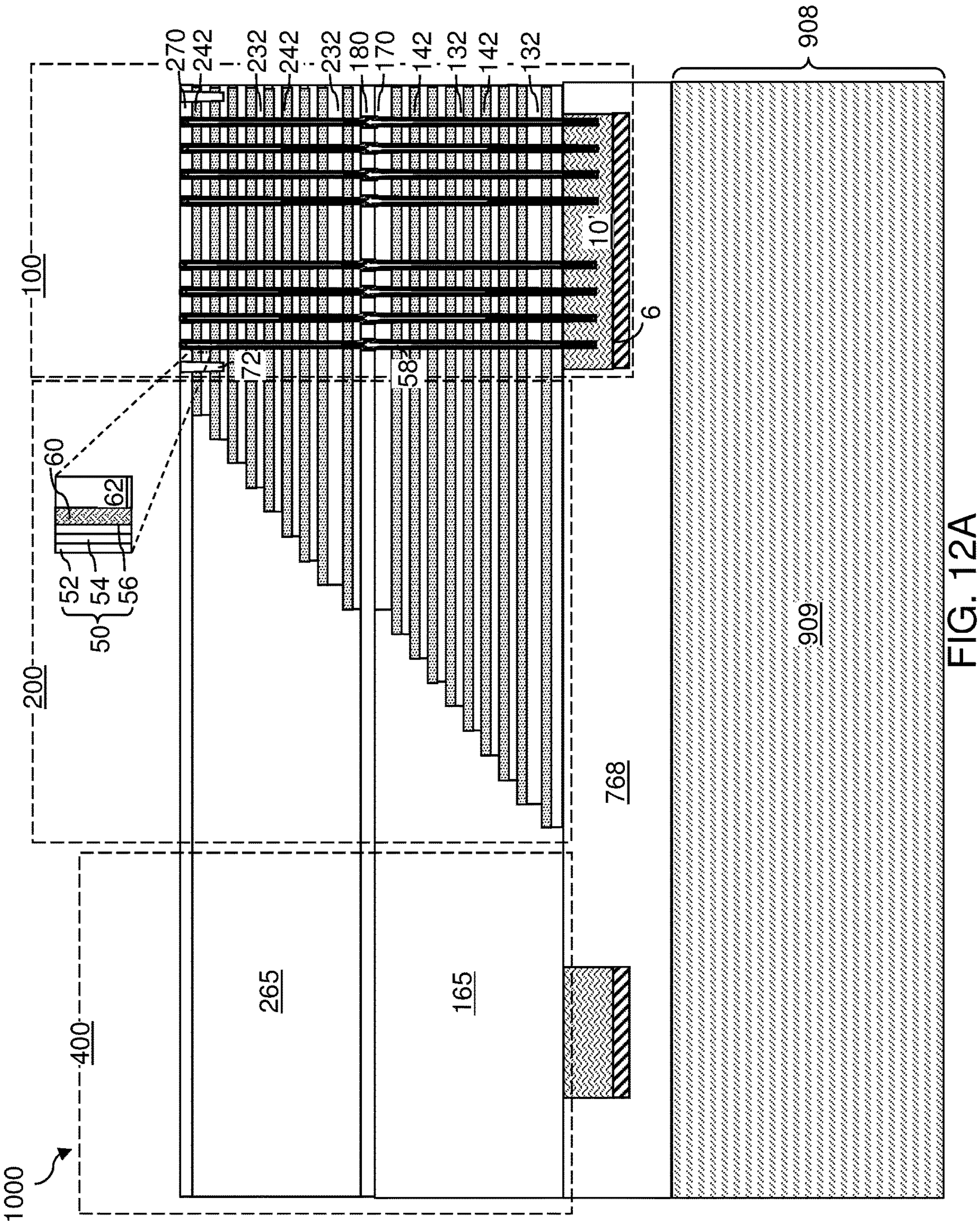
FIG. 12A is a vertical cross-sectional view of the first exemplary structure after formation of memory stack structures according to an embodiment of the present disclosure.
Figure 12B:
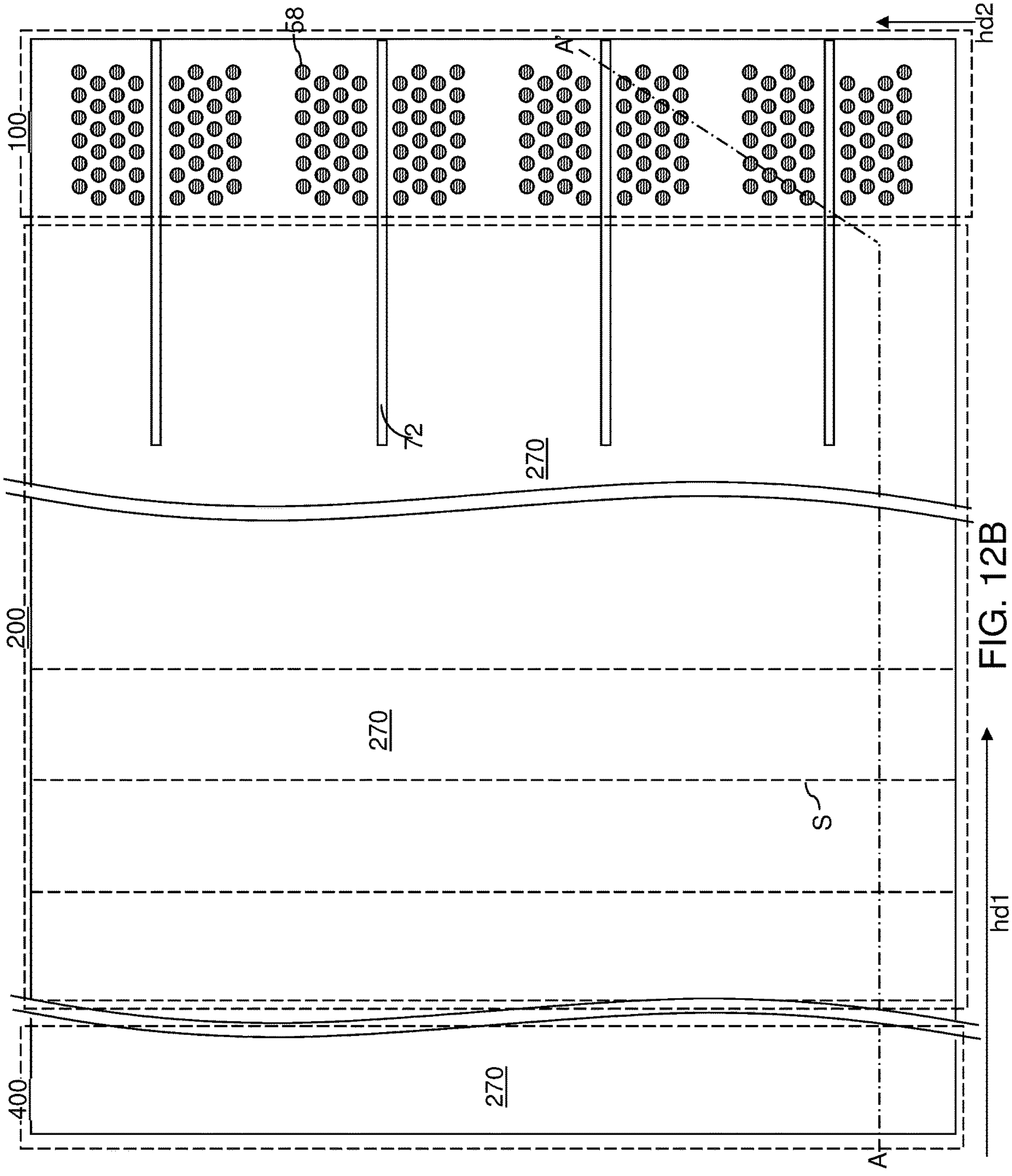
FIG. 12B is a top-down view of the first exemplary structure of FIG. 12A. The hinged vertical plane A-A' corresponds to the plane of the vertical cross-sectional view of FIG. 12A.

Referring to FIGS. 12A and 12B, the first exemplary structure is illustrated after formation of the memory opening fill structures 58.

Figure 13A:
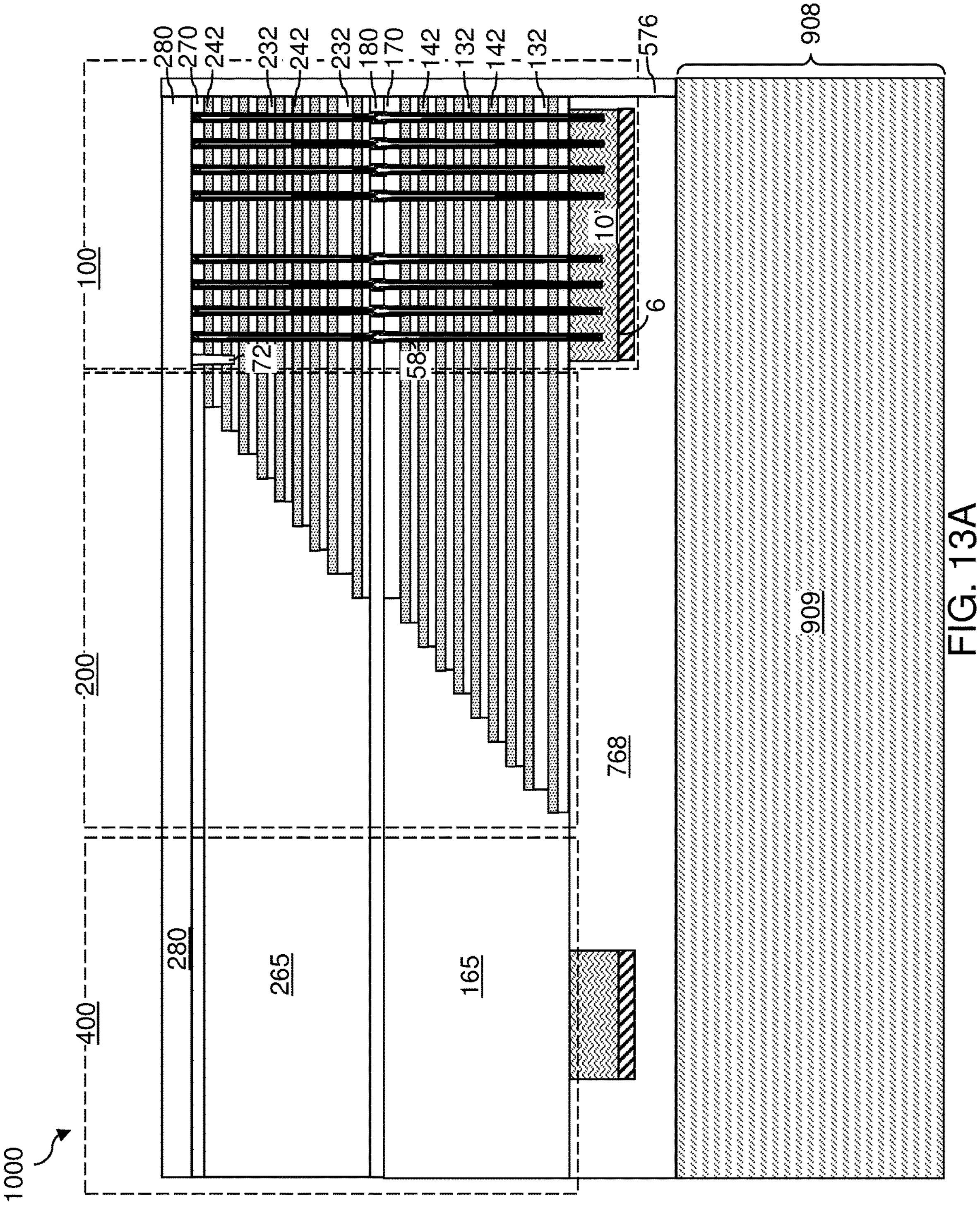
FIG. 13A is a vertical cross-sectional view of the first exemplary structure after formation of through-stack insulating material portion according to an embodiment of the present disclosure.
Figure 13B:
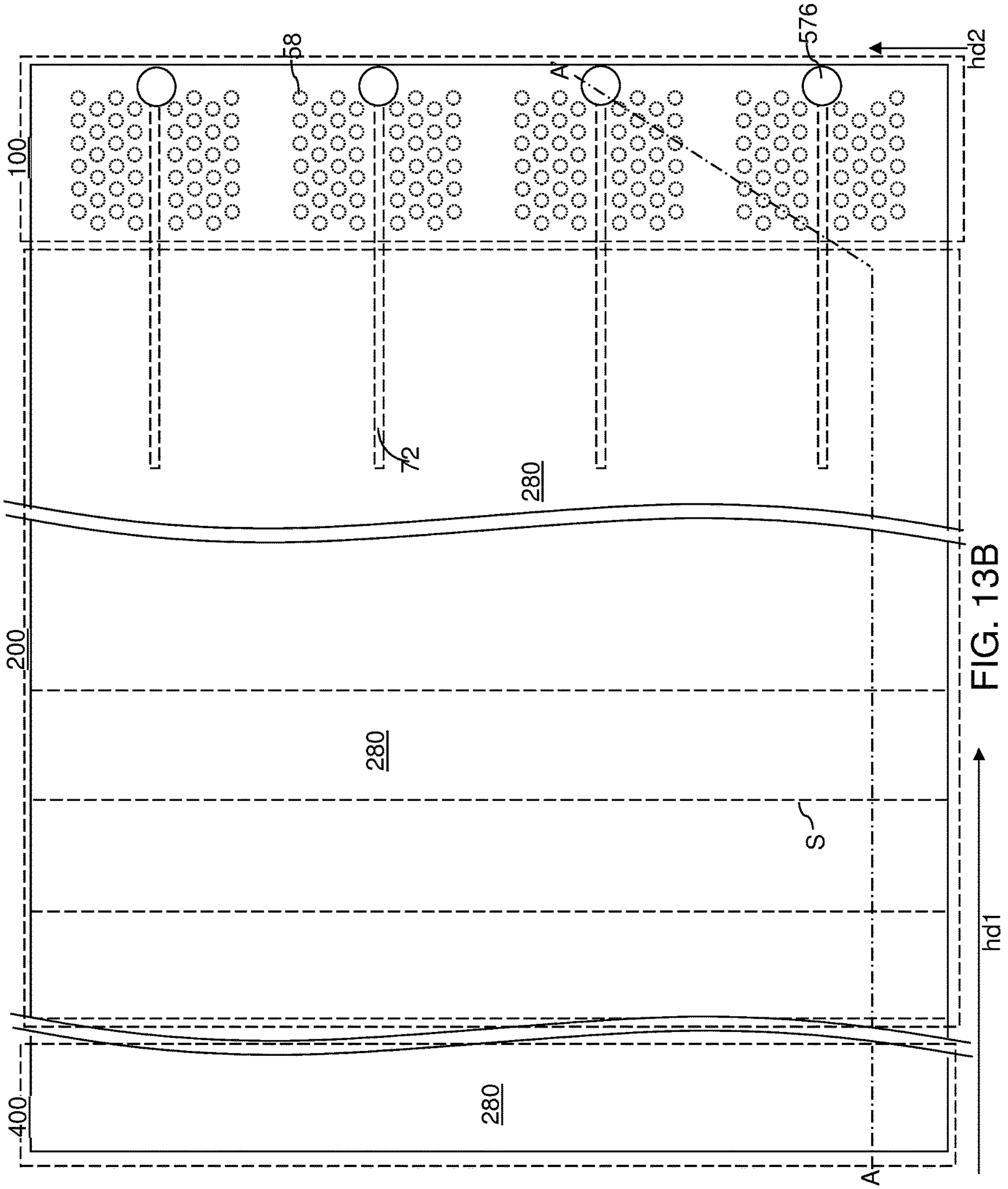
FIG. 13B is a top-down view of the first exemplary structure of FIG. 13A. The hinged vertical plane A-A' corresponds to the plane of the vertical cross-sectional view of FIG. 13A.
Figure 14A:
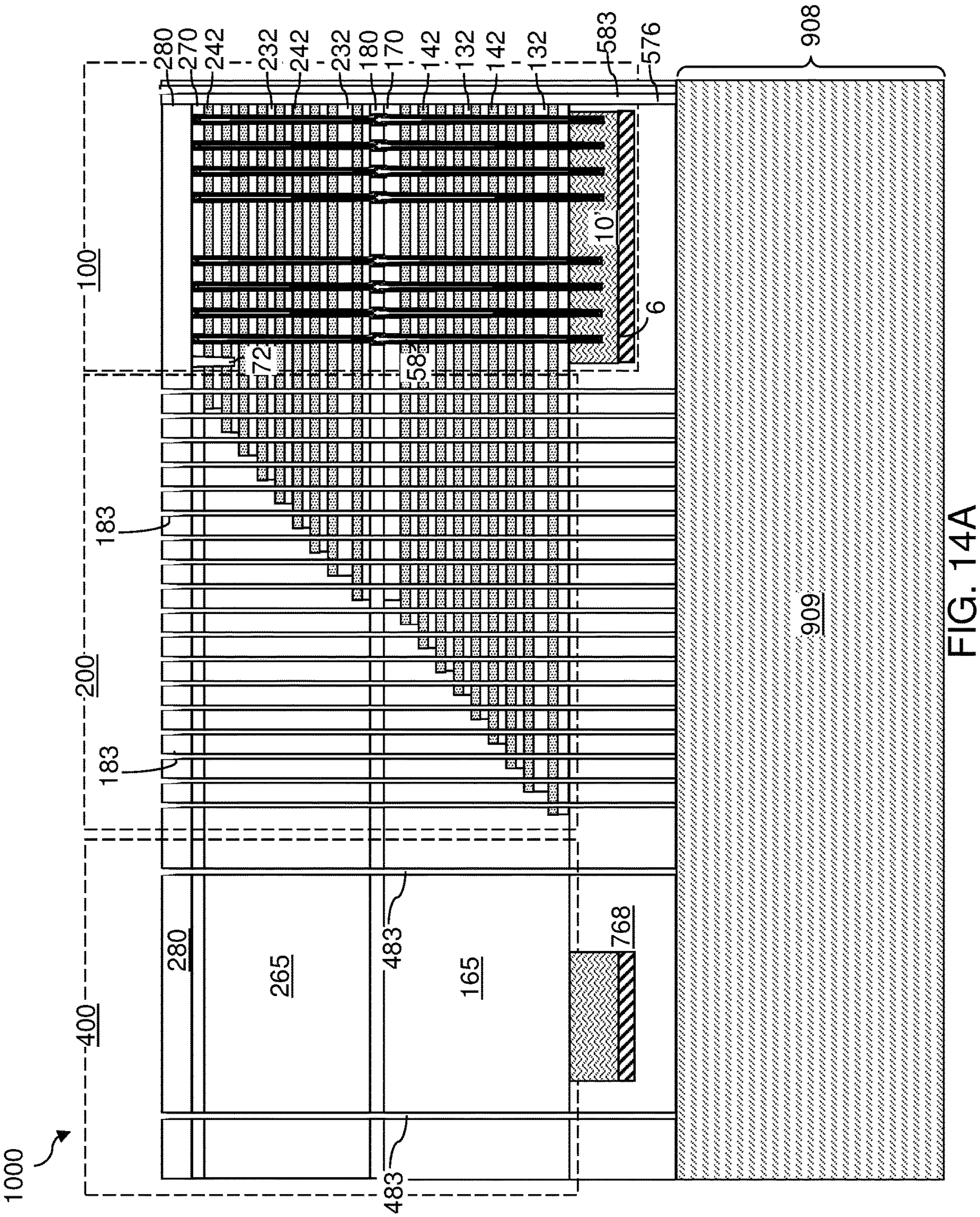
FIG. 14A is a vertical cross-sectional view of the first exemplary structure after formation of staircase region via cavities, peripheral region via cavities, and array region via cavities according to an embodiment of the present disclosure.
Figure 14B:
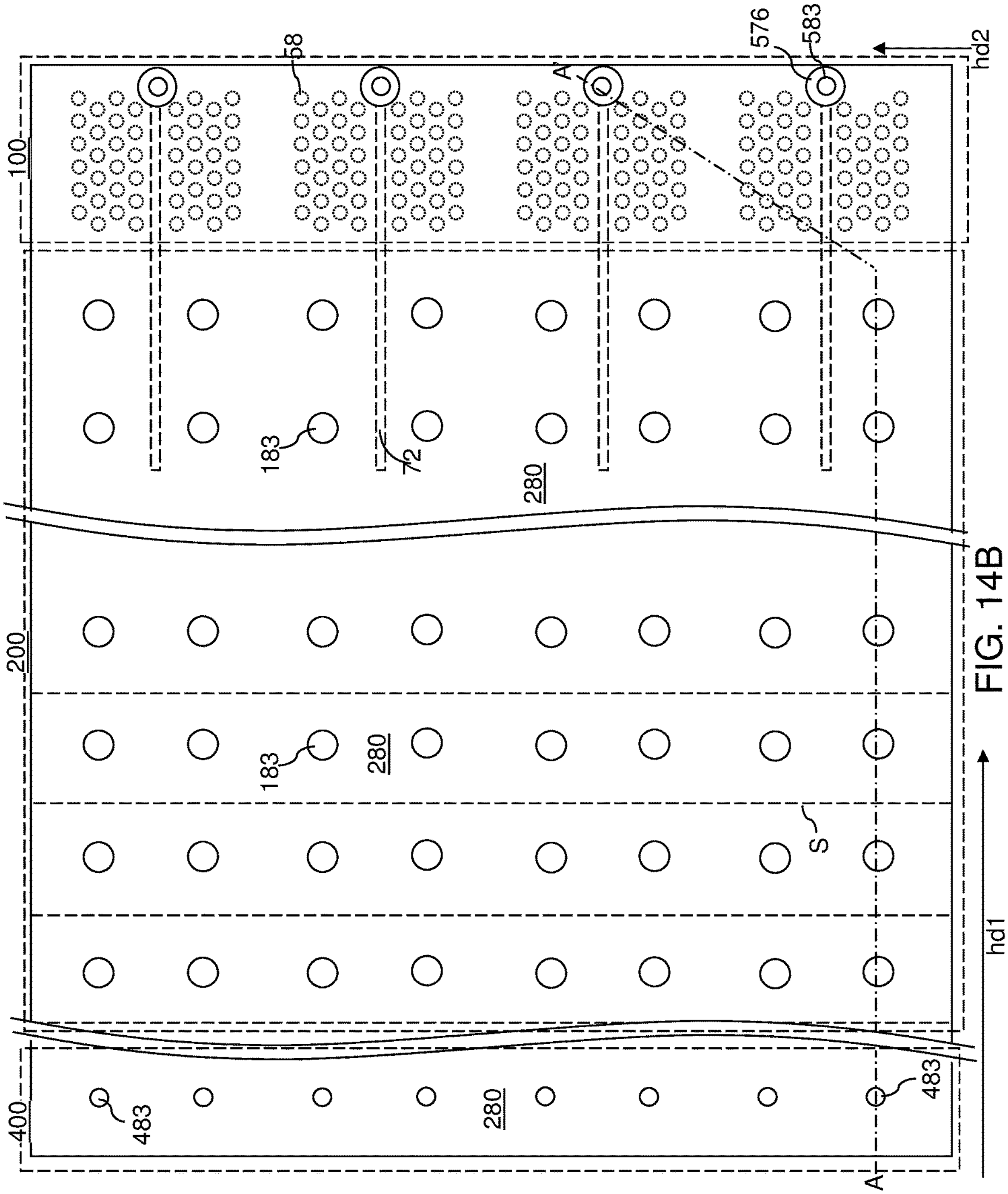
FIG. 14B is a top-down view of the first exemplary structure of FIG. 14A. The hinged vertical plane A-A' corresponds to the plane of the vertical cross-sectional view of FIG. 14A.
Figure 15A:
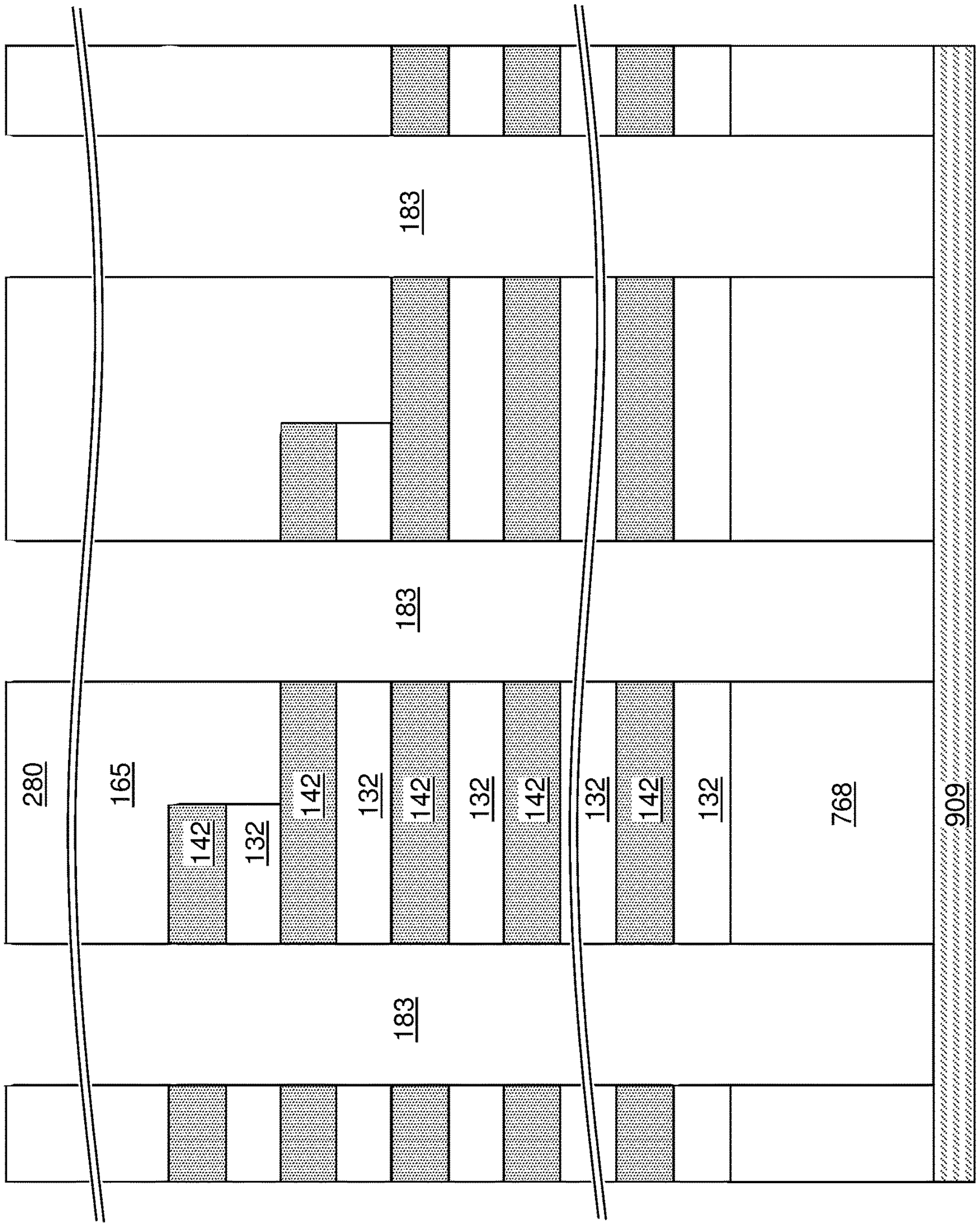
FIGS. 15A, 15B, and 15C are magnified vertical cross-sectional views of a staircase region via cavity, a peripheral region via cavity, and an array region via cavity, respectively, at the processing steps of FIGS. 14A and 14B.
Figure 15C:
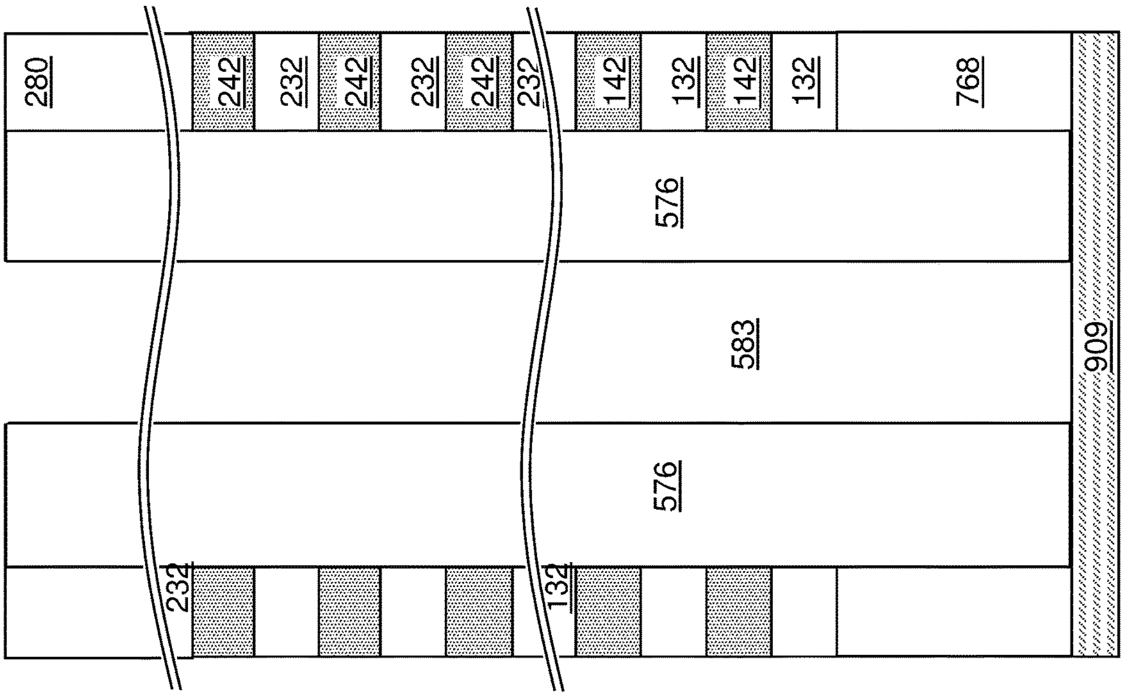
Figure 15B:
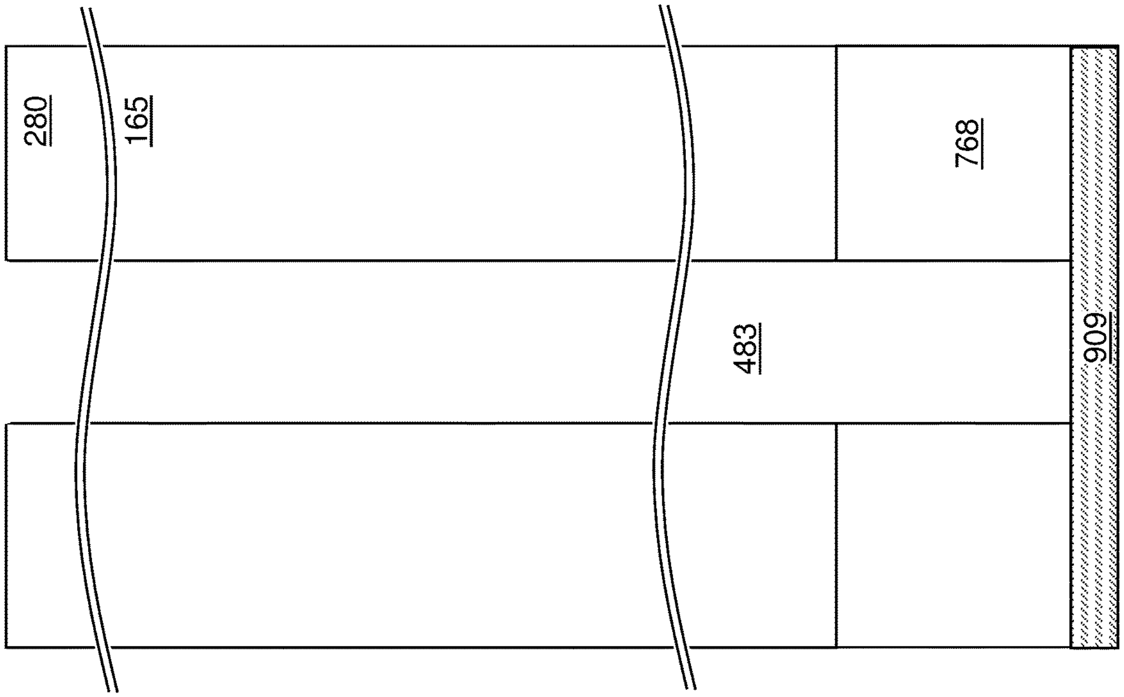

Referring to FIGS. 13A and 13B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Through-stack via cavities can be formed with the memory array region 100, for example, by applying and patterning of a photoresist layer to form openings therein, and by anisotropically etching the portions of the first contact level dielectric layer 280, the alternating stacks (132, 146, 232, 246), and the dielectric buffer layer 768 that underlie the openings in the photoresist layer. In one embodiment, each of the through-stack via cavities can be formed within a respective three-dimensional memory array so that each through-stack via cavities is laterally surrounded by memory opening fill structures 58. In one embodiment, one or more of the through-stack via cavities can be formed through the drain-select-level isolation structures 72. However, other locations may also be selected. In one embodiment, the first-through-stack via cavities can be formed within areas of openings in the in-process source-level material layers 10' and the optional planar conductive material layer 6.

A dielectric material is deposited in the through-stack via cavities. The dielectric material can include a silicon-oxide based material such as undoped silicate glass, doped silicate glass, or a flowable oxide material. The dielectric material can be deposited by a conformal deposition method such as chemical vapor deposition or spin coating. A void may be formed within an unfilled portion of each through-stack via cavity. Excess portion of the deposited dielectric material may be removed from above a horizontal plane including the top surface of the first contact level dielectric layer 280, for example, by chemical mechanical planarization or a recess etch. Each remaining dielectric material portion filling a respective one of the through-stack via cavity constitutes a through-stack insulating material portion 576. The through-stack insulating material portions 576 contact sidewalls of the alternating stacks (132, 146, 232, 246).

Referring to FIGS. 14A, 14B, 15A, 15B, and 15C, a photoresist layer (not shown) can be applied over the first contact level dielectric layer 280, and can be lithographically patterned to form various openings in areas in which via cavities are to be subsequently formed. The openings can be formed over the through-stack insulating material portions 576 in the memory array region 100, over horizontal surfaces of the stepped surfaces in the staircase region 200, and in the peripheral region 400. An anisotropic etch process can be performed to transfer the pattern of the openings in the photoresist layer through the various material portions in the memory-level assembly. Various contact via cavities (183 and optionally 483 and/or 583) can be formed through the memory-level assembly. Specifically, the various contact via cavities (183, 483, 583) can vertically extend to the top surfaces of the first carrier substrate 908.

The various contact via cavities (183, 483, 583) that are formed through the memory-level assembly include staircase region via cavities 183 that extends through a respective one of the horizontal surfaces of the stepped surfaces in the staircase region 200, peripheral region via cavities 483 that extend through the retro-stepped dielectric material portions (265, 165) in the peripheral region 400, and array region via cavities 583 that are formed through a respective one of the through-stack insulating material portions 576 in the memory array region 100. In one embodiment, each of the various contact via cavities (183, 483, 583) can be a cylindrical via cavity. As used herein, a "cylindrical via cavity" refers to a via cavity having only a straight sidewall or straight sidewalls such that each straight sidewall is vertical or substantially vertical. As used herein, a surface is "substantially vertical" if the taper angle of the surface with respect to a vertical direction is less than 5 degrees. Each staircase region via cavity 183 is a cylindrical via cavity that extends through a second retro-stepped dielectric material portion 265 and a subset of layers within the second alternating stack (232, 242) and the first alternating stack (132, 142) and over the first carrier substrate 908. A top surface of a respective one of the first carrier substrate 908 can be physically exposed at the bottom of each of the various contact via cavities (183, 483, 583).

Figure 16A:
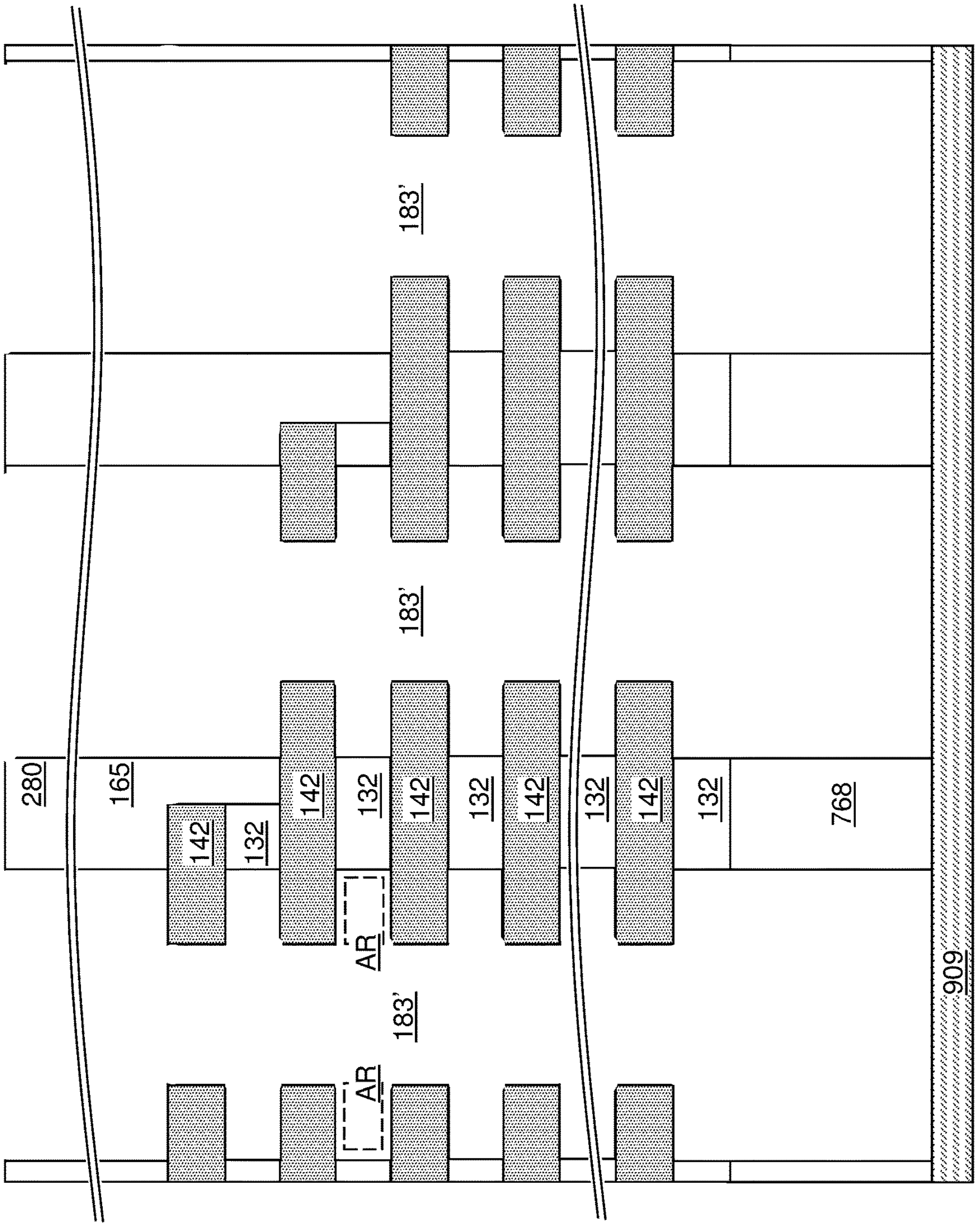
FIGS. 16A. 16B, and 16C are magnified vertical cross-sectional views of a staircase region via cavity, a peripheral region via cavity, and an array region via cavity, respectively, after an isotropic etch process that converts the staircase region via cavity into a ribbed via cavity according to an embodiment of the present disclosure.
Figure 16C:
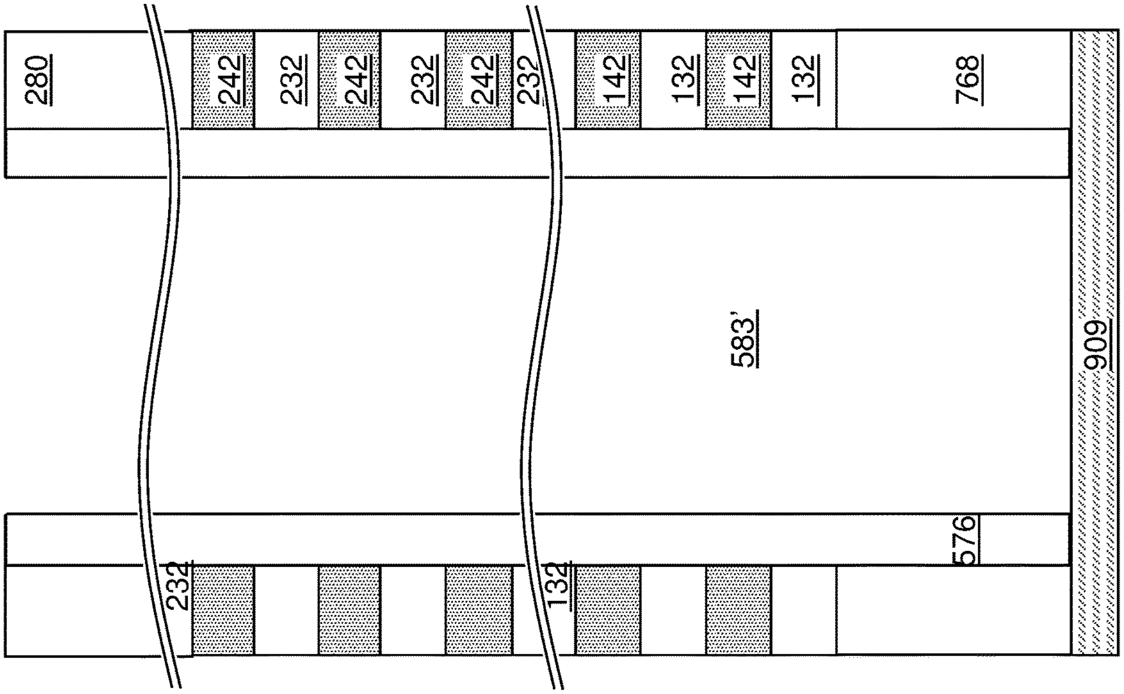
Figure 16B:
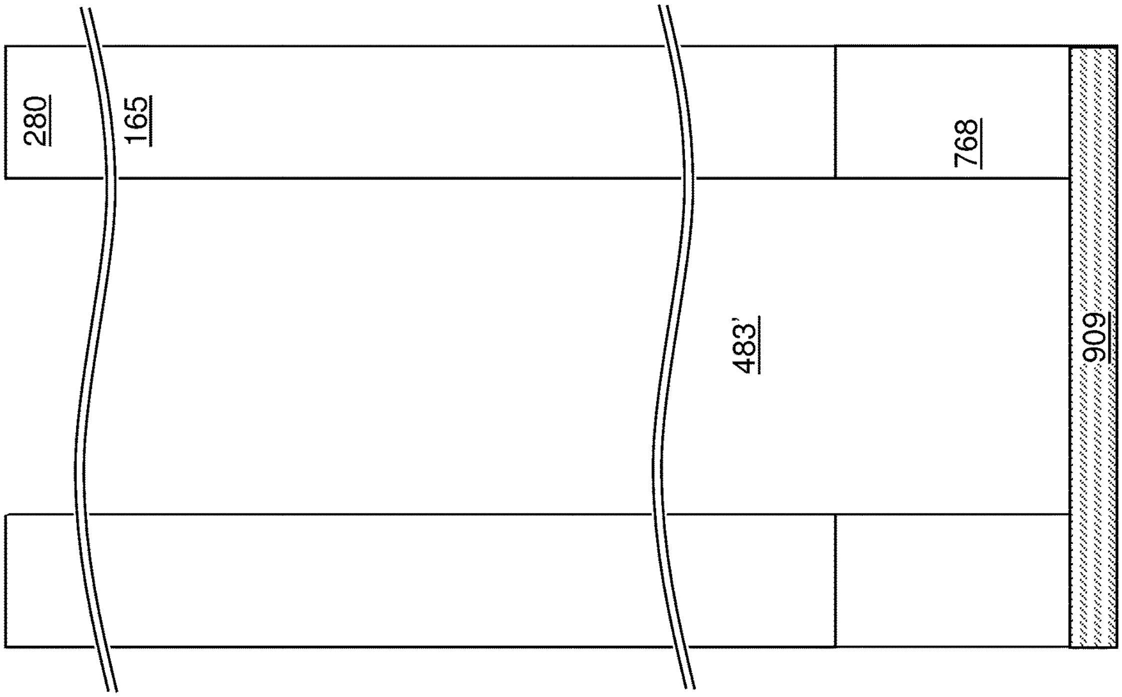

Referring to FIGS. 16A. 16B, and 16C, an isotropic etch process can be performed to laterally recess the insulating layers (132, 232) with respect to the spacer material layers such as the first and second sacrificial material layers (142, 242). Each staircase region via cavity 183 can be converted from a cylindrical via cavity to a ribbed via cavity 183'. As used herein, a "ribbed via cavity" refers to a via cavity including at least one annular laterally protruding volume. Each annular laterally protruding volume of a ribbed via cavity is herein referred to as a "rib region."

In one embodiment, the retro-stepped dielectric material portions (165, 265) can include a same dielectric material or a similar dielectric material as the insulating layers (132, 232). For example, the first and second insulating layers (132, 232) can include undoped silicate glass, and the retro-stepped dielectric material portions (165, 265) can include undoped silicate glass or doped silicate glass. In this case, the ribbed via cavities 183' can be formed from the cylindrical staircase region via cavities 183 by etching materials of the retro-stepped dielectric material portions (165, 265) and the insulating layers (132, 232) selective to the spacer material layers (i.e., the first and second sacrificial material layers (142, 242)).

In one embodiment, the dielectric materials of the first contact level dielectric layer 270, the first and second insulating cap layers (170, 270), the first and second retro-stepped dielectric material portions (165, 265), and the insulating layers (132, 232) can comprise silicon oxide materials (such as undoped silicate glass and various doped silicate glasses), and the first and second sacrificial material layers (142, 242) can include a sacrificial material that is not a silicate glass material (such as silicon nitride or a semiconductor material). In this case, the isotropic etch process can etch the dielectric materials of the first contact level dielectric layer 270, the first and second insulating cap layers (170, 270), the first and second retro-stepped dielectric material portions (165, 265), and the insulating layers (132, 232) can be etched selective to the materials of the first and second sacrificial material layers (142, 242) to form the ribbed via cavities 183'.

In one embodiment, the spacer material layers of the alternating stacks (132, 142, 232, 242) can include sacrificial material layers (142, 242) that are composed of silicon nitride, and the insulating layers (132, 232) and the retro-stepped dielectric material portions (265, 165) can include silicon oxide materials. In this case, the retro-stepped dielectric material portions (165, 265) and each insulating layer (132, 232) physically exposed to the staircase region via cavities 183 can be isotropically recessed by a wet etch process employing hydrofluoric acid. Each ribbed via cavity 183' can include a ribbed cavity region extending through the alternating stacks (132, 142, 232, 242), an overlying cavity laterally surrounded by the second retro-stepped dielectric material portion 265 and optionally by the first retro-stepped dielectric material portion 165 (in case the ribbed via cavity 183' extends only through the first-tier alternating stack (132, 142) and does not extend through the second-tier alternating stack (232, 242)), an underlying cavity that underlies the alternating stacks (132, 142, 232, 242), and annular recesses AR, or rib regions, formed at levels of insulating layers (132, 232) in the subset of layers within the alternating stacks (132, 142, 232, 242) through which the ribbed via cavity 183' vertically extends.

Each of the peripheral region via cavities 483 and the array region via cavities 583 can be isotropically expanded laterally to form expanded peripheral region via cavities 483' and expanded array region via cavities 583'. In one embodiment, the dielectric materials of the first contact level dielectric layer 280, the first and second insulating cap layers (170, 270), the first and second retro-stepped dielectric material portions (165, 265), and the insulating layers (132, 232) can include a same dielectric material such as undoped silicate glass, and the peripheral region via cavities 483' and the expanded array region via cavities 583' can be cylindrical cavities. Alternatively, the dielectric materials of the first contact level dielectric layer 280, the first and second insulating cap layers (170, 270), the first and second retro-stepped dielectric material portions (165, 265), and the insulating layers (132, 232) can have different etch rates during the isotropic etch process, and the peripheral region via cavities 483' and expanded array region via cavities 583' may include lateral steps having a lesser lateral dimension than the recess distance by which the sacrificial material layers (142, 242) are laterally recessed.

Figure 17A:
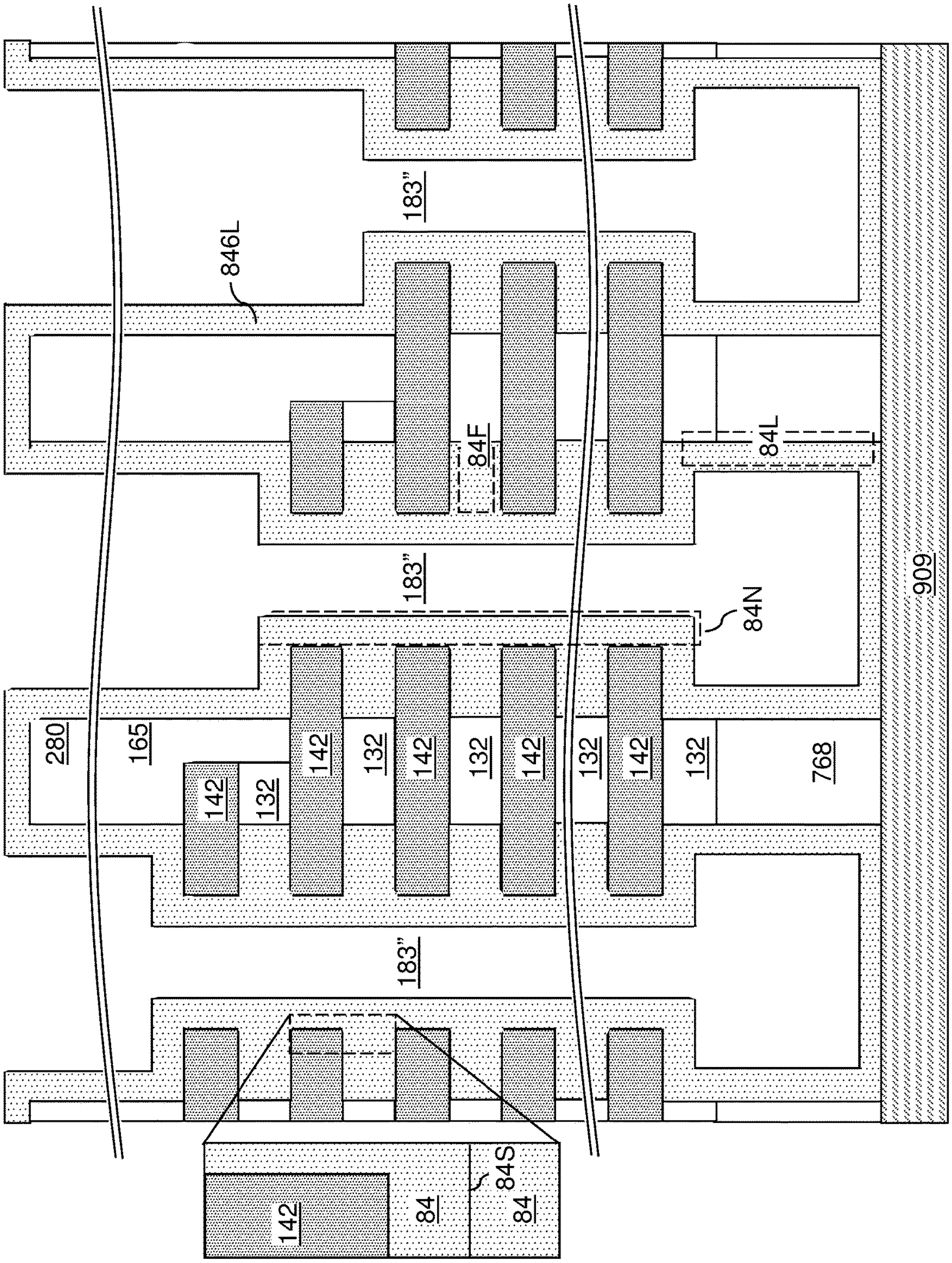
FIGS. 17A. 17B, and 17C are magnified vertical cross-sectional views of a staircase region via cavity, a peripheral region via cavity, and an array region via cavity, respectively, after deposition of a conformal dielectric via liner according to an embodiment of the present disclosure.
Figure 17C:
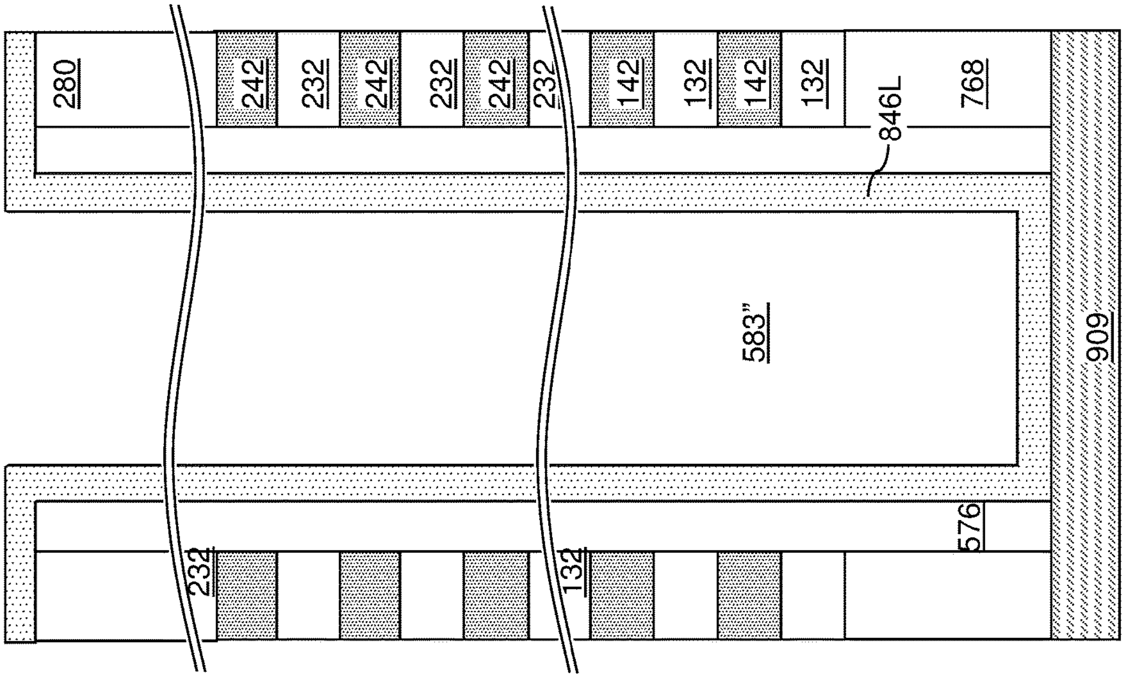
Figure 17B:
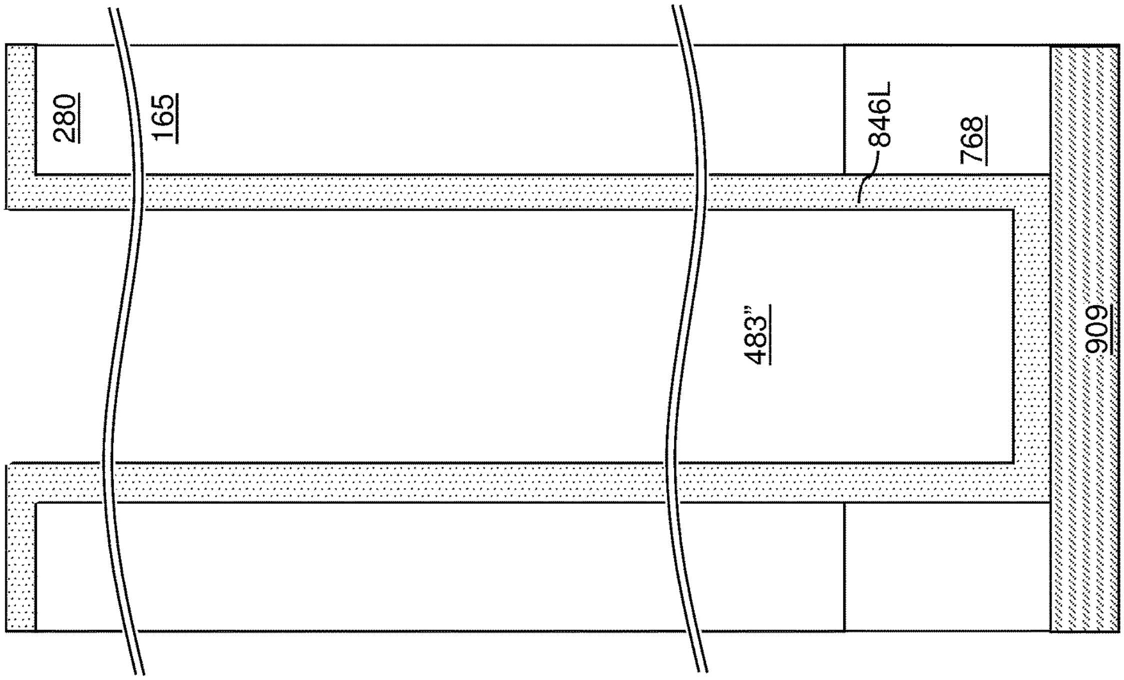
Figure 18A:
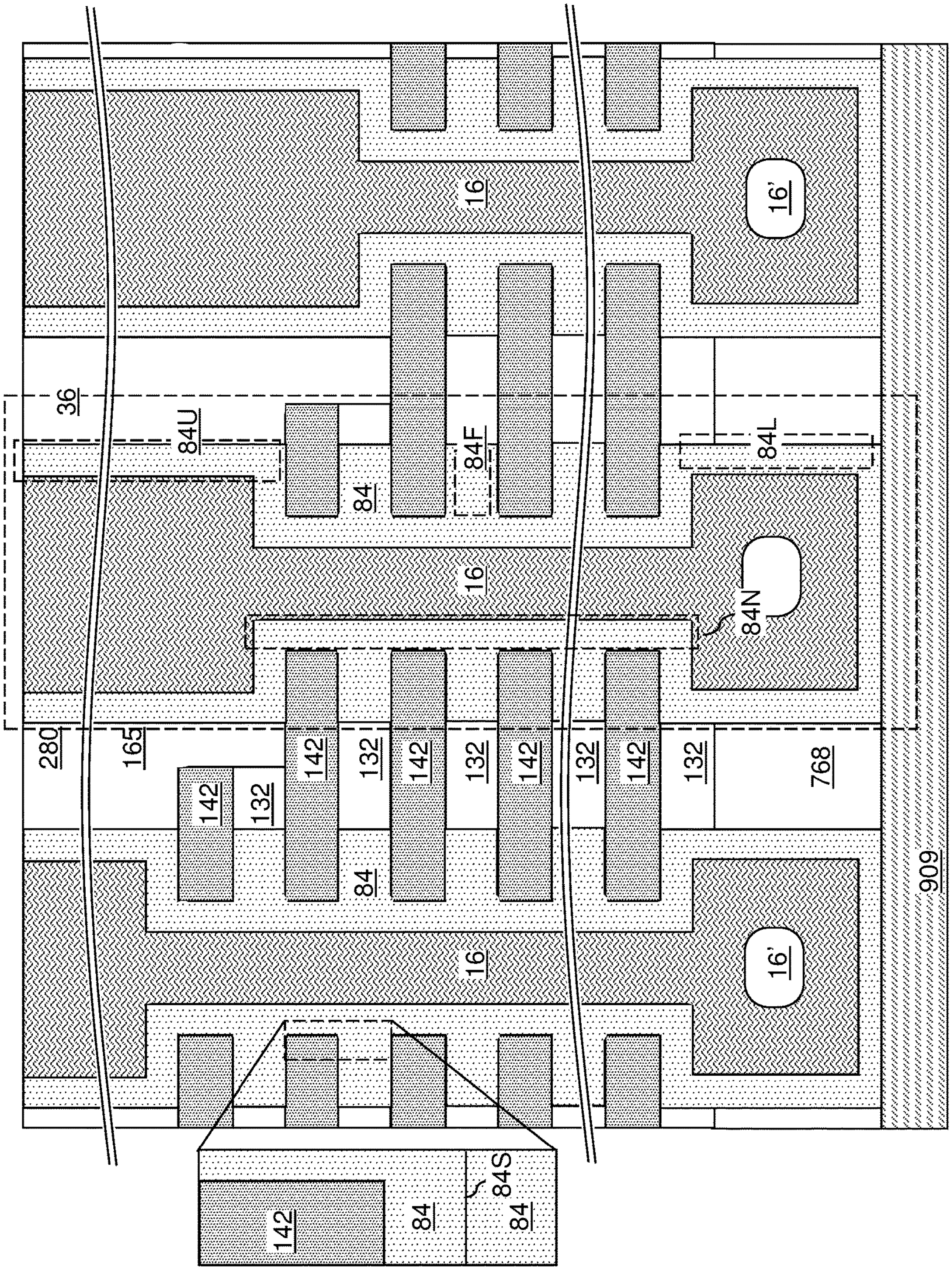
FIGS. 18A, 18B, and 18C are magnified vertical cross-sectional views of a staircase region via cavity, a peripheral region via cavity, and an array region via cavity, respectively, after formation of various sacrificial via fill material portions therein according to an embodiment of the present disclosure.
Figure 18C:
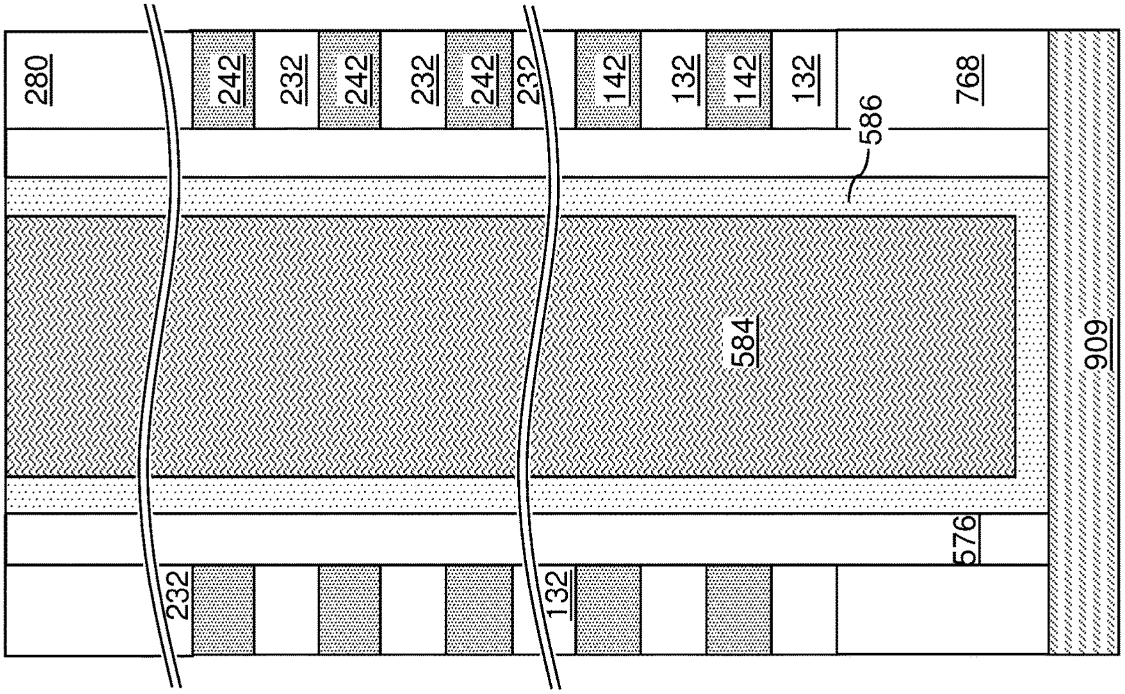
Figure 18B:
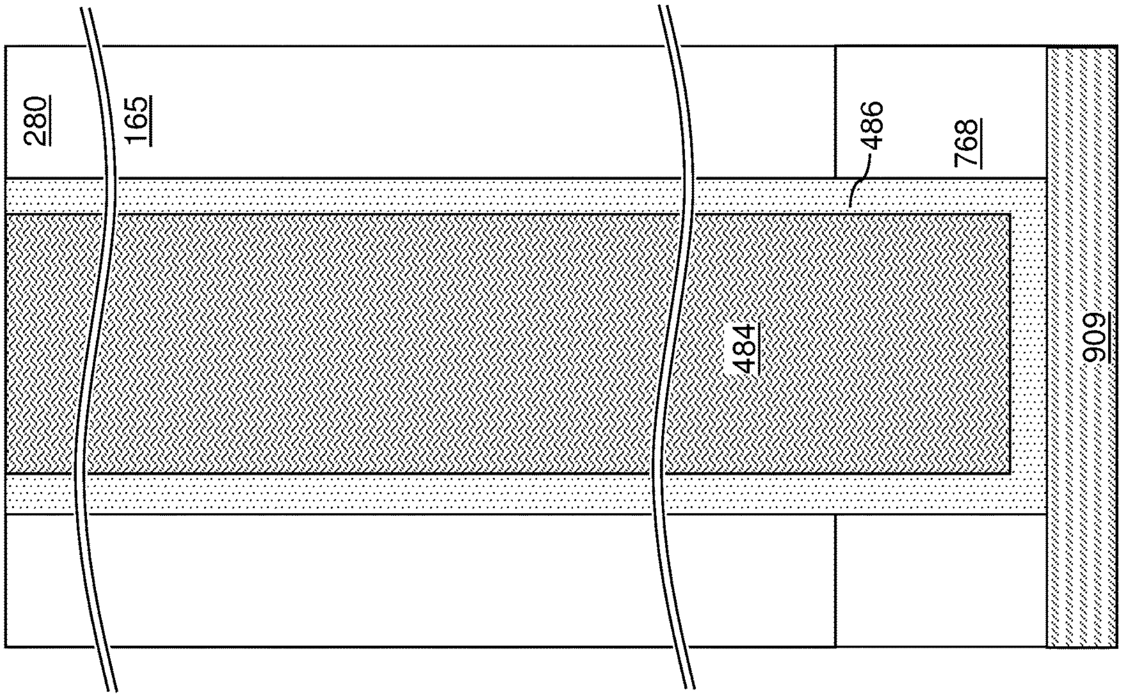
Figure 19:
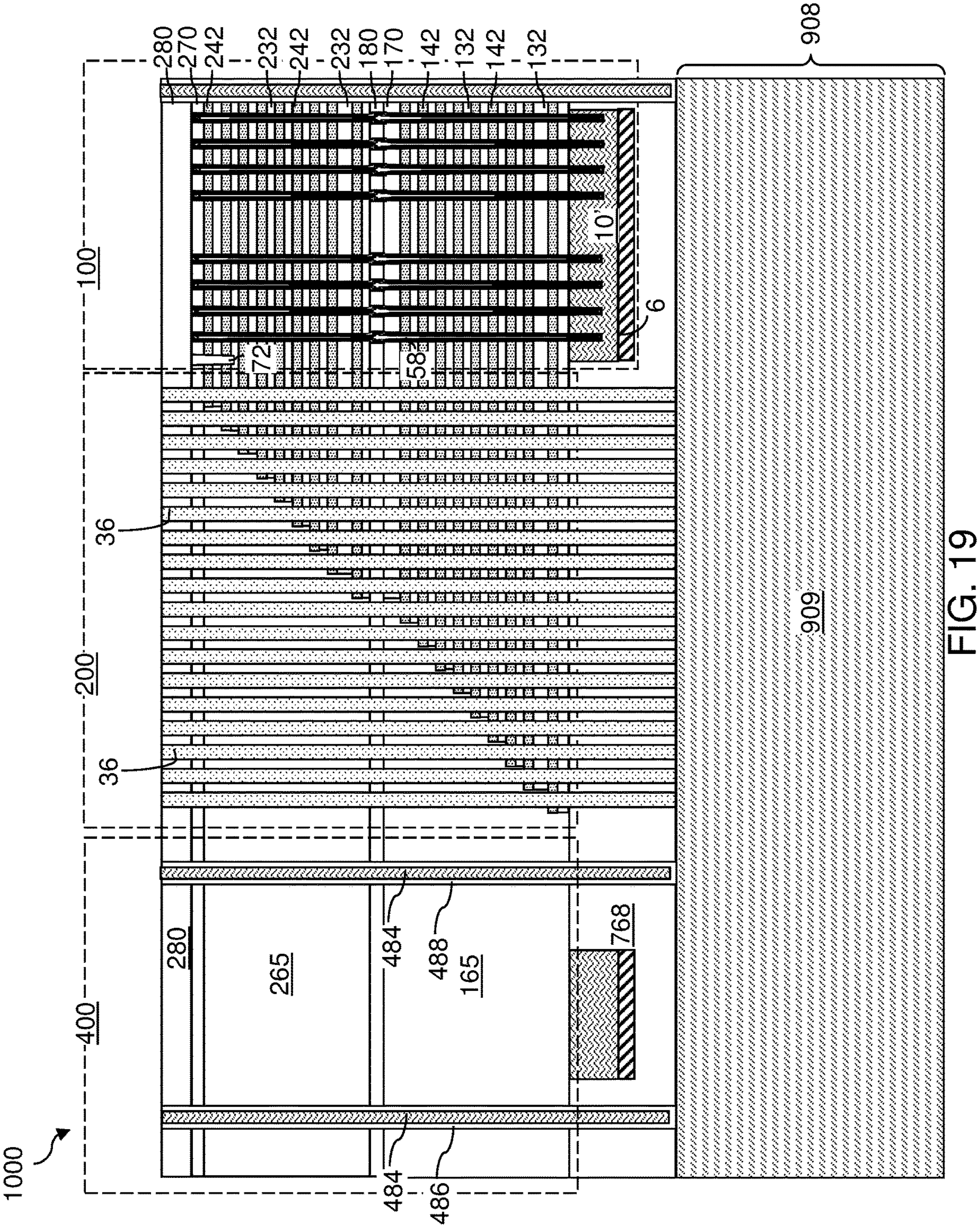
FIG. 19 is a vertical cross-sectional view of the first exemplary structure at the processing steps of FIGS. 18A, 18B, and 18C.

Referring to FIGS. 17A, 17B, and 17C, a conformal dielectric via liner 846L can be deposited at the periphery of the ribbed via cavities 183', the expanded peripheral region via cavities 483', and expanded array region via cavities 583' by a conformal deposition process. The conformal dielectric via liner 846L includes a dielectric material that is different from the material of the sacrificial material layers (142, 242). For example, the conformal dielectric via liner 846L can include silicon oxide or a dielectric metal oxide (such as aluminum oxide). In one embodiment, the conformal dielectric via liner 846L can include undoped silicate glass formed by thermal decomposition of tetraethyl orthosilicate (TEOS). The thickness of the conformal dielectric via liner 846L can be greater than one half of the maximum thickness of the sacrificial material layers (142, 242). Portions 84F of the conformal dielectric via liner 846L deposited at peripheries of the ribbed via cavities 183' fill the annular recesses AR (i.e., the rib regions). A neck portion 84N of the conformal dielectric via liner 846L can be formed around each set of at least one annular portions of the conformal dielectric via liner 846L that fill the annular recess(es) of each ribbed via cavity 183'. An annular seam 84S can be present within each portion of the conformal dielectric via liner 846L that fills the annular recesses AR. The conformal dielectric via liner 846L can be formed directly on each physically exposed top surface of the first carrier substrate 908. An unfilled void 183" can be present within each ribbed via cavity 183' after deposition of the conformal dielectric via liner 846L. An unfilled void 483" can be present within each expanded peripheral region via cavity 483' after deposition of the conformal dielectric via liner 846L. An unfilled void 583" can be present within each expanded array region via cavity 583' after deposition of the conformal dielectric via liner 846L.

Referring to FIGS. 18A, 18B, 18C, and 19, a sacrificial via fill material can be deposited in each of the unfilled voids (183", 483", 583") in the staircase region via cavities, the peripheral region via cavities, and the array region via cavities by a conformal deposition process. Various sacrificial via fill material portions (16, 484, 584) can be formed in the unfilled voids (183", 483", 583") by deposition of the sacrificial via fill material and planarization of the sacrificial via fill material from above the top surface of the first contact level dielectric layer 280. The sacrificial via fill material is a material that can be removed selective to the material of the conformal dielectric via liner 846L. For example, the sacrificial via fill material can comprise a semiconductor material such as amorphous silicon or a dielectric material such as organ silicate glass. The sacrificial via fill material can be deposited by a non-conformal deposition process or a conformal deposition process. A void 16' may be present at a lower portion of each staircase region via cavity. Planarization of the sacrificial via fill material can be performed by a chemical mechanical planarization (CMP) process or by a recess etch process. Horizontal portions of the conformal dielectric via liner 846L can be removed from above the top surface of the first contact level dielectric layer 280 by the planarization process.

Each remaining portion of the sacrificial material filling the voids constitutes a sacrificial via fill material portion (16, 484, 584). The sacrificial via fill material portions (16, 484, 584) include staircase region sacrificial via fill material portions 16 formed in the staircase region via cavities, peripheral region sacrificial via fill material portions 484 formed in the peripheral region via cavities, and array region sacrificial via fill material portions 584 formed in the array region via cavities. Each remaining portion of the conformal dielectric via liner 486L in the various via cavities constitute a conformal insulating liner (84, 486, 586). The conformal insulating liners (84, 486, 586) include staircase region conformal dielectric via liners 84, peripheral region conformal insulating liners 486, and array region conformal insulating liners 586. Each staircase region conformal dielectric via liner 84 can include neck portion 84N that vertically extends through a respective subset of the layers in the alternating stacks (132, 142, 232, 242), an upper cylindrical portion 84U extending through the first contact level dielectric layer 280 and the second retro-stepped dielectric material portion 265 and optionally through the first retro-stepped dielectric material portion 165, a lower cylindrical portion 84L that extends through the bottommost first insulating layer 132 and the dielectric buffer layer 768, and a bottom portion that contacts a top surface of the substrate material layer 909. Each adjoining set of a staircase region conformal dielectric via liner 84 and a staircase region sacrificial via fill material portion 16 constitutes a staircase region sacrificial via structure 36.

Figure 20A:
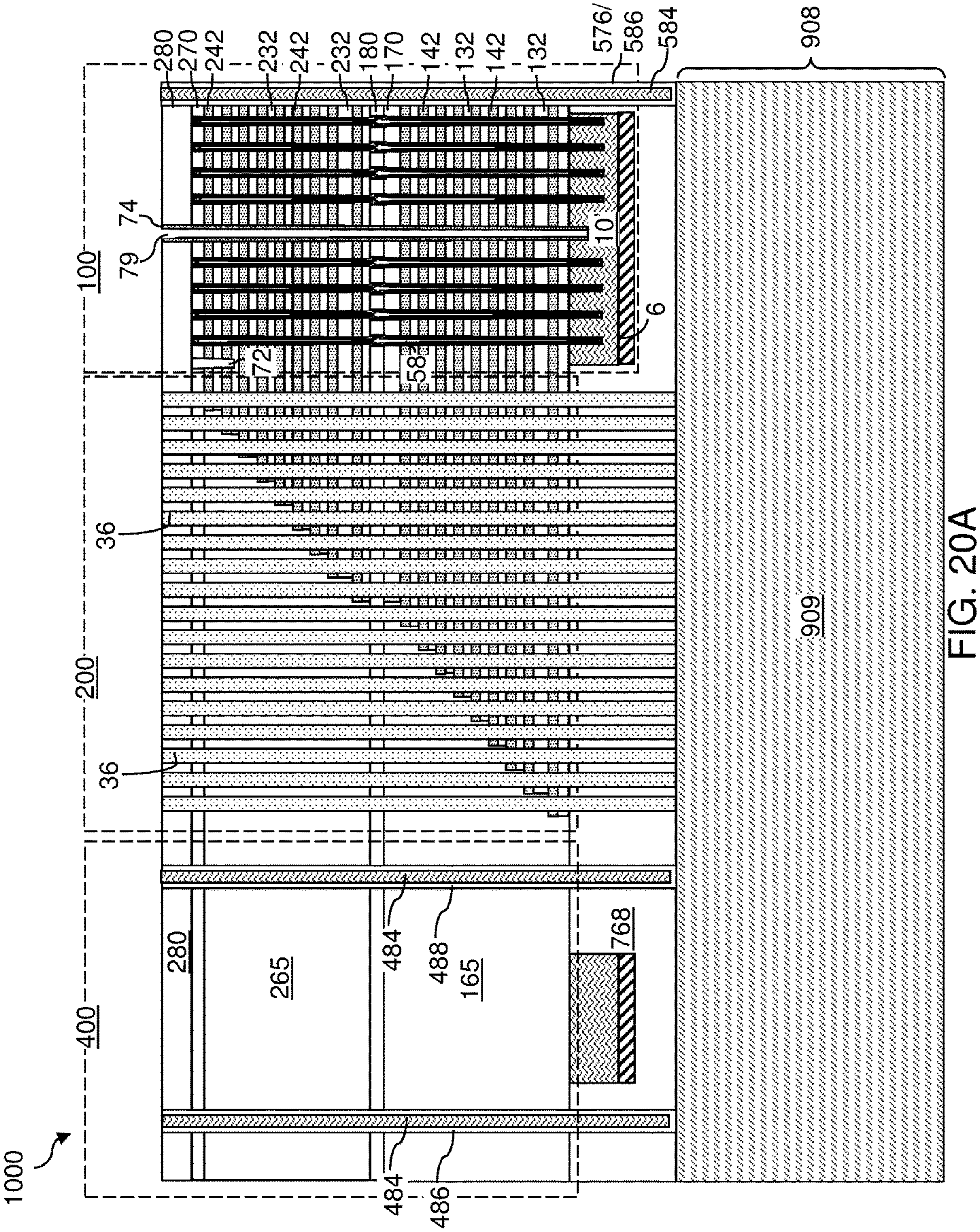
FIG. 20A is a vertical cross-sectional view of the first exemplary structure after formation of backside trenches according to an embodiment of the present disclosure.
Figure 20B:
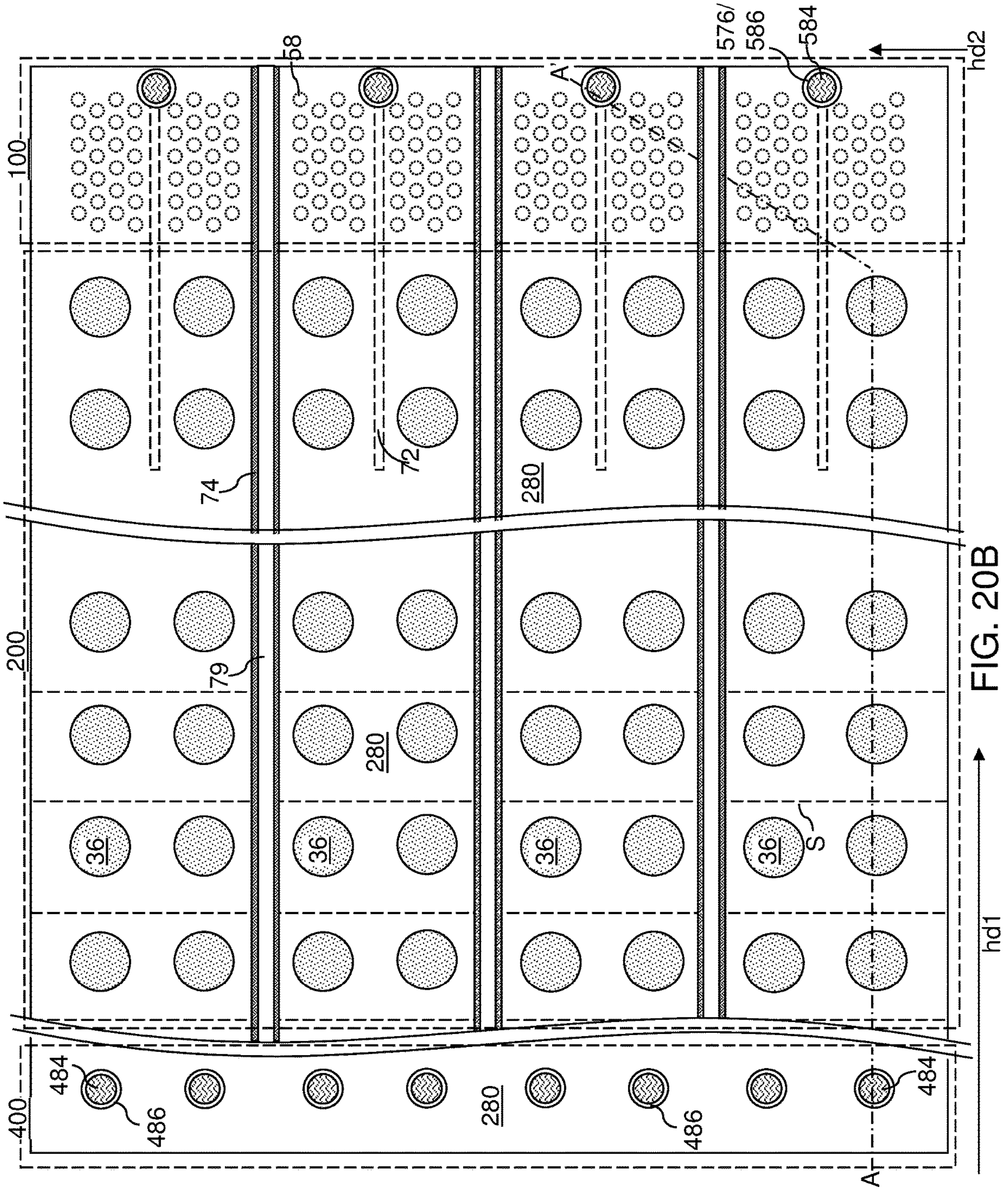
FIG. 20B is a top-down view of the first exemplary structure of FIG. 20A. The hinged vertical plane A-A' corresponds to the plane of the vertical cross-sectional view of FIG. 20A.
Figure 21A:
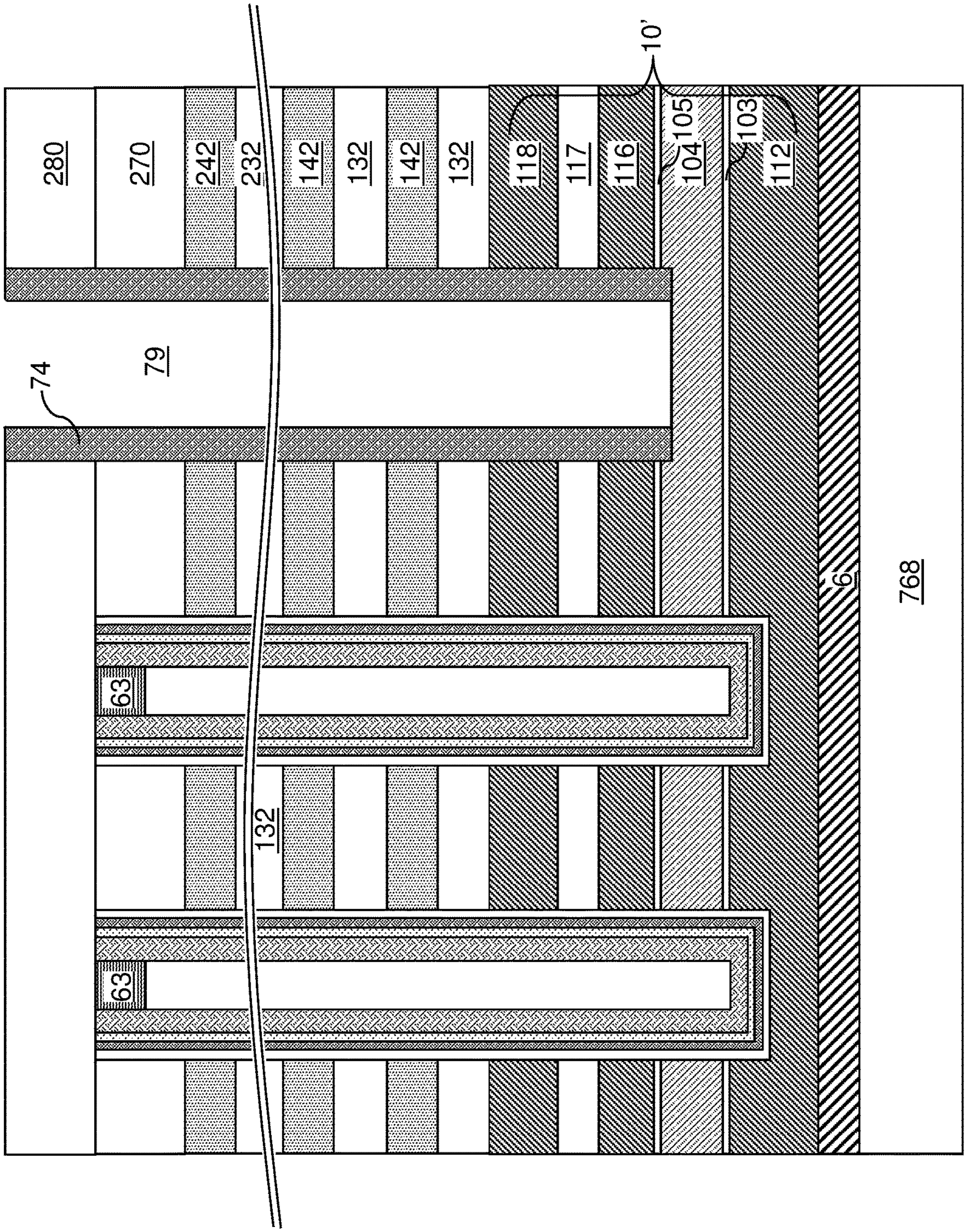
FIGS. 21A-21E are sequential vertical cross-sectional views of a region of the first exemplary structure during formation of source-level material layers by replacement of various material portions within the in-process source-level material layers of FIG. 1B with a middle buried semiconductor layer according to an embodiment of the present disclosure.

Referring to FIGS. 20A, 20B, and 21A, backside trenches 79 are subsequently formed through the first contact level dielectric layer 280 and the memory-level assembly. For example, a photoresist layer can be applied and lithographically patterned over the first contact level dielectric layer 280 to form elongated openings that extend along the first horizontal direction (e.g., word line direction) hd1. An anisotropic etch is performed to transfer the pattern in the patterned photoresist layer through a predominant portion of the memory-level assembly to the in-process source-level material layers 10'. For example, the backside trenches 79 can extend through the optional source selective level conductive layer 118, the source-level insulating layer 117, the upper source layer 116, and the upper sacrificial liner 105 and into the source-level sacrificial layer 104. The optional source selective level conductive layer 118 and the source-level sacrificial layer 104 can be employed as etch stop layers for the anisotropic etch process that forms the backside trenches 79. The photoresist layer can be subsequently removed, for example, by ashing.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region 100 (which may extend over a memory plane) and the staircase region 200. The backside trenches 79 can laterally divide the memory-level assembly into memory blocks.

Backside trench spacers 74 can be formed on sidewalls of the backside trenches 79 by conformal deposition of a dielectric spacer material and an anisotropic etch of the dielectric spacer material. The dielectric spacer material is a material that can be removed selective to the materials of first and second insulating layers (132, 232). For example, the dielectric spacer material can include silicon nitride. The lateral thickness of the backside trench spacers 74 can be in a range from 4 nm to 60 nm, such as from 8 nm to 30 nm, although lesser and greater thicknesses can also be employed.

Figure 21B:
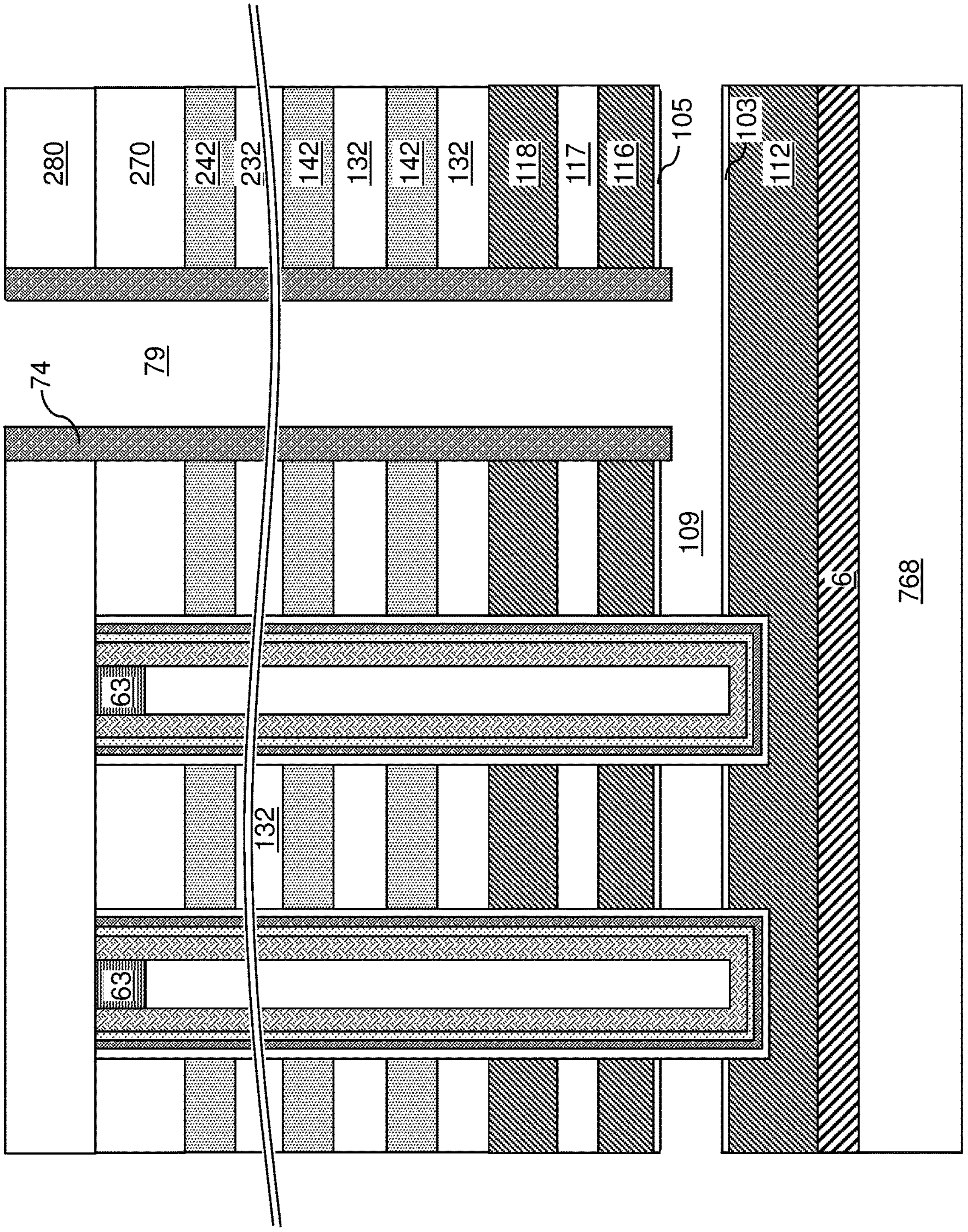

Referring to FIG. 21B, an etchant that etches the material of the source-level sacrificial layer 104 selective to the materials of the backside trench spacers 74, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 21C:
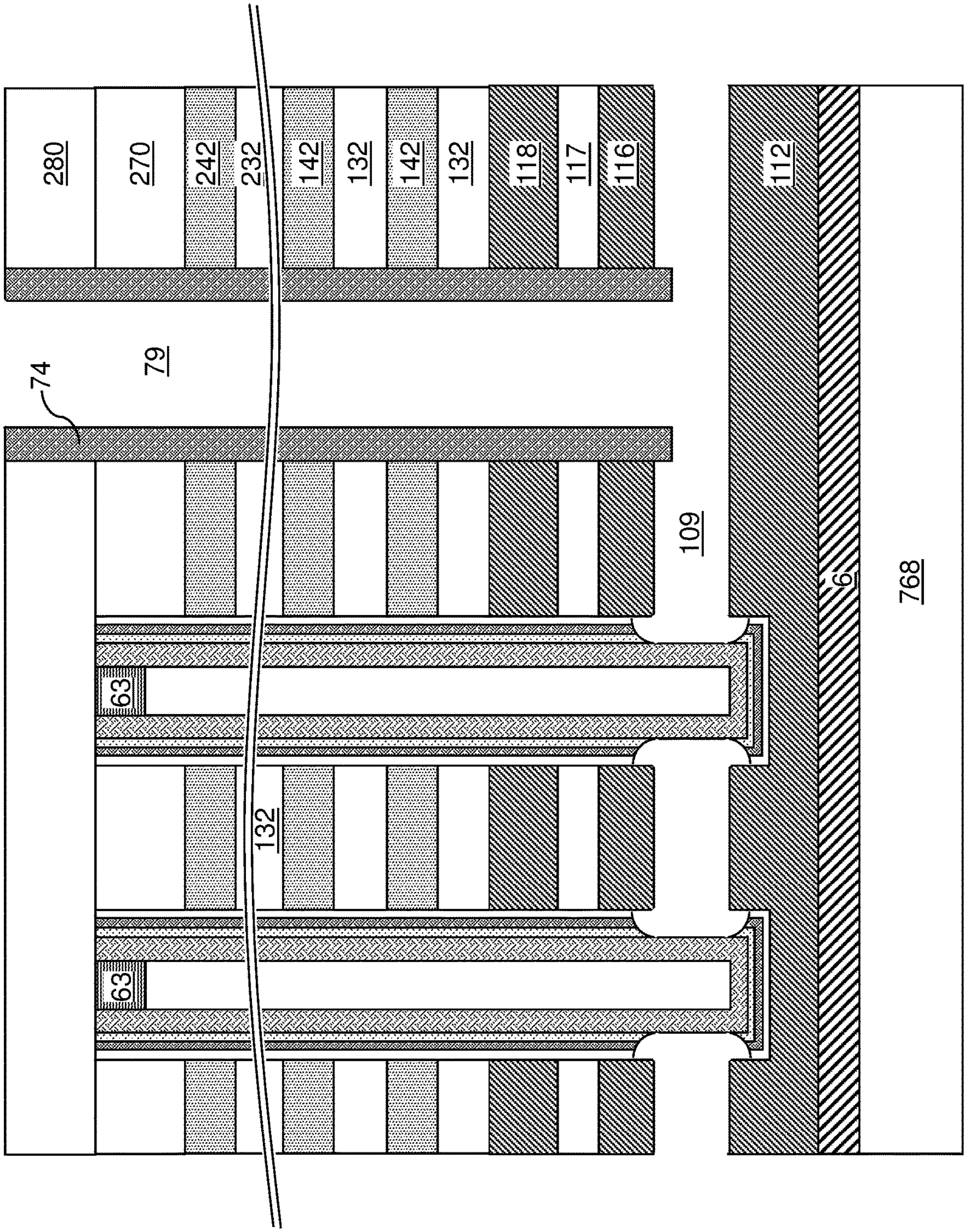

Referring to FIG. 21C, a sequence of isotropic etchants, such as wet etchants, can be applied through the backside trenches 79 and the source cavity 109 to the physically exposed portions of the memory films 50 in the source cavity 109 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 21D:
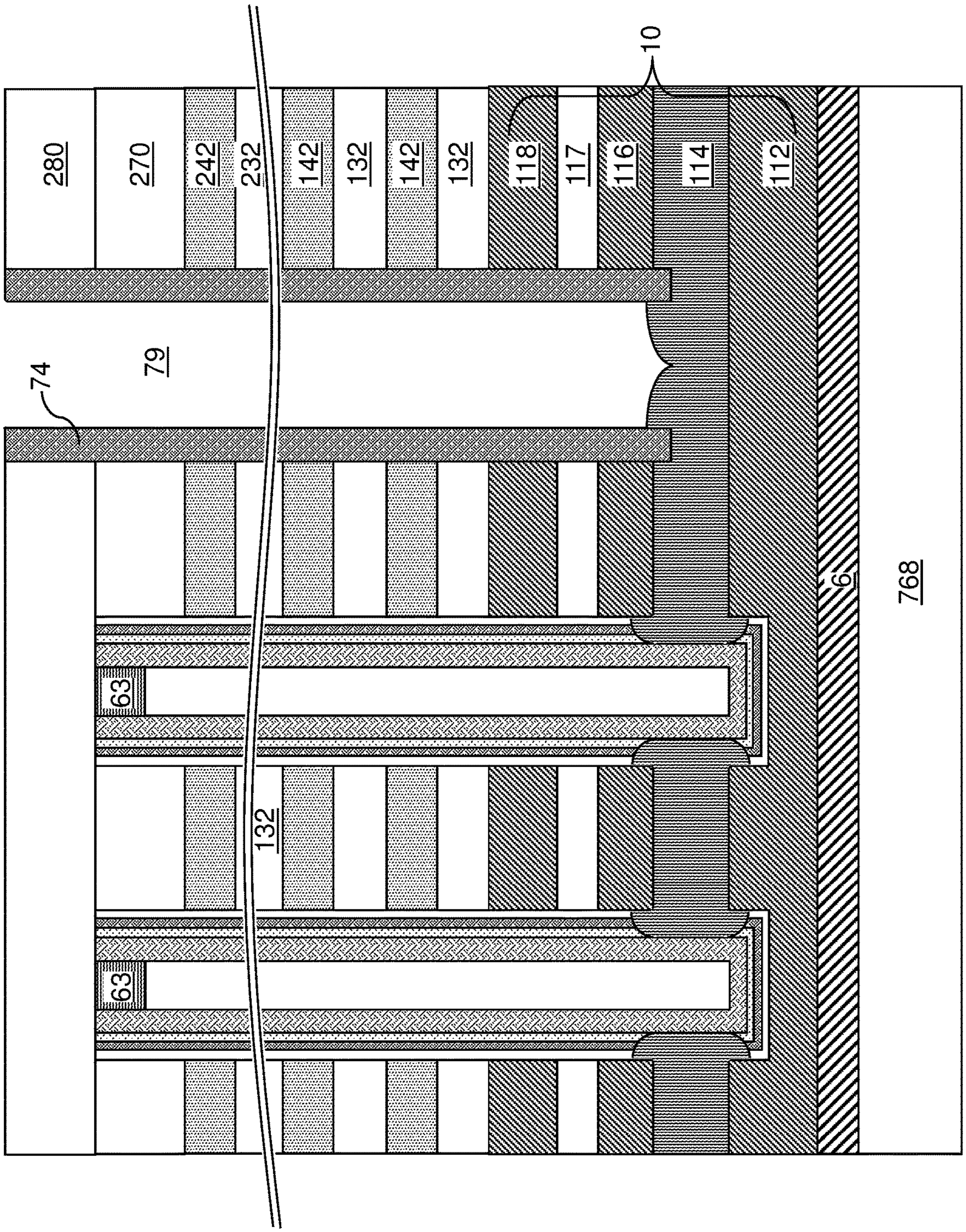

Referring to FIG. 21D, a doped semiconductor material having a doping of the second conductivity type can be deposited by a selective semiconductor deposition process. A semiconductor precursor gas, an etchant, and a dopant precursor gas can be flowed concurrently into a process chamber including the first exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine can be flowed. The deposited doped semiconductor material forms a source contact layer 114, which can contact sidewalls of the vertical semiconductor channels 60. The duration of the selective semiconductor deposition process can be selected such that the source cavity is filled with the source contact layer 114, and the source contact layer 114 contacts the exposed portions of the semiconductor channel 60 and bottom end portions of inner sidewalls of the backside trench spacers 74. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0\times10^{19}/cm^3$ to $2.0\times10^{21}/cm^3$, although lesser and greater dopant concentrations can also be employed. The set of layers including the buried source layer (112, 114, 116), the source-level insulating layer 117, and the optional source selective level conductive layer 118 constitutes source level layers 10, which replaced the in-process source level layers 10'.

Figure 21E:
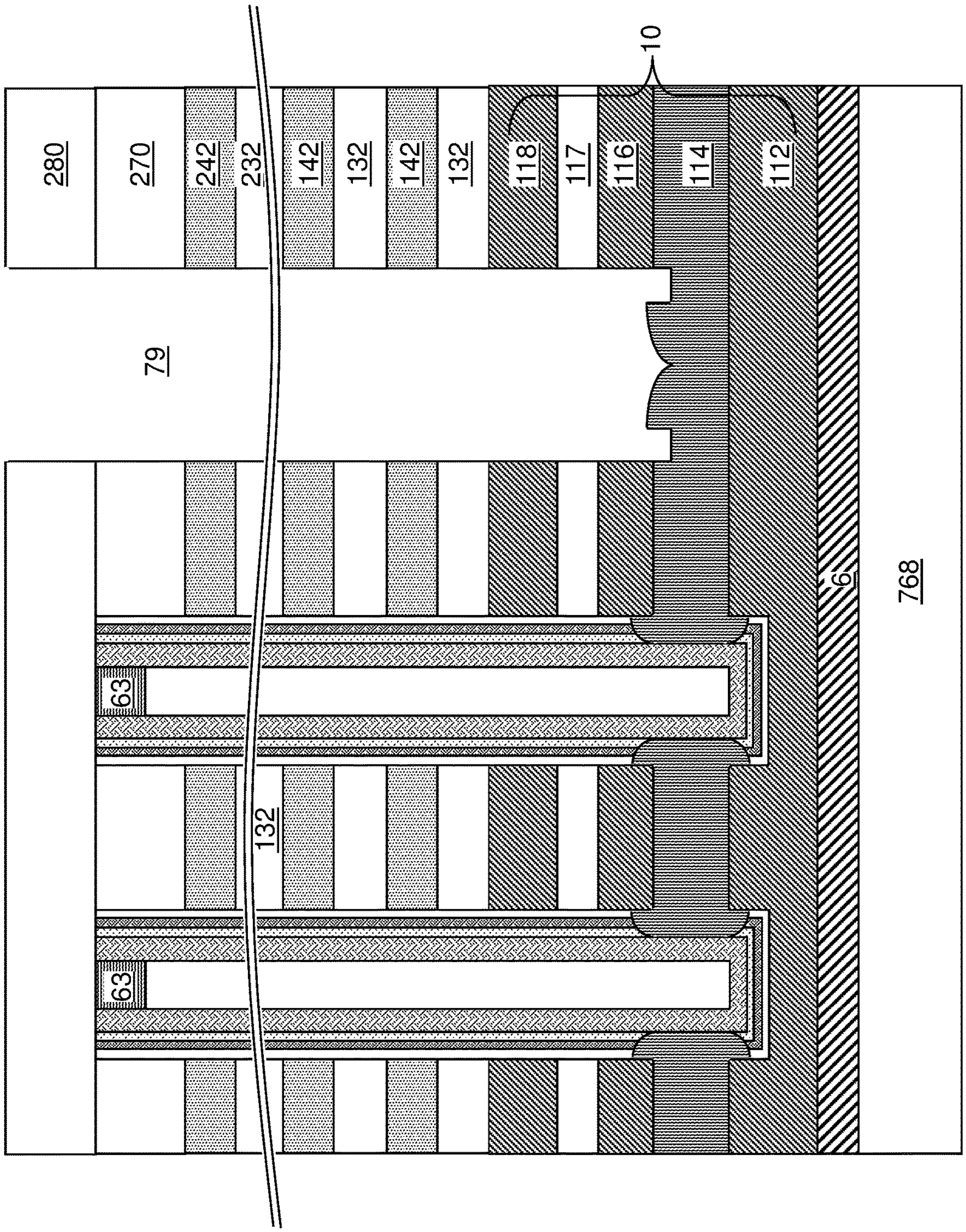
Figure 22:
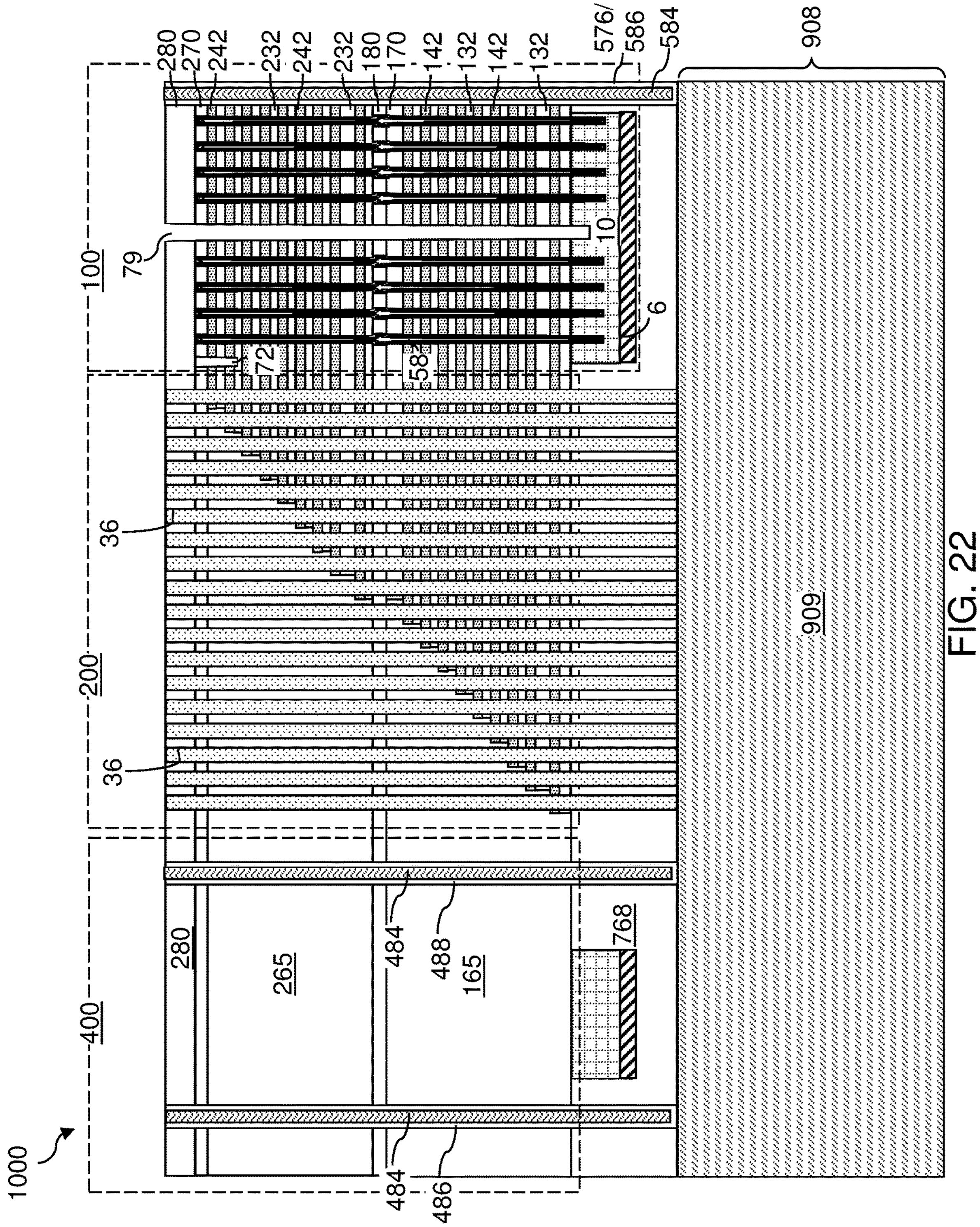
FIG. 22 is a vertical cross-sectional view of the first exemplary structure at the processing steps of FIG. 21E.

Referring to FIGS. 21E and 22, an isotropic etch process can be performed to remove the backside trench spacers 74. In an illustrative example, if the backside trench spacers 74 include silicon nitride, a wet etch employing hot phosphoric acid can be employed to remove the backside trench spacers selective to the materials of the source contact layer 114, the insulating layers (132, 232), the first and second insulating cap layer (170, 270), and the first contact level dielectric layer 280.

Figure 23:
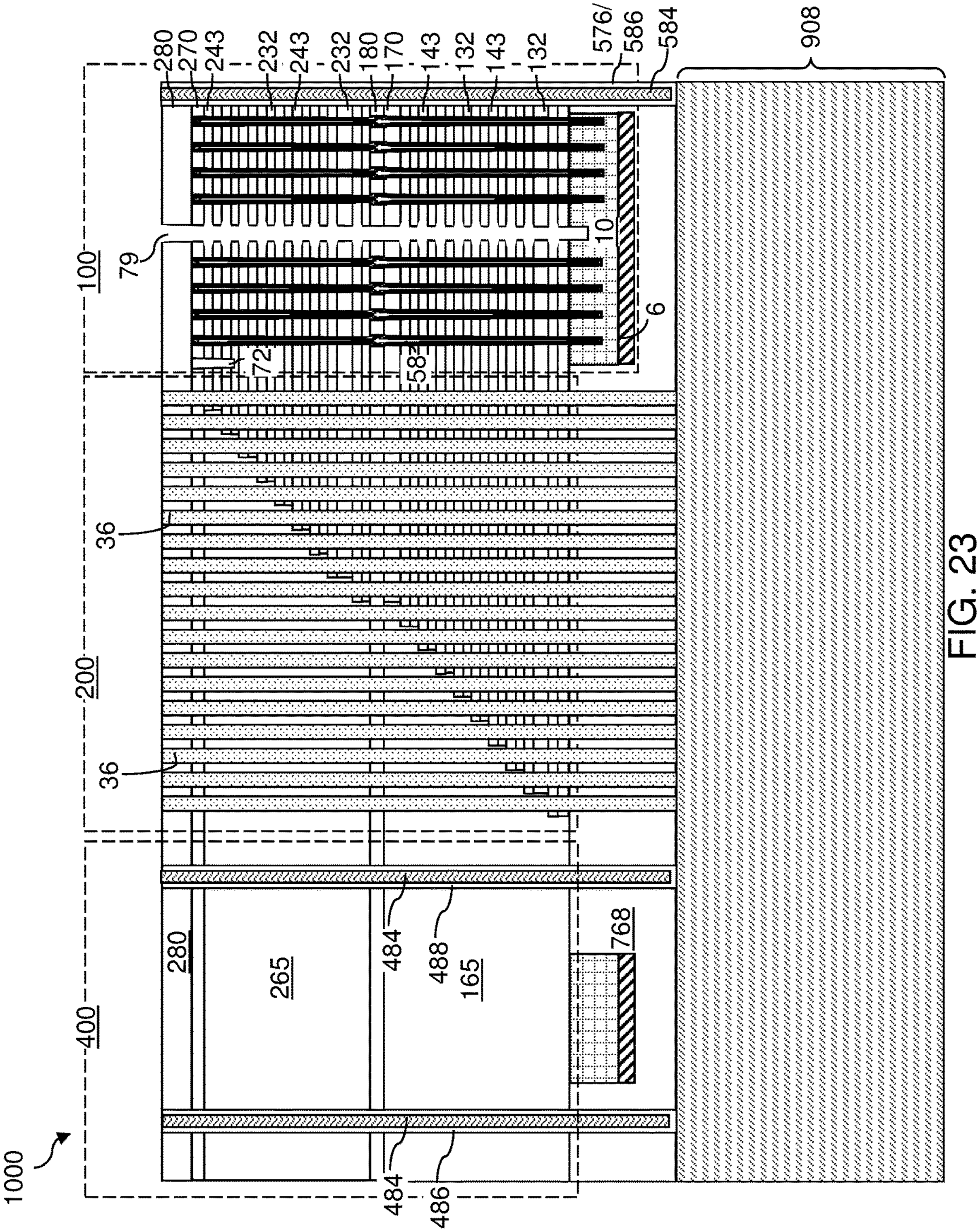
FIG. 23 is a vertical cross-sectional view of the first exemplary structure after formation of backside recesses according to an embodiment of the present disclosure.

Referring to FIG. 23, an etchant that selectively etches the materials of the first and second sacrificial material layers (142, 242) with respect to the materials of the first and second insulating layers (132, 232), the first and second insulating cap layers (170, 270), the material of the conformal insulating liners (84, 486, 586), the material of the outermost layer of the memory films 50, and materials of the sacrificial via fill material portions (16, 484, 584) can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the material of the conformal insulating liners (84, 486, 586), and the material of the outermost layer of the memory films 50 can include silicon oxide materials, and the materials of the sacrificial via fill material portions (16, 484, 584) can include doped polysilicon, a doped silicon-containing alloy material, or a doped silicate glass or an organ silicate glass having a greater etch rate than the silicon oxide materials of the first and second insulating layers (132, 232), the first and second insulating cap layers (170, 270), the material of the conformal insulating liners (84, 486, 586). First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 908. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 24:
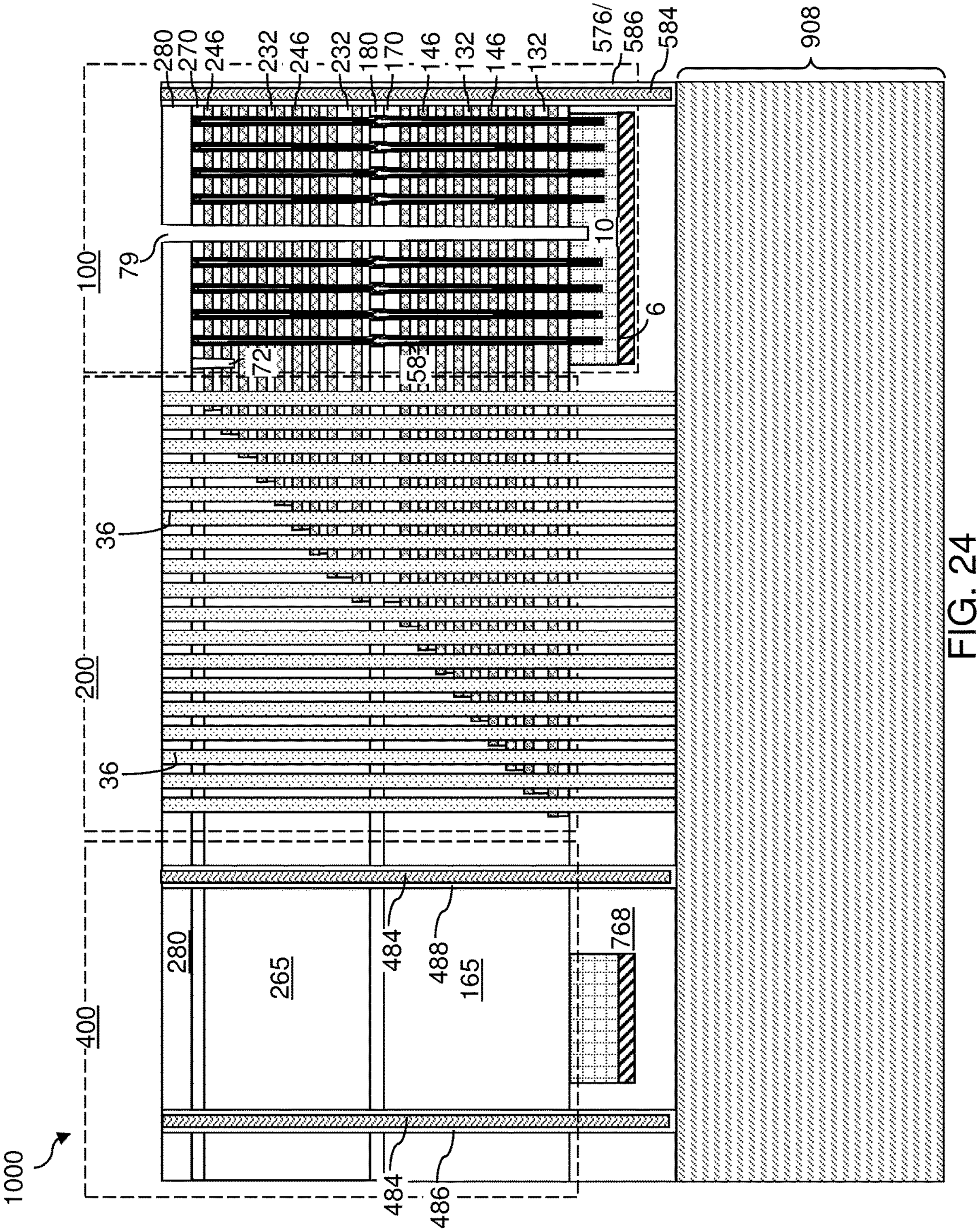
FIG. 24 is a vertical cross-sectional view of the first exemplary structure after formation of electrically conductive layers in the backside recesses according to an embodiment of the present disclosure.
Figure 25A:
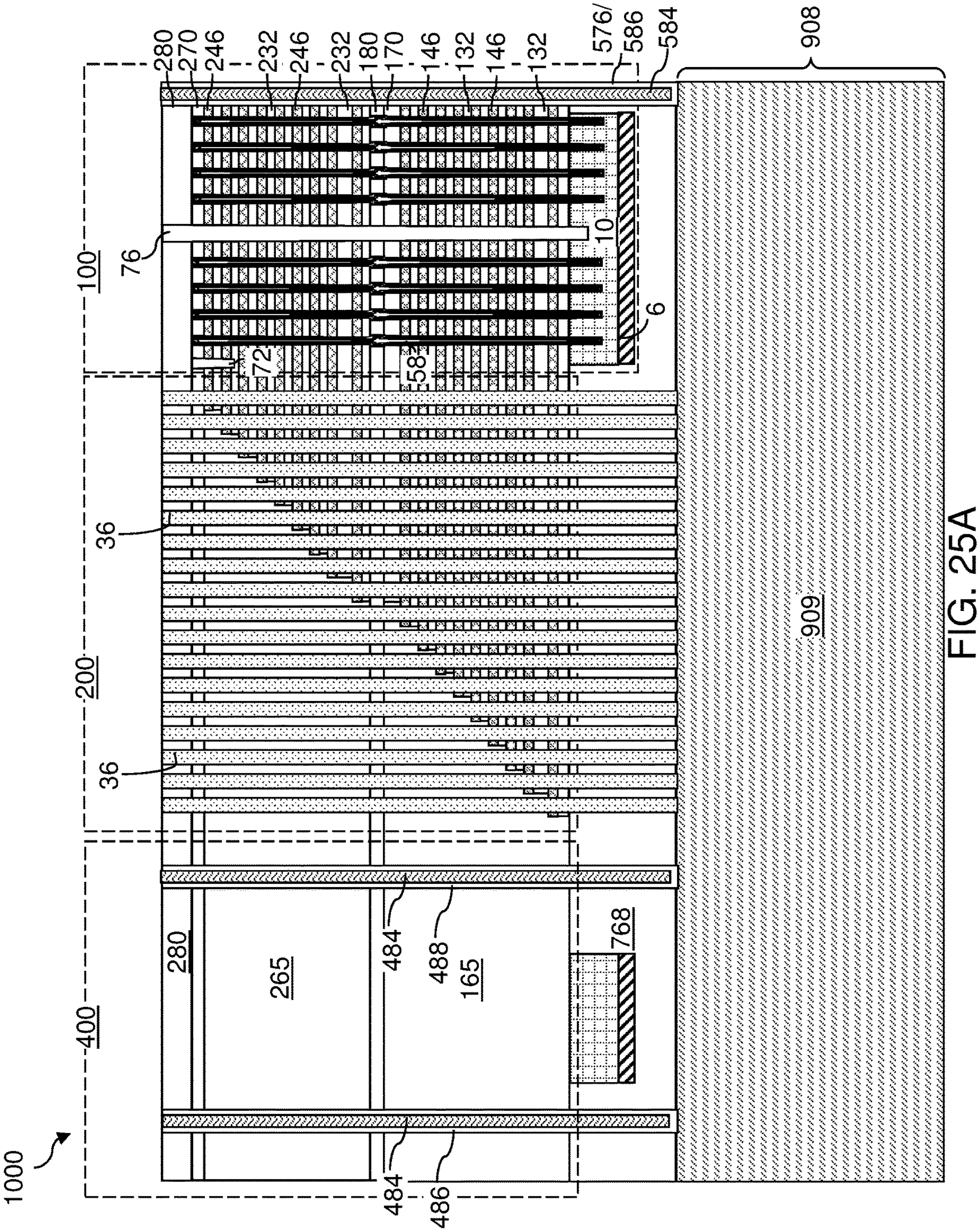
FIG. 25A is a vertical cross-sectional view of the first exemplary structure after formation of dielectric wall structures in the backside trenches according to an embodiment of the present disclosure.
Figure 25B:
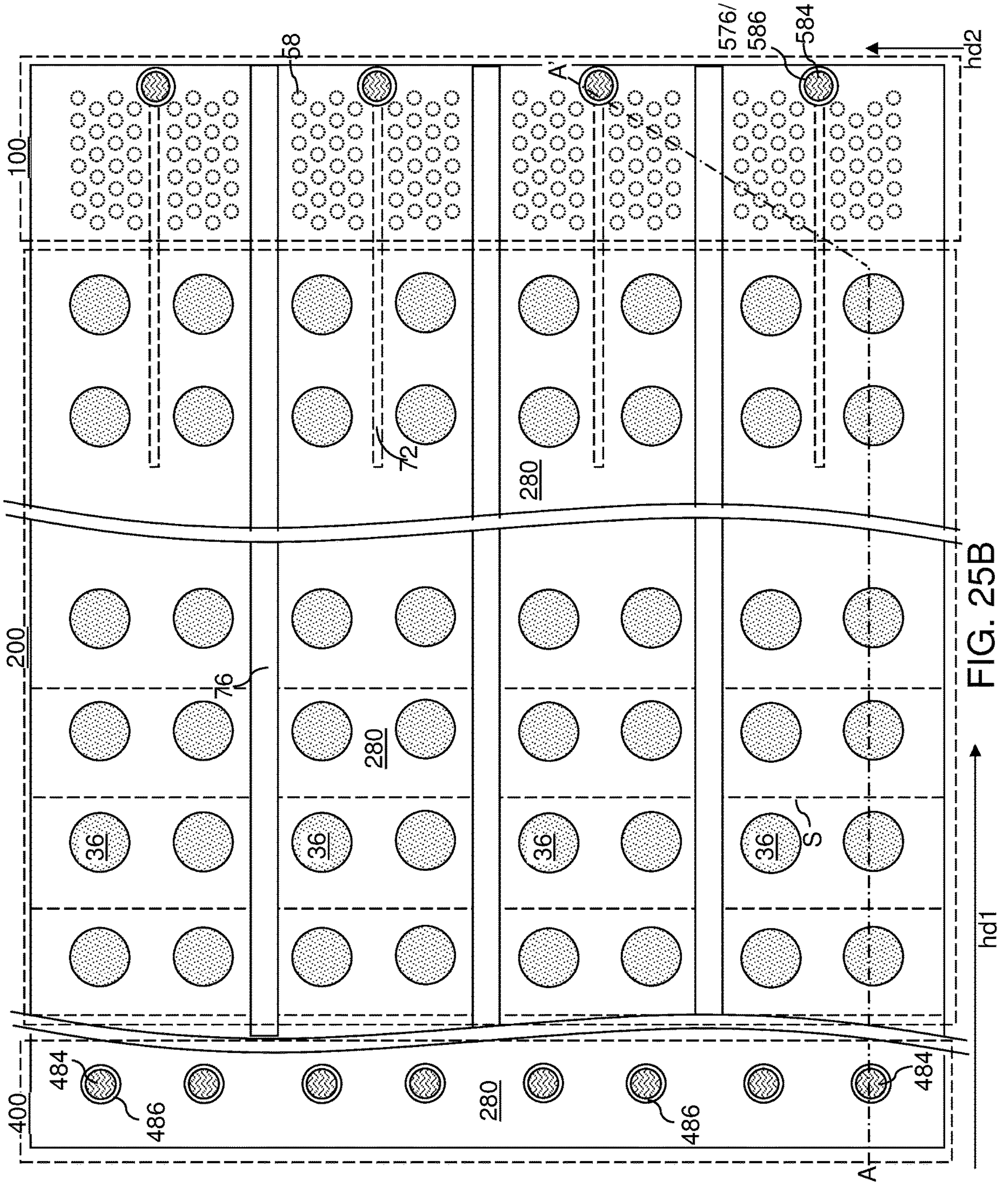
FIG. 25B is a top-down view of the first exemplary structure of FIG. 25A. The hinged vertical plane A-A' corresponds to the plane of the vertical cross-sectional view of FIG. 25A.
Figure 25C:
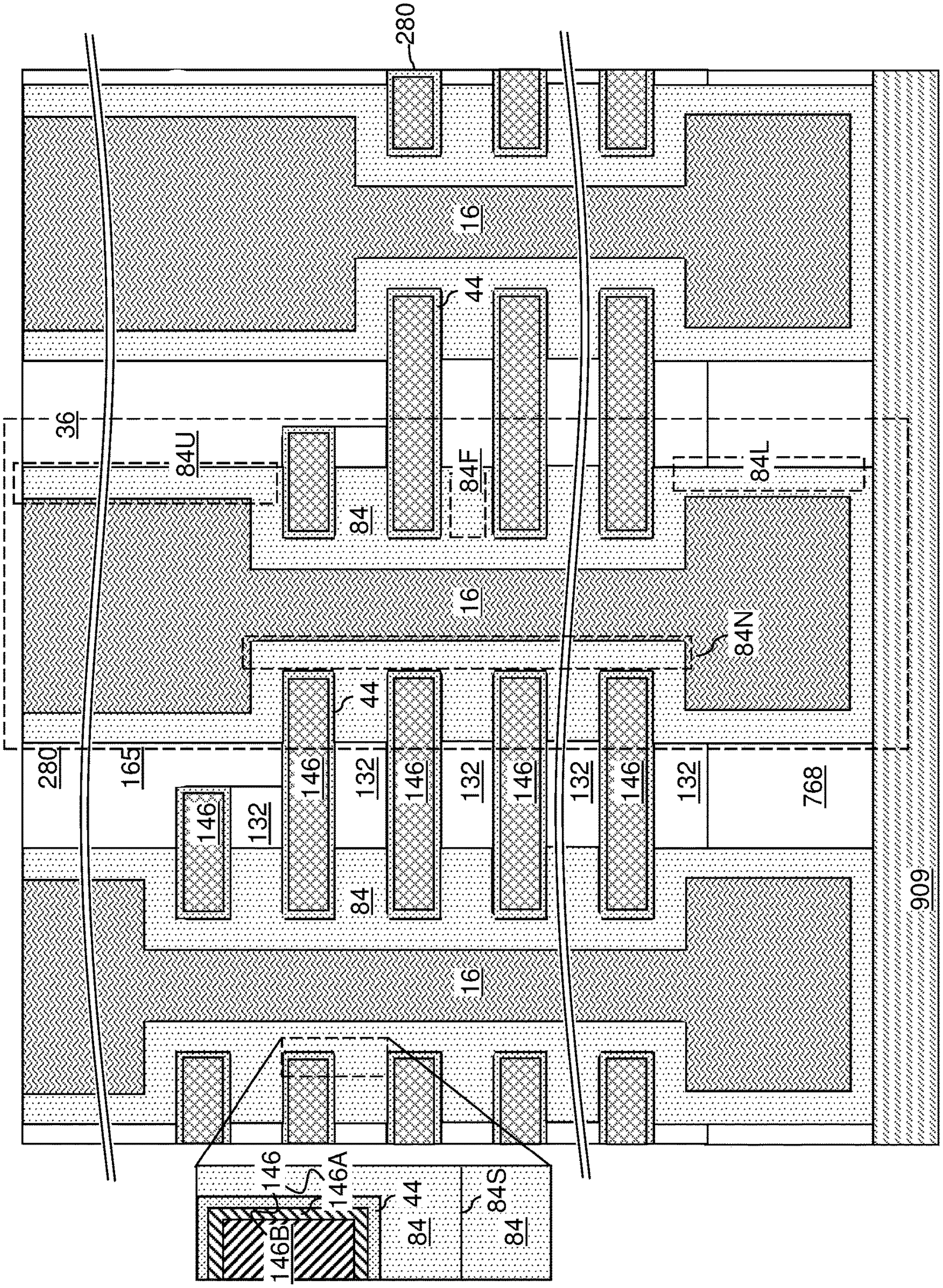
FIGS. 25C, 25D, and 25E are magnified vertical cross-sectional views of a staircase region via cavity, a peripheral region via cavity, and an array region via cavity, respectively, at the processing steps of FIGS. 25A and 25B.
Figure 25E:
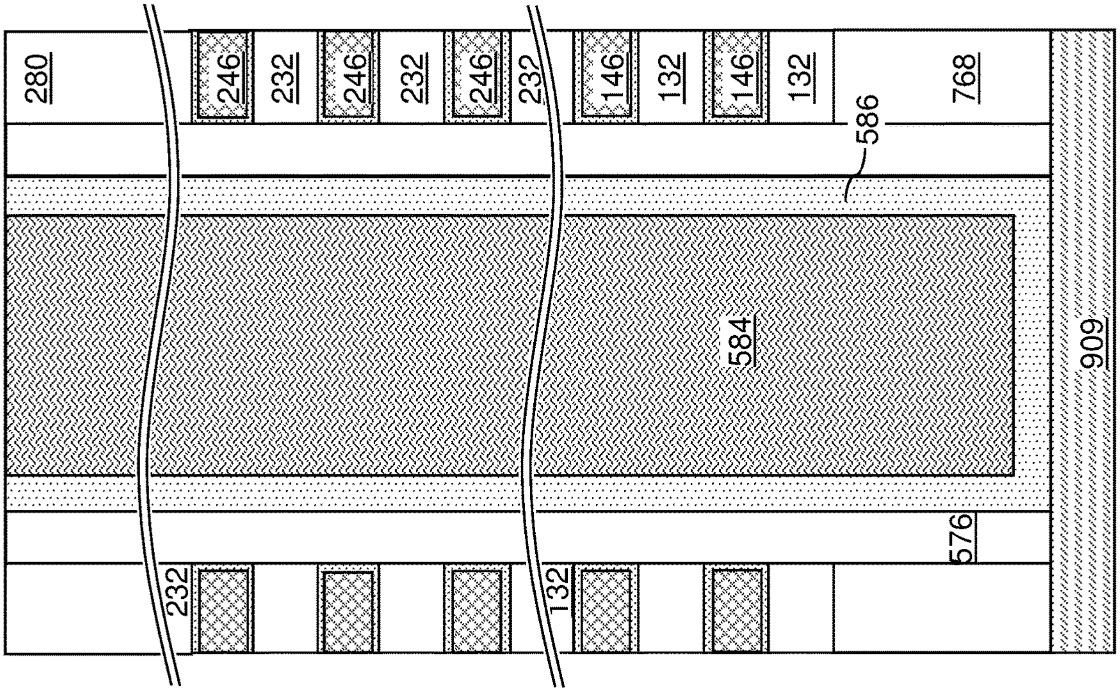
Figure 25D:
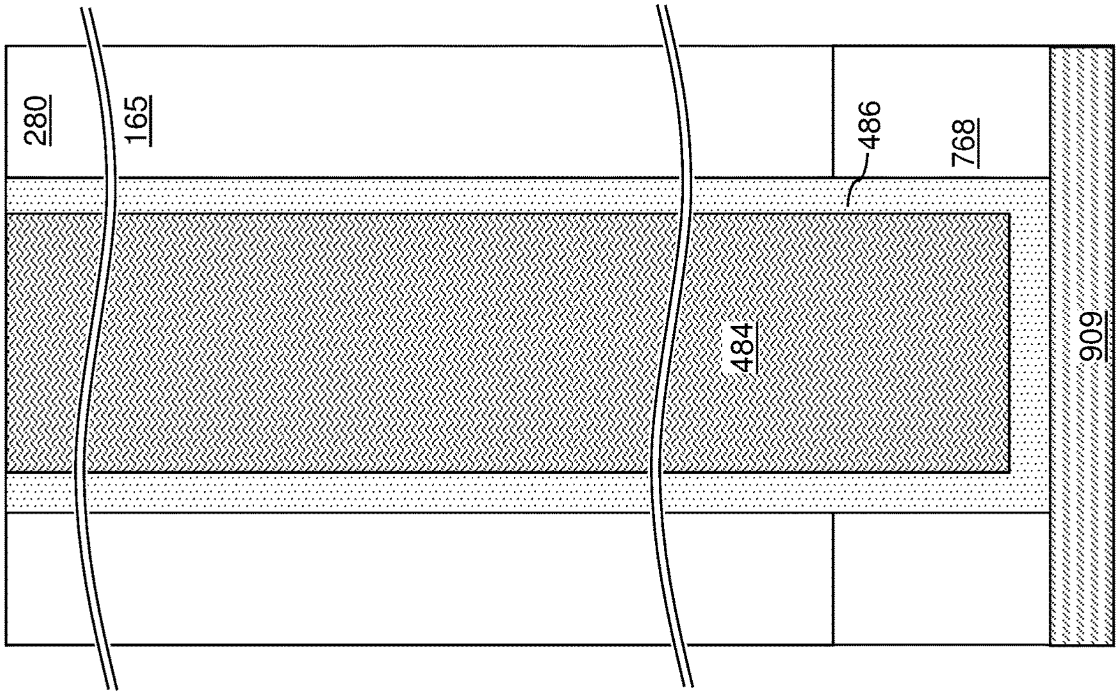

Referring to FIG. 24, a backside blocking dielectric layer (not shown) can be optionally deposited in the backside recesses and the backside trenches 79 and over the first contact level dielectric layer 280. The backside blocking dielectric layer can be deposited on the physically exposed portions of the outer surfaces of the memory stack structures 55, which are portions of the memory opening fill structures 58. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (243, 243), on the sidewalls of the backside trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses 243, a plurality of second electrically conductive layers 246 can be formed in the plurality of second backside recesses 243, and a continuous metallic material layer (not shown) can be formed on the sidewalls of each backside trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The memory-level assembly is located over the substrate material layer 909. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Referring to FIGS. 25A-25E, an insulating material can be deposited in the backside trenches 79 by a conformal deposition process. Excess portions of the insulating material deposited over the top surface of the first contact level dielectric layer 280 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2. Backside blocking dielectric layers 44 are explicitly illustrated in FIGS. 25C-25E.

Figure 26:
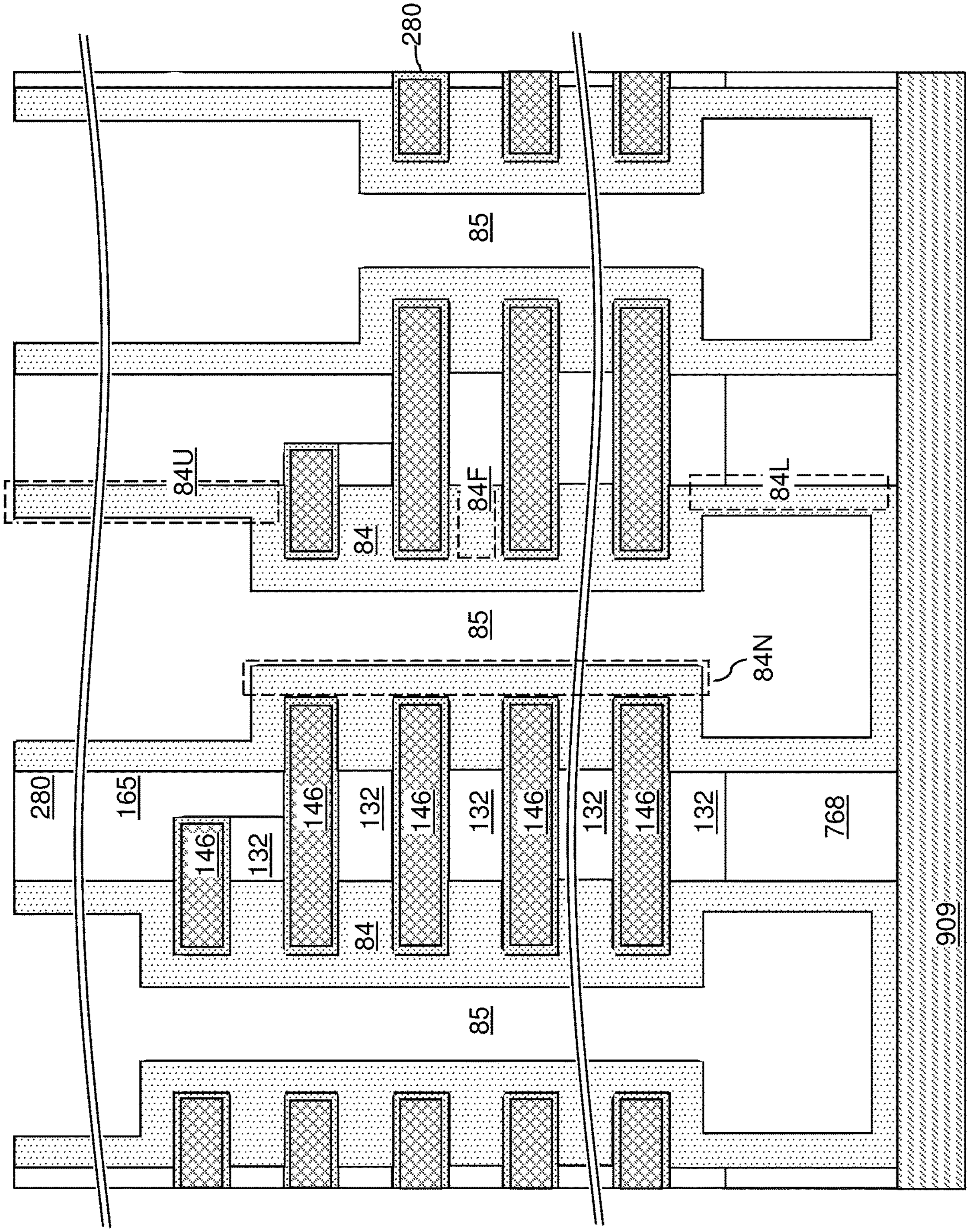
FIG. 26 is a magnified vertical cross-sectional view of a staircase region via cavity after removal of sacrificial via fill material portions according to an embodiment of the present disclosure.

Referring to FIG. 26, the sacrificial materials of the sacrificial via fill material portions (16, 484, 584) can be removed selective to the material of the conformal insulating liners (84, 486, 586) and the first contact level dielectric layer 280. For example, if the sacrificial via fill material portions (16, 484, 584) include a doped semiconductor material, such as doped amorphous silicon or polysilicon, then a wet etch employing a KOH or TMY solution can be employed to remove the sacrificial via fill material portions (16, 484, 584). If the sacrificial via fill material portions (16, 484, 584) include organ silicate glass or a doped silicate glass such as borosilicate glass, the sacrificial via fill material portions (16, 484, 584) can be removed by a wet etch process employing a dilute hydrofluoric acid. Each staircase via cavity can include a staircase region conformal dielectric via liner 84 and a column-shaped void 85 including a shaft-shaped void region extending through a subset of layers of the alternating stacks (132, 246, 232, 246), a capital-shaped void region overlying the shaft-shaped void region, and a base-shaped void region underlying the shaft-shaped void region.

As used herein, a "column-shaped" element refers to an element that has a general shape of a Doric column, i.e., an element that has a shaft portion that extends with a straight sidewall or a tapered sidewall, a capital portion having a greater lateral dimension than the shaft portion and overlying the shaft portion, and a base portion having a greater lateral dimension than the shaft portion and underlying the shaft portion. Each staircase region conformal dielectric via liner 84 can include neck portion 84N that surrounds the shaft portion and vertically extends through a respective subset of the layers in the alternating stacks (132, 142, 232, 242), an upper cylindrical portion 84U that surrounds the capital portion and extends through the first contact level dielectric layer 280 and the second retro-stepped dielectric material portion 265 and optionally through the first retro-stepped dielectric material portion 165, a lower cylindrical portion 84L that surrounds the base portion and extends through the bottommost first insulating layer 132 and the dielectric buffer layer 768, and a bottom portion that contacts a top surface of the substrate material layer 909.

Figure 27A:
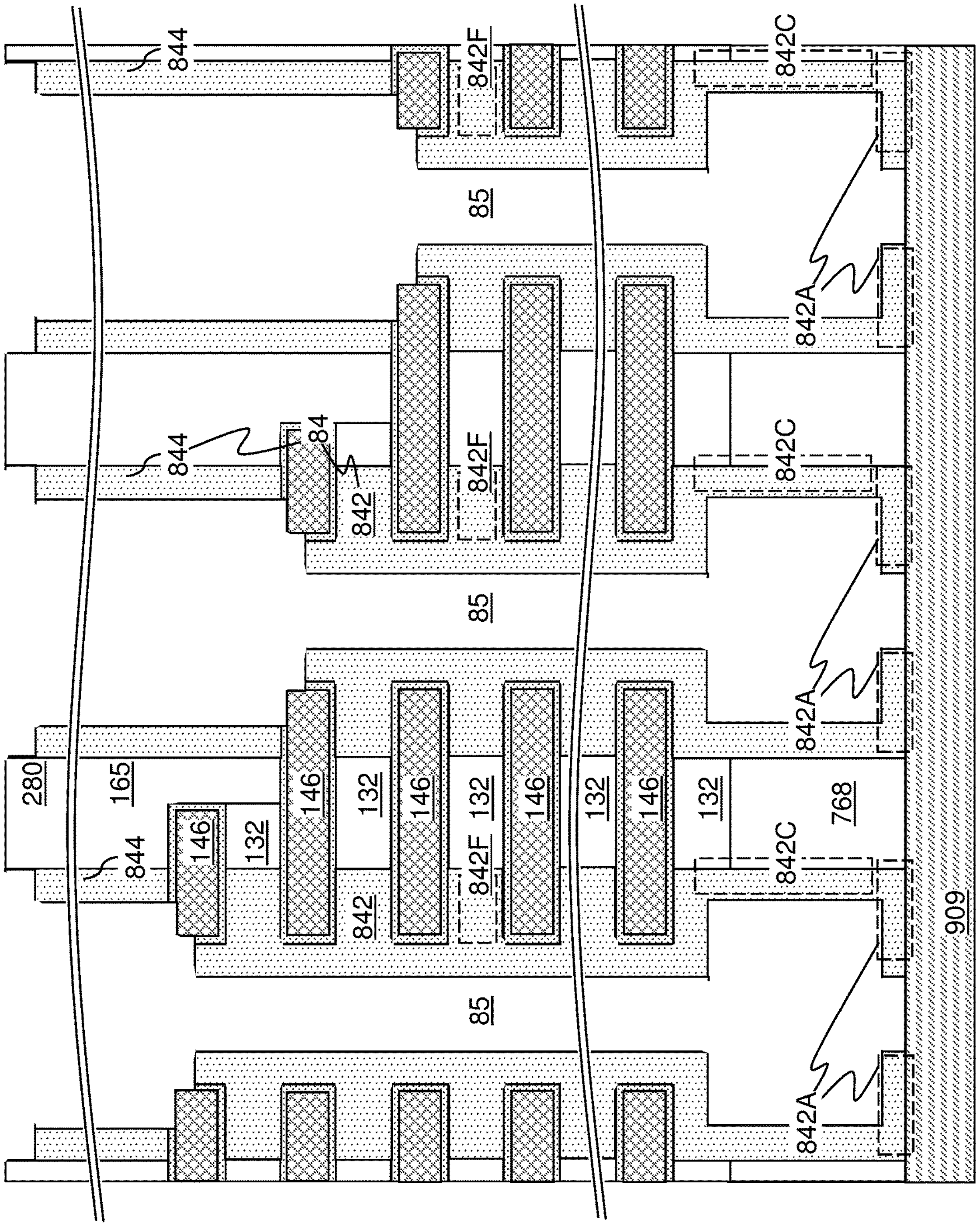
FIGS. 27A, 27B, and 27C are magnified vertical cross-sectional views of a staircase region via cavity, a peripheral region via cavity, and an array region via cavity, respectively, after an anisotropic etch process that physically exposes annular surfaces of the electrically conductive layers and surfaces of underlying lower-level metal interconnect structures according to an embodiment of the present disclosure.
Figure 27C:
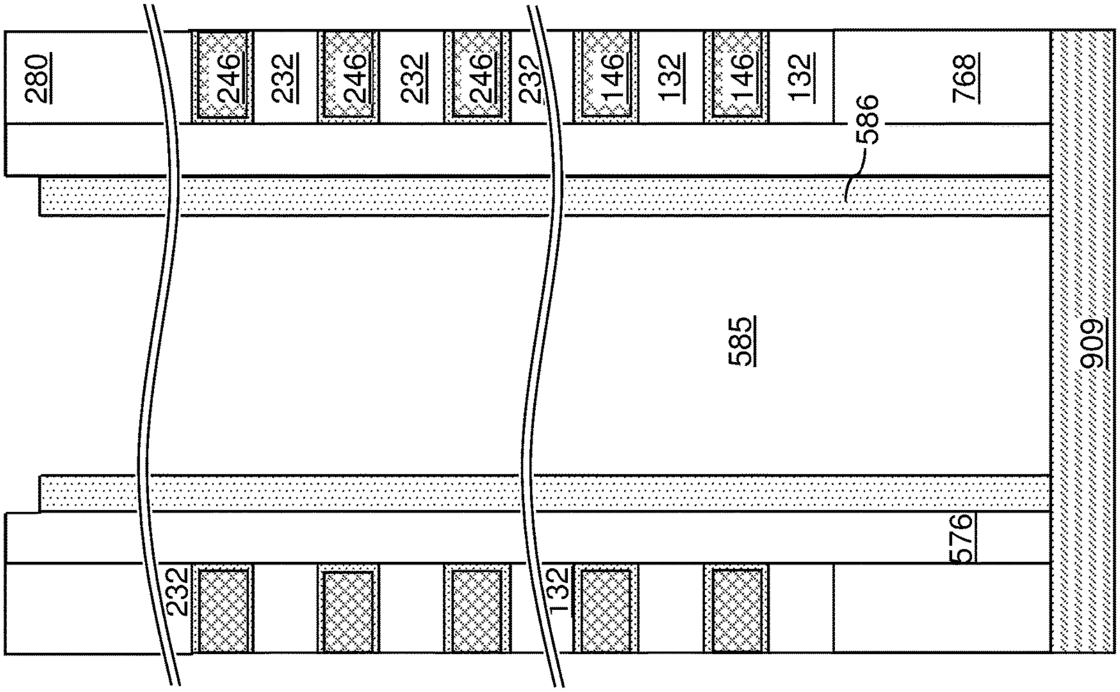
Figure 27B:
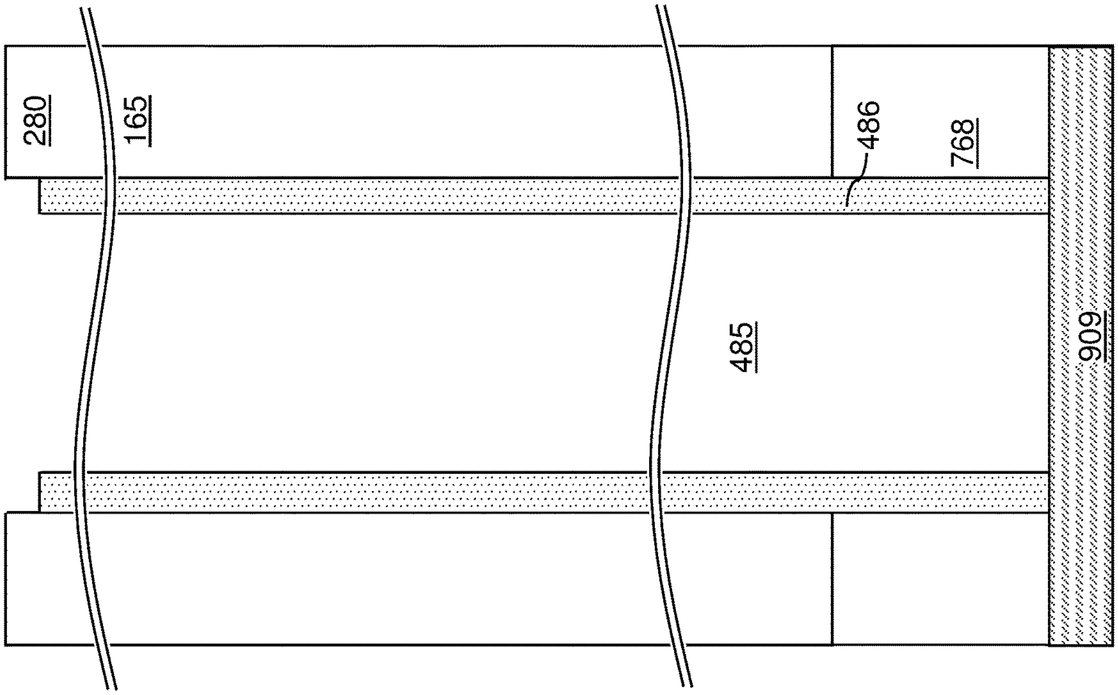
Figure 28A:
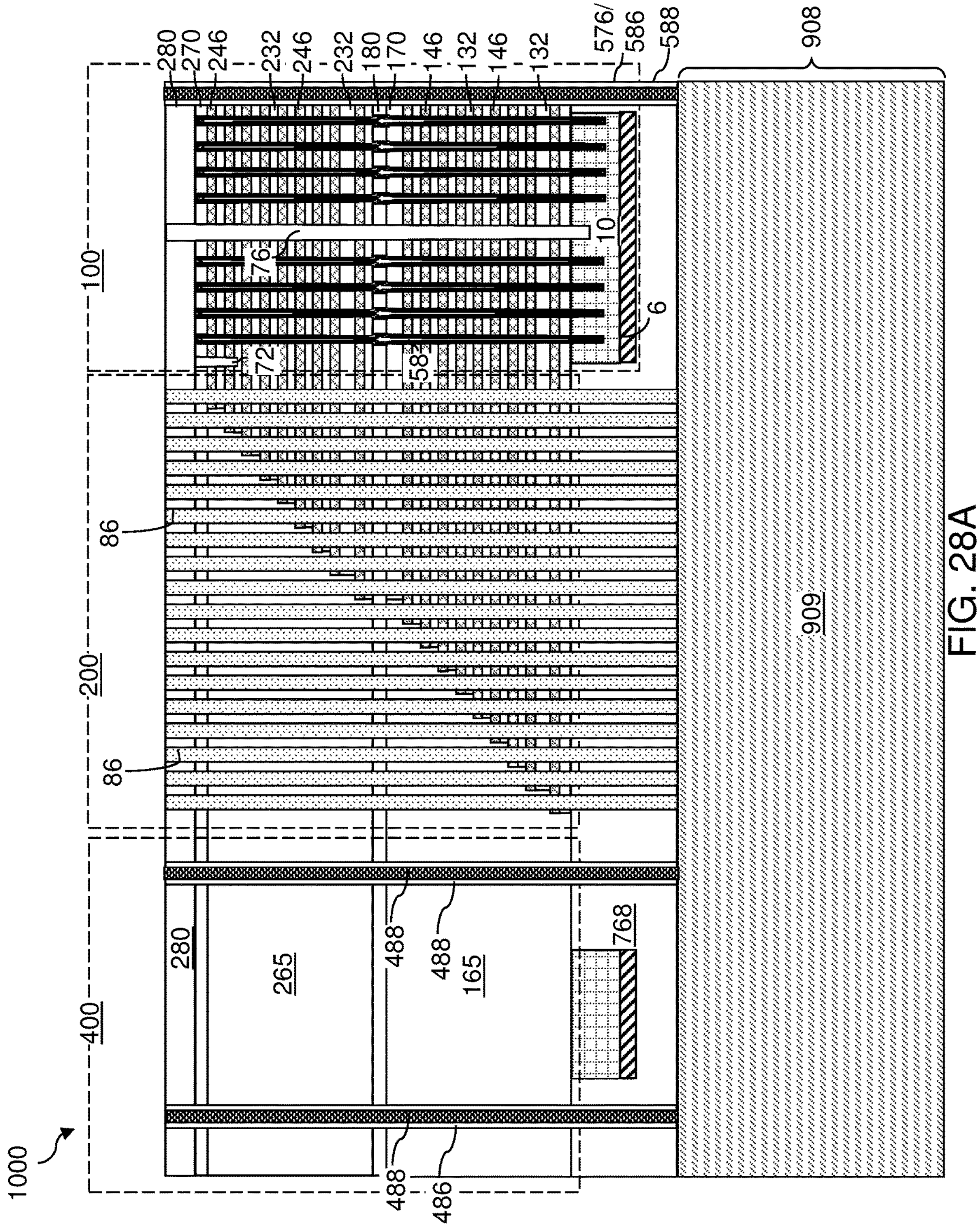
FIG. 28A is a vertical cross-sectional view of the first exemplary structure after formation of various contact via structures in the various via cavities according to an embodiment of the present disclosure.
Figure 28B:
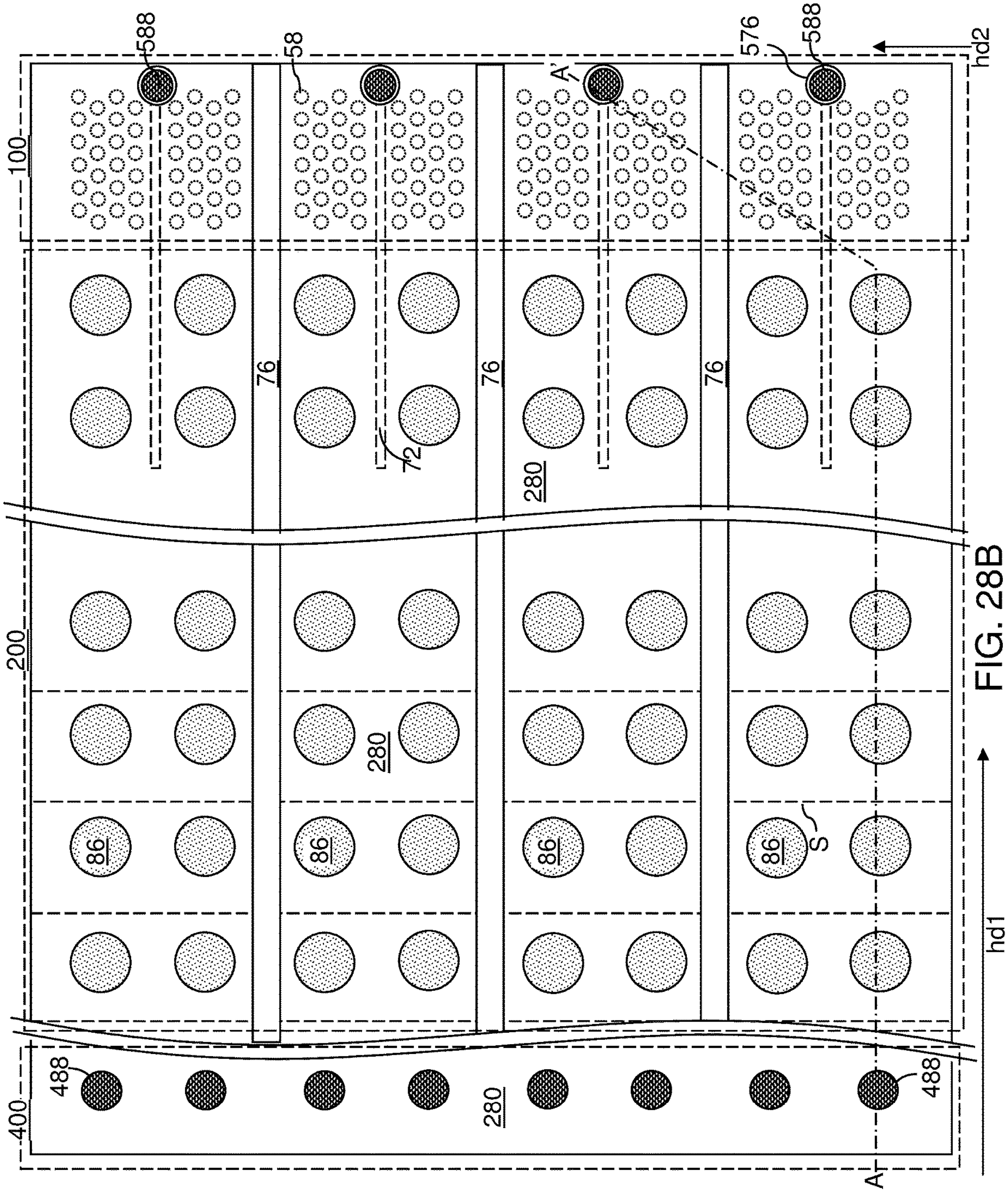
FIG. 28B is a top-down view of the first exemplary structure of FIG. 28A. The hinged vertical plane A-A' corresponds to the plane of the vertical cross-sectional view of FIG. 28A.
Figure 28C:
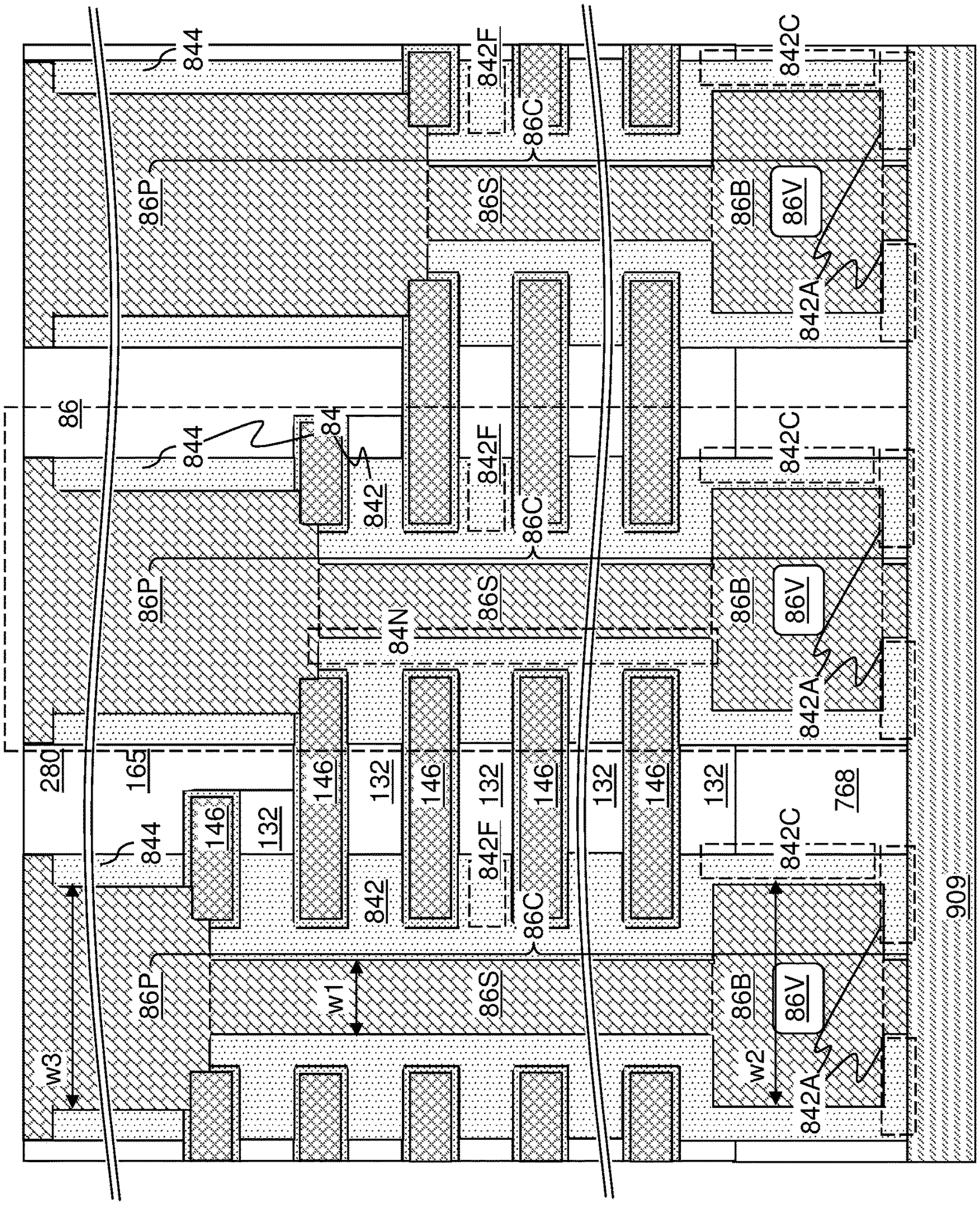
FIGS. 28C, 28D, and 28E are magnified vertical cross-sectional views of a staircase region via cavity, a peripheral region via cavity, and an array region via cavity, respectively, at the processing steps of FIGS. 28A and 28B.
Figure 28E:
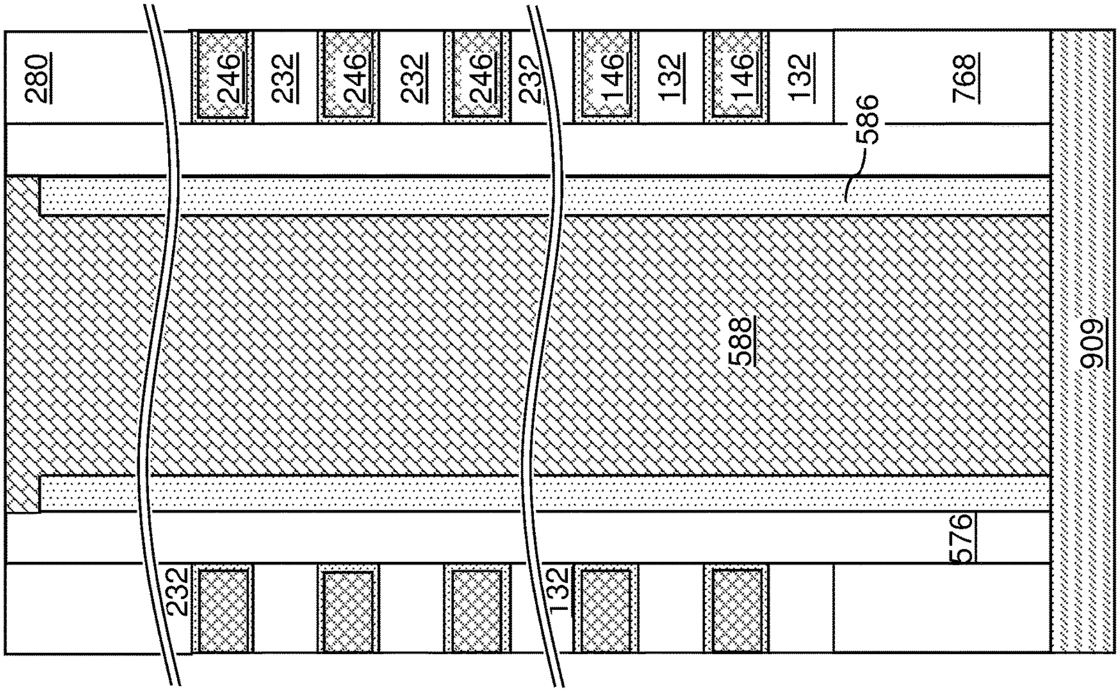
Figure 28D:
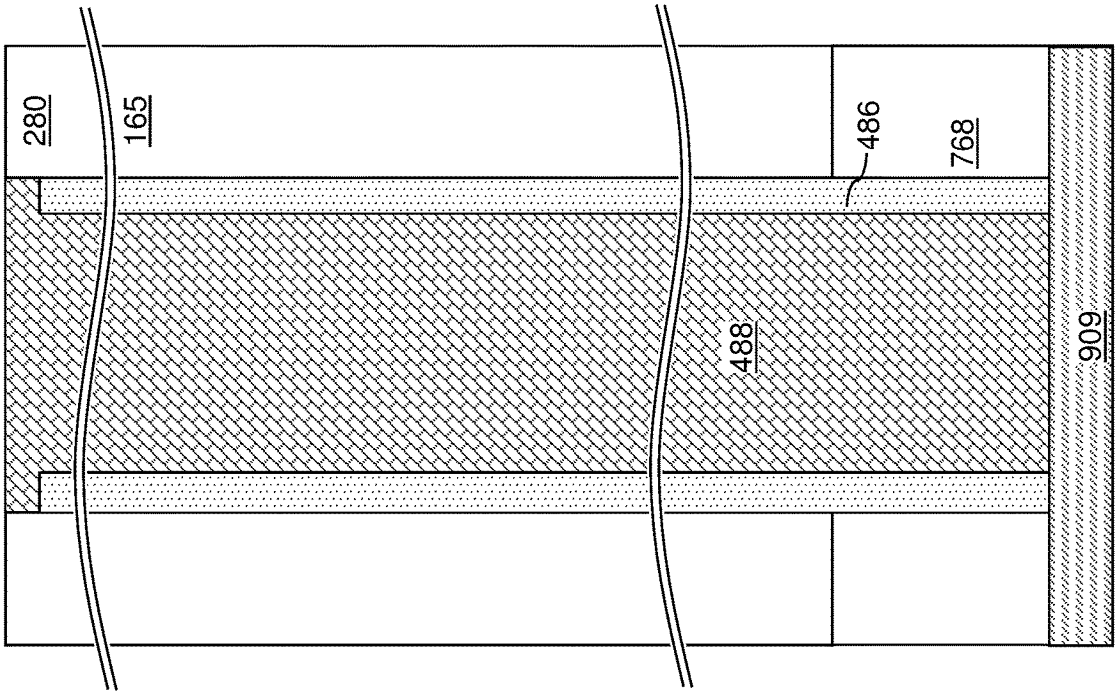
Figure 28F:
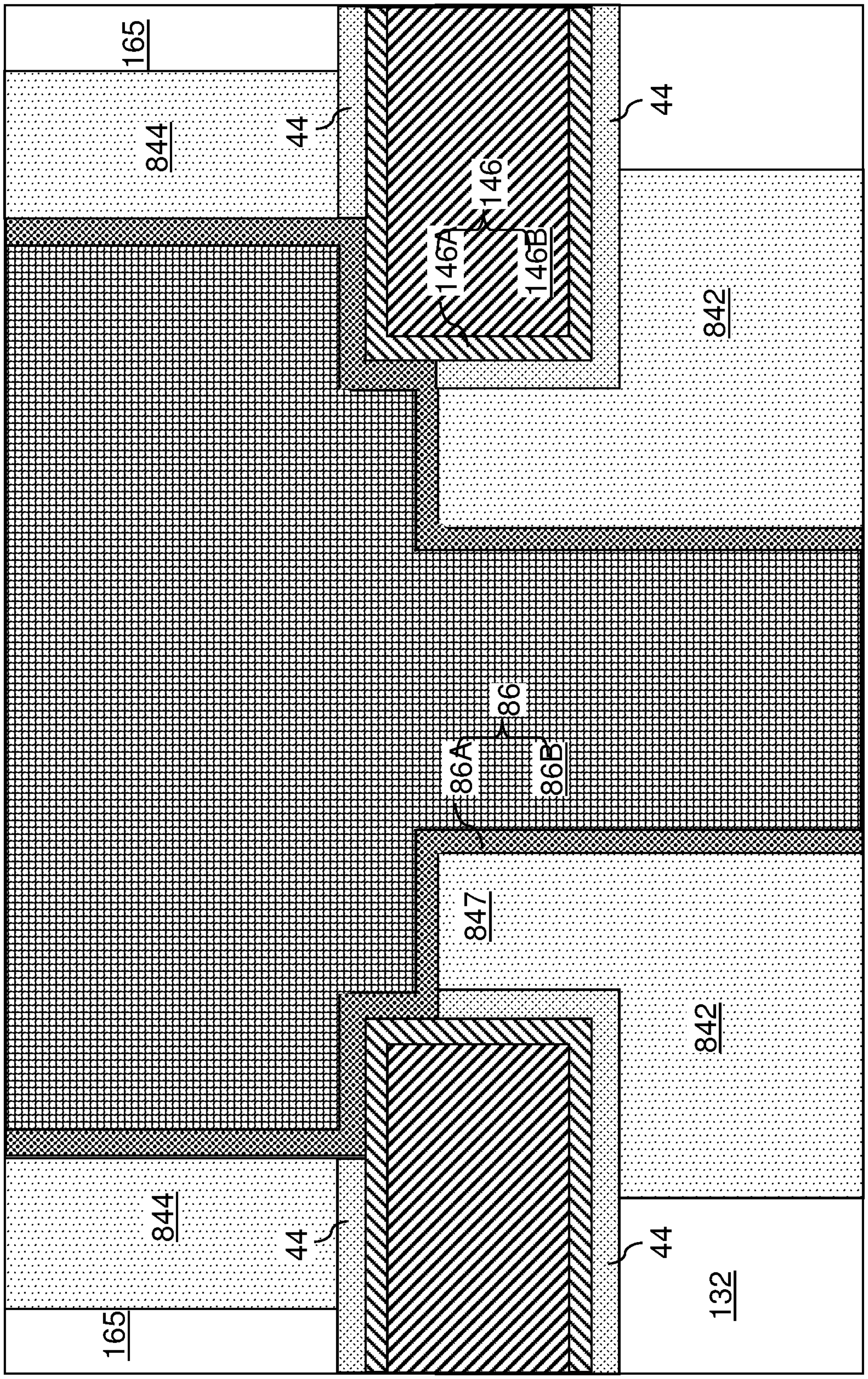
FIG. 28F is a magnified view of a region of a column-shaped conductive via structure that is formed in a staircase region via cavity.

Referring to FIGS. 27A, 27B, and 27C, an anisotropic etch process can be performed to remove horizontal portions of the staircase region conformal dielectric via liner 84 that are not masked by an overlying structure. The anisotropic etch process can include a terminal etch step that etches physically exposed portions of the backside blocking dielectric layers 44. Thus, an annular top surface of a respective topmost electrically conductive layer (146 or 246) and a cylindrical surface of the topmost electrically conductive layer (146 or 246) among the set of electrically conductive layers (146, 246) through which each respective column-shaped void 85 extends can be physically exposed within each staircase region via cavity. Further, an opening can be formed at the bottommost portion of each staircase region conformal dielectric via liner 84.

Each staircase region conformal dielectric via liner 84 can be divided into a ribbed insulating liner 842 and a cylindrical insulating liner 844. Each ribbed insulating liner 842 includes a neck portion 84N that continuously extends from a topmost electrically conductive layer (146 and/or 246) within a subset of the electrically conductive layers (146 and/or 246) to a bottommost electrically conductive layer (146 and/or 246) within the subset of the electrically conductive layers (146 and/or 246), laterally-protruding annular rib regions 842F having annular shapes, a cylindrical portion 842C having a cylindrical shape and underlying the alternating stack (132, 146, 232, 246), and an annular region 842A adjoining a bottom portion of the cylindrical portion 842C and having an annular shape. Outer sidewalls of the laterally-protruding annular rib regions 842F can be cylindrical. Each cylindrical insulating liner (e.g., spacer) 844 can be embedded within the second retro-stepped dielectric material portion 265, and may be embedded within the first retro-stepped dielectric material portion 165. A top surface of the substrate material layer 909 can be physically exposed by the anisotropic etch process underneath each column-shaped void 85.

The anisotropic etch removes horizontal portions of the peripheral region conformal insulating liners 486 and array region conformal insulating liners 586. A peripheral region cylindrical void 485 can be formed within each peripheral region via cavity, and an array region cylindrical void 585 can be formed within each array region via cavity. A top surface of the substrate material layer 909 can be physically exposed by the anisotropic etch process underneath the peripheral region cylindrical voids 485 and the array region cylindrical voids 585.

Referring to FIGS. 28A-28F, at least one conductive material can be deposited in the column-shaped voids 85, the peripheral region cylindrical voids 485, and the array region cylindrical voids 585. The at least one conductive material can include a metallic liner material that is conformally deposited to form a metallic liner 86A within each void, and a metal fill material that is conformally deposited to form a metal fill portion 86B. In one embodiment, the metallic liner 86A can include a conductive metal nitride such as Tin, and the metal fill portion 86B can include a metal such as tungsten, cobalt, molybdenum, or copper.

Each combination of a metallic liner 86A and a metal fill portion 86B filling a column-shaped void 85 constitutes a column-shaped conductive via structure 86C. Each column-shaped conductive via structure 86C can include a conductive shaft portion 86S extending through a set of electrically conductive layers (146, 246), a conductive capital portion 86P overlying the conductive shaft portion 86S and contacting a topmost electrically conductive layer (146 or 246) whose top surface is exposed in each column-shaped void 85, a conductive base portion 86B underlying the bottommost electrically conductive layer 146 within the set of electrically conductive layers (146, 246), and a downward-protruding portion 86R that protrudes downward from the conductive base portion 86B. An encapsulated void 86V may be present within each conductive base portion 86B due to the conformal nature of the deposition process employed to deposit the conductive material(s) of the column-shaped conductive via structures 86C. The conductive capital portion 86P and the conductive base portion 86B have greater lateral extents than the conductive shaft portion 86S within each column-shaped conductive via structure 86C. In one embodiment, each column-shaped conductive via structure 86C comprises a respective conductive shaft portion 86S having a first width w1; a respective conductive base portion 86B having a second width w2 that is greater than then the first width w1; and a respective conductive capital portion 86P having a third width w3 that is greater than the first width w1. The third width w3 may be the same as, greater than or less than the second width w2 depending on material compositions of the retro-stepped dielectric material portions (165, 265) and the dielectric buffer layer 768.

Each column-shaped conductive via structure 86C is formed directly on the top surface of the topmost electrically conductive layer (146 or 246) among the set of electrically conductive layers (146, 246) through which the respective column-shaped conductive via structure 86C extends. Each electrically conductive layer (146, 246) within the subset of the electrically conductive layers (146, 246) other than the topmost electrically conductive layer (146 or 246) is electrically isolated from the column-shaped conductive via structure 86C by a ribbed insulating liner 842. Each column-shaped conductive via structure 86C is formed on inner sidewalls of a ribbed insulating liner 842 and a cylindrical insulating liner 844. At least one of the column-shaped conductive via structures 86C can be formed directly on a top surface of the substrate material layer 909.

Each combination of a metallic liner 86A and a metal fill portion 86B filling a peripheral region cylindrical void 485 constitutes a peripheral region contact via structure 488. Each combination of a metallic liner 86A and a metal fill portion 86B filling an array region cylindrical void 585 constitutes an array region contact via structure 588. Each of the peripheral region contact via structures 488 and the array region contact via structures 588 can contact the substrate material layer 909. Each electrically conductive layer (146, 246) can include a conductive metallic liner 146A and a conductive fill material portion 146B.

Each combination of a column-shaped conductive via structure 86C, a ribbed insulating liner 842, and a cylindrical insulating liner 844 located within a staircase region via cavity constitutes a laterally-insulated via structure 86. Each laterally-insulated via structure 86 includes a respective column-shaped conductive via structure 86 as a conductive via structure, and include a respective ribbed insulating liner 842 and a respective cylindrical insulating liner 844 as a laterally insulating structure. The gap between the ribbed insulating liner 842 and the cylindrical insulating liner 844 provides an annular electrically conductive path at which the column-shaped conductive via structure 86C and an electrically conductive layer (146 or 246) makes a surface-to-surface contact.

Figure 29A:
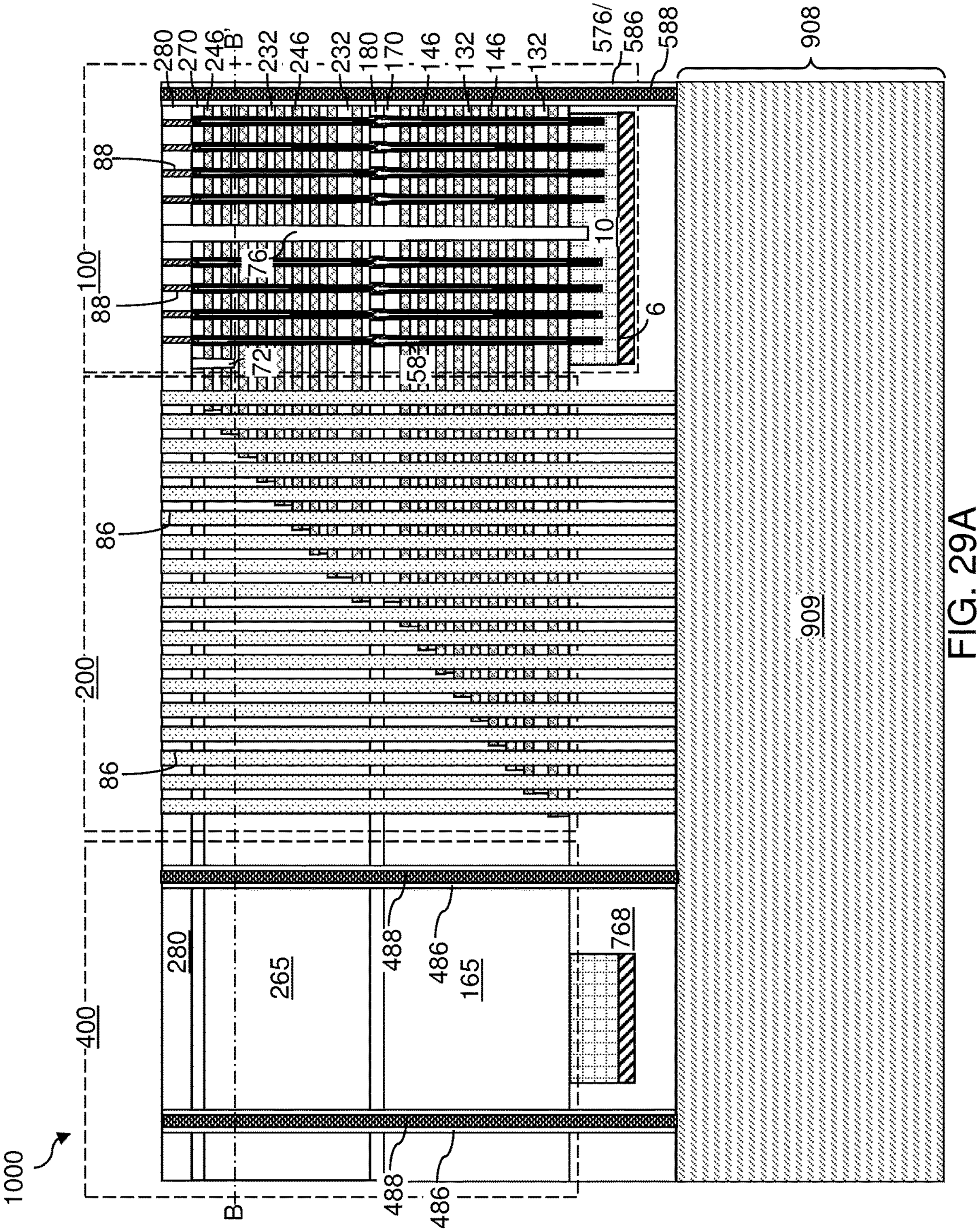
FIG. 29A is a vertical cross-sectional view of the first exemplary structure after formation of drain contact via structures according to an embodiment of the present disclosure.
Figure 29B:
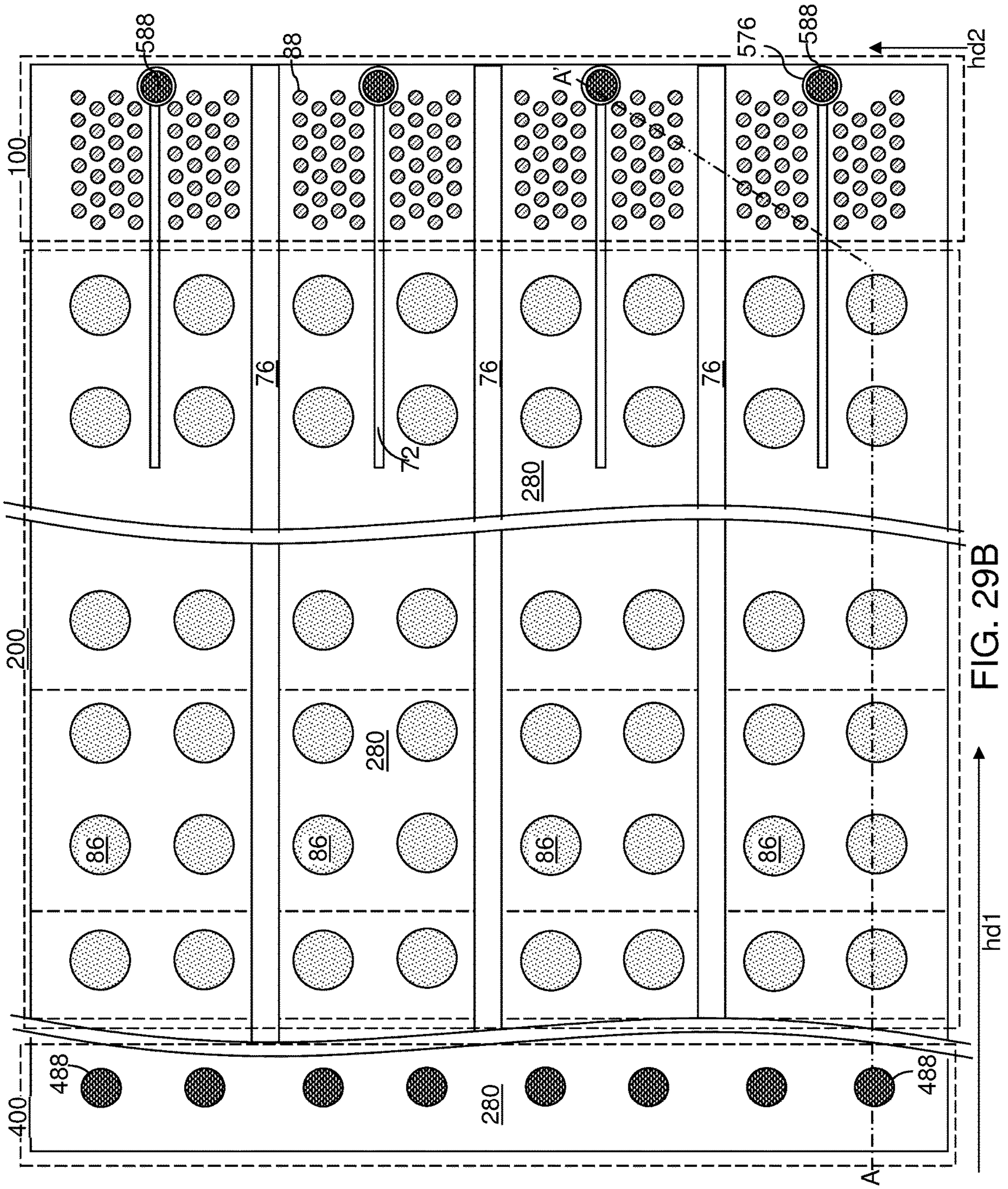
FIG. 29B is a horizontal cross-sectional view of the first exemplary structure along the horizontal plane B-B' of FIG. 28A. The hinged vertical plane A-A' corresponds to the plane of the vertical cross-sectional view of FIG. 28A.

Referring to FIGS. 29A and 29B, drain contact via structures 88 can be formed through the first contact level dielectric layer 280 directly on top surfaces of the drain regions 63.

Figure 30:
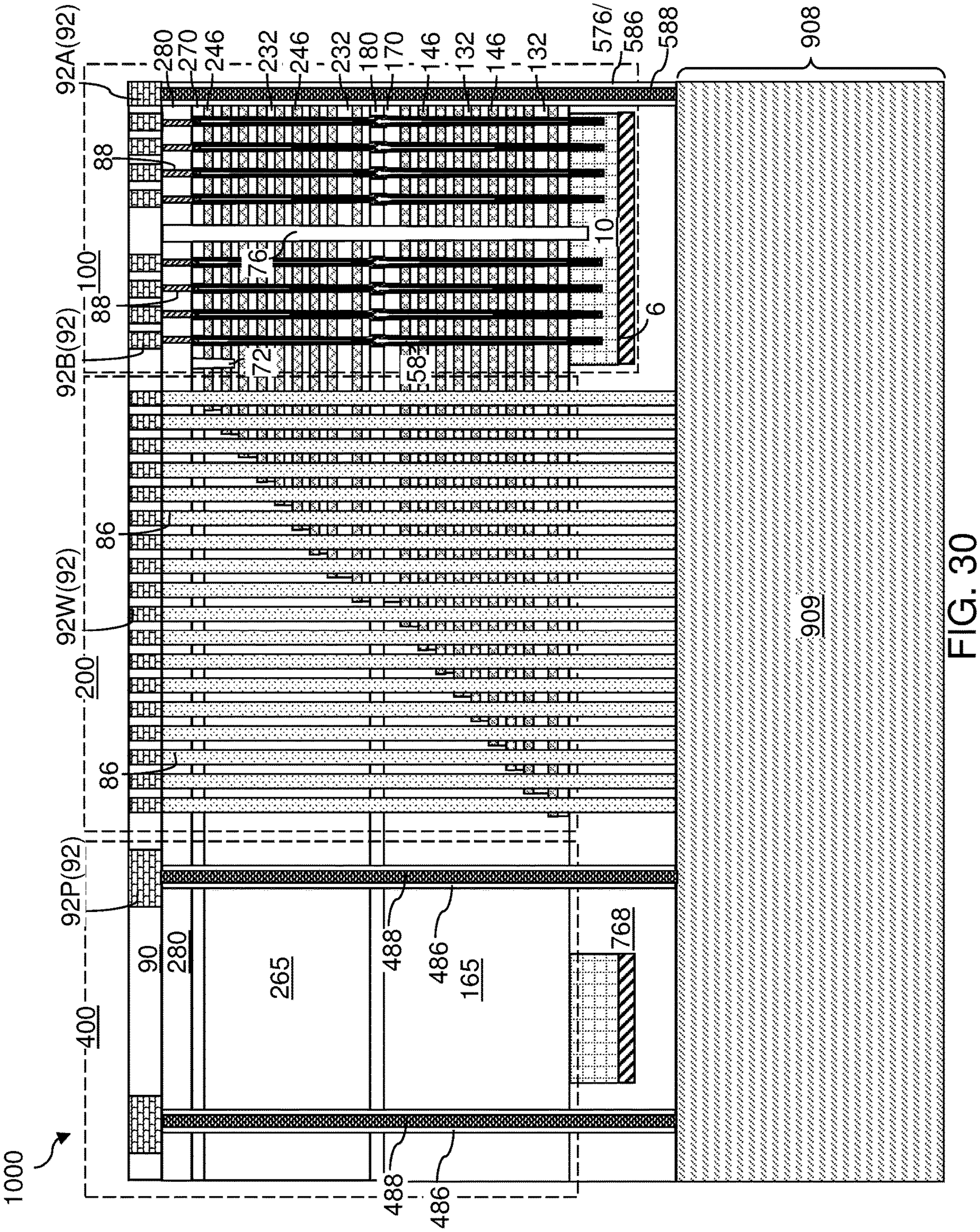
FIG. 30 is a vertical cross-sectional view of the first exemplary structure after formation of upper-level metal line structures according to an embodiment of the present disclosure.

Referring to FIG. 30, at least one additional dielectric layer can be formed over the first contact level dielectric layer 280, and additional metal interconnect structures (herein referred to as upper-level metal interconnect structures 92) can be formed in the at least one additional dielectric layer. For example, the at least one additional dielectric layer can include a line-level dielectric layer 284 that is formed over the first contact level dielectric layer 280. The upper-level metal interconnect structures 92 can include bit lines 92B contacting a respective one of the drain contact via structures 88, word line connection line structures 92W contacting a respective one of the column-shaped conductive via structures 86C, peripheral region line structures 92P contacting a respective one of the peripheral region contact via structures 488, and array region line structures 92A contacting a respective one of the array region contact via structures 588.

Figure 31:
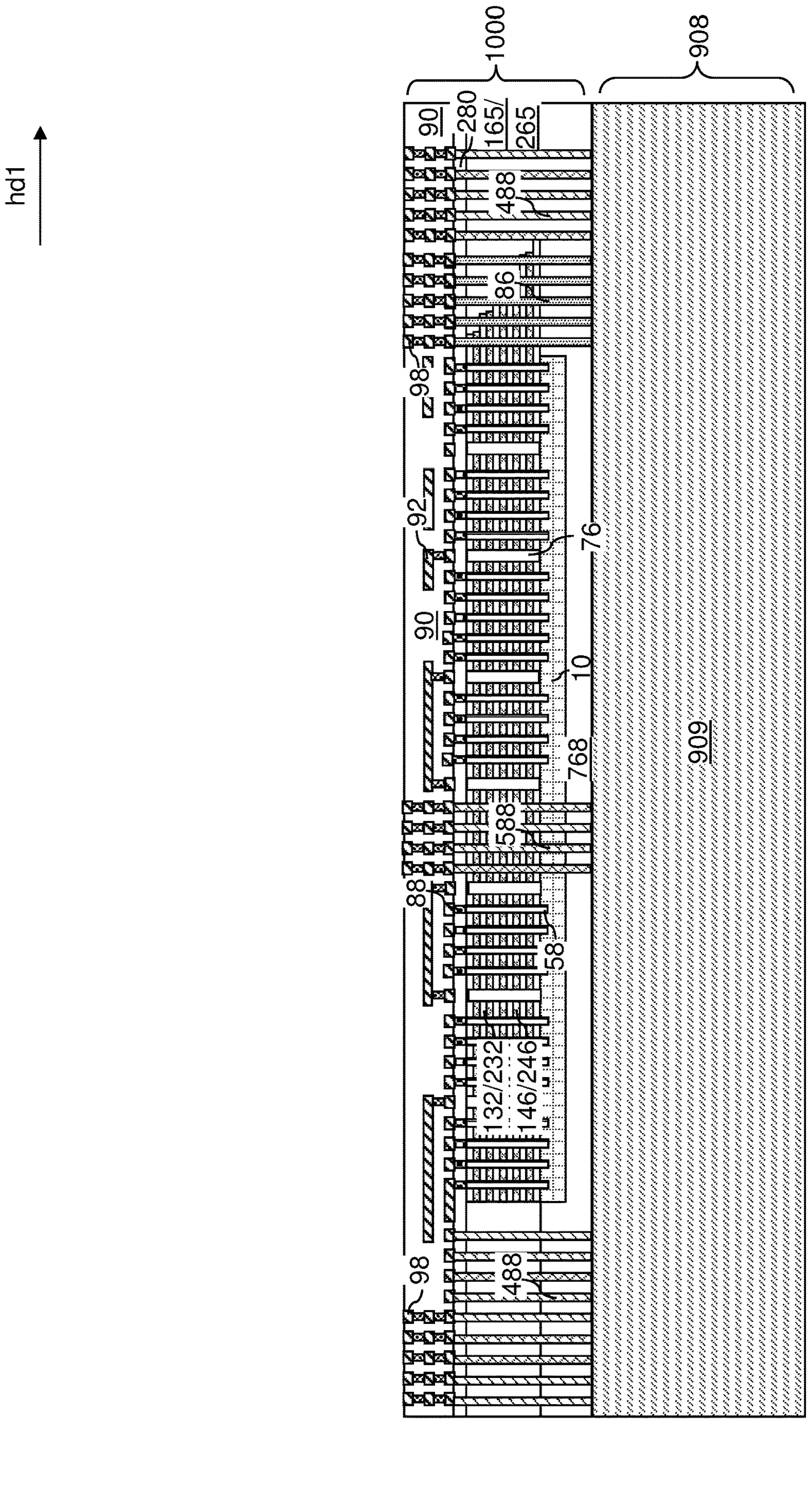
FIG. 31 is a vertical cross-sectional view of the first exemplary structure after formation of metal interconnect structures, interconnect-level dielectric material layers, and memory-side bonding pads to provide a first memory die according to an embodiment of the present disclosure.

Referring to FIG. 31, the first exemplary structure is illustrated after formation of additional metal interconnect structures, additional interconnect-level dielectric material layers, and memory-side bonding pads 98 to provide a first memory die 1000. The set of all metal interconnect structures is herein referred to as memory-side metal interconnect structures 92 or first memory-side metal interconnect structures. The memory-side metal interconnect structures 92 may comprise metal line structures and metal via structures. The interconnect-level dielectric material layers are herein referred to as memory-side dielectric material layers 90 or first memory-side dielectric material layers. The memory-side bonding pads 98 may comprise electrically conductive bonding pads, such as copper or copper alloy bonding pads, that can be subsequently employed for metal-to-metal bonding with mating metal bonding pads provided in another semiconductor die (not shown). The memory-side bonding pads 98 in the first memory die 1000 are also referred to as first memory-side bonding pads 98, and are electrically connected to the first memory-side metal interconnect structures 92.

In one embodiment, the first memory die 1000 comprises a first alternating stack (132, 146, 232, 246) of first insulating layers 132, 232 and first electrically conductive layers 146, 246, first memory opening fill structures 58 located within first memory openings 49 that vertically extend through the first alternating stack (132, 146, 232, 246) and comprising a respective vertical stack of first memory elements, a first stepped dielectric material portion (165, 265) contacting stepped surfaces of the first alternating stack (132, 146, 232, 246), and first column-shaped conductive via structures 86C comprising a respective conductive shaft portion 86S vertically extending through a respective subset of the first electrically conductive layers 146, 246, a respective conductive base portion 86B connected to a first end of the respective conductive shaft portion 86S, and a respective conductive capital portion 86P connected to a second end of the respective conductive shaft portion 86S and contacting an annular horizontal surface of a respective one of the first electrically conductive layers 146, 246.

Figure 32:
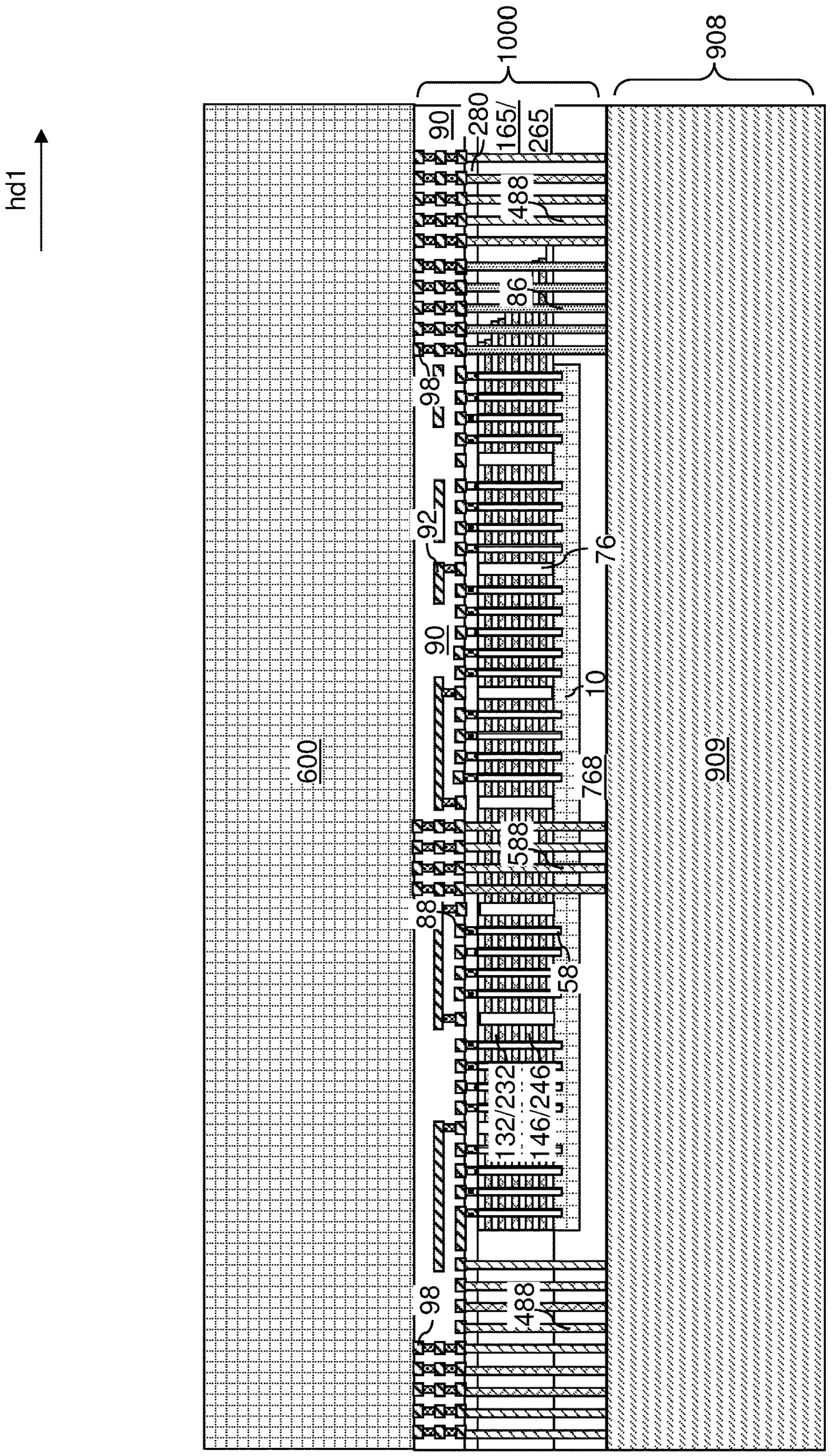
FIG. 32 is a vertical cross-sectional view of the first exemplary structure after attaching a second carrier substrate according to an embodiment of the present disclosure.
Figure 33A:
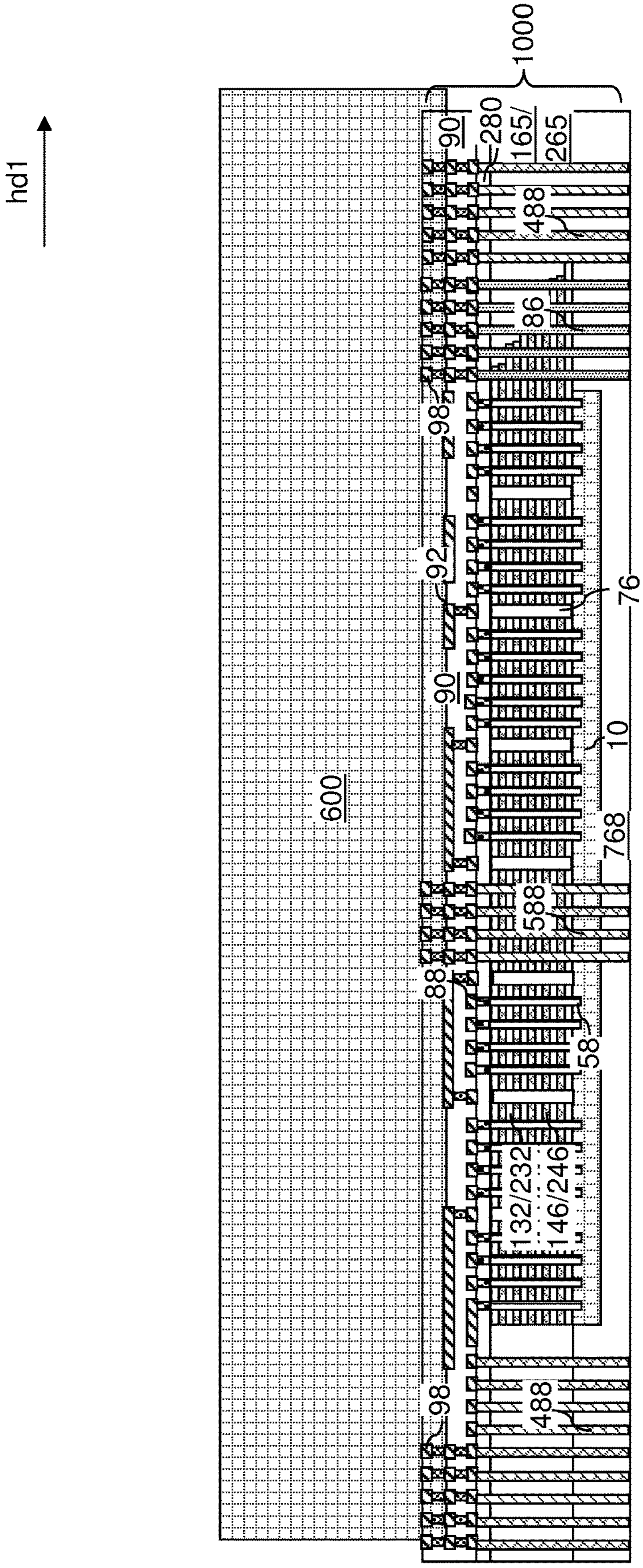
FIG. 33A is a vertical cross-sectional view of the first exemplary structure after detaching the first carrier substate according to an embodiment of the present disclosure.
Figure 33B:
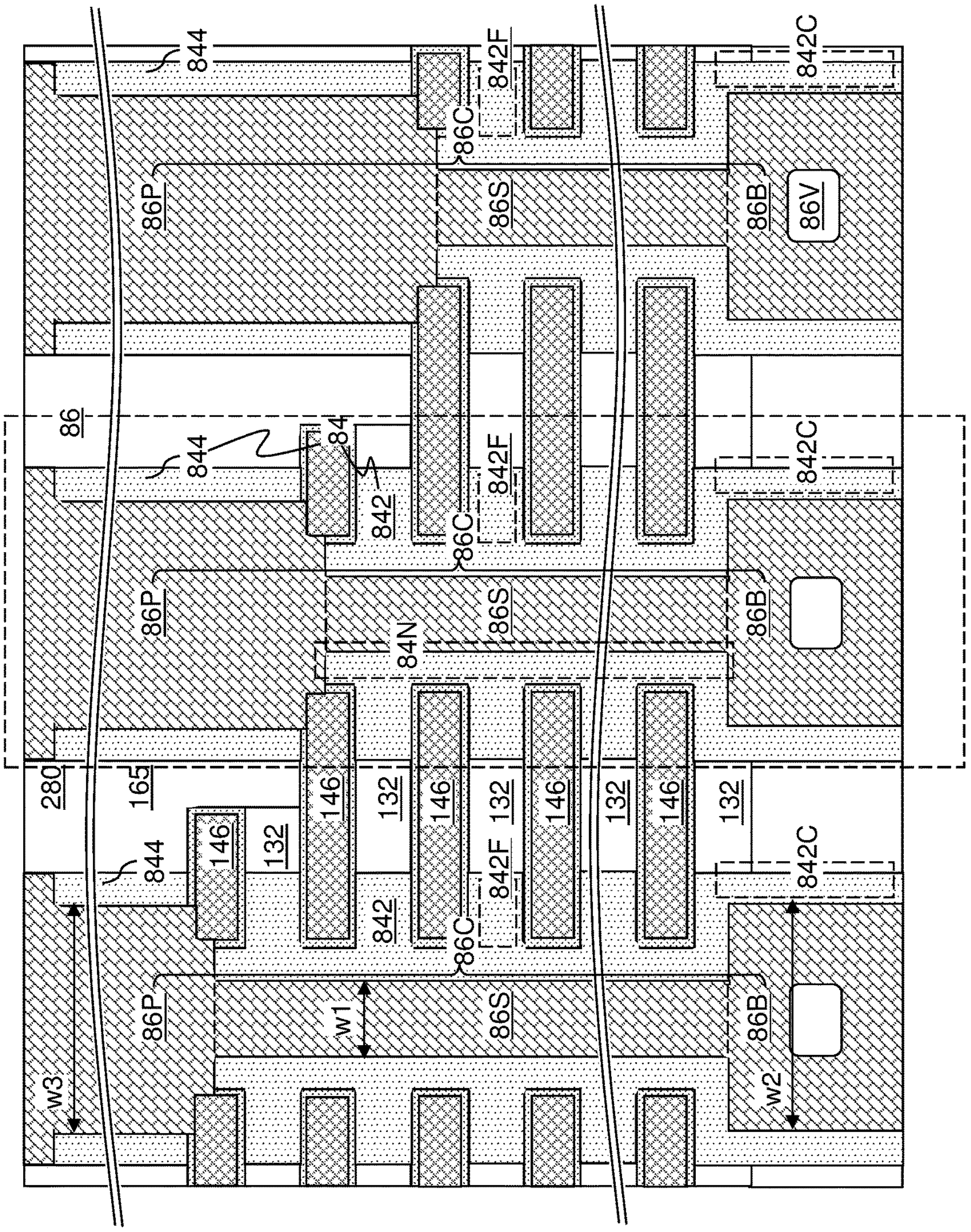
FIGS. 33B, 33C, and 33D are magnified vertical cross-sectional views of column-shaped conductive via structures, a peripheral region contact via structure, and an array region contact via structure, respectively, at the processing steps of FIG. 33A.
Figure 33D:
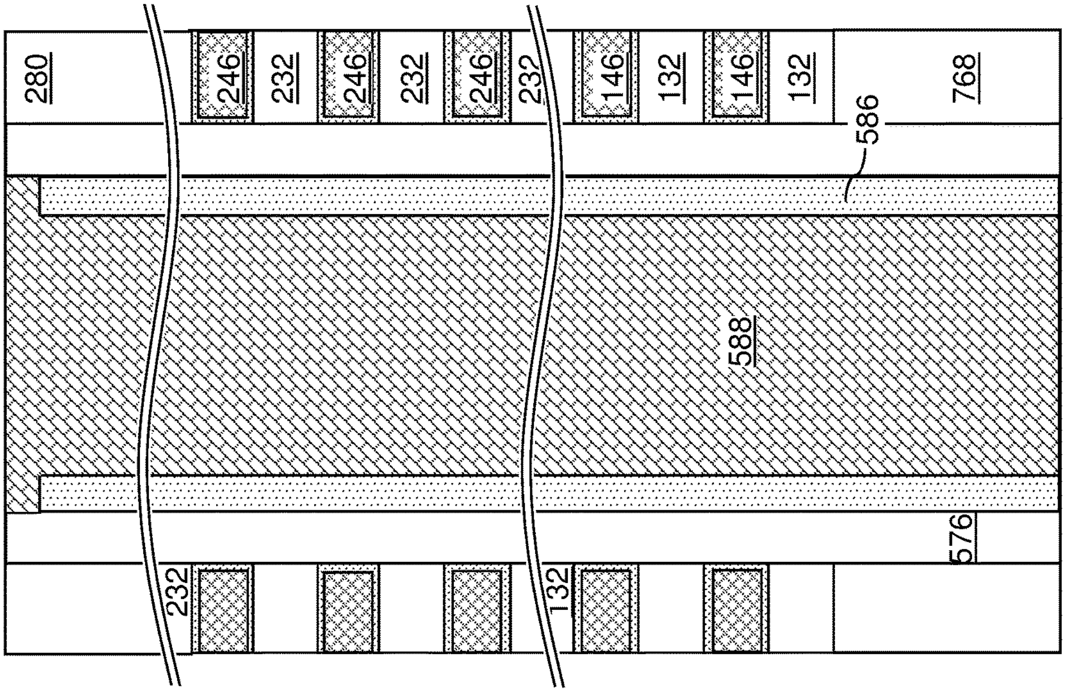
Figure 33C:
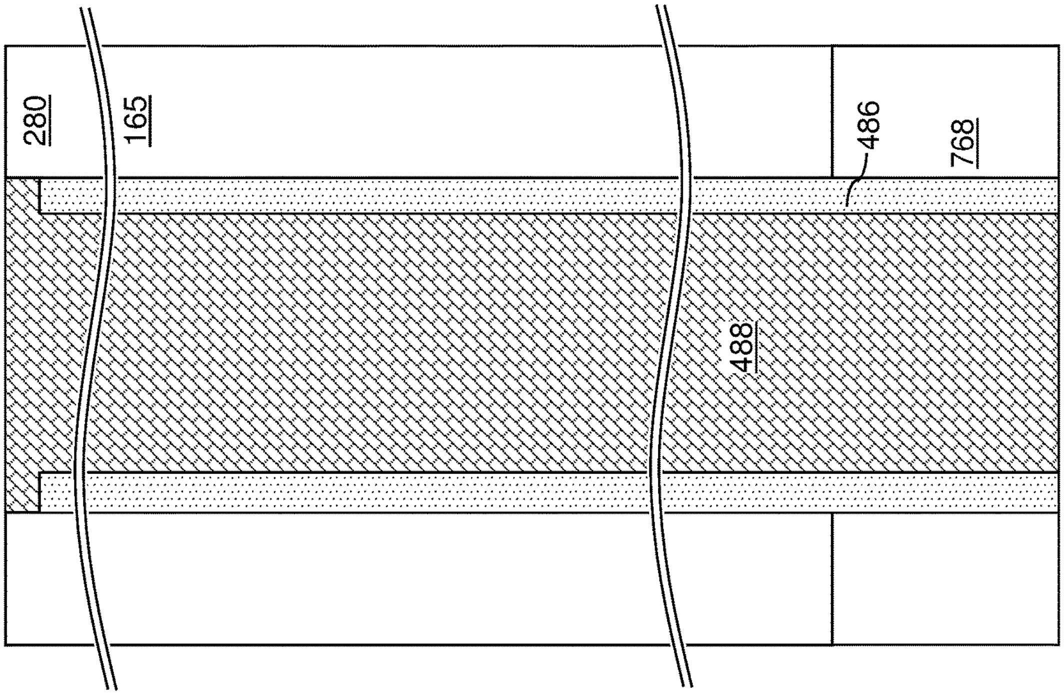

Referring to FIG. 32, a second carrier substrate 600 may be attached to the horizontal surface of the first memory die 1000 containing physically exposed horizontal surfaces of the first memory-side bonding pads 98. For example, a sacrificial adhesive layer (not shown) may be employed to attach the second carrier substrate 600 to the first memory die 1000. Alternatively, oxide to oxide bonding may be used to attach an oxide (e.g., silicon oxide) layer on a surface of the second carrier substrate 600 to an oxide (e.g., silicon oxide) layer 90 forming the horizontal surface of the first memory die 1000 The substrate of the second carrier substrate 600 includes a carrier substrate material, which can be selected from any material that may be employed for the first carrier substrate 908 as discussed above.

Referring to FIGS. 33A-33D, the first carrier substrate 908 may be removed from the assembly of the first memory die 1000 and the second carrier substrate 600. For example, the first carrier substrate 908 may be removed by grinding, polishing, an isotropic etch process, and/or an anisotropic etch process. Alternatively or additionally, a sacrificial spacer layer (not illustrated) and/or a sacrificial adhesive layer (not illustrated) may be employed between the first carrier substrate 908 and the assembly of the first memory die 1000 and the second carrier substrate 600 to facilitate detachment and subsequent reuse of the first carrier substrate 908. A bottom surface (i.e., a backside surface) of the dielectric buffer layer 760, and end surfaces of the laterally-insulated via structures 86, the peripheral region contact via structures 488, and the array region contact via structures 588 can be physically exposed upon removal of the first carrier substrate 908. Specifically, planar horizontal surfaces of the conductive base portions 86B of the column-shaped conductive via structures 86C, annular cylindrical portions 842C of the ribbed insulating liner 842, and horizontal end surfaces of the peripheral region contact via structures 488 and the array region contact via structures 588 may be physically exposed upon removal of the first carrier substrate 908. In case the planar horizontal surfaces of the conductive base portions 86B of the column-shaped conductive via structures 86C are covered by an insulating material after removal of the carrier substrate 908, then the insulating material may be removed by selective etching to expose the planar horizontal surfaces of the conductive base portions 86B of the column-shaped conductive via structures 86C In case the first column-shaped conductive via structures 86C, the peripheral region contact via structures 488, and the array region contact via structures 588 comprise copper, a touch-up polishing process may be employed so that physically exposed surfaces of the logic-side bonding pads 788 to the first column-shaped conductive via structures 86C, the peripheral region contact via structures 488, and the array region contact via structures 588 comprise copper surfaces that may be subsequently employed for copper-to-copper bonding.

Figure 34A:
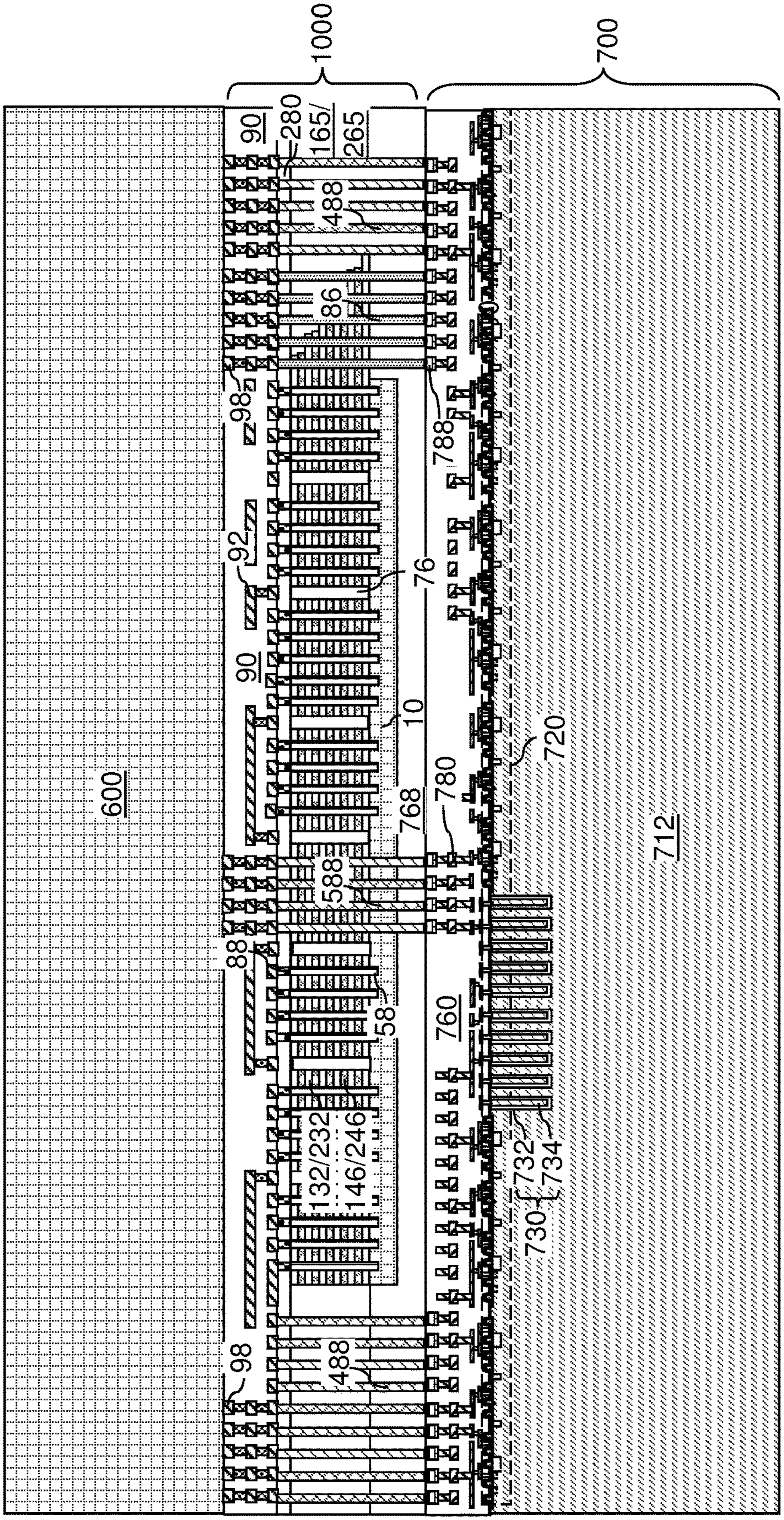
FIG. 34A is a vertical cross-sectional view of the first exemplary structure after bonding a logic die to the memory die according to an embodiment of the present disclosure.
Figure 34B:
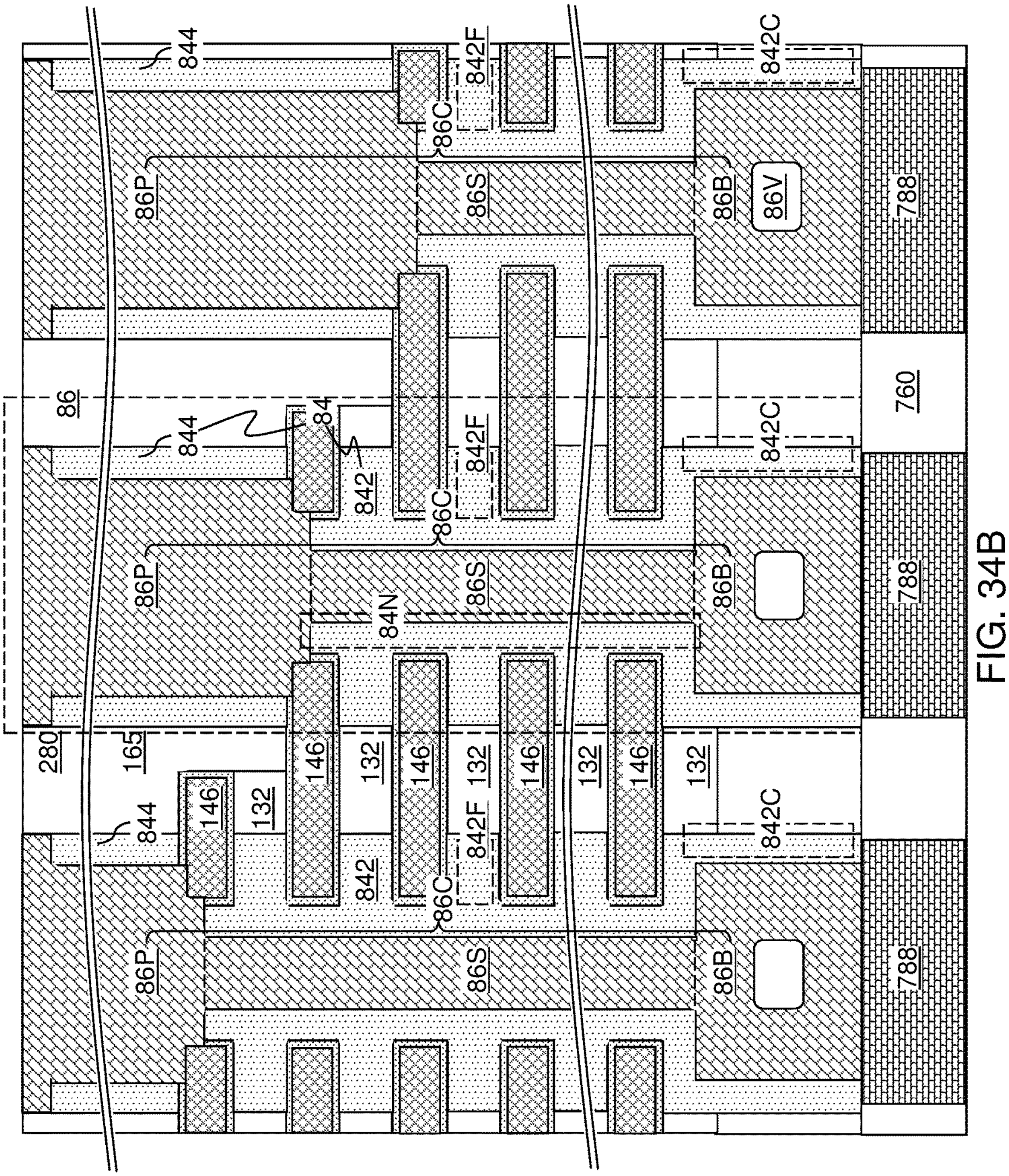
FIG. 34B is a magnified vertical cross-sectional views of a region around column-shaped conductive via structures at the processing steps of FIG. 34A.

Referring to FIGS. 34A and 34B, a logic die 700 is provided. The logic die 700 includes driver circuit 720, which may include complementary metal oxide semiconductor (CMOS) transistors located on a logic substrate including a logic-side semiconductor material layer 712. The logic substrate may comprise a silicon wafer or a silicon-on-insulator wafer, and the logic-side semiconductor material layer 712 may comprise a doped well in the top part of the logic substrate and/or an epitaxial semiconductor layer located on the logic substrate. The driver circuit 720 can be configured to drive electrical nodes within the first memory die 1000. In one embodiment, optional logic-side through-substrate connection structures 730 can be formed in an upper portion of the logic substrate. Each logic-side through-substrate connection structure 730 can include a logic-side laterally-isolated through-substrate via structure 734 and a logic-side substrate insulating spacer 732 that surrounds the logic-side laterally-isolated through-substrate via structure 734. Logic-die dielectric material layers 760 can be formed over the driver circuit 720, and can be embedded in the logic-side dielectric material layers 760. Logic-die bonding pads 788 can be embedded in the uppermost level of the logic-side dielectric material layers 780. The logic-side bonding pads 788 are electrically connected to a respective node (e.g., source, drain or gate) of the driver circuit 720. The pattern of the logic-side bonding pads 788 can be a mirror image pattern of the pattern of the first column-shaped conductive via structures 86C, the peripheral region contact via structures 488, and the array region contact via structures 588 of the first memory die 1000.

The logic die 700 can be bonded to the first memory die 1000. The logic die 700 can be attached to the substrate side of the first memory die 1000 by bonding the logic-side bonding pads 788 to the first column-shaped conductive via structures 86C, the peripheral region contact via structures 488, and the array region contact via structures 588 of the first memory die 1000. Metal-to-metal bonding (such as copper to copper bonding) or hybrid bonding (such as metal to metal and dielectric to dielectric bonding) can be employed to bond the logic-side bonding pads 788 to the first column-shaped conductive via structures 86C, the peripheral region contact via structures 488, and the array region contact via structures 588 of the first memory die 1000. In one embodiment, each of the logic-side bonding pads 788, the first column-shaped conductive via structures 86C, the peripheral region contact via structures 488, and the array region contact via structures 588 may comprise copper, and copper-to-copper bonding may be employed.

In one embodiment, a first subset of the logic-side bonding pads 788 can be bonded to the conductive base portions 86B of the first column-shaped conductive via structures 86C via metal-to-metal bonding. A second subset of the logic-side bonding pads 788 can be bonded to planar end surfaces of the peripheral region contact via structures 488 via metal-to-metal bonding. A third subset of the logic-side bonding pads 788 can be bonded to planar end surfaces of the array region contact via structures 588 via metal-to-metal bonding. In case hybrid bonding is employed, dielectric-to-dielectric bonding (such as oxide-to-oxide bonding) can be formed between the logic-side dielectric material layers 760 and the dielectric buffer layer 768 in the first memory die 1000. The first memory die 1000 can be attached directly to the logic die 700.

Figure 35:
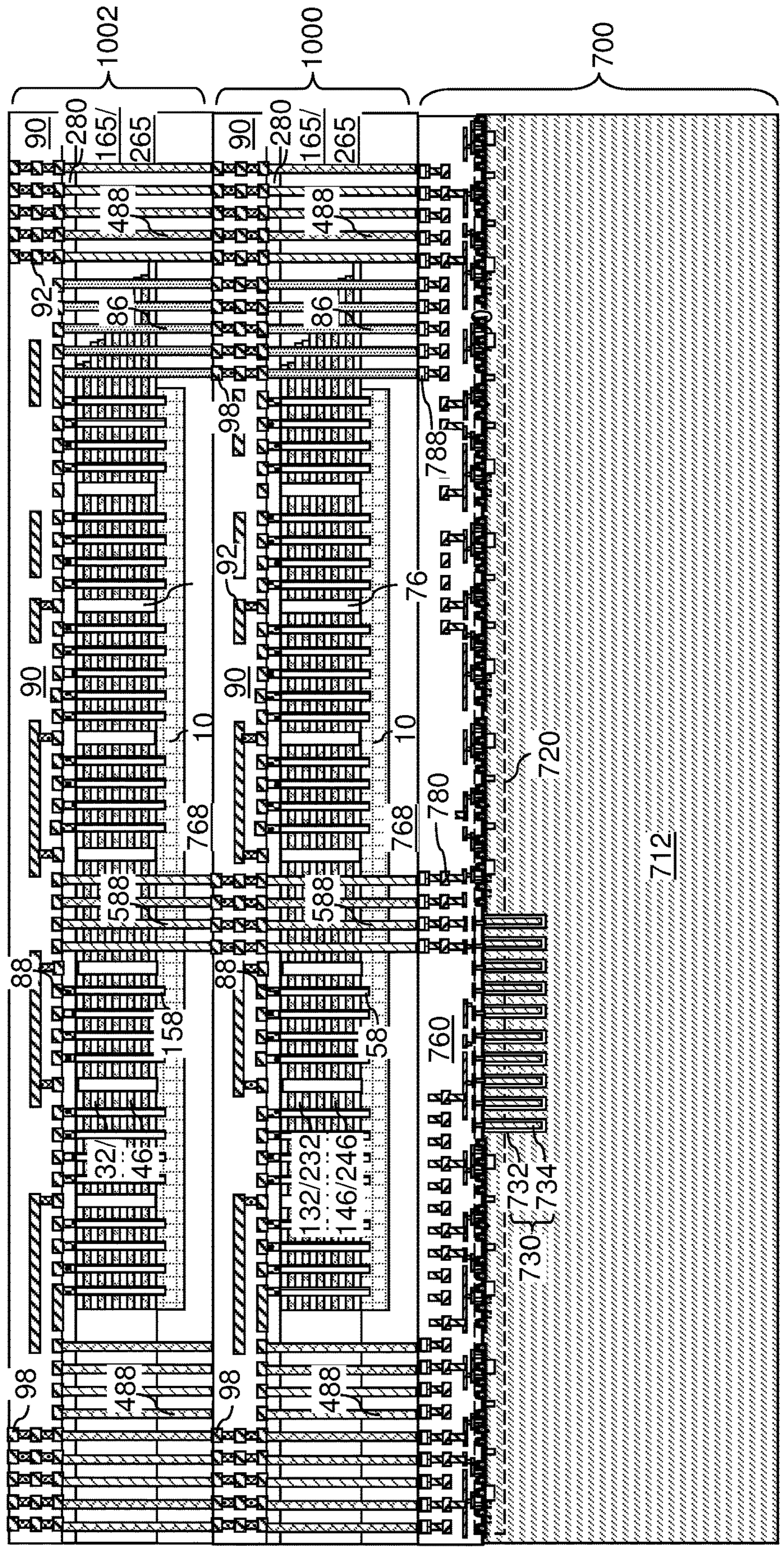
FIG. 35 is a vertical cross-sectional view of the first exemplary structure after attaching an additional memory die according to an embodiment of the present disclosure.

Referring to FIG. 35, the second carrier substate 600 can be detached from the bonded assembly including the logic die 700 and the first memory die 1000. A suitable clean process may be performed to clean the physically exposed horizontal surface of the first memory die 1000.

A second memory die 1002 may be provided. In one embodiment, the second memory die 1002 comprises a second alternating stack (32, 46) of second insulating layers 32 and second electrically conductive layers 46, second memory opening fill structures 158 located within second memory openings that vertically extend through the second alternating stack (32, 46) and comprising a respective vertical stack of second memory elements, a second stepped dielectric material portion (165, 265) contacting stepped surfaces of the second alternating stack (32, 46).

The second memory die 1002 may be formed in the same manner as the first memory die 1000, and includes column-shaped conductive via structures 86C (which are hereafter referred to as second column-shaped conductive via structures 86C), the peripheral region contact via structures 488, and the array region contact via structures 588. In one embodiment, the second memory die 1002 comprises second column-shaped conductive via structures 86C comprising a respective conductive shaft portion 86S vertically extending through a respective subset of the second electrically conductive layers 46, a respective conductive base portion 86B connected to a first end of the respective conductive shaft portion 86S, and a respective conductive capital portion 86P connected to a second end of the respective conductive shaft portion 86S and contacting an annular horizontal surface of a respective one of the second electrically conductive layers 46. According to an aspect of the present disclosure, the pattern of the second column-shaped conductive via structures 86C, the peripheral region contact via structures 488, and the array region contact via structures 588 in the second memory die 1002 may be the same as the pattern of the first memory-side bonding pads 98 of the first memory die 1000.

The second memory die 1002 can be bonded to the first memory die 1000. For example, metal-to-metal bonding can be induced between the first memory-side bonding pads 98 of the first memory die 1000 and the set of the second column-shaped conductive via structures 86C, the peripheral region contact via structures 488, and the array region contact via structures 588 in the second memory die 1002. For example, copper-to-copper bonding may be employed between the first memory-side bonding pads 98 of the first memory die 1000 and the set of the second column-shaped conductive via structures 86C, the peripheral region contact via structures 488, and the array region contact via structures 588 in the second memory die 1002.

In one embodiment, a first subset of the memory-side bonding pads 98 of the first memory die 1000 can be bonded to the conductive base portions 86B of the second column-shaped conductive via structures 86C of the second memory die 1002 via metal-to-metal bonding. A second subset of the memory-side bonding pads 98 of the first memory die 1000 can be bonded to planar end surfaces of the peripheral region contact via structures 488 of the second memory die 1002 via metal-to-metal bonding. A third subset of the memory-side bonding pads 98 of the first memory die 1000 can be bonded to planar end surfaces of the array region contact via structures 588 of the second memory die 1002 via metal-to-metal bonding. In case hybrid bonding is employed, dielectric-to-dielectric bonding (such as oxide-to-oxide bonding) can be formed between the memory-side dielectric material layers 90 of the first memory die 1000 and the dielectric buffer layer 768 in the second memory die 1002. The second memory die 1002 can be attached directly to the first memory die 1000.

In one embodiment, the second column-shaped conductive via structures 86C are electrically connected to a respective one of the first column-shaped conductive via structures 86C. In one embodiment, the first memory die 1000 comprises first memory-side metal interconnect structures 92 embedded within first memory-side dielectric material layers 90 and first memory-side bonding pads 98 electrically connected to the first memory-side metal interconnect structures 92; and the conductive base portions 86B of the second column-shaped conductive via structures 86C are bonded to the first memory-side bonding pads 98. The peripheral region contact via structures 488 and/or the array region contact via structures 588 in the first and the second memory die (1000, 1002) may be used to electrically connect the semiconductor devices in the driver circuit 720 in the logic die 700 to external voltage source(s).

Figure 36:
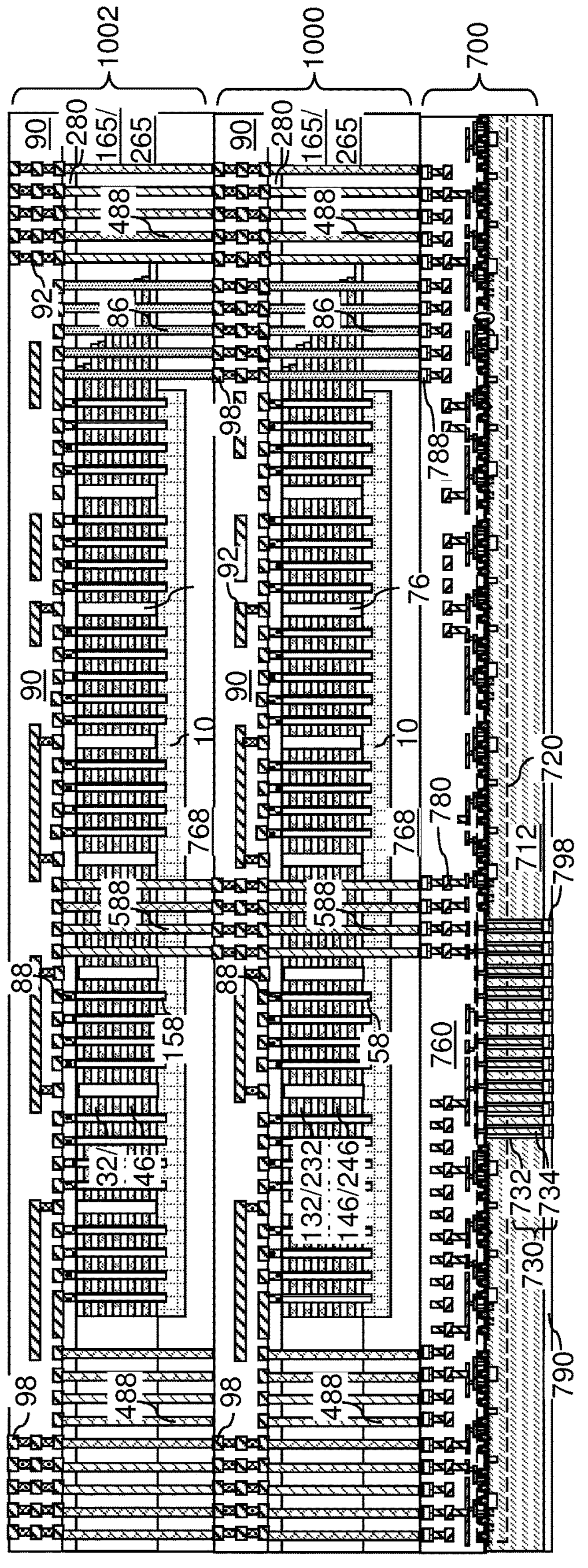
FIG. 36 is a vertical cross-sectional view of the first exemplary structure after thinning the backside of a logic-side substrate and forming backside bonding structures according to an embodiment of the present disclosure.

In an alternative embodiment shown in FIG. 36, the backside of the logic-side semiconductor material layer 712 may optionally be thinned, for example, by grinding, polishing, an isotropic etch process (such as a wet etch process), and/or an anisotropic etch process (such as a reactive ion etch process). The thinning of the logic-side semiconductor material layer 712 can continue until surfaces of the logic-side laterally-isolated through-substrate via structures 734 (if present) are physically exposed. Each laterally-isolated through-substrate via structure 934 can be laterally surrounded by a respective substrate insulating spacer 932. Each contiguous combination of a substrate insulating spacer 932 and a laterally-isolated through-substrate via structure 934 constitutes a logic-side through-substrate connection structure 930.

A backside insulating layer 790 can be deposited on the backside surface of the logic-side semiconductor material layer 712 as thinned by the thinning process. The backside insulating layer 790 includes an insulating material such as silicon oxide, and can have a thickness in a range from 500 nm to 5 microns. Backside bonding structures 798 can be formed in the backside insulating layer 790 such that each backside bonding structure 798 contacts a horizontal surface of a respective one of the laterally-isolated through-substrate via structures 934. Thus, each backside bonding structure 798 is located on the backside of the logic-side semiconductor material layer 712 (which is the semiconductor substrate of the logic die 700), and is electrically connected to a respective one of the laterally-isolated through-substrate via structures 934. The backside bonding structure 798 may be used to electrically connect the semiconductor devices in the driver circuit 720 in the logic die 700 to external voltage source(s).

According to various embodiments of the present disclosure and referring collectively to FIGS. 1A-36, a bonded assembly comprises: a first memory die 1000 comprising a first alternating stack (132, 146, 232, 246) of first insulating layers (132, 232) and first electrically conductive layers (146, 246), first memory opening fill structures 58 located within first memory openings 49 that vertically extend through the first alternating stack and comprising a respective vertical stack of first memory elements (e.g., portions of the memory film 50, such as portions of layer 54 of the memory film 50), a first stepped dielectric material portion (165, 265) contacting stepped horizontal surfaces of the first alternating stack, and first column-shaped conductive via structures 86C comprising a respective conductive shaft portion 86S vertically extending through a respective subset of the first electrically conductive layers (146, 246), a respective conductive base portion 86B connected to a first end of the respective conductive shaft portion 86S, and a respective conductive capital portion 86P connected to a second end of the respective conductive shaft portion 86S and contacting the horizontal stepped surface of a respective one of the first electrically conductive layers (146, 246); and a logic die 700 comprising a driver circuit 720 configured to drive electrical nodes (e.g., word lines and bit lines) within the first memory die 1000, logic-side metal interconnect structures 780 embedded within logic-side dielectric material layers 760, and logic-side bonding pads 788 that are bonded to the conductive base portions 86B of the first column-shaped conductive via structures 86C.

In one embodiment, the logic-side bonding pads 788 are bonded to the conductive base portions 86B of the first column-shaped conductive via structures 86C; the respective conductive shaft portion 86S has a first width w1; the respective conductive base portion 86B has a second width w2 that is greater than then the first width w1; and the respective conductive capital portion 86P has a third width w3 that is greater than the first width w1. In one embodiment, the conductive base portions 86B of the first column-shaped conductive via structures 86C are more proximal to the logic die 700 than any of the first electrically conductive layers (146, 246) within the first alternating stack (132, 146, 232, 246) is to the logic die 700. In one embodiment, the logic-side bonding pads 788 are bonded to the conductive base portions 86B of the first column-shaped conductive via structures 86C via metal-to-metal bonding. In one embodiment, the conductive capital portions 86P of the first column-shaped conductive via structures 86C are laterally surrounded by the first stepped dielectric material portion (165, 265).

In one embodiment, each conductive shaft portion 86S of the first column-shaped conductive via structures 86C is laterally surrounded by a respective ribbed insulating liner 842 including laterally-protruding portions located at levels of a subset of the first insulating layers 32. In one embodiment, the respective ribbed insulating liner 842 laterally surrounds a conductive base portion 86B of a respective one of the first column-shaped conductive via structures 86C. In one embodiment, each conductive capital portion 86P of the first column-shaped conductive via structures 86C is laterally surrounded by a respective cylindrical insulating liner 844 comprising a same insulating material as the ribbed insulating liners 842.

In one embodiment, the bonded assembly comprises a second memory die 1002 that is bonded to the first memory die 1000 and comprising a second alternating stack (32, 46) of second insulating layers 32 and second electrically conductive layers 46, second memory opening fill structures 158 located within second memory openings 49 that vertically extend through the second alternating stack (32, 46) and comprising a respective vertical stack of second memory elements, a second stepped dielectric material portion (165, 265) contacting horizontal stepped surfaces of the second alternating stack (32, 46), and second column-shaped conductive via structures 86C comprising a respective conductive shaft portion 86S vertically extending through a respective subset of the second electrically conductive layers 46, a respective conductive base portion 86B connected to a first end of the respective conductive shaft portion 86S, and a respective conductive capital portion 86P connected to a second end of the respective conductive shaft portion 86S and contacting the horizontal stepped surface of a respective one of the second electrically conductive layers 46. In one embodiment, the second column-shaped conductive via structures 86C are electrically connected to a respective one of the first column-shaped conductive via structures 86C.

In one embodiment, the first memory die 1000 comprises first memory-side metal interconnect structures 92 embedded within first memory-side dielectric material layers 90 and first memory-side bonding pads 98 electrically connected to the first memory-side metal interconnect structures 92; and the conductive base portions 86B of the second column-shaped conductive via structures 86C are bonded to the first memory-side bonding pads 98.

In one embodiment, the first memory die 1000 comprises a semiconductor material layer 10 located on the first alternating stack; the first memory opening fill structures 58 further comprise a respective vertical semiconductor channel 60 having an end that is electrically connected to the semiconductor material layer 10; and the semiconductor material layer 10 has a lesser vertical extent than the conductive base portions of the first column-shaped conductive via structures 86C.

Figure 37:
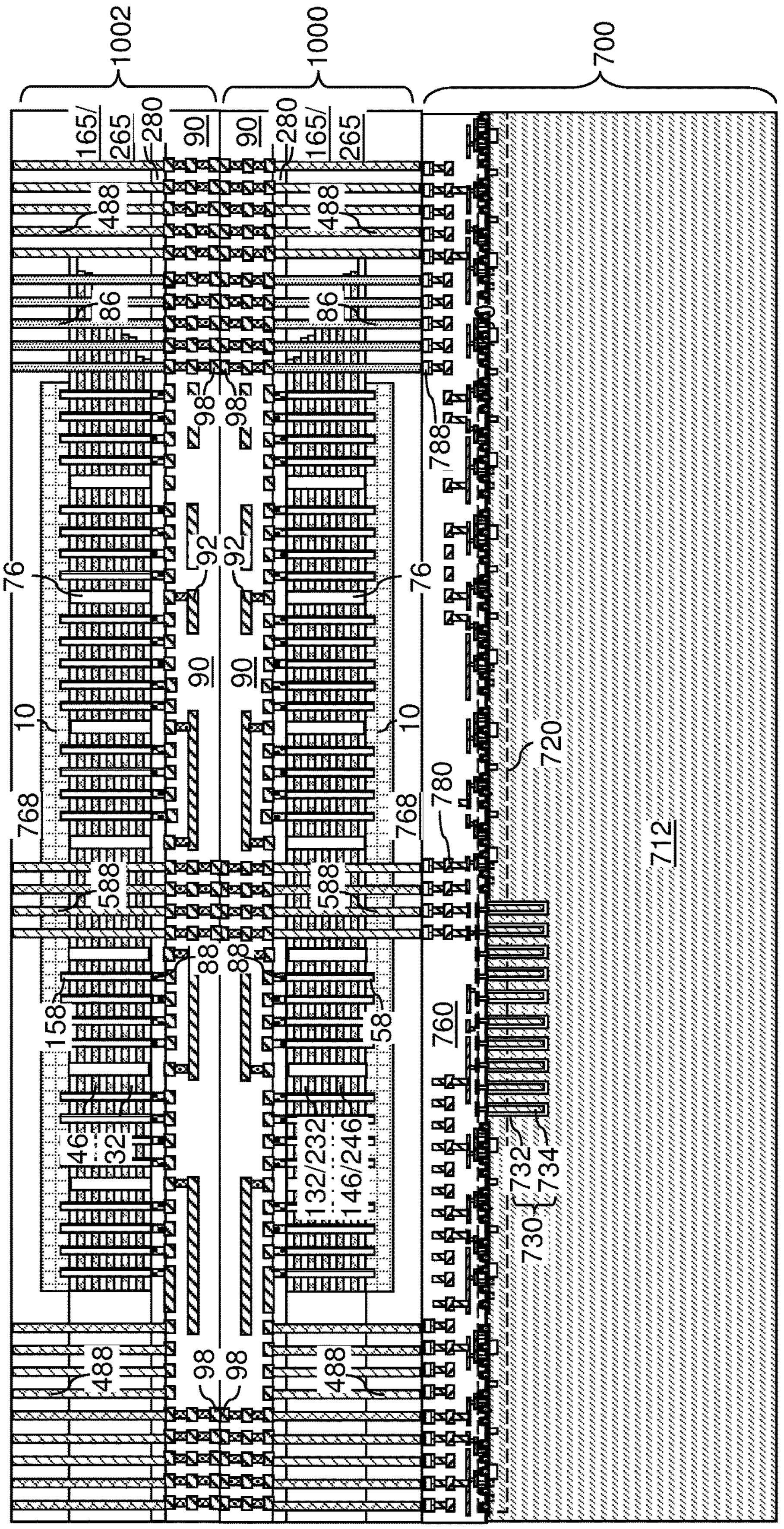
FIG. 37 is a vertical cross-sectional view of a first alternative configuration of the first exemplary structure after attaching an additional memory die according to an embodiment of the present disclosure.

Referring to FIG. 37, a first alternative configuration of the first exemplary structure is illustrated. The first alternative configuration of the first exemplary structure can be derived from the first exemplary structure illustrated in FIGS. 34A and 34B by detaching the second carrier substate 600 from the bonded assembly including the logic die 700 and the first memory die 1000, and by bonding the second memory die 1002 to the first memory die 1000 such that first memory-side bonding pads 98 in the first memory die 1000 are bonded to second memory-side bonding pads 98 of the second memory die 1002. In other words, the top of the first memory die 1000 is bonded to the top of the second memory die 1002 in this alternative embodiment. According to an aspect of the present disclosure, the pattern of the second memory-side bonding pads 98 of the second memory die 1002 may be a mirror image pattern of the pattern of the first memory-side bonding pads 98 of the first memory die 1000.

For example, metal-to-metal bonding can be induced between the first memory-side bonding pads 98 of the first memory die 1000 and the second memory-side bonding pads 98 of the second memory die 1002. For example, copper-to-copper bonding may be employed between the first memory-side bonding pads 98 of the first memory die 1000 and the second memory-side bonding pads 98 of the second memory die 1002. In case hybrid bonding is employed, dielectric-to-dielectric bonding (such as oxide-to-oxide bonding) can be formed between the memory-side dielectric material layers 90 of the first memory die 1000 and the memory-side dielectric material layers 90 in the second memory die 1002. The second memory die 1002 can be attached directly to the first memory die 1000.

In the first alternative configuration of the first exemplary structure, the first memory die 1000 comprises first memory-side metal interconnect structures 92 embedded within first memory-side dielectric material layers 90 and first memory-side bonding pads 98 electrically connected to the first memory-side metal interconnect structures 92; the second memory die 1002 comprises second memory-side metal interconnect structures 92 embedded within second memory-side dielectric material layers 90 and second memory-side bonding pads 98 electrically connected to the second memory-side metal interconnect structures 92; and the second memory-side bonding pads 98 are bonded to the first memory-side bonding pads 98.

In one embodiment, end surfaces of the second column-shaped conductive via structures 86C, the peripheral region contact via structures 488, and the array region contact via structures 588 can be physically exposed after bonding the second memory die 1002 to the first memory die 1000. Optionally, an additional memory die (not shown) may be bonded to the second memory die 1002 such that bonding structures in the additional memory die are bonded to a respective one of the second column-shaped conductive via structures 86C, the peripheral region contact via structures 488, and the array region contact via structures 588 of the second memory die 1002.

Figure 38:
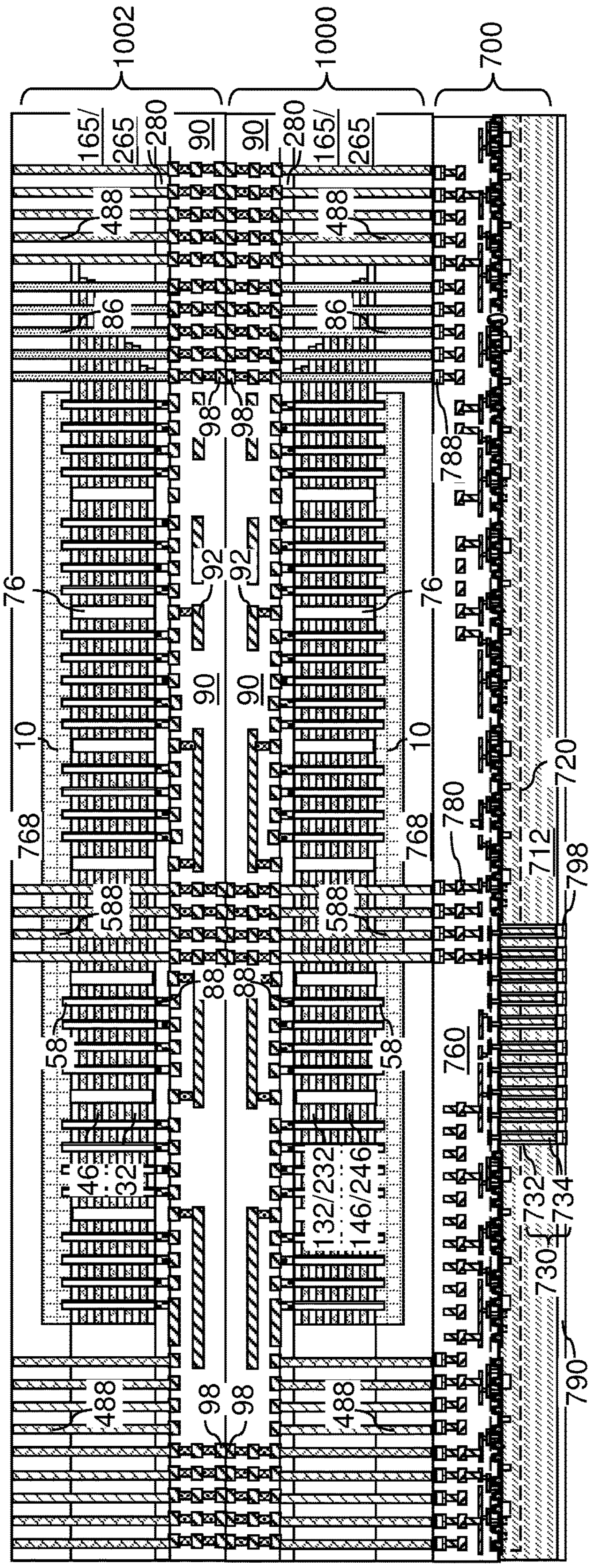
FIG. 38 is a vertical cross-sectional view of the first alternative configuration of the first exemplary structure after thinning the backside of a logic-side substrate and forming backside bonding structures according to an embodiment of the present disclosure.

Referring to FIG. 38, the processing steps described with reference to FIG. 36 may optionally be performed to thin the backside of the logic-side semiconductor material layer 712. A backside insulating layer 790 can be deposited on the backside surface of the logic-side semiconductor material layer 712 as thinned by the thinning process. Backside bonding structures 798 can be formed in the backside insulating layer 790 such that each backside bonding structure 798 contacts a horizontal surface of a respective one of the laterally-isolated through-substrate via structures 934.

Figure 39:
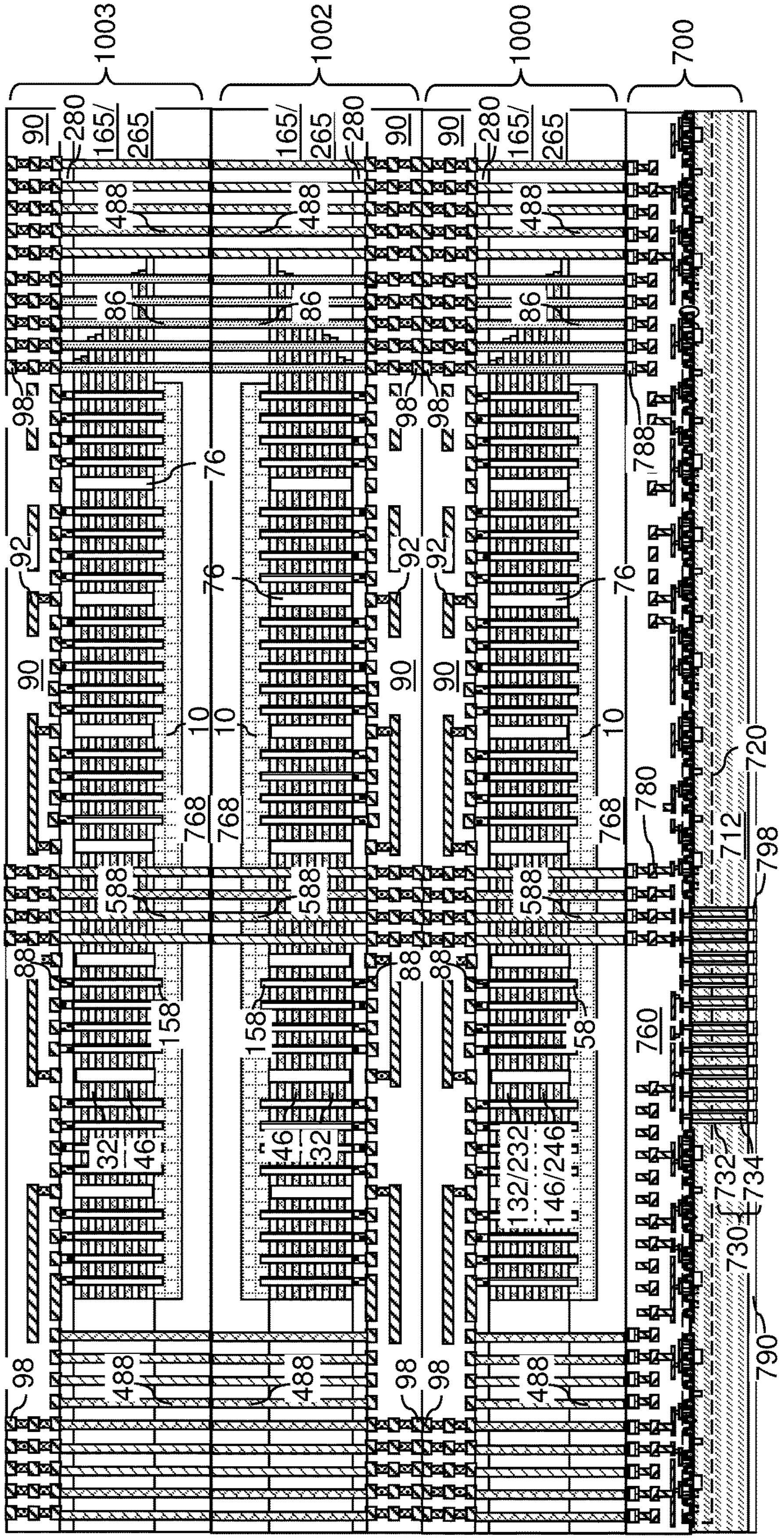
FIG. 39 is a vertical cross-sectional view of a second alternative configuration of the first exemplary structure after thinning the backside of a logic-side substrate and forming backside bonding structures according to an embodiment of the present disclosure.

Referring to FIG. 39, a second alternative configuration of the first exemplary structure may be derived from the first exemplary structure illustrated in FIG. 36 or from the first alternative configuration of the first exemplary structure illustrated in FIG. 38 by attaching a third memory die 1003 to the second memory die 1002. Generally, the third memory die 1003 may be formed in the same manner as the first and/or second memory die (1000 and/or 1002). The metallic bonding structures of the third memory die 1003 on the side that faces the second memory die 1002 may be arranged as a mirror image of the metallic bonding structure of the second memory die 1002. Generally, the third memory die 1003 may be attached to the second memory die 1002 prior to, or after, thinning the logic die 700.

In one embodiment, the metallic bonding structures of the second memory die 1002 that face the third memory die 1003 may comprise second memory-side bonding pads 98, and the metallic bonding structures of the third memory die 1003 that face the second memory die 1002 may comprise third memory-side bonding pads 98.

In another embodiment, the metallic bonding structures of the second memory die 1002 that face the third memory die 1003 may comprise second memory-side bonding pads 98, and the metallic bonding structures of the third memory die 1003 that face the second memory die 1002 may comprise third column-shaped conductive via structures 86C, peripheral region contact via structures 488, and array region contact via structures 588 that are located in the third memory die 1003.

In one embodiment, the metallic bonding structures of the second memory die 1002 that face the third memory die 1003 may comprise second column-shaped conductive via structures 86C, peripheral region contact via structures 488, and array region contact via structures 588 that are located in the second memory die 1002, and the metallic bonding structures of the third memory die 1003 that face the second memory die 1002 may comprise third memory-side bonding pads 98.

In another embodiment, the metallic bonding structures of the second memory die 1002 that face the third memory die 1003 may comprise second column-shaped conductive via structures 86C, peripheral region contact via structures 488, and array region contact via structures 588 that are located in the second memory die 1002, and the metallic bonding structures of the third memory die 1003 that face the second memory die 1002 may comprise third column-shaped conductive via structures 86C, peripheral region contact via structures 488, and array region contact via structures 588 that are located in the third memory die 1003.

The various embodiments of the present disclosure may be employed to provide zia-style column-shaped conductive via structures 86C, which may be employed as bonding structures. These bonding structures provide a more compact memory die 1000 and permit use of a higher thermal budget to form the logic die 700 prior to bonding the logic die to the memory die 1000.

Figure 40:
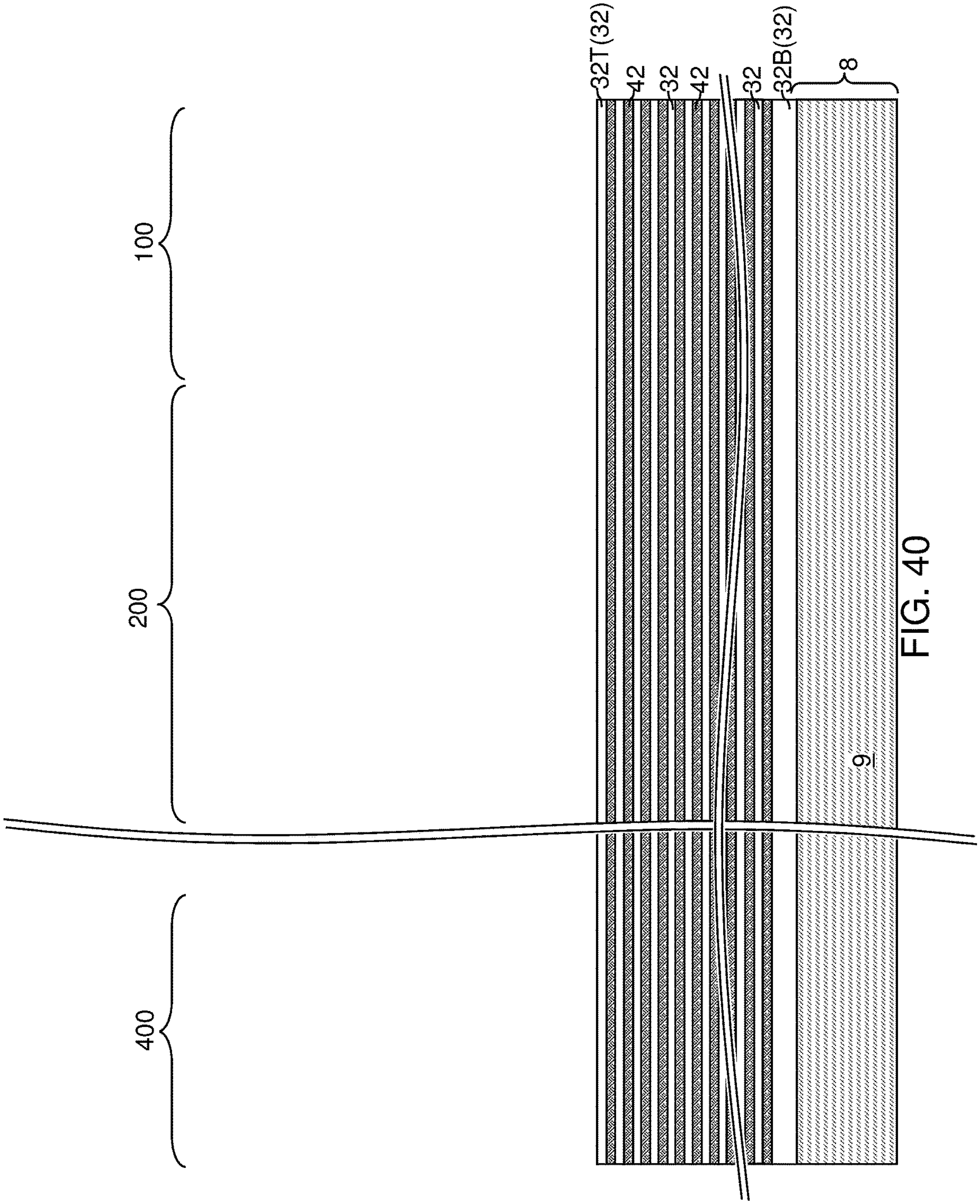
FIG. 40 is a vertical cross-sectional view of a second exemplary structure for forming a memory die after formation of a vertically alternating sequence of continuous insulating layers and continuous sacrificial material layers over a carrier substrate according to an embodiment of the present disclosure.

Referring to FIG. 40, a second exemplary structure according to a second embodiment of the present disclosure is illustrated, which may be employed to form a memory die. The second exemplary structure comprises a substrate 8, which may be a carrier substrate that is subsequently removed. The substrate 8 may comprise a semiconductor material (e.g., silicon wafer), an insulating material, a conductive material, or a combination thereof. The substrate 8 comprises a material that can provide structural support to material portions that are subsequently formed thereupon. The substrate 8 may comprise a substrate material layer 9 at least at an upper portion thereof. In one embodiment, the substrate material layer 9 may be a semiconductor material layer, such as a silicon layer or a doped well in a silicon substrate.

At least one alternating stack of insulating layers 32 and spacer material layers can be formed over the substrate material layer 9. The spacer material layers may be formed as sacrificial material layers 42 that are subsequently replaced with electrically conductive layers, or may be formed as electrically conductive layers. While embodiments in which sacrificial material layers 42 are employed to form at least one alternating stack (32, 42) are described, other embodiments are expressly contemplated herein in which the spacer material layers are formed as electrically conductive layers (thereby obviating the need to perform replacement processes).

Each insulating layer 32 can include an insulating material, and each sacrificial material layer 42 can include a sacrificial material. An alternating plurality of insulating layers 32 and sacrificial material layers 42 is formed over the in-process source-level material layers. As used herein, a "sacrificial material" refers to a material that is removed during a subsequent processing step.

Insulating materials that can be employed for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The sacrificial material of the sacrificial material layers 42 comprises a material can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. In one embodiment, the sacrificial material layers 42 can be material layers that comprise silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethylorthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the vertically alternating sequence (32, 42) can have a uniform thickness that is substantially invariant within each respective sacrificial material layer 42. The topmost layer among the insulating layers 32 is herein referred to as a topmost insulating layer 32T. The bottommost layer among the insulating layers 32 is herein referred to as a bottommost insulating layer 32B.

Figure 41A:
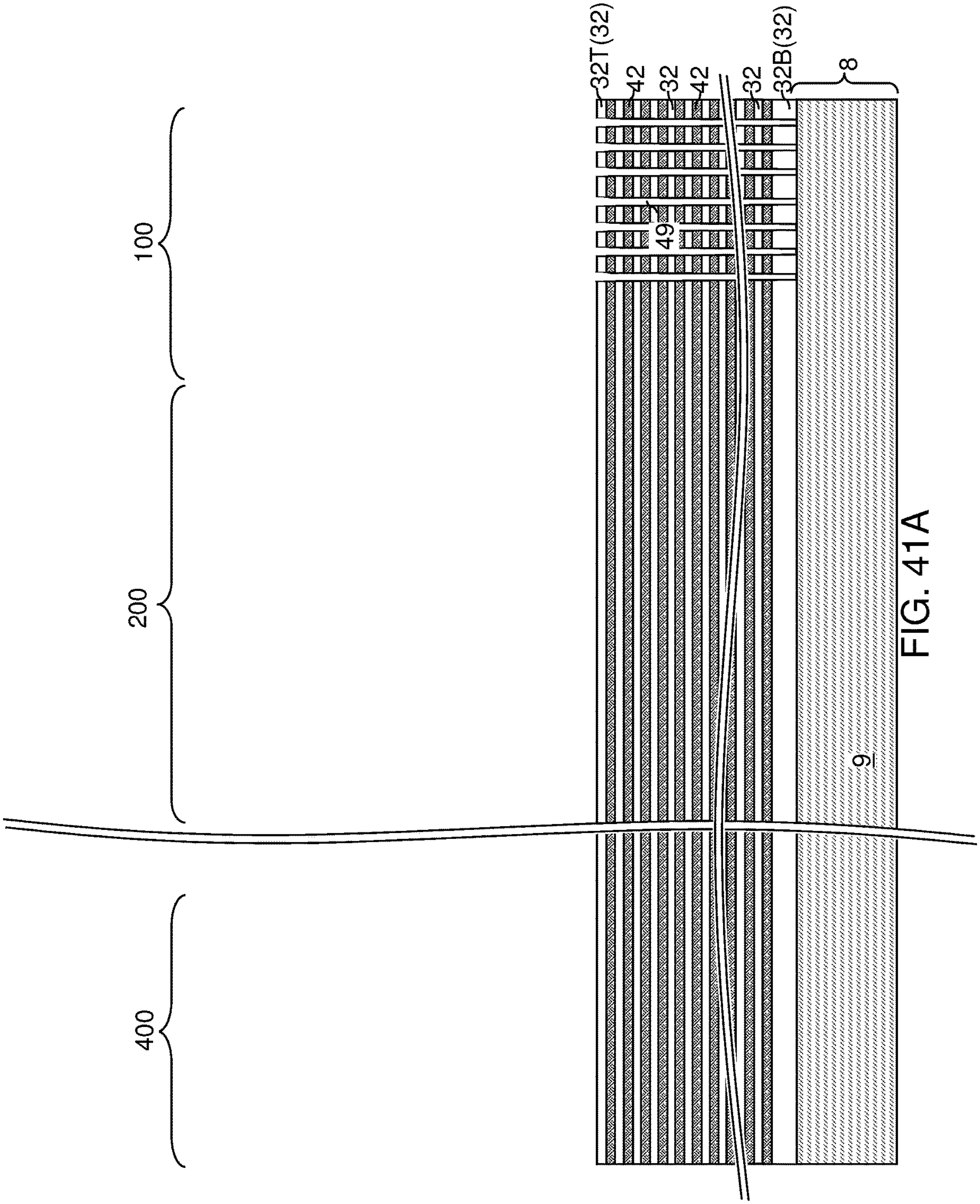
FIG. 41A is a vertical cross-sectional view of the second exemplary structure after formation of memory openings according to an embodiment of the present disclosure.
Figure 41B:
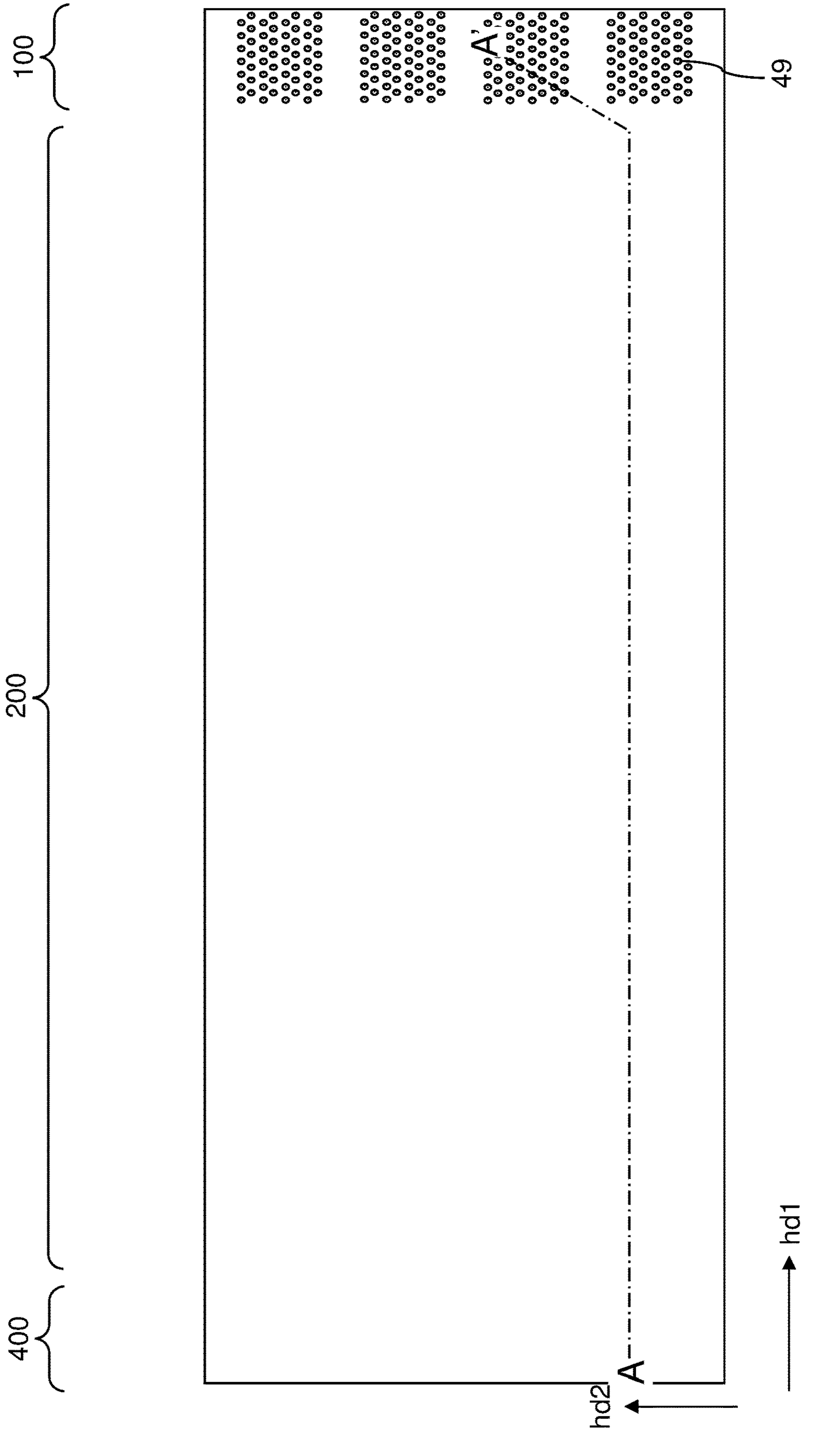
FIG. 41B is a top-down view of the second exemplary structure of FIG. 41A. The hinged vertical plane A-A' is a plane of the vertical cross-sectional view of FIG. 41A.

Referring to FIGS. 41A and 41B, memory openings 49 can be formed through the alternating stack (32, 42) and optionally partly through the semiconductor material layer 9. For example, a photoresist layer (not shown) can be applied over the alternating stack (32, 42), and can be lithographically patterned to form arrays of discrete openings therethrough. The pattern of openings in the photoresist layer can be transferred through the alternating stack (32, 42) and partly through the semiconductor material layer 9 by an anisotropic etch process to form the memory openings 49.

The memory openings 49 are openings that are formed in the memory array region 100 through each layer within the first alternating stack (32, 42) and are subsequently employed to form memory stack structures therein. The bottom surfaces of the memory openings 49 can be recessed surfaces of the lower source-level semiconductor layer 112. Thus, each memory opening 49 can be formed through the source-level sacrificial layer 104, and may have a bottom surface between a horizontal plane including the bottom surface of the lower source-level semiconductor layer 112 and a horizontal plane including the top surface of the lower source-level semiconductor layer 112.

In one embodiment, the memory openings 49 can be formed as clusters that are laterally spaced apart from each other along the second horizontal direction hd2. Each cluster of memory openings 49 can include a respective two-dimensional array of memory openings 49 having a first pitch along one horizontal direction and a second pitch along another horizontal direction. In one embodiment, the direction of the first memory structure pitch can be the first horizontal direction hd1 (e.g., word line direction) and the direction of the second memory structure pitch can be the second horizontal direction hd2 (e.g., bit line direction), or vice versa.

FIGS. 42A-42D provide sequential cross-sectional views of a memory opening 49 during formation of a memory opening fill structure 58. The same structural change occurs in each memory openings 49.

Figure 42B:
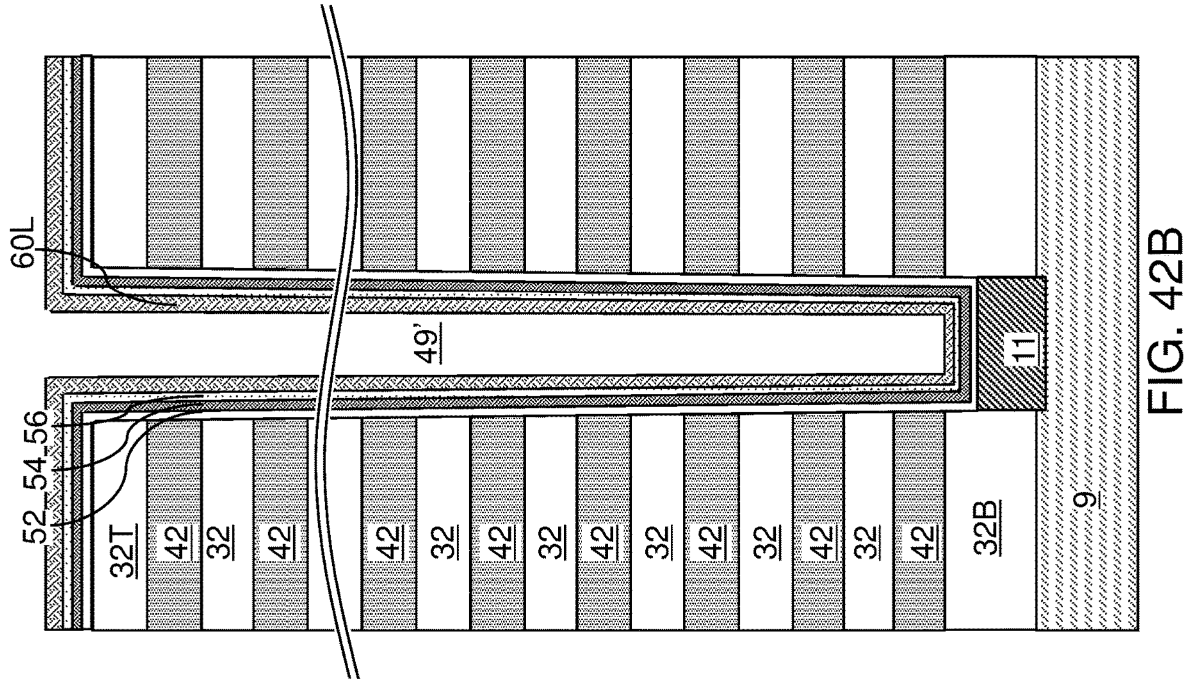
FIGS. 42A-42D are sequential vertical cross-sectional views of the a memory region during formation of a memory opening fill structure according to an embodiment of the present disclosure.
Figure 42A:
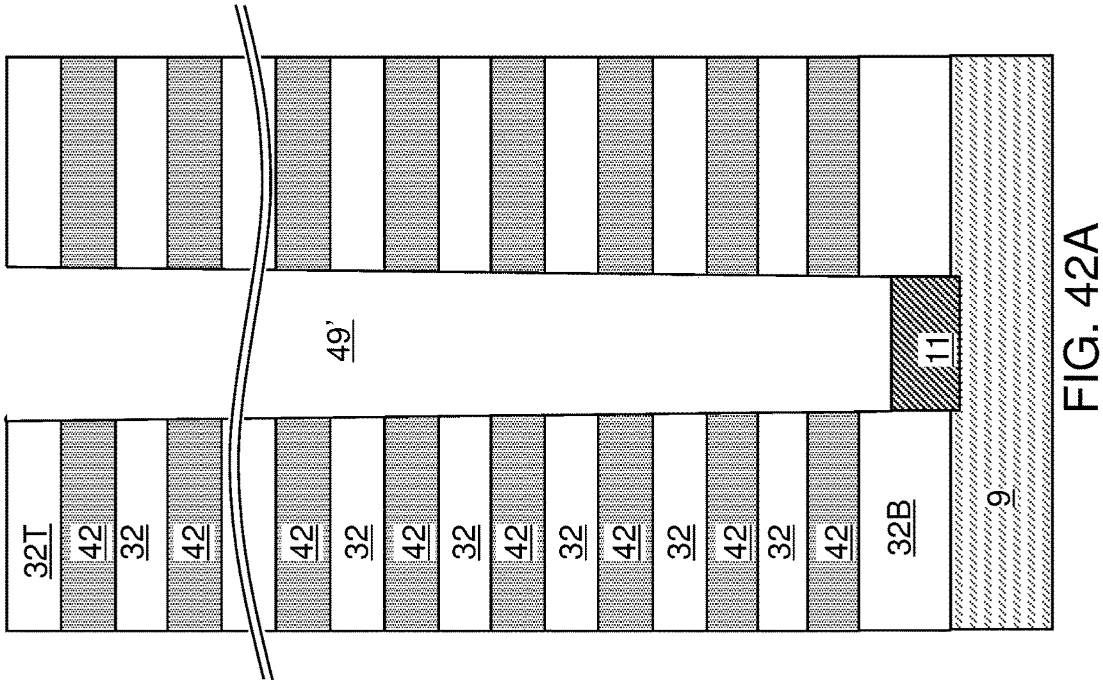

Referring to FIG. 42A, a memory opening 49 in the second exemplary device structure of FIGS. 3A and 3B is illustrated.

Referring to FIG. 42B, a stack of layers including a blocking dielectric layer 52, a memory material layer 54, an optional dielectric liner 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of electric polarization, ferroelectric resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While an embodiment is described in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

Generally, any vertical stack of memory elements known in the art may replace the memory material layer 54. The vertical stack of memory elements can be formed at levels of the sacrificial material layers 42 within each memory opening 49, and may be formed as portions of a continuous memory material layer, or may be formed as discrete memory material portions.

The optional dielectric liner 56, if present, includes a dielectric material. In one embodiment, the optional dielectric liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The optional dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the optional dielectric liner 56 can include a stack of a first silicon oxide layer, a silicon oxynitride layer, and a second silicon oxide layer, which is commonly known as an ONO stack. In one embodiment, the optional dielectric liner 56 can include a silicon oxide layer that is substantially free of carbon or a silicon oxynitride layer that is substantially free of carbon. The thickness of the optional dielectric liner 56 can be in a range from 2 nm to 20 nm, although lesser and greater thicknesses can also be employed. The stack of the blocking dielectric layer 52, the memory material layer 54, and the optional dielectric liner 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Figure 42D:
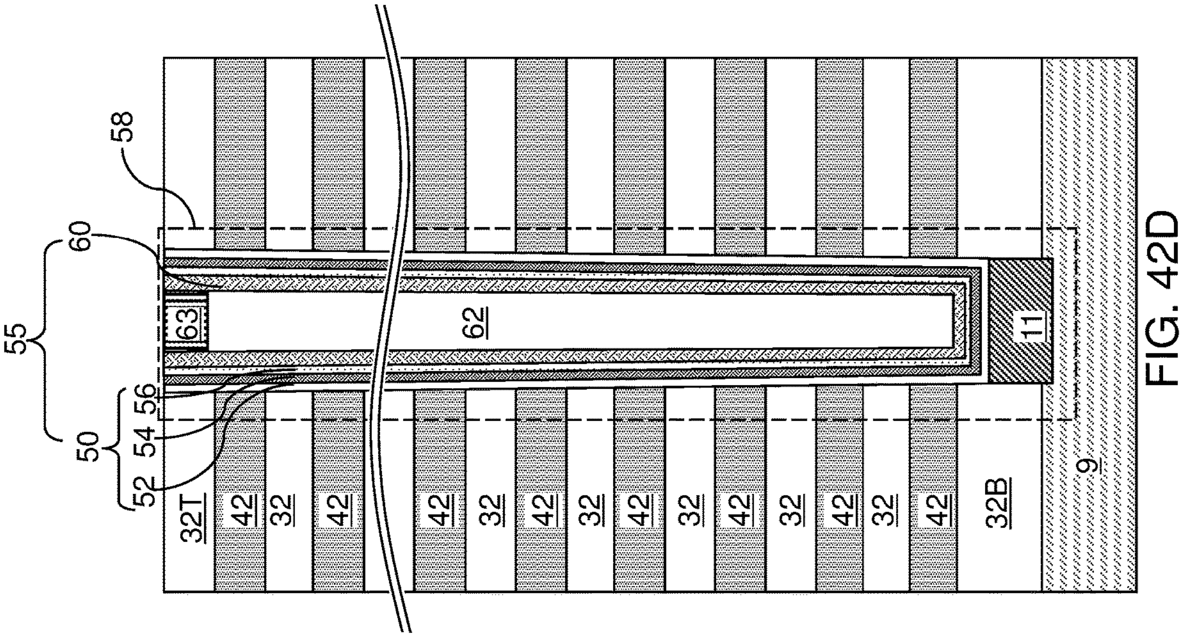
Figure 42C:
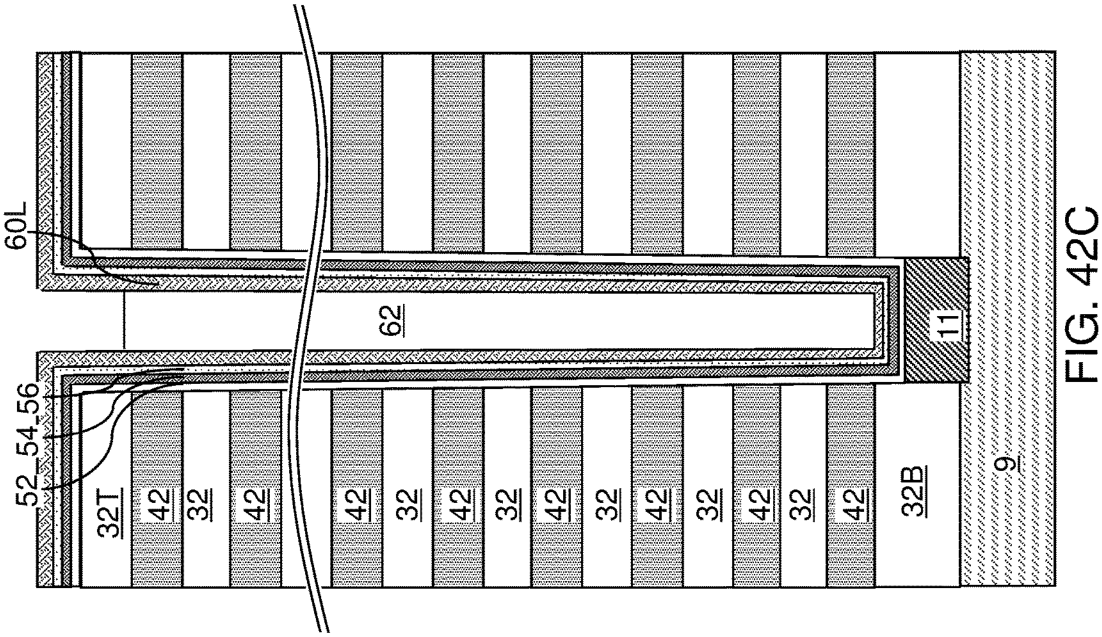

Referring to FIG. 42C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the topmost insulating layer 32T can be removed, for example, by a recess etch. The recess etch continues until top surfaces of the remaining portions of the dielectric core layer are recessed to a height between the top surface of the topmost insulating layer 32T and the bottom surface of the topmost insulating layer 32T. Each remaining portion of the dielectric core layer constitutes a dielectric core 62.

Referring to FIG. 42D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the optional dielectric liner 56, the memory material layer 54, and the blocking dielectric layer 52 that overlie the horizontal plane including the top surface of the topmost insulating layer 32T can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{18}/cm^3$ to $2.0\times10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. An optional dielectric liner 56 is surrounded by a memory material layer 54, and laterally surrounds a vertical semiconductor channel 60. Each adjoining set of a blocking dielectric layer 52, a memory material layer 54, and a optional dielectric liner 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a optional dielectric liner 56, a plurality of memory elements comprises portions of the memory material layer 54, and an optional blocking dielectric layer 52. Each combination of a memory stack structure 55, a dielectric core 62, and a drain region 63 within a memory opening 49 constitutes a memory opening fill structure 58.

Figure 43:
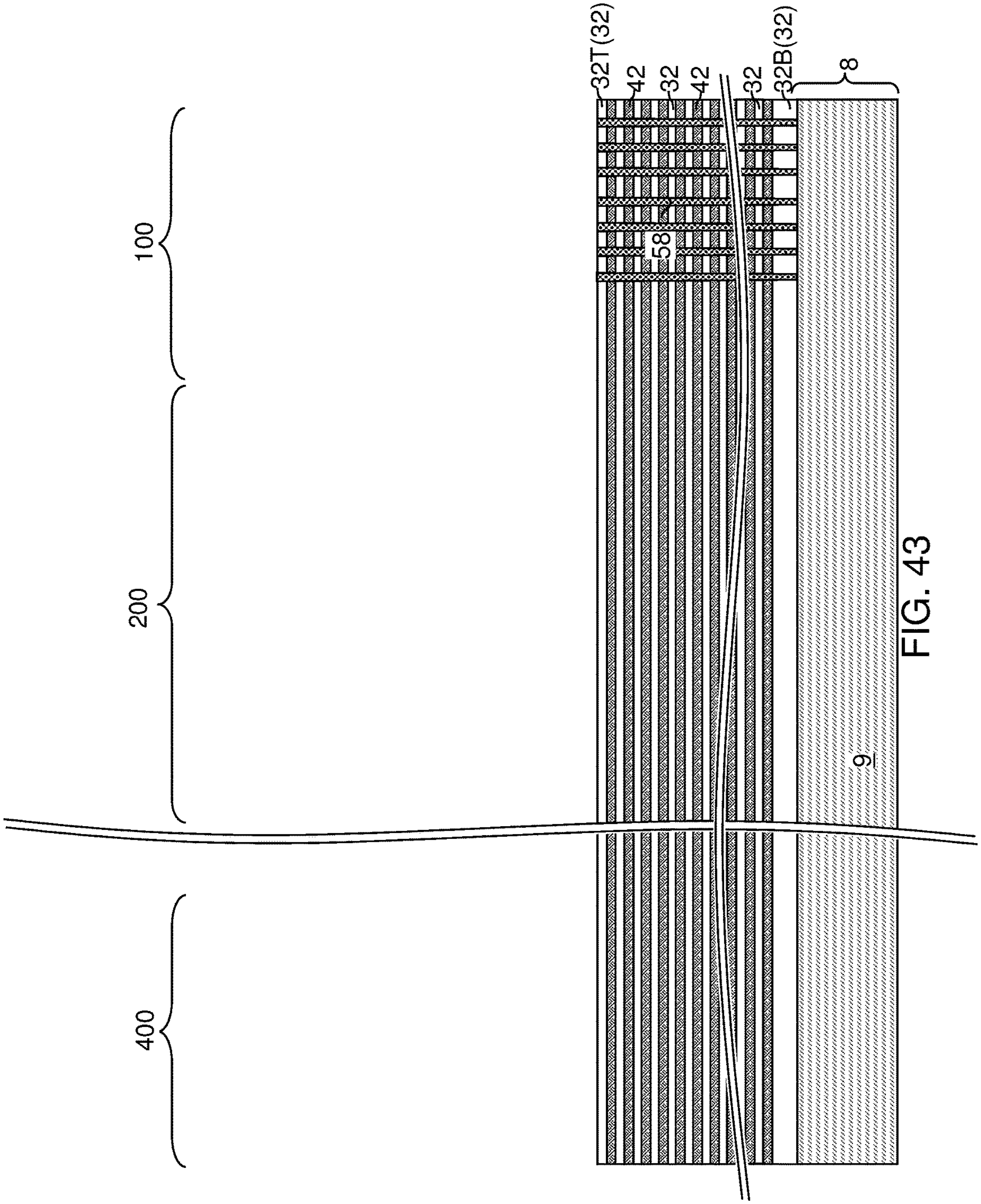
FIG. 43 is a vertical cross-sectional view of the second exemplary structure after formation of memory opening fill structures according to an embodiment of the present disclosure.

Referring to FIG. 43, the second exemplary structure is shown after formation of memory opening fill structures 58 in the memory openings 49. Each memory opening 49 is filled with a respective memory opening fill structure 58. Each memory opening fill structure 58 comprises a respective vertical semiconductor channel 60 and a respective vertical stack of memory elements (e.g., memory cells).

Figure 44A:
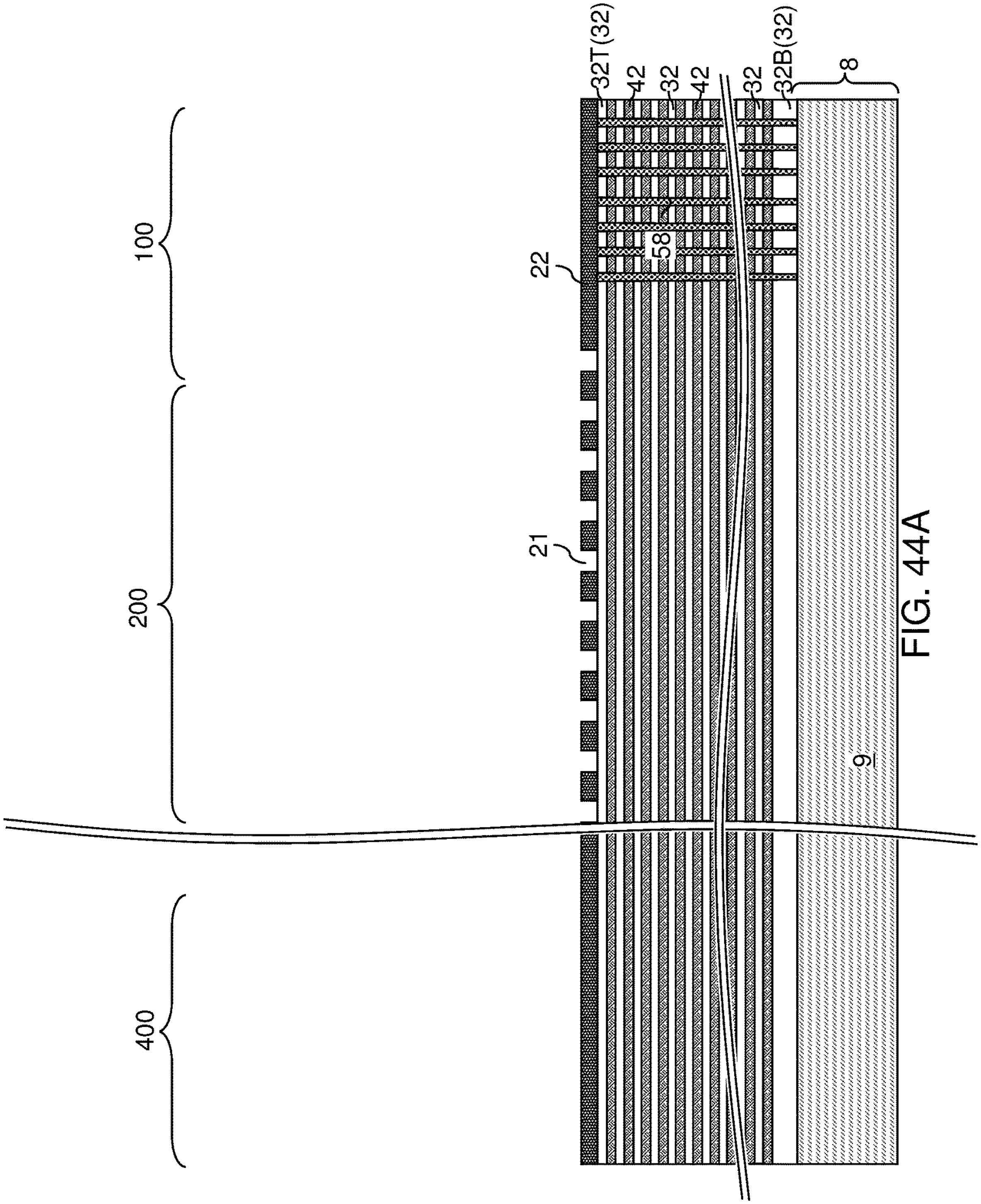
FIG. 44A is a vertical cross-sectional view of the second exemplary structure after formation of a patterned etch mask layer according to an embodiment of the present disclosure.
Figure 44B:
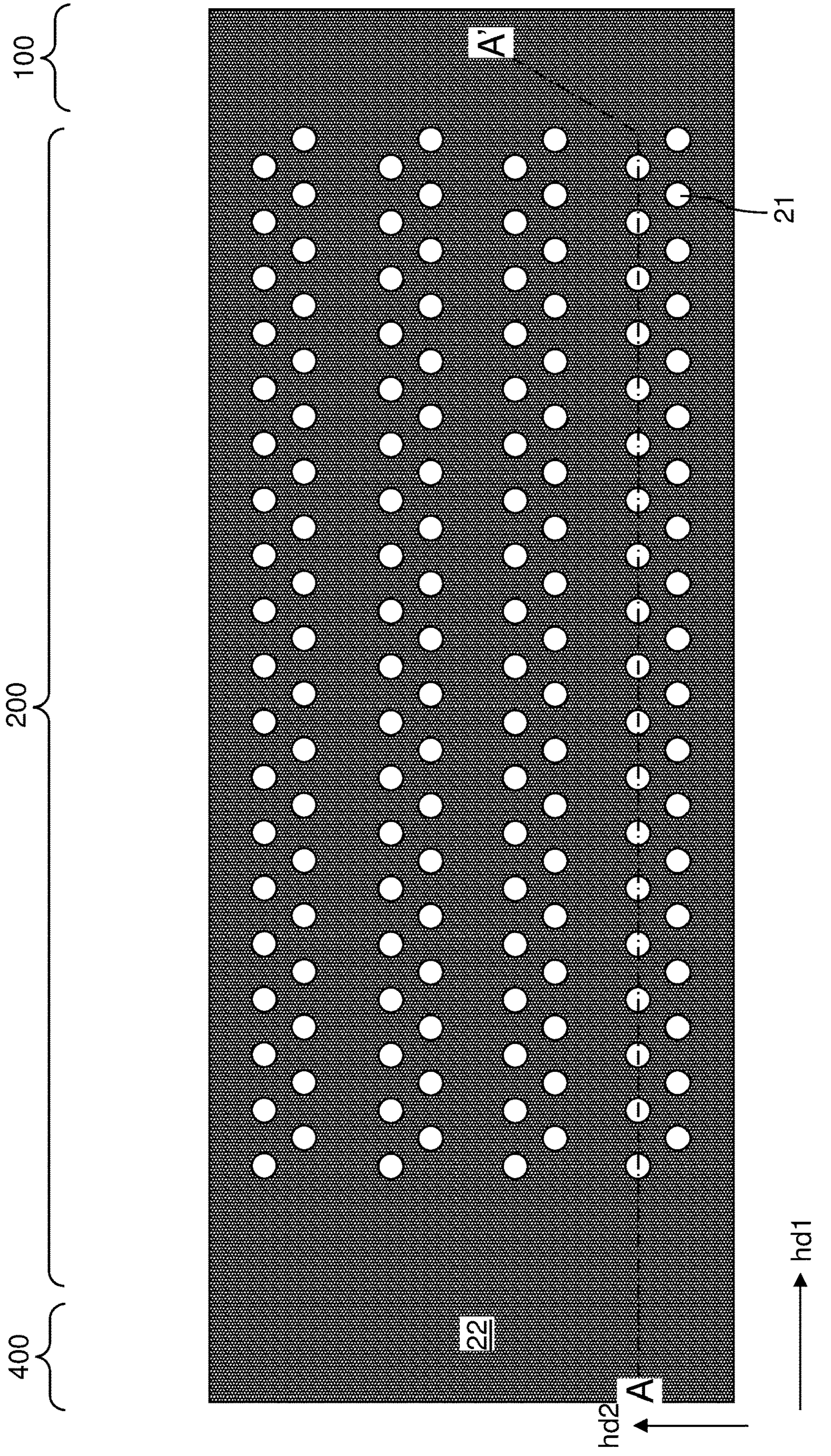
FIG. 44B is a top-down view of the second exemplary structure of FIG. 44A. The hinged vertical plane A-A' is a plane of the vertical cross-sectional view of FIG. 44A.

Referring to FIGS. 44A and 44B, a patterned hard mask layer 22 can be formed over the alternating stack (32, 42) of insulating layers 32 and sacrificial material layers 42. The patterned hard mask layer 22 can be formed by depositing a blanket etch mask layer (i.e., an unpatterned hard mask layer) over the alternating stack (32, 42), by applying a photoresist layer (not shown) over the blanket etch mask layer and lithographically patterning the photoresist layer, and by transferring a pattern in the patterned photoresist layer though the blanket etch mask layer by performing an anisotropic etch process that etches unmasked portions of the blanket etch mask layer that are not covered by the patterned photoresist layer. The patterned photoresist layer can be subsequently removed, for example, by ashing.

The patterned hard mask layer 22 may comprise arrays of mask openings 21. Each array of mask openings 21 comprises a plurality of openings that are located between a respective strip region that laterally extends along the first horizontal direction hd1. Generally, the arrays of mask openings 21 may be laterally spaced apart along the second horizontal direction hd2. Each array of mask openings 21 may be laterally offset along the first horizontal direction hd1 from a respective array of memory opening fill structures 58 located in the memory array region 100. The patterned hard mask layer 22 may be composed of a hard mask material. A hard mask material refers to a non-ashable mask material, i.e., a material that cannot be removed employing normal ashing processes. In contrast, a photoresist material is an ashable material, and thus, is not a hard mask material. In one embodiment, the patterned hard mask layer 22 may comprise a metallic material (such as TiN, TaN, WN, Ti, Ta, W, Ru, etc.) and/or an inorganic dielectric material (such as silicon nitride, silicon carbide, silicon carbide nitride, or at least one dielectric metal oxide material). The thickness of the patterned hard mask layer 22 may be in a range from 100 nm to 1,000 nm, although lesser and greater thicknesses may also be employed.

FIGS. 45A-45J are sequential vertical cross-sectional view of a contact region during formation of in-process layer contact assemblies 26 according to the second embodiment of the present disclosure.

Figure 45A:
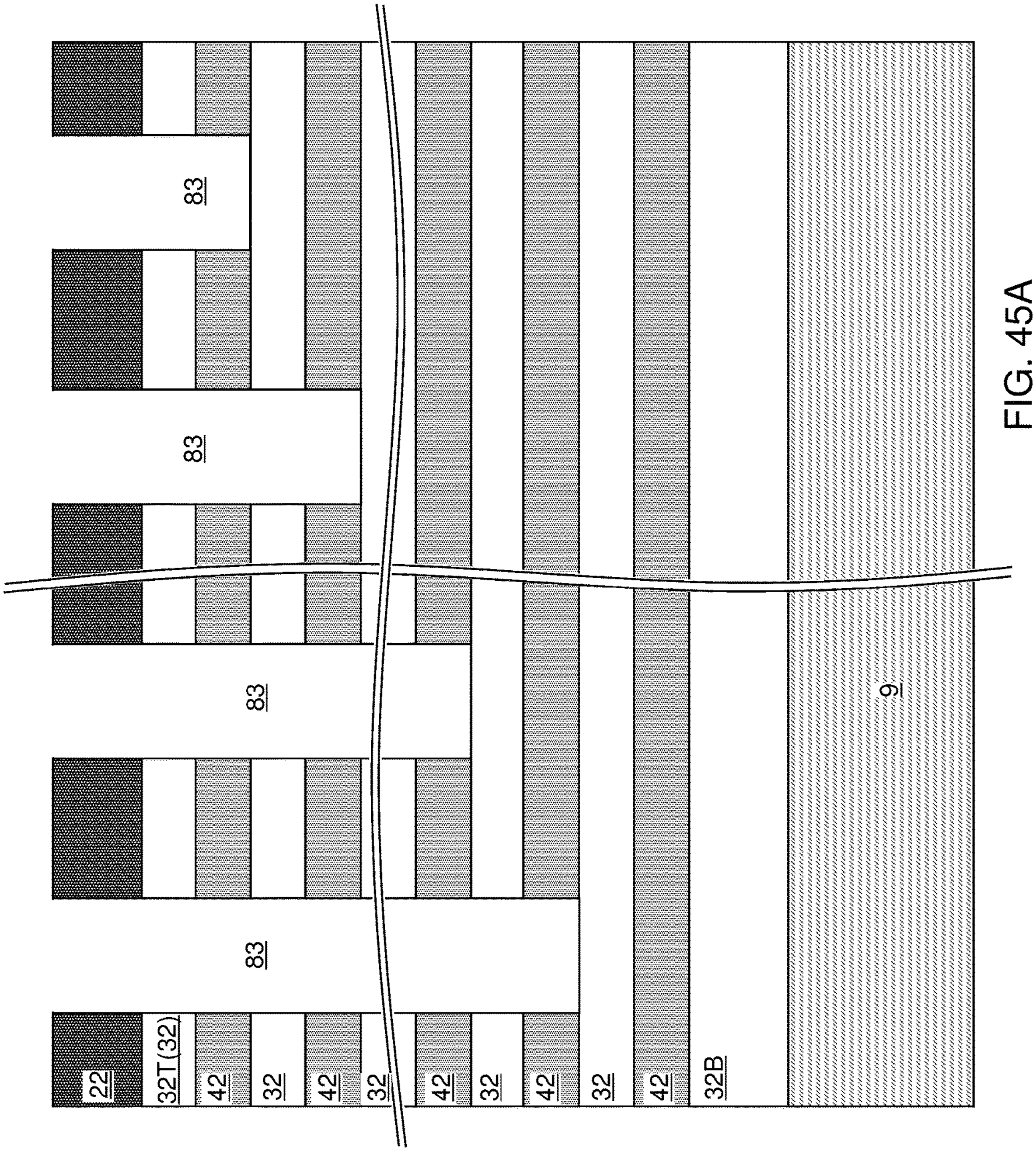
FIGS. 45A-45J are sequential vertical cross-sectional view of a contact region during formation of in-process side-contact via structures according to an embodiment of the present disclosure.

Referring to FIG. 45A, a combination of an etch mask formation process and an anisotropic etch process may be repeated N times with variations in the patterns of openings in the etch masks and with changes in the duration of the anisotropic etch processes. The integer N may be in integer from 2 to 10, such as from 3 to 8.

For each i-th iteration of the combination of an etch mask formation process and an anisotropic etch process for which the integer i runs from 1 to N, an i-th masking layer, such as an i-th photoresist, can be applied over the patterned hard mask layer 22, and can be lithographically patterned to form openings therethrough. The areas of the pattern of the openings in the i-th masking layer includes areas of an i-th subset of the mask openings 21 in the patterned hard mask layer 22. In one embodiment, the i-th subset of the mask openings 21 may comprise about one half of all i-th subset of the mask openings 21.

An i-th anisotropic etch process can be performed to transfer the pattern of the openings in the i-th masking layer through a respective set of F(i) insulating layers 32 and F(i) sacrificial material layers 42 within each opening in the i-th masking layer. In one embodiment, each function F(i) may have a different positive integer value for each integer value i. In one embodiment, the value of each function F(i) may be positive integers that are integer powers of 2. In an illustrative example, F(i) may be 2(i−1). In another example, F(i) may be 2(N−i). In yet another example, the set of all values for F(i), $0<i<N+1$, may include all integer powers of 2 between 1 and 2N−1 in any order. In still another example, the set of all values of F(i) may include any set of non-overlapping positive integers less than 2N−1.

In one embodiment, the insulating layers 32 can include silicon oxide and the sacrificial material layers 42 can include a sacrificial material such as silicon nitride. In this case, an anisotropic etch process that etches F(i) pairs of insulating layers 32 and sacrificial material layers 42 can include F(i) iterations of a first anisotropic etch step that etches the sacrificial material of the sacrificial material layers 42 selective to silicon oxide, and a second anisotropic etch step that etches silicon oxide selective to the sacrificial material of the sacrificial material layers 42. The i-th subset of the in-process contact openings 83 can be vertically extended through a respective contiguous set of F(i) sacrificial material layers 42 and F(i) insulating layers 32. The i-th subset of the in-process contact openings 83 can be vertically extended through a respective contiguous set of F(i) sacrificial material layers 42 and F(i) insulating layers 32. The i-th masking layer can be subsequently removed, for example, by ashing and/or selective etching.

Generally, the masking patterns for the N masking layers (which may be N patterned photoresist layers) and the set of values for F(i), $0<i<N+1$, may be selected such that via openings, which are herein referred to as in-process contact openings 83, that are formed underneath the mask openings 21 in the patterned photoresist layer have different depths. In one embodiment, the masking patterns for the N masking layers (which may be N patterned photoresist layers) and the set of values for F(i), $0<i<N+1$, may be selected such that each sacrificial material layer 42 other than the bottommost sacrificial material layer 42 is physically exposed to a respective in-process contact opening 83 within each array of in-process contact openings 83 that underlie a respective array of mask openings 21. Each array of in-process contact openings 83 may be formed between a respective pair of strip regions in the patterned hard mask layer 22 that are free of any mask opening 21 therein.

Generally, at least one alternating stack of insulating layers 32 and sacrificial material layers 42 can be formed over the substrate 8, and in-process contact openings 83 can be formed through the at least one alternating stack (32, 42). According to an aspect of the present disclosure, each of the in-process contact openings 85 vertically extends through a respective first subset of layers within the alternating stack (32, 42).

Figure 45B:
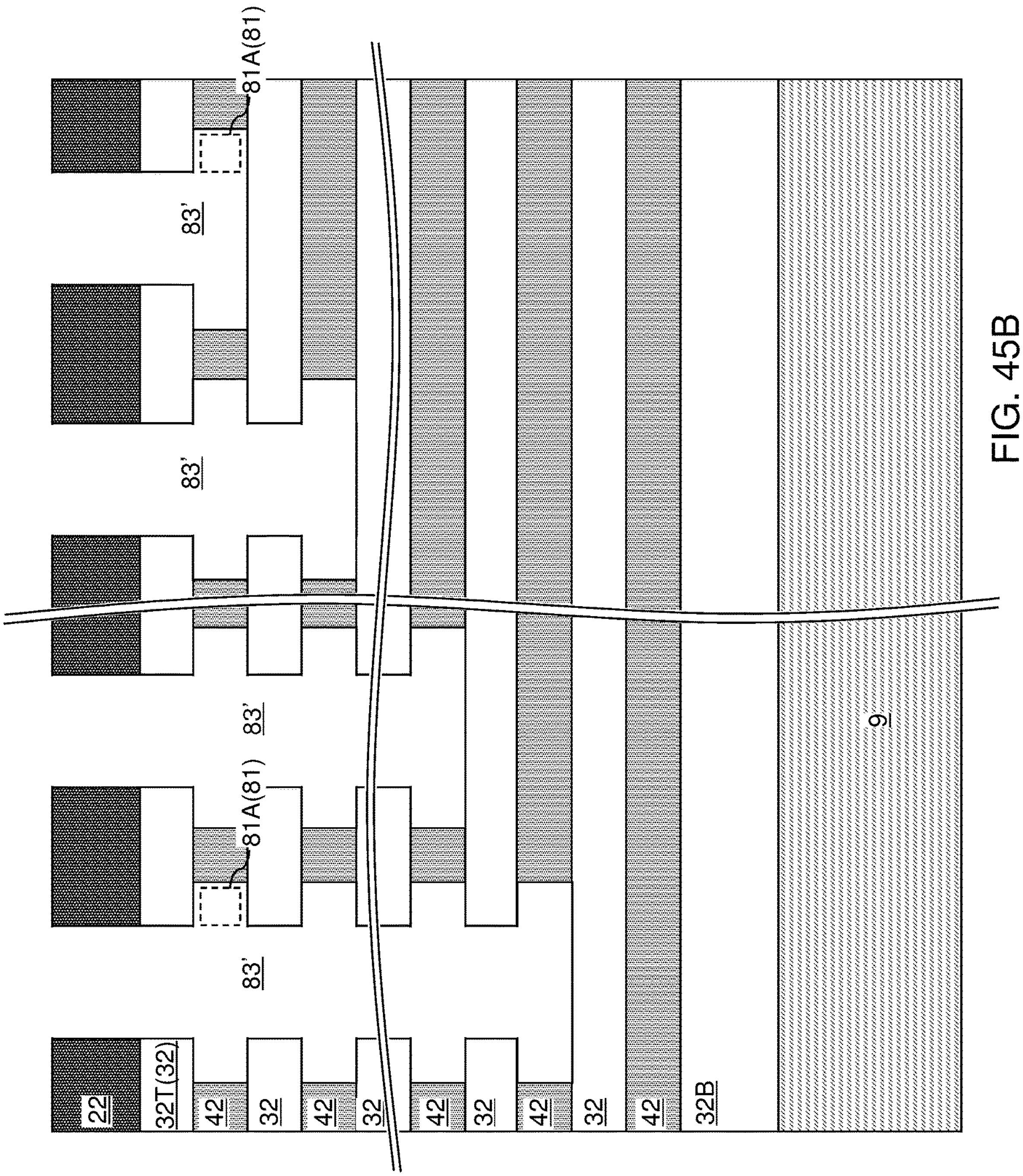

Referring to FIG. 45B, a first selective isotropic etch process can be performed to isotropically etch the material of the sacrificial material layers 42 selective to the material of the insulating layers 32. First annular cavities 81A can be formed at each level of physically exposed sacrificial material layers 42 around each in-process contact opening 83. The first annular cavities 81A are a first subset of annular cavities 81 that are formed around contact openings that are formed underneath the mask openings 21 in the hard mask layer 22. In an illustrative example, the insulating layers 32 may comprise silicon oxide, the sacrificial material layers 42 may comprise silicon nitride, and the first selective isotropic etch process may comprise a timed wet etch process employing phosphoric acid. The duration of the first selective isotropic etch process may be selected such that the lateral etch distance may be in a range from 5 nm to 100 nm, such as from 10 nm to 50 nm, although lesser and greater lateral etch distances may also be employed. The first annular cavities 81A are formed within annular volumes from which the material of the sacrificial material layers 42 are removed. Each contiguous combination of an in-process contact opening 83 and at least one first annular cavity 81A constitutes a finned opening 83', which is also referred to as a finned cavity.

Figure 45C:
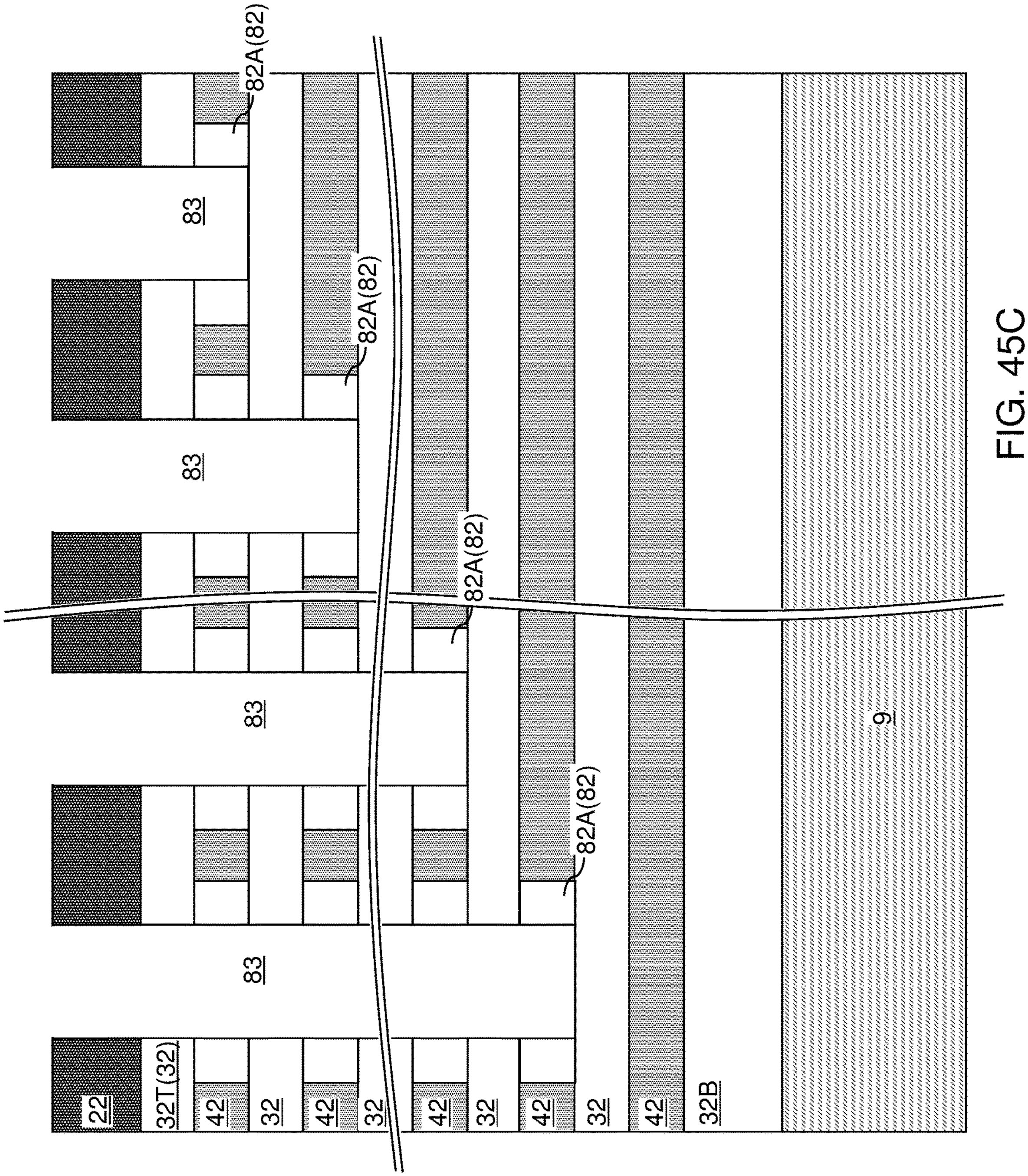

Referring to FIG. 45C, a dielectric fill material such as undoped silicate glass (e.g., silicon oxide), a doped silicate glass, or a dielectric metal oxide material can be conformally deposited in the first annular cavities 81A. An anisotropic etch process can be performed to remove portions of the dielectric fill material that are deposited outside the volume of the first annular cavities 81A. Each remaining portion of the dielectric fill material that fills a respective first annular cavity 81A is herein referred to as a first annular dielectric spacer 82A, or as an upper annular dielectric spacer 82A The first annular dielectric spacers 82A are a first subset of annular dielectric spacers 82 that are formed around via openings underneath the mask openings 21 in the patterned hard mask layer 22. Generally, the first annular dielectric spacers 82A (i.e., the first subset of the annular dielectric spacers 82) can be formed by replacing proximal portions of the sacrificial material layers 42 with dielectric material portions around the in-process contact openings 83. In one embodiment, inner cylindrical sidewalls of the first annular dielectric spacers 82A may be vertically coincident with (i.e., located within a same vertical plane as) physically exposed sidewalls of the insulating layers 32 around each in-process contact opening 83.

Figure 45D:
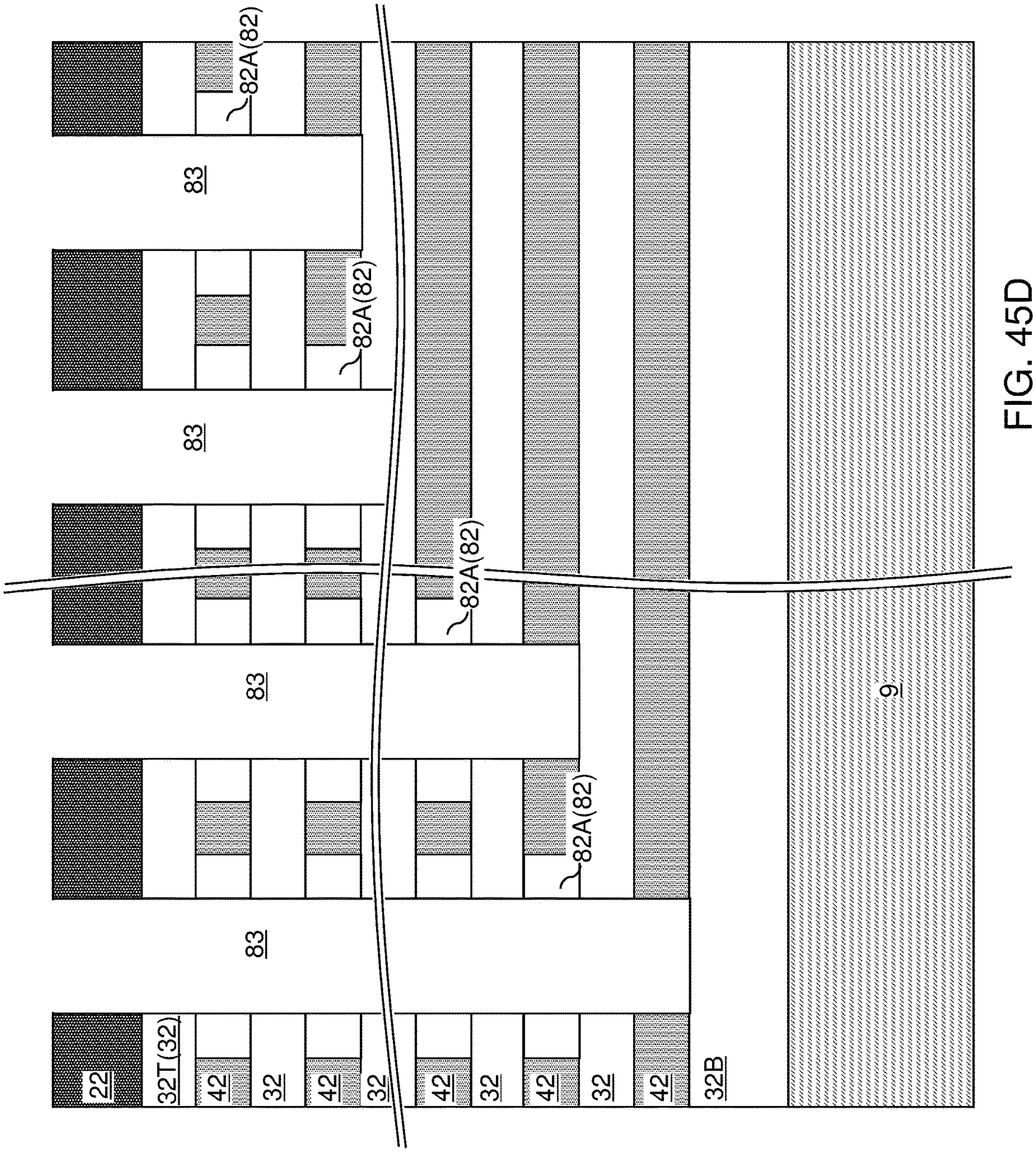

Referring to FIG. 45D, an anisotropic etch process can be performed to vertically extend each in-process contact opening 83 through a respective underlying pair of an insulating layer 32 and a sacrificial material layer 42. The patterned hard mask layer 22 is employed as an etch mask during the anisotropic etch process. Each in-process contact opening 83 can be vertically extended downward through a respective underlying insulating layer 32 and a respective underlying spacer material layer (such as a respective underlying sacrificial material layer 42) within the at least one alternating stack (32, 42) that are located underneath the bottom surface of the respective in-process contact opening 83. A cylindrical sidewall of the underlying sacrificial material layer 42 can be physically exposed to each vertically extended in-process contact opening 83.

Figure 45E:
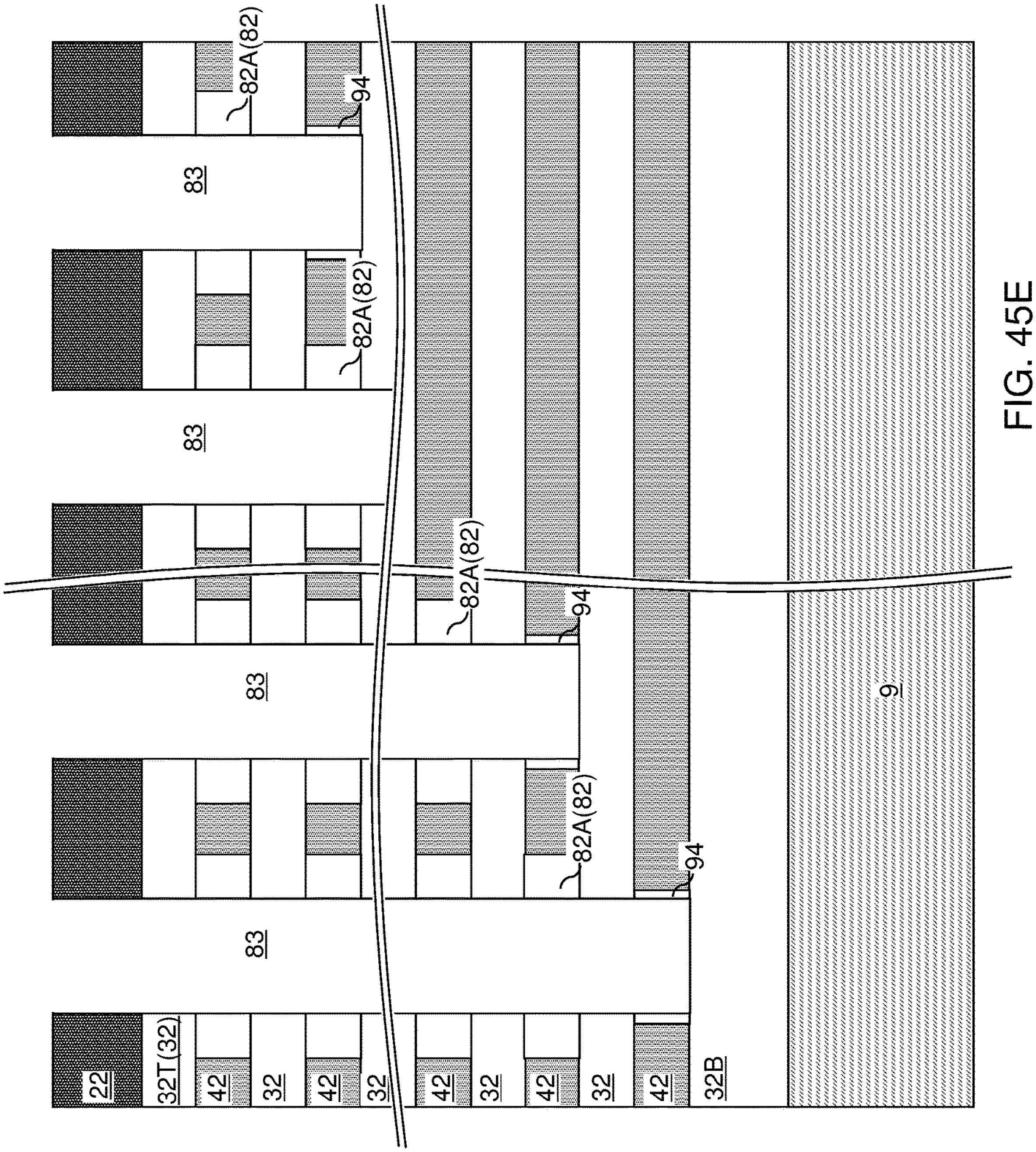

Referring to FIG. 45E, annular sacrificial spacers 94 can be formed on remaining portions of a respective underlying spacer material layer 42 after vertically extending the in-process contact openings 83. In other words, the annular sacrificial spacers 94 can be formed on each portion of the sacrificial material layers 42 that are physically exposed to the in-process contact openings. In one embodiment, each of the annular sacrificial spacers 94 may be self-aligned to the physically exposed sidewalls of the sacrificial material layers 42.

In an illustrative example, the sacrificial material layers 42 may be composed of a silicon nitride material, and the annular sacrificial spacers 94 may be formed by oxidation of physically exposed surface portions of the sacrificial material layers 42. The oxidation process may comprise a thermal oxidation process or a plasma oxidation process. In this case, the annular sacrificial spacers 94 may comprise silicon oxide and/or silicon oxynitride. In one embodiment, the annular sacrificial spacers 94 may be formed by oxidation of tubular surface portions of physically exposed spacer material layers, which may be embodied as the sacrificial material layers 42.

In an alternative example, the sacrificial material layers 42 may be isotropically recessed relative to the insulating layers 32 to form annular recesses which have a smaller lateral width (i.e., thickness) than that of the finned annular cavities 81A. A dielectric fill material may be conformally deposited in the annular recesses, and an anisotropic etch process may be performed to remove portions of the dielectric fill material that are deposited outside the volumes of the annular recesses. Portions of the dielectric fill material that fill the annular recesses constitute the annular sacrificial spacers 94.

The lateral thickness of each annular sacrificial spacer 94 may be less than the lateral thickness of each first annular dielectric spacer 82A. As used herein, a lateral thickness of an annular element refers to a lateral distance between an inner sidewall and an outer sidewall. In one embodiment, the lateral thickness of each annular sacrificial spacer 94 may be less than the lateral thickness of each first annular dielectric spacer 82A by at least 30%, such as 50% to 300%. In one embodiment, the lateral thickness of each annular sacrificial spacer 94 may be in range from 1 nm to 20 nm, such as from 2 nm to 10 nm, although lesser and greater lateral thicknesses may also be employed.

Figure 45F:
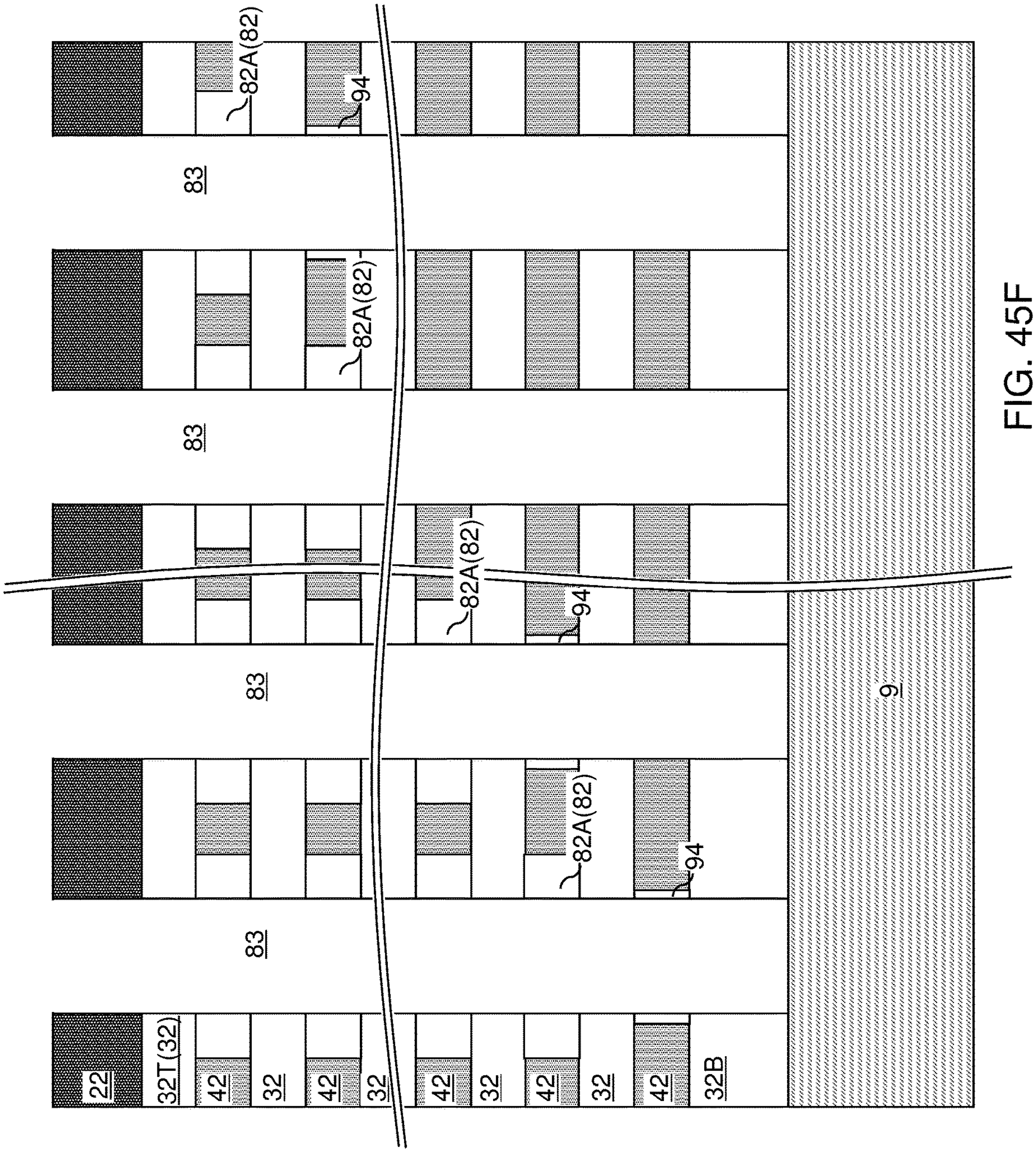

Referring to FIG. 45F, the in-process contact openings 83 may be vertically extended further downward after formation of the annular sacrificial spacers 94 by performing an additional anisotropic etch process. The etch chemistry of the additional anisotropic etch process may be selected such that the additional anisotropic etch process etches through the insulating layers 32 and the sacrificial material layers 42 underneath the in-process contact openings 83. The additional anisotropic etch process may have an etch chemistry that is selective to a semiconductor material in the semiconductor material layer 9. The anisotropic etch process vertically extends the in-process contact openings 83 through each layer in the alternating stack (32, 42), and each of the in-process contact openings 83 reaches a maximum height. Each of the in-process contact openings 83 becomes a contact opening 85 after the additional anisotropic etch process. In one embodiment, a top surface of a semiconductor material layer 9 can be physically exposed underneath each contact opening 85 after the additional anisotropic etch process.

Figure 45G:
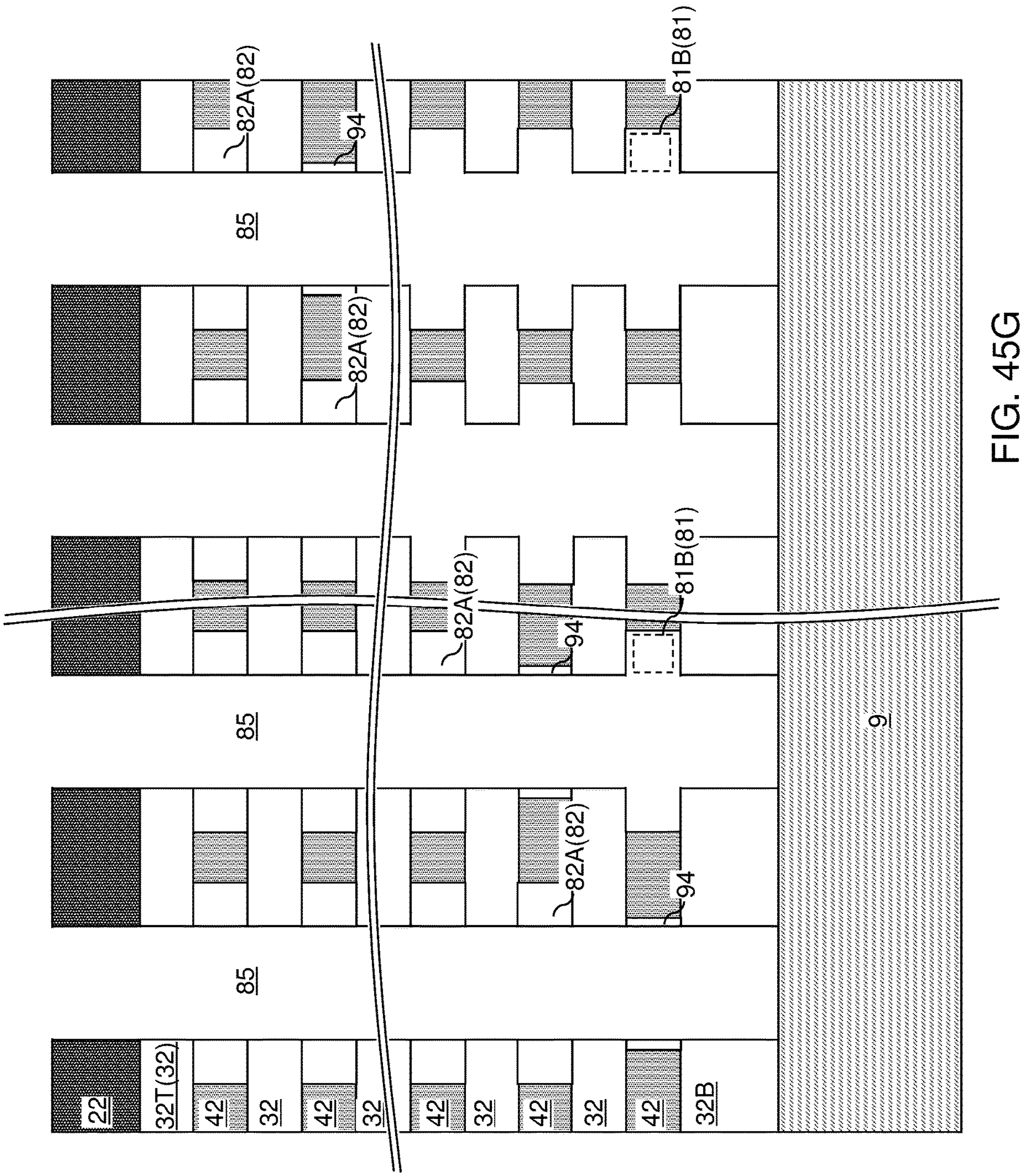

Referring to FIG. 45G, a second selective isotropic etch process can be performed to isotropically etch the material of the sacrificial material layers 42 selective to the material of the insulating layers 32. Second annular cavities 81B can be formed at each level of physically exposed sacrificial material layers 42 around each contact opening 85. The second annular cavities 81B are a second subset of annular cavities 81 that are formed around contact openings 85. In an illustrative example, the insulating layers 32 may comprise silicon oxide, the sacrificial material layers 42 may comprise silicon nitride, and the second selective isotropic etch process may comprise a timed wet etch process employing phosphoric acid. The duration of the second selective isotropic etch process may be selected such that the lateral etch distance may be in a range from 5 nm to 100 nm, such as from 10 nm to 50 nm, although lesser and greater lateral etch distances may also be employed. The second annular cavities 81B are formed within annular volumes from which the material of the sacrificial material layers 42 are removed. Each contiguous combination of a contact opening 85 and at least one second annular cavity 81B constitutes a finned opening, which is also referred to as a finned cavity.

Figure 45H:
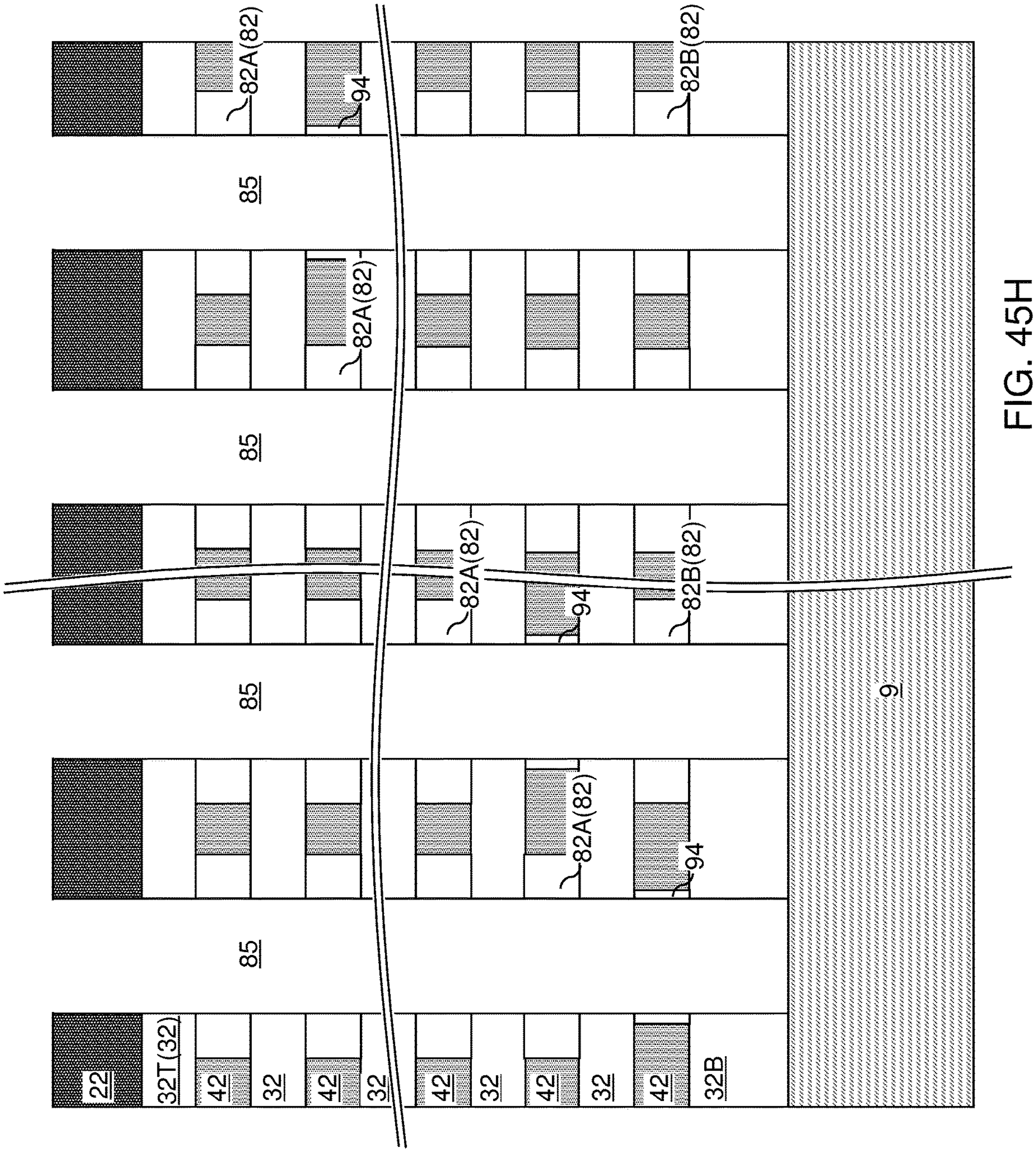

Referring to FIG. 45H, a dielectric fill material such as undoped silicate glass, a doped silicate glass, or a dielectric metal oxide material can be conformally deposited in the second annular cavities 81B. An anisotropic etch process can be performed to remove portions of the dielectric fill material that are deposited outside the volume of the second annular cavities 81B. Each remaining portion of the dielectric fill material that fills a respective second annular cavity 81B is herein referred to as a second annular dielectric spacer 82B, or a lower annular dielectric spacer 82B. The second annular dielectric spacers 82B are a second subset of annular dielectric spacers 82 that are formed around contact openings 85. Generally, the second annular dielectric spacers 82B (i.e., the second subset of the annular dielectric spacers 82) can be formed by replacing proximal portions of the sacrificial material layers 42 with dielectric material portions around the contact openings 85 after formation of the annular sacrificial spacers 94. In one embodiment, inner cylindrical sidewalls of the second annular dielectric spacers 82B may be vertically coincident with (i.e., located within a same vertical plane as) physically exposed sidewalls of the insulating layers 32 around each contact opening 85. In one embodiment, the second annular dielectric spacers 82B may comprise the same material as the first annular dielectric spacers 82A. In one embodiment, the annular dielectric spacers 82 may comprise a dielectric material such as undoped silicate glass (e.g., silicon oxide), a doped silicate glass, or a dielectric metal oxide material.

Generally, a combination of a contact opening 85 and a vertical stack of annular dielectric spacers 82 and an annular sacrificial spacer 94 can be formed through at least one alternating stack (32, 42) of insulating layers 32 and spacer material layers underneath each mask opening 21 in the patterned hard mask layer 22. In one embodiment, plural annular dielectric spacers 82 and one annular sacrificial spacer 94 may be exposed in each contact opening 85. For a subset of the combinations of a respective contact opening 85 and a respective vertical stack of annular dielectric spacers 82 and a respective annular sacrificial spacer 94, the vertical stack of annular dielectric spacers 82 may comprise at least one upper annular dielectric spacer 82A overlying the annular sacrificial spacer 94, and at least one lower annular dielectric spacer 82B underlying the annular sacrificial spacer 94. One of the spacer material layers (such as the sacrificial material layer 42) may be laterally spaced from the contact opening 85 by the annular sacrificial spacer 94.

In one embodiment, the lateral thickness of each annular sacrificial spacer 94 may be less than the lateral thickness of each annular dielectric spacers 82 (i.e., 82A and 82B). In one embodiment, the lateral thickness of each annular sacrificial spacer 94 may be less than the lateral thickness of each annular dielectric spacers 82 (e.g., first and second annular dielectric spacers (82A, 82B)) by at least 30%, such as 50% to 300%. In one embodiment, a top surface of the substrate material layer 9 may be physically exposed underneath the contact opening 85.

Figure 45I:
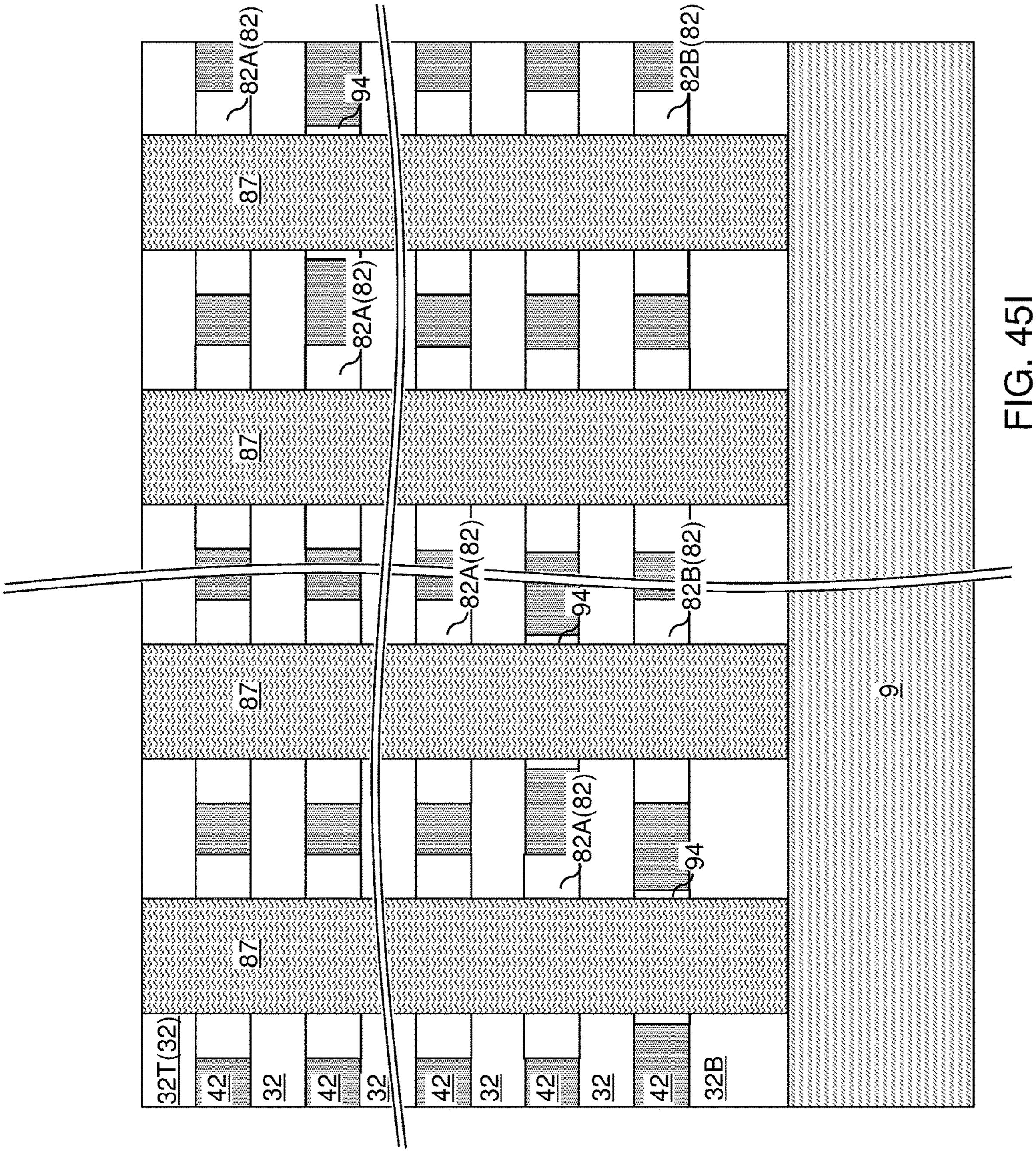

Referring to FIG. 45I, a sacrificial fill material can be deposited into the contact openings 85. The sacrificial fill material comprises a material that can be subsequently removed selective to materials of the annular dielectric spacers 82, the annular sacrificial spacers 94, and the insulating layers 32. For example, the sacrificial fill material may comprise a semiconductor material (such as amorphous silicon, polysilicon, or a silicon-germanium alloy), a carbon-based material (such as amorphous carbon or diamond-like carbon), organosilicate glass, a polymer material, etc. Excess portions of the sacrificial fill material may be removed from above the horizontal plane including the top surface of the topmost insulating layer 32T. The patterned hard mask layer 22 may be removed selective to the materials of the topmost insulating layer 32T and the sacrificial fill material, for example, employing an etch process such as a wet etch process. Each remaining portion of the sacrificial fill material that fills a respective contact opening 85 constitutes a sacrificial contact opening fill structure 87. Each of the sacrificial contact opening fill structure 87 may have a respective cylindrical shape. In one embodiment, top surfaces of the sacrificial contact opening fill structures 87 may be formed within the horizontal plane including the top surface of the topmost insulating layer 32T. Each contiguous combination of a sacrificial contact opening fill structure 87, a vertical stack of annular dielectric spacers 82, and an annular sacrificial spacer 94 is herein referred to as an in-process layer contact assembly 26. Arrays of in-process layer contact assemblies 26 are formed through the at least one alternating stack (32, 42) of insulating layers 32 and spacer material layers (such as sacrificial material layers 62).

Figure 45J:
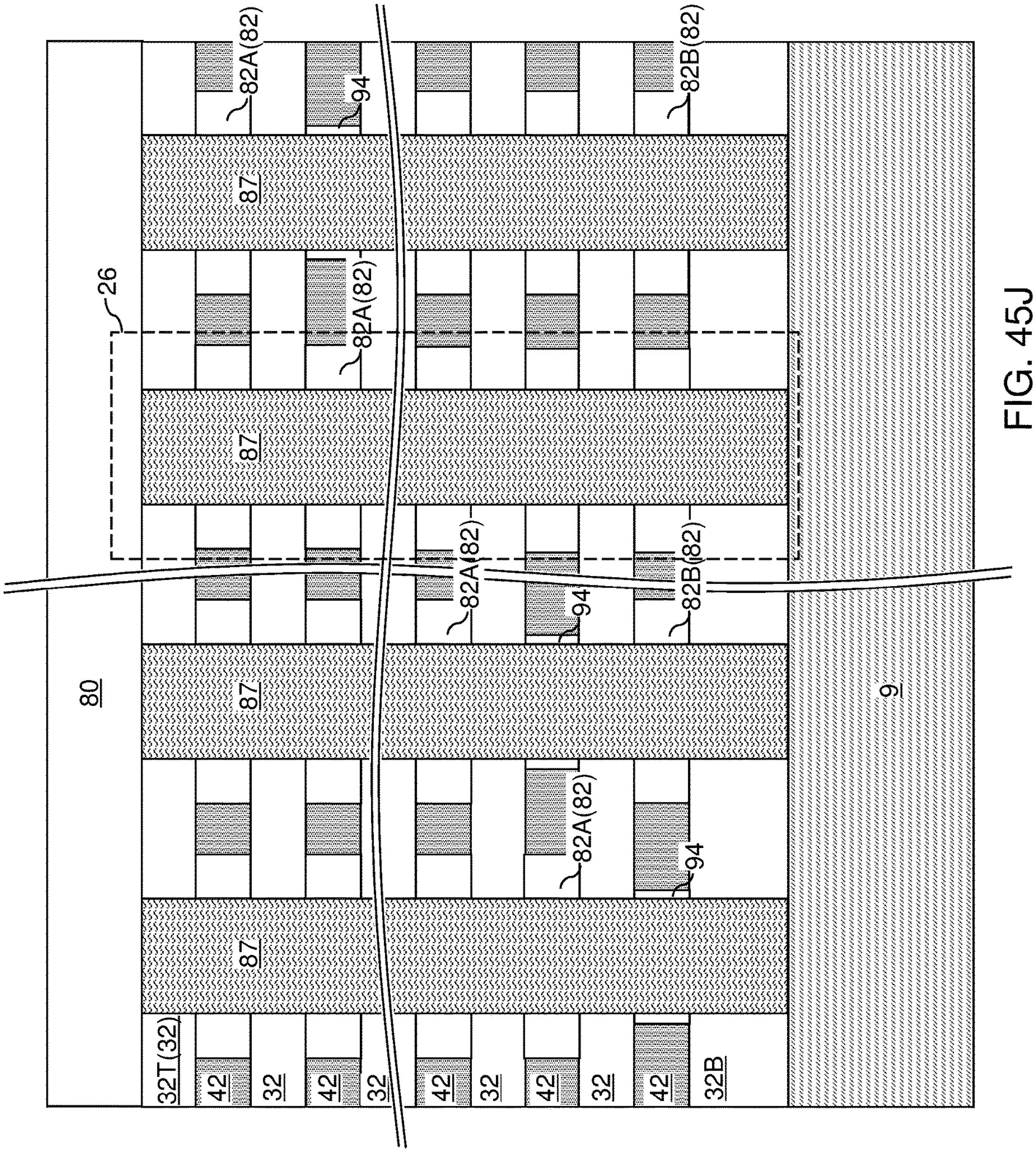
Figure 46:
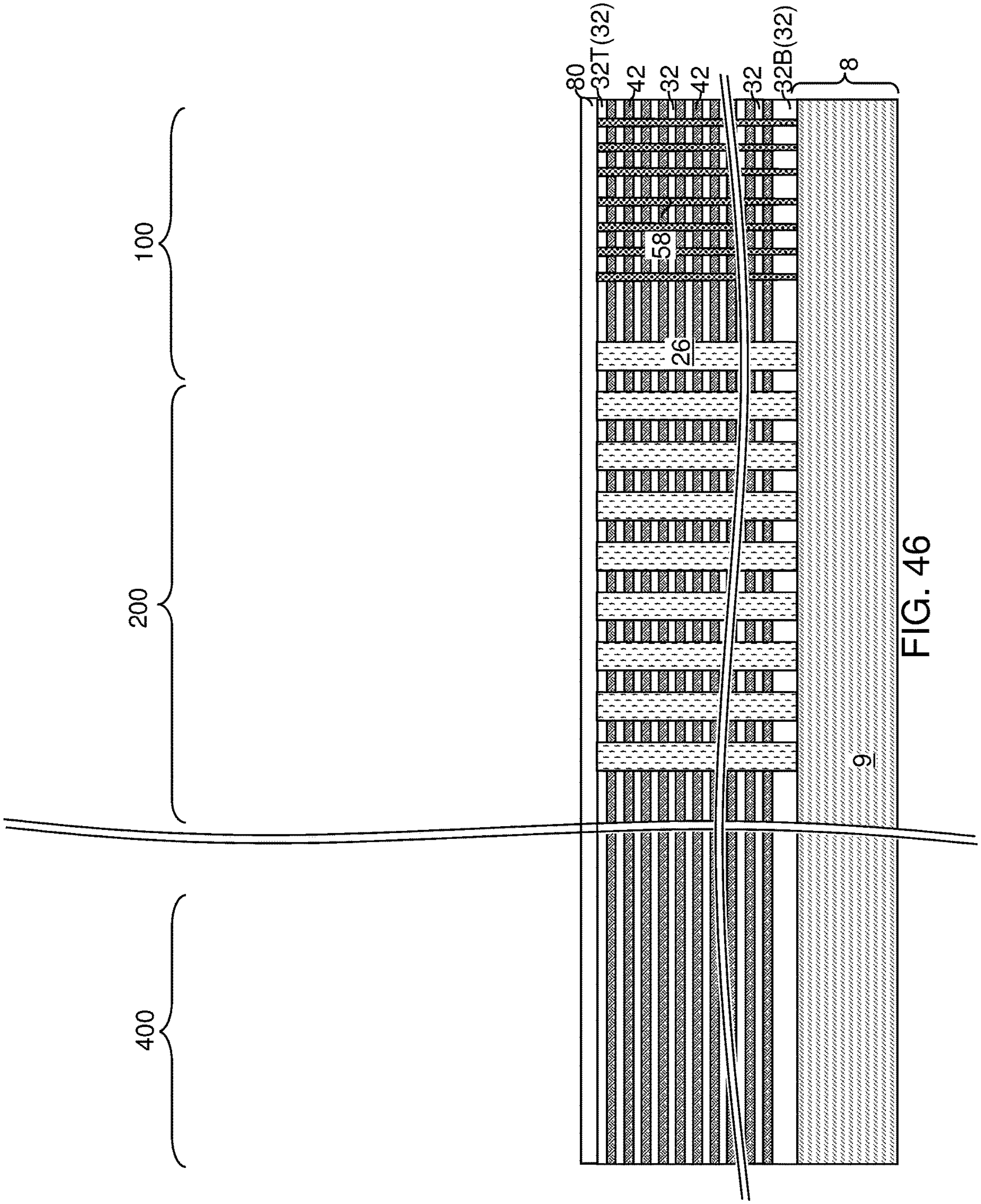
FIG. 46 is a vertical cross-sectional view of the second exemplary structure after formation of in-process side-contact via structures and a contact-level dielectric layer according to an embodiment of the present disclosure.

Referring to FIGS. 45J and 46, a contact-level dielectric layer 80 may be formed above the alternating stack (32, 42) and the in-process layer contact assemblies 26 by conformal or non-conformal deposition of a dielectric material. The contact-level dielectric layer 80 comprises a dielectric material such as undoped silicate glass or a doped silicate glass. The thickness of the contact-level dielectric layer 80 may be in a range from 50 nm to 600 nm, such as from 100 nm to 300 nm, although lesser and greater thicknesses may also be employed.

Figure 47A:
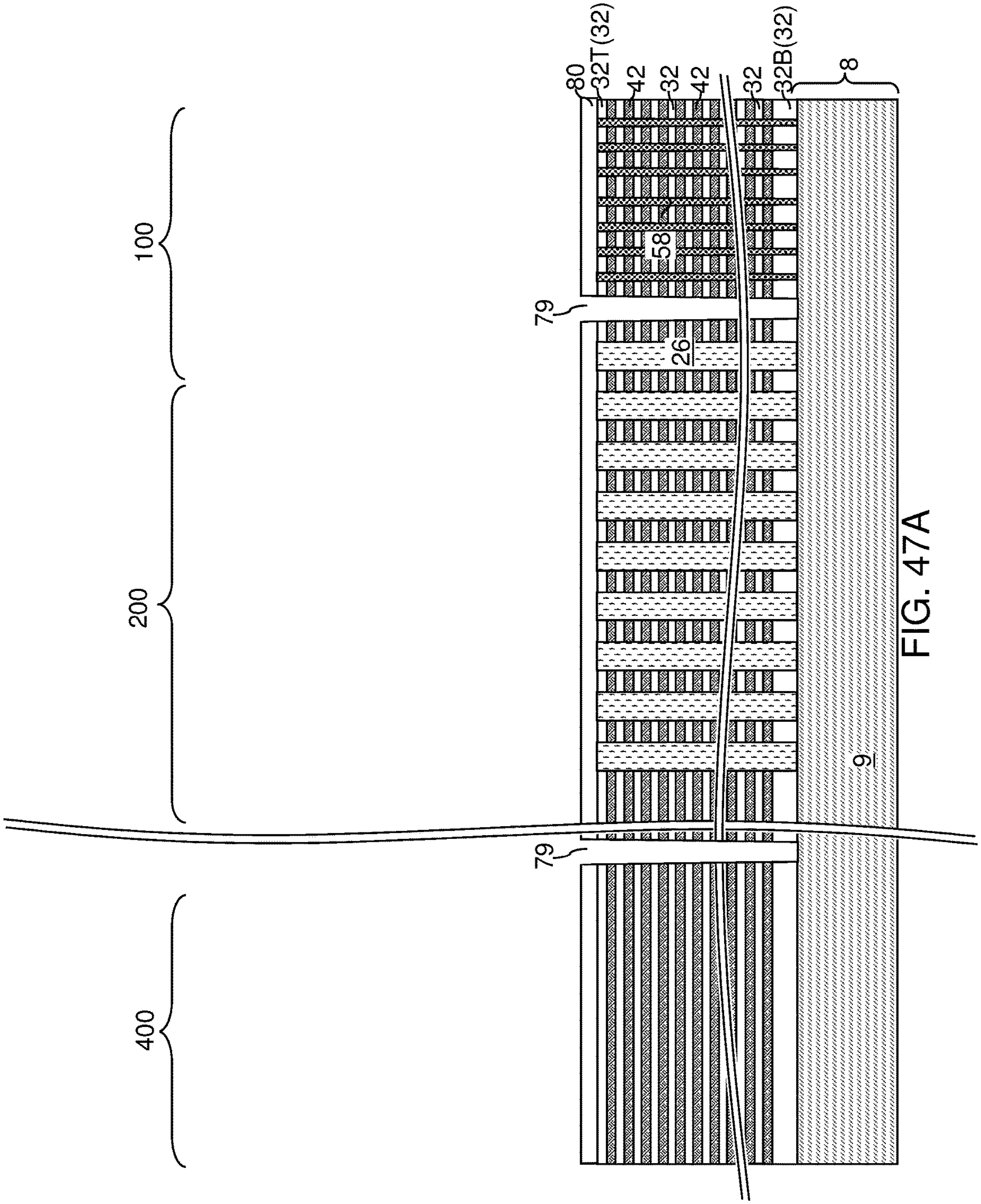
FIG. 47A is a vertical cross-sectional view of the second exemplary structure after formation of backside trenches according to an embodiment of the present disclosure.
Figure 47B:
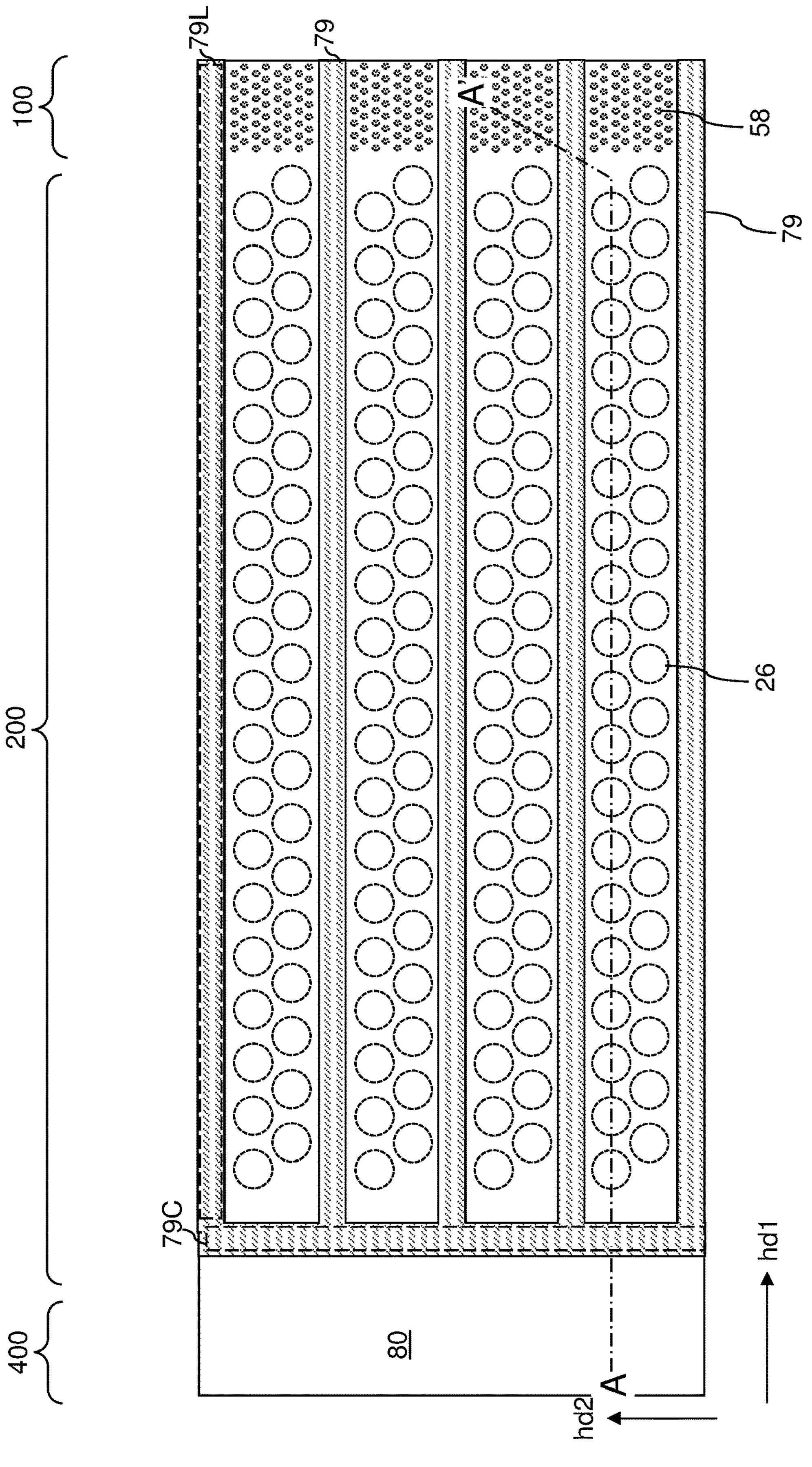
FIG. 47B is a top-down view of the second exemplary structure of FIG. 47A. The hinged vertical plane A-A' is a plane of the vertical cross-sectional view of FIG. 47A.

Referring to FIGS. 47A and 47B, a photoresist layer (not shown) can be applied over the contact-level dielectric layer 80, and is lithographically patterned to form first elongated openings in areas between clusters of memory opening fill structures 58 and to form a second elongated opening that is connected to end portions of the second elongated openings. The pattern in the photoresist layer can be transferred through the contact-level dielectric layer 80 and the alternating stack (32, 42) employing an anisotropic etch to form backside trenches 79. The backside trenches 79 vertically extend from the top surface of the contact-level dielectric layer 80 to the top surface of the topmost semiconductor material layer that underlies the alternating stack (32, 42). The backside trenches 79 comprise lengthwise backside trenches 79L that laterally extend along the first horizontal direction hd1 between neighboring arrays of memory opening fill structures 58 and between neighboring arrays of in-process layer contact assemblies 26. The backside trenches 79 may further comprise a connection backside trench 79C that is connected to end portions of the lengthwise backside trenches 79L and laterally extends along the second horizontal direction hd2. In one embodiment, the lengthwise backside trenches 79L may laterally extend through the memory array region 100 and the contact region 200. The connection backside trench 79C may be formed in proximity to a boundary between the contact region 200 and the connection region 400.

In one embodiment, the lengthwise backside trenches 79L can laterally extend along the first horizontal direction hd1 and can be laterally spaced apart from each other along the second horizontal direction hd2 that is perpendicular to the first horizontal direction hd1. The memory opening fill structures 58 can be arranged in rows that extend along the first horizontal direction hd1. Multiple rows of memory opening fill structures 58 can be located between each neighboring pair of lengthwise backside trenches 79L. The photoresist layer can be removed, for example, by ashing.

Figure 48A:
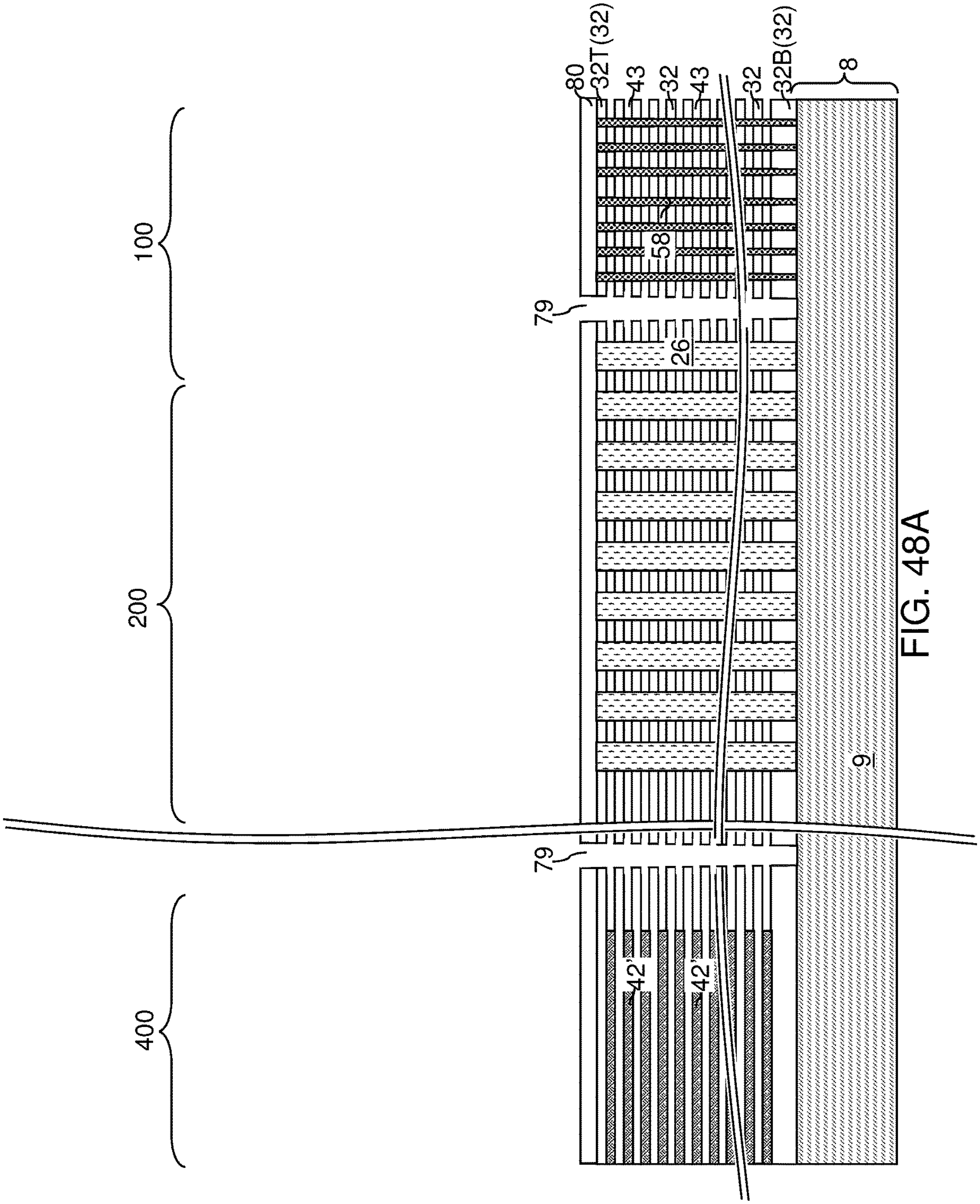
FIG. 48A is a vertical cross-sectional view of the second exemplary structure after formation of backside recesses according to an embodiment of the present disclosure.
Figure 48B:
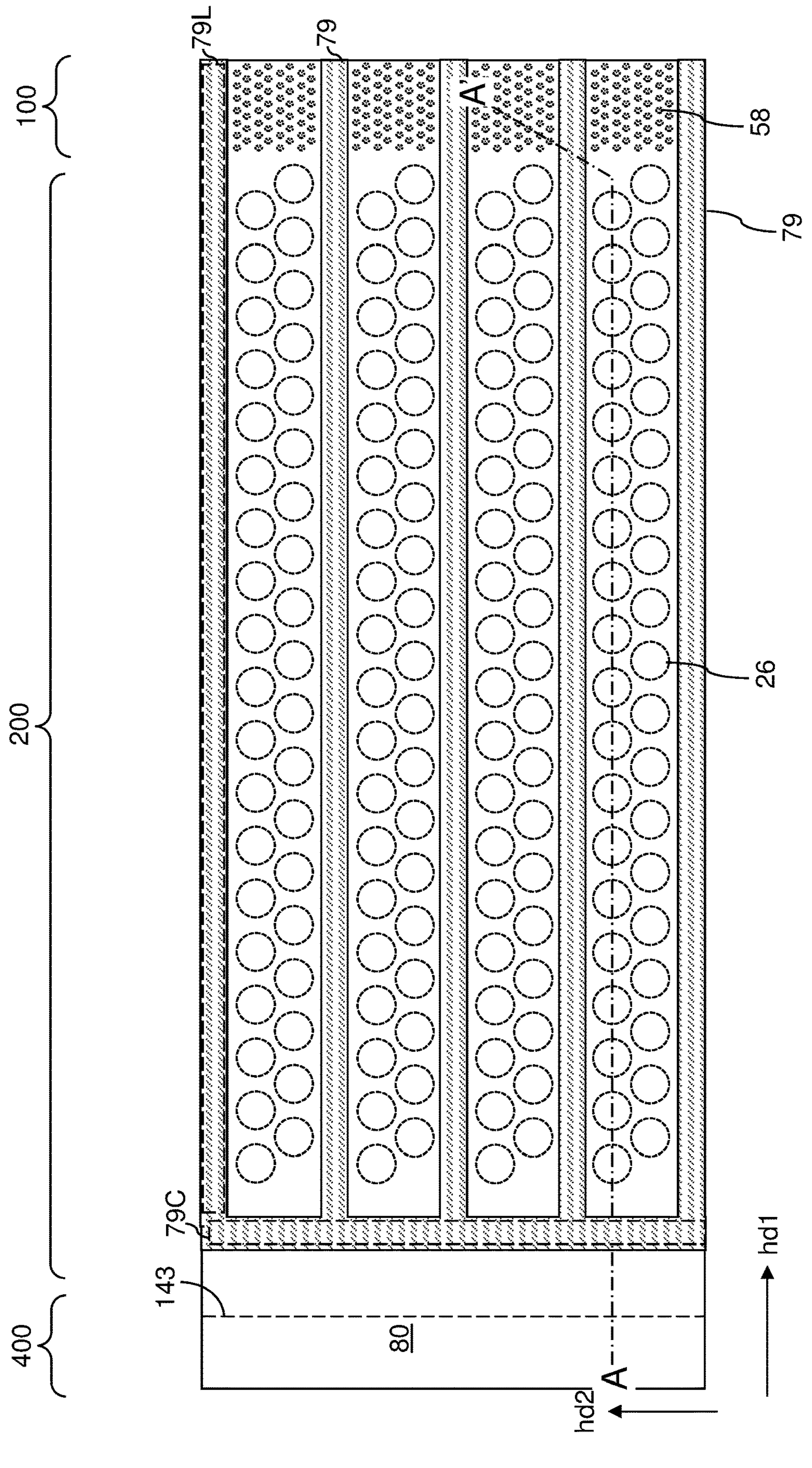
FIG. 48B is a top-down view of the second exemplary structure of FIG. 48A. The hinged vertical plane A-A' is a plane of the vertical cross-sectional view of FIG. 48A.
Figure 48C:
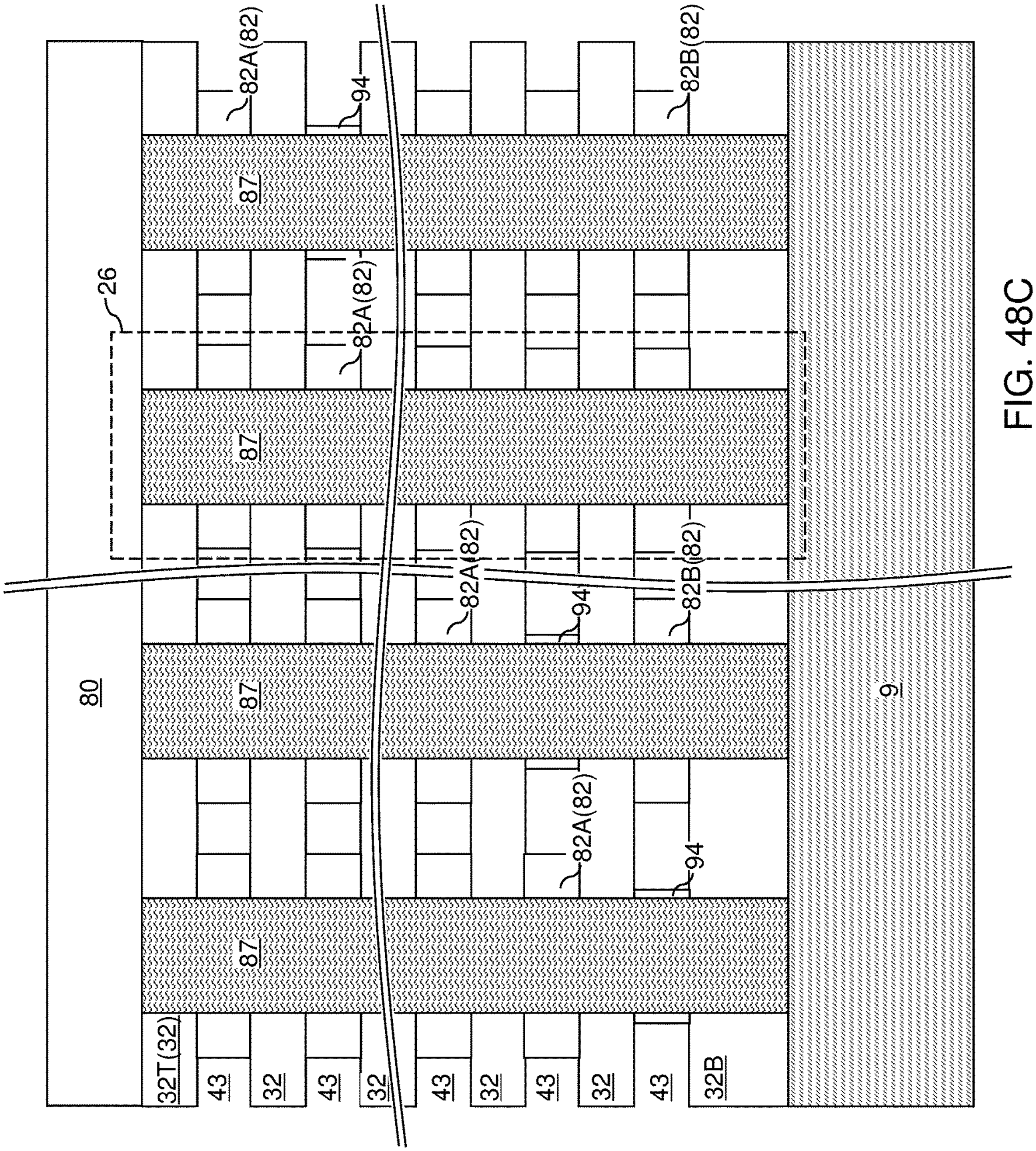
FIG. 48C is a magnified vertical cross-sectional view of a contact region of the second exemplary structure of FIGS. 48A and 48B.

Referring to FIG. 48A-48C, an etchant that selectively etches the materials of the sacrificial material layers 42 with respect to the materials of the insulating layers 32 and the material of the outermost layer of the memory films 50 can be introduced into the backside trenches 79, for example, employing an isotropic etch process. For example, the sacrificial material layers 42 can include silicon nitride, the materials of the insulating layers 32 and the material of the outermost layer of the memory films 50 can include silicon oxide materials. Backside recesses 43 are formed in volumes from which the sacrificial material layers 42 are removed.

The isotropic etch process can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the second exemplary structure is immersed within a wet etch tank including phosphoric acid, which etches silicon nitride selective to silicon oxide, silicon, and various other materials employed in the art.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. Each of the backside recesses 43 can laterally extend substantially parallel to the top surface of the substrate 8. A backside recess 43 can be vertically bounded by a top surface of an underlying insulating layer 32 and a bottom surface of an overlying insulating layer 32. In one embodiment, each of the backside recesses 43 can have a uniform height throughout.

Unetched remaining portions of the sacrificial material layers 42 may remain in the connection region 400. The remaining portions of the sacrificial material layers 42 comprise dielectric material layers, and may be hereafter referred to as dielectric material plates 42'.

Figure 49A:
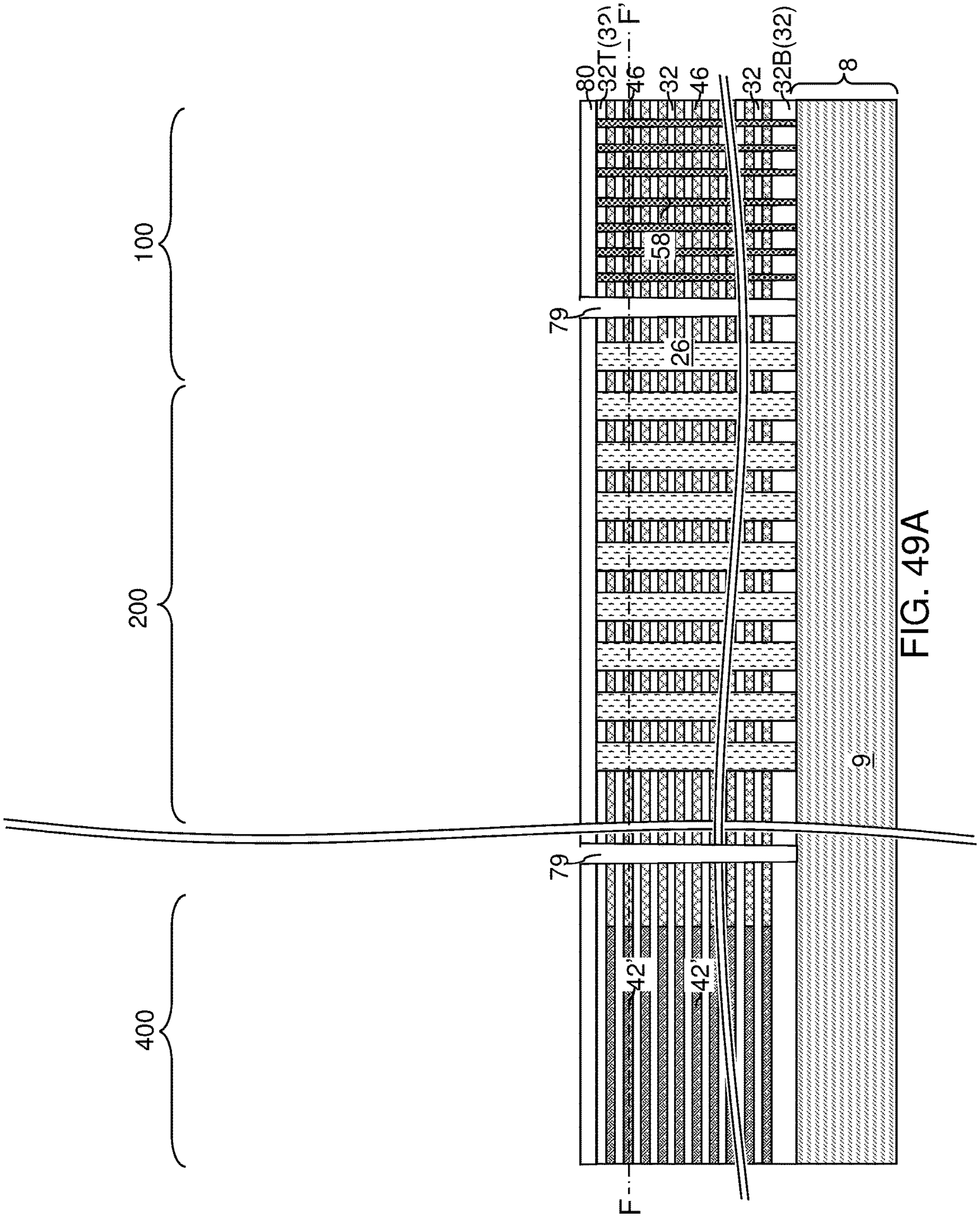
FIG. 49A is a vertical cross-sectional view of the second exemplary structure after formation of electrically conductive layers according to an embodiment of the present disclosure.
Figure 49B:
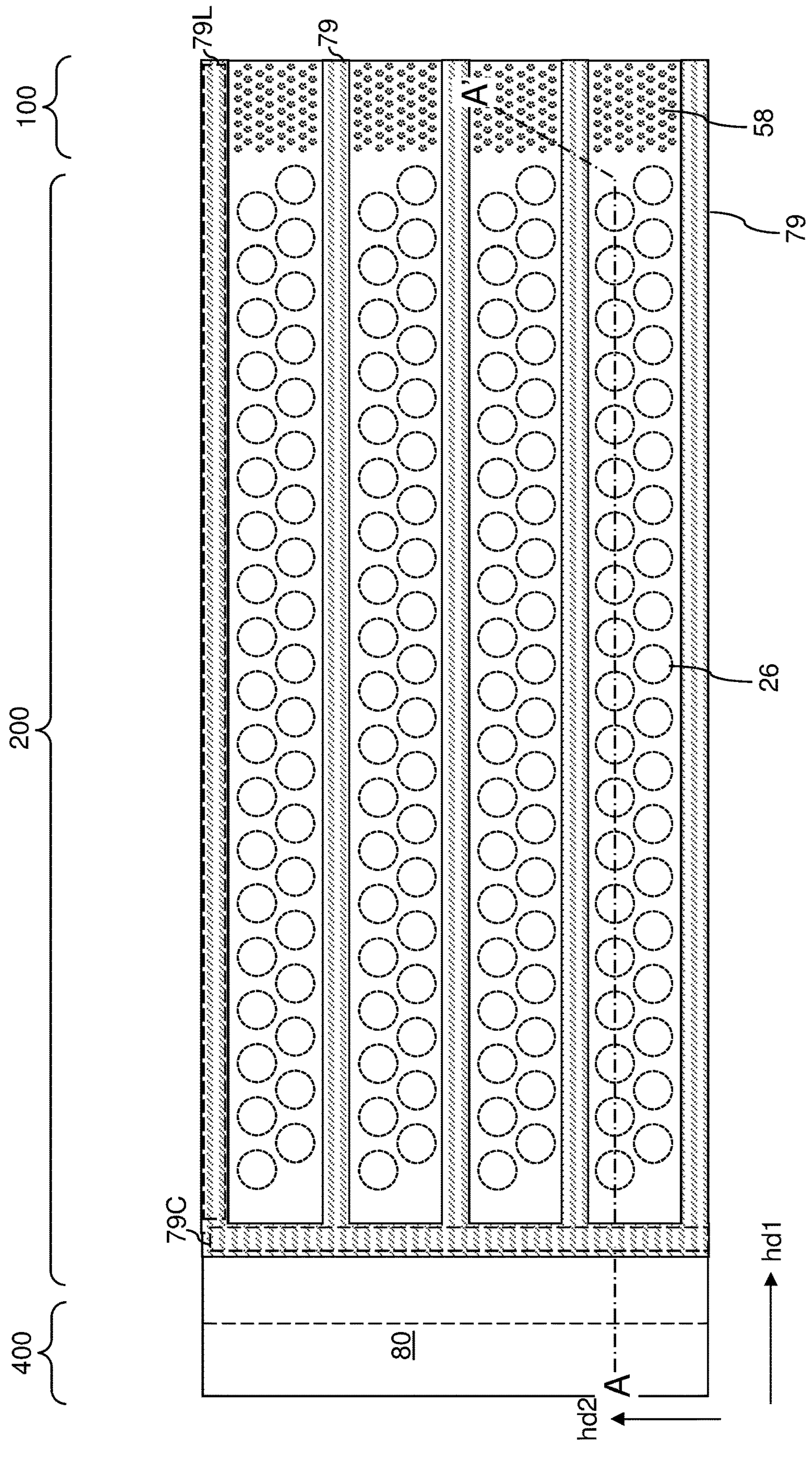
FIG. 49B is a top-down view of the second exemplary structure of FIG. 49A. The hinged vertical plane A-A' is a plane of the vertical cross-sectional view of FIG. 49A.
Figure 49C:
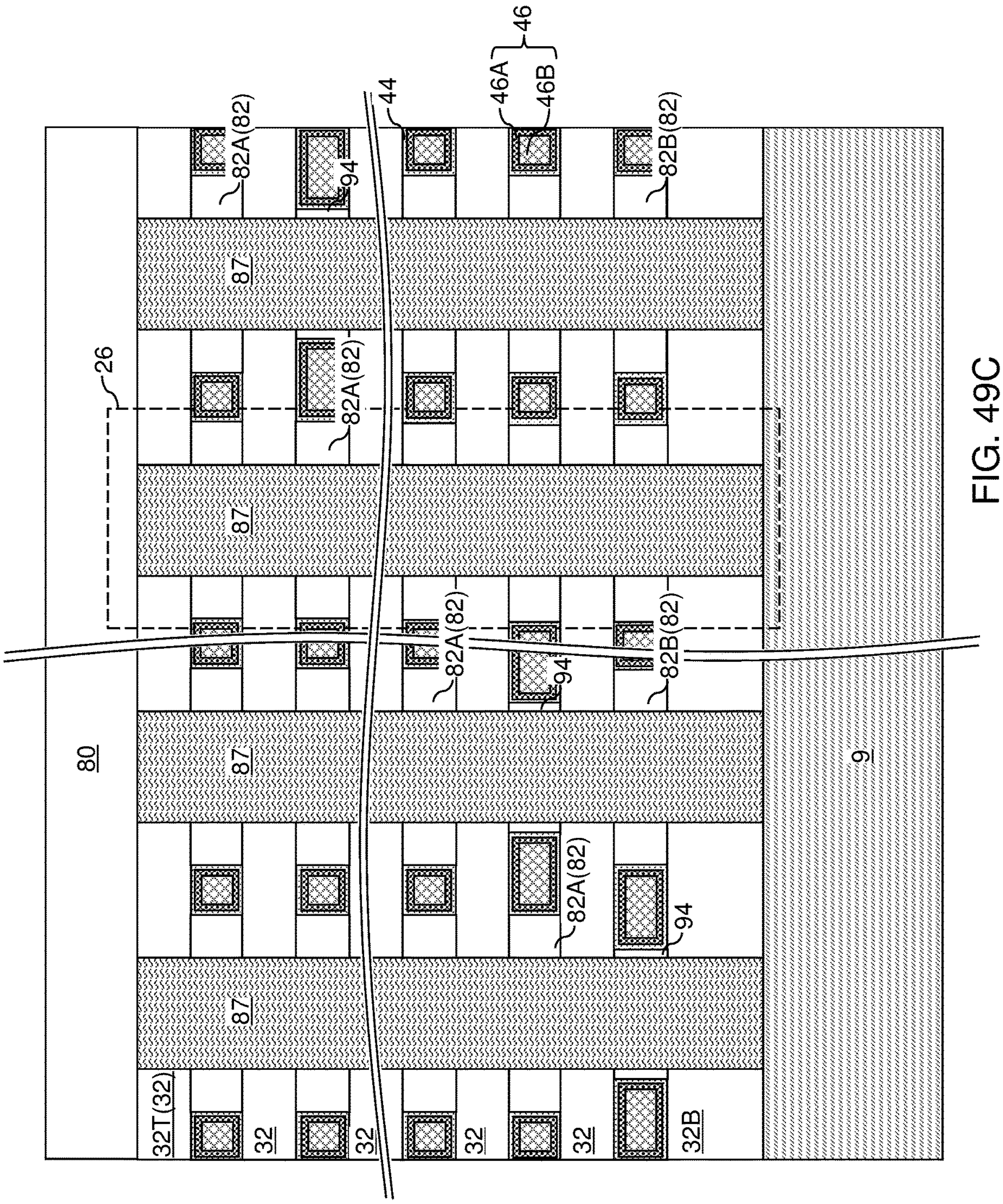
FIG. 49C is a magnified vertical cross-sectional view of a contact region of the second exemplary structure of FIGS. 49A and 49B.

Referring to FIGS. 49A-49C, a backside blocking dielectric layer 44 can be optionally deposited in the backside recesses 43 and the backside trenches 79 and over the contact-level dielectric layer 80. The backside blocking dielectric layer 44 comprises a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory opening fill structures 58 that are physically exposed to the backside recesses 43. A backside cavity is present within the portion of each backside trench 79 that is not filled with the backside blocking dielectric layer 44.

A metallic barrier layer 46A can be deposited in the backside recesses 43, peripheral portions of the backside trenches 79, and over the contact-level dielectric layer 80. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, MoN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 80 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory opening fill structures 58 by the metallic barrier layer 46A, which is a metallic barrier layer that blocks diffusion of fluorine atoms therethrough.

An etch back process can be performed to remove portions of the metallic fill material layer 46B and the metallic barrier layer 46A from inside the backside trenches 79 and from above the contact-level dielectric layer 80. The etch back process may comprise an isotropic etch process and/or an anisotropic etch process. Each combination of a remaining portion of the metallic barrier layer 46A and a remaining portion of the metallic fill material layer 46B that remain in a respective backside recess 43 constitutes an electrically conductive layer 46. The backside blocking dielectric layer 44 may or may not remain in the backside trenches 79.

Each electrically conductive layer 46 includes a portion of the metallic barrier layer 46A and a portion of the metallic fill material layer 46B that are located between a vertically neighboring pair of dielectric material layers such as a pair of insulating layers 32. Each sacrificial material layer 42 can be replaced with an electrically conductive layer 46. Generally, at least one alternating stack (32, 46) of insulating layers 32 and electrically conductive layers 46 can be formed over the substrate 8.

Figure 50:
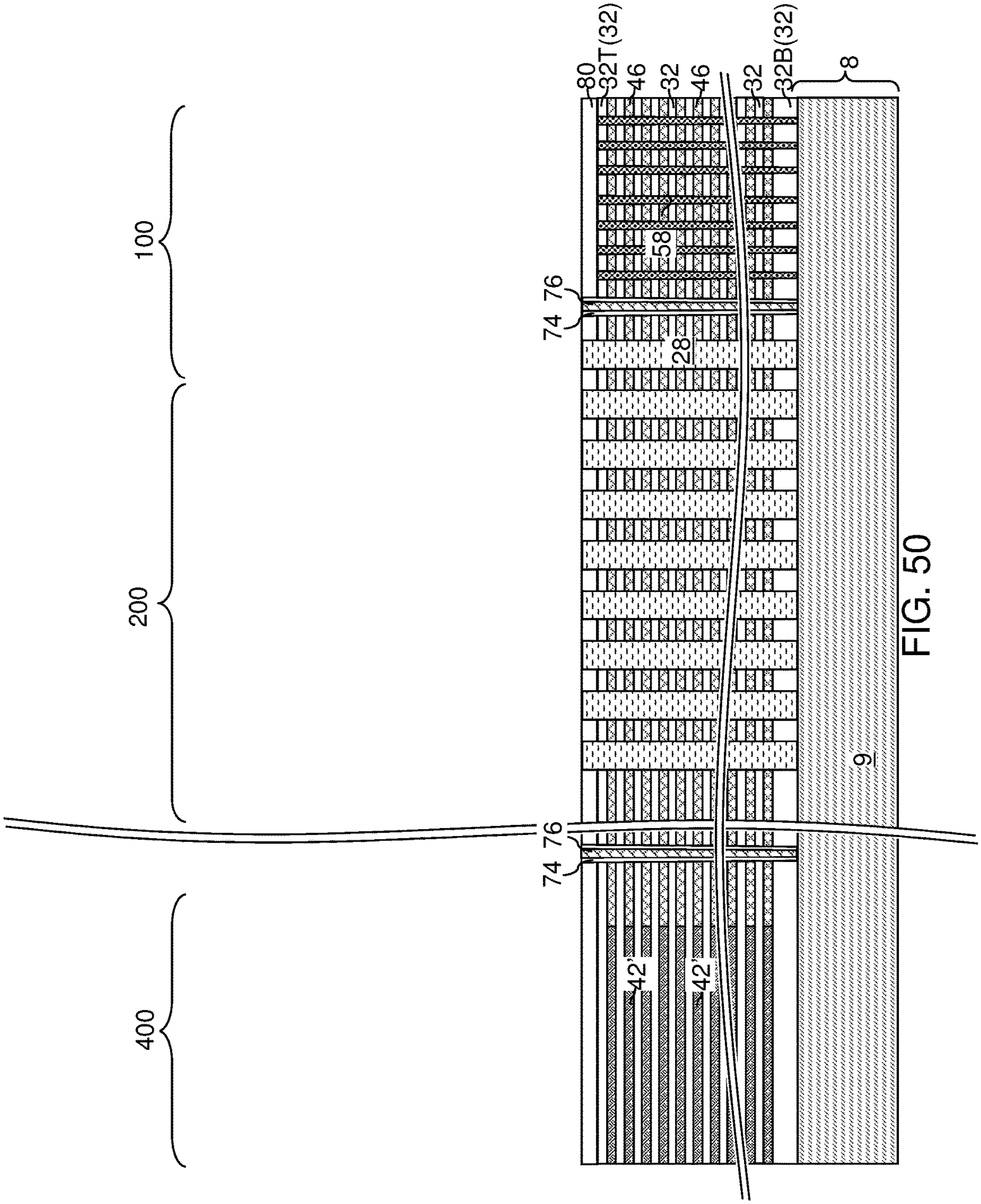
FIG. 50 is a vertical cross-sectional view of the second exemplary structure after formation of backside trench fill structures according to an embodiment of the present disclosure.

Referring to FIG. 50, an insulating material layer can be formed in the backside trenches 79 and over the contact-level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 80 and at the bottom of each backside trench 79. Each remaining portion of the insulating material layer constitutes an insulating spacer 74. A backside cavity is present within a volume surrounded by each insulating spacer 74.

A backside contact via structure 76 can be formed within each backside cavity. Each backside contact via structure 76 can fill a respective cavity. Each contact via structures 76 can be formed by depositing at least one conductive material in a remaining unfilled volume (i.e., a backside cavity) of the backside trenches 79. For example, the at least one conductive material can include a conductive liner and a conductive fill material portion. The conductive liner can include a conductive metallic liner such as TiN, TaN, MoN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact-level dielectric layer 80 overlying the alternating stack (32, 46) as a stopping layer. If chemical mechanical planarization (CMP) process is employed, the contact-level dielectric layer 80 can be employed as a CMP stopping layer. Each remaining continuous portion of the at least one conductive material in the backside trenches 79 constitutes a backside contact via structure 76.

FIGS. 51A-51D are sequential vertical cross-sectional views of the contact region 200 during replacement of the in-process layer contact assemblies 26 with layer contact assemblies 28 according to the second embodiment of the present disclosure.

Figure 51A:
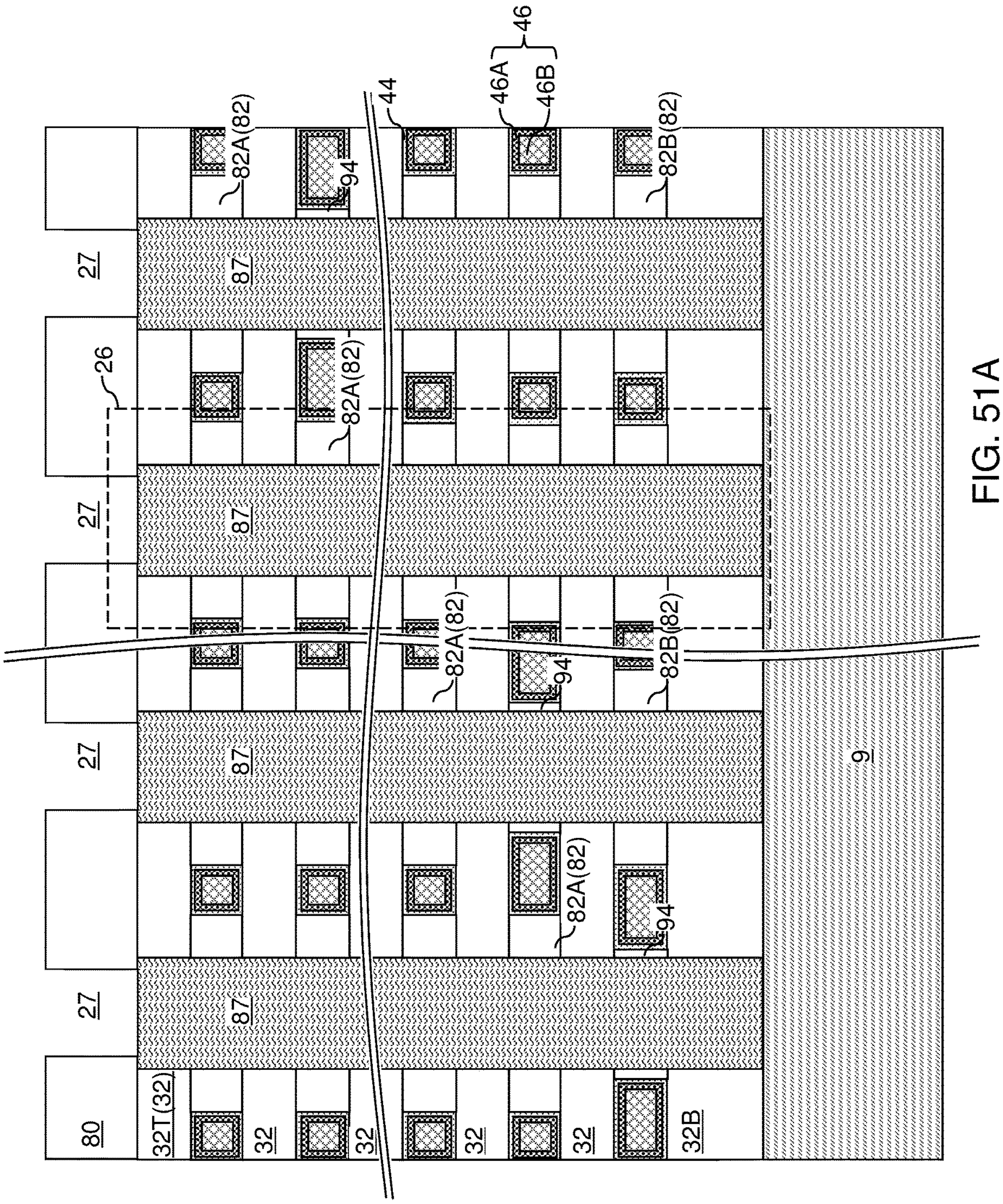
FIGS. 51A-51D are sequential vertical cross-sectional views of the contact region during replacement of the in-process side-contact via structures with side-contact via structures according to an embodiment of the present disclosure.

Referring to FIG. 51A, a photoresist layer (not shown) can be applied over the contact-level dielectric layer 80, and can be lithographically patterned to form openings over the in-process layer contact assemblies 26. An anisotropic etch process may be performed to transfer the pattern of the openings in the photoresist layer through the contact-level dielectric layer 80. An array of openings 27 can be formed through the contact-level dielectric layer 80. A top surface of a sacrificial contact opening fill structure 87 can be physically exposed at the bottom of each opening 27 through the contact-level dielectric layer 80.

Figure 51B:
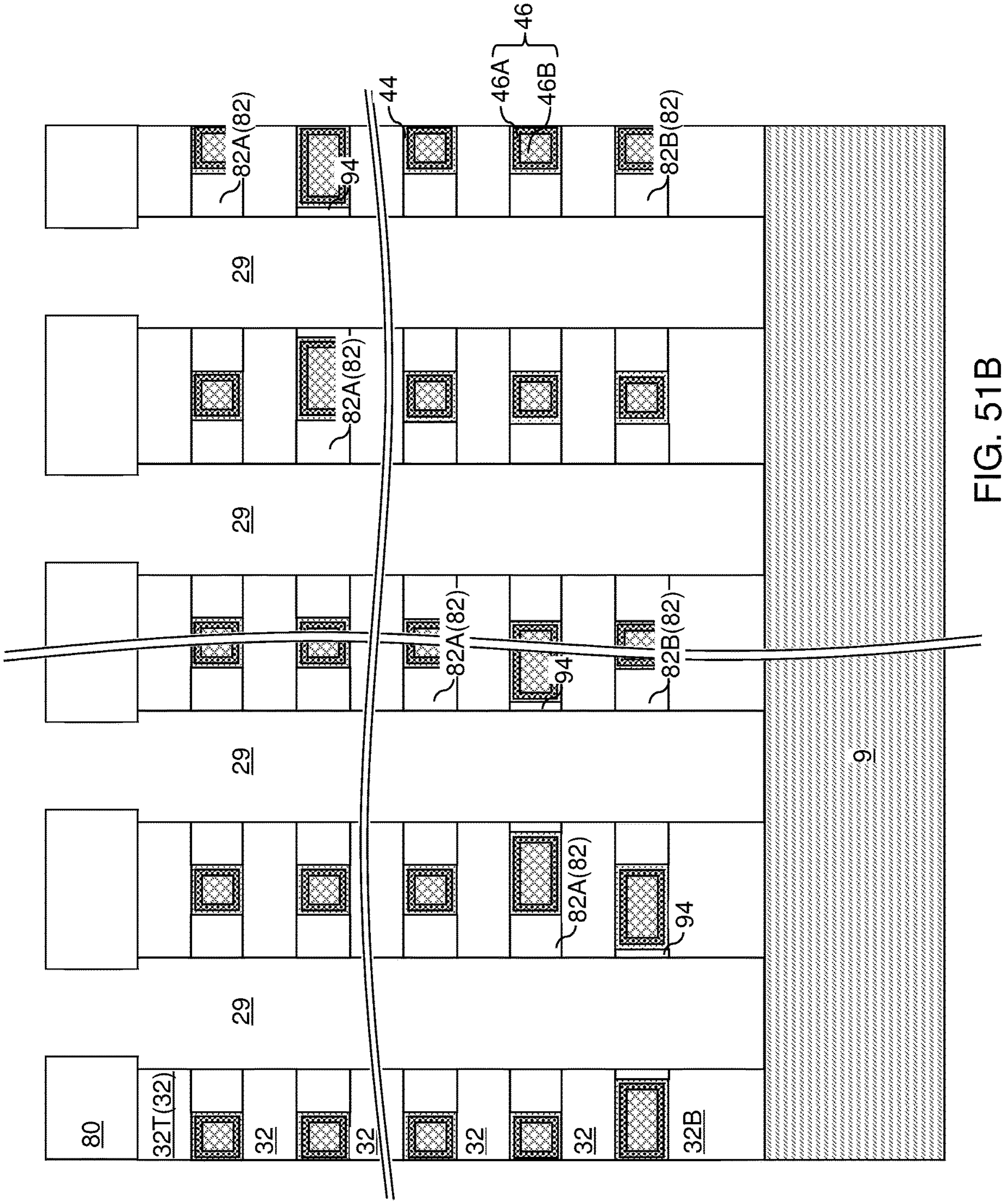

Referring to FIG. 51B, a selective etch process can be performed to remove the sacrificial contact opening fill structures 87 selective to the contact-level dielectric layer 80, the insulating layers 32, the annular dielectric spacers 82, the annular sacrificial spacers 94, and the substrate material layer 9. In an illustrative example, if the sacrificial contact opening fill structures 87 comprise amorphous silicon, then a wet etch process employing hot trimethyl-2 hydroxyethyl ammonium hydroxide ("hot TMY") or tetramethyl ammonium hydroxide (TMAH) can be employed to remove the sacrificial contact opening fill structures 87. Alternatively, if the sacrificial contact opening fill structures 87 comprise a carbon material, then the sacrificial contact opening fill structures 87 can be removed by ashing. Contact openings 29 can be formed within the volumes of the contact openings 85.

Figure 51C:
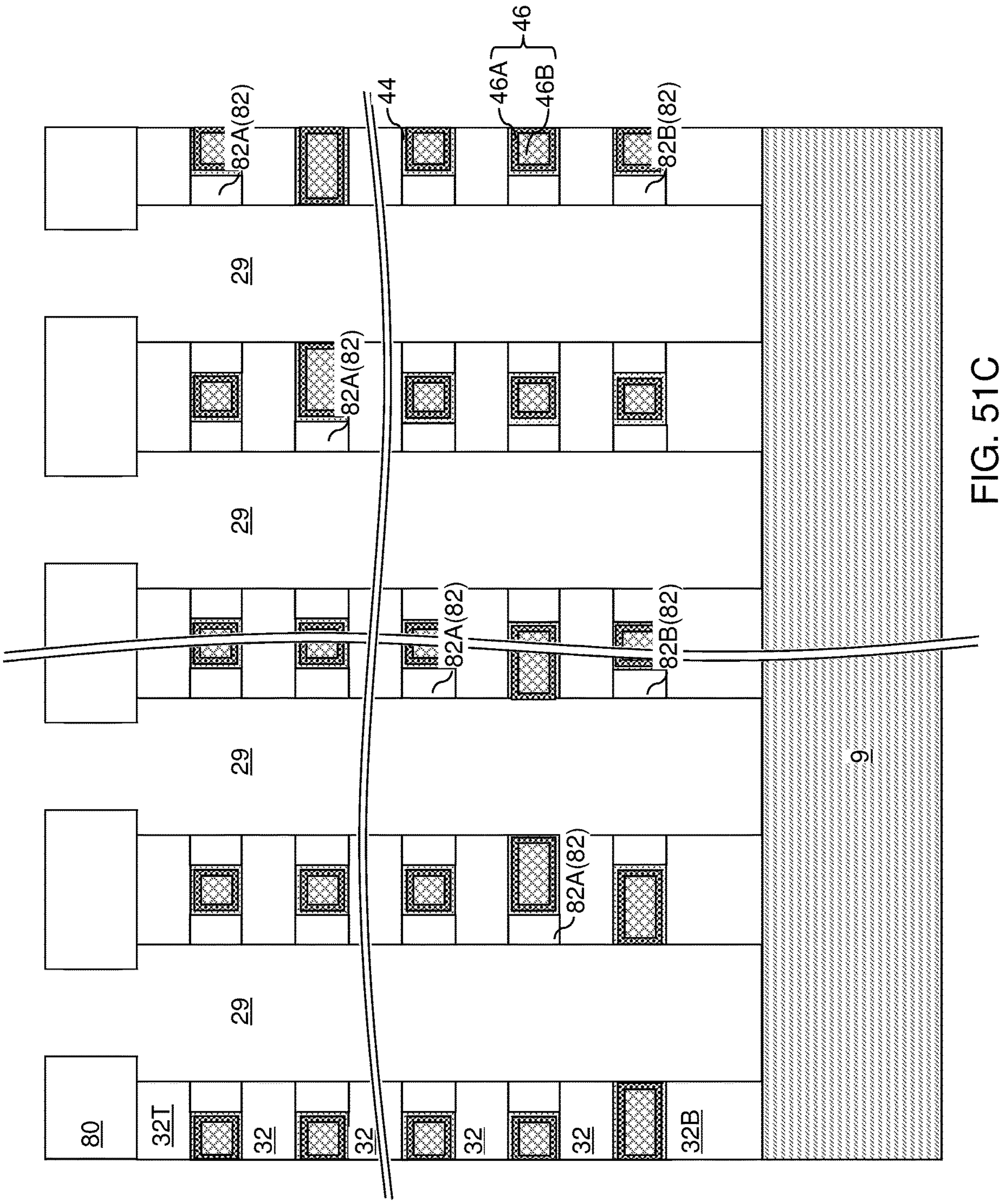

Referring to FIG. 51C, at least one isotropic etch process can be performed to remove the annular sacrificial spacers 94 and vertically-extending portions of the backside blocking dielectric layers 44 that are located adjacent to the annular sacrificial spacers 94. For example, if the annular sacrificial spacers 94 comprise silicon oxide and if the backside blocking dielectric layers 44 comprise aluminum oxide, then a wet etch process employing dilute hydrofluoric acid is used to remove the annular sacrificial spacers 94 and portions of the backside blocking dielectric layers 44 that were proximal to the annular sacrificial spacers 94. In one embodiment, inner portions of the annular dielectric spacers 82 can be collaterally removed around each contact opening 29 during removal of the annular sacrificial spacer 94. Alternatively, a $NH_4OH{:}H_2O_2{:}H_2O$ based etch may be used to remove the exposed vertical portions of the backside blocking dielectric layers 44 after removal of the annular sacrificial spacers 84. In one embodiment, the insulating layers 32, the contact-level dielectric layer 80, and the annular dielectric spacers 82 may be collaterally recessed during the at least one isotropic etch process that removes the annular sacrificial spacers 94 and the vertical portions of the backside blocking dielectric layers 44.

A cylindrical sidewall of an electrically conductive layer 46 can be physically exposed around each volume from which a combination of an annular sacrificial spacer 94 and a vertical cylindrical portion of a backside blocking dielectric layer 44 is removed. Each contact opening 29 can be laterally expanded by the at least one isotropic etch process. Each contact opening 29 can be laterally bounded by a respective generally-cylindrical sidewall, which may have a straight vertical cross-sectional profile or a laterally-undulating vertical cross-sectional profile depending on whether physically exposed cylindrical sidewalls of the insulating layers 32 are vertically coincident with inner cylindrical sidewalls of the annular dielectric spacers 82. Generally, the inner cylindrical sidewalls of the annular dielectric spacers 82 may be located at, inside or outside a cylindrical vertical plane including physically exposed cylindrical sidewalls of the insulating layers 32 around each contact opening 29. Generally, a cylindrical sidewall of one of the electrically conductive layers 46 can be physically exposed at each level from which an annular sacrificial spacer 94 is removed. In one embodiment, each of the electrically conductive layers 46 may be physically exposed within each group of cylindrical openings 29 located in a memory block between a neighboring pair of backside trench fill structures (74, 76) located within a respective neighboring pair of lengthwise backside trenches 79L.

Figure 51D:
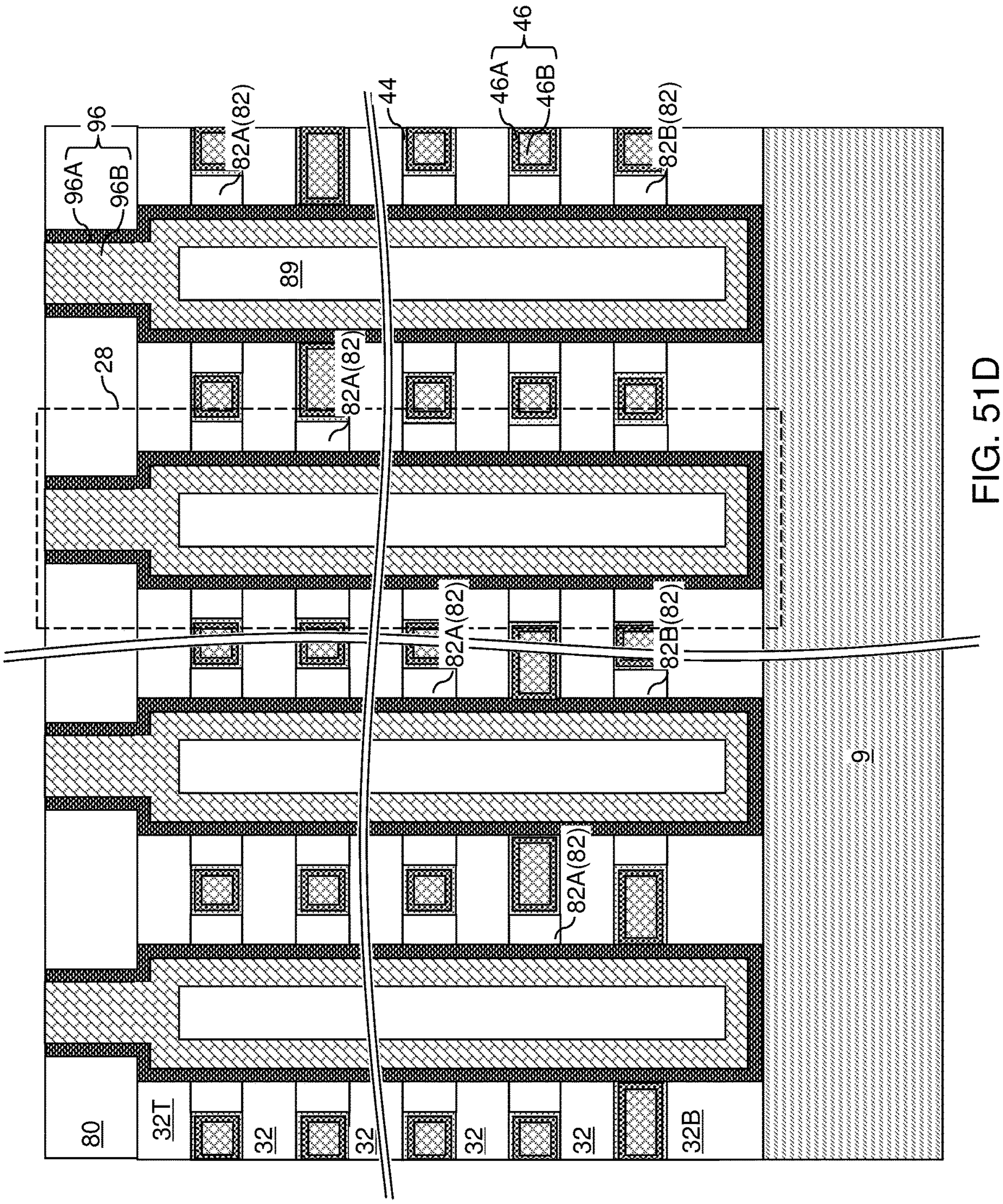

Referring to FIG. 51D, at least one conductive material can be deposited in the contact openings 29. The at least one conductive material may comprise a metallic barrier material and a metallic fill material. The metallic barrier material may comprise a metallic nitride material such as TiN, TaN, and/or WN and/or a metallic carbide material such as TiC, TaC, and/or WC. The metallic fill material may comprise W, Ti, Ta, Ru, Co, Mo, Cu, etc. The at least one conductive material may be deposited by chemical vapor deposition, physical vapor deposition, electroplating, electroless plating, or combinations thereof. Excess portions of the at least one conductive material can be removed from above the horizontal plane including the top surface of the contact-level dielectric layer 80 by performing a planarization process, which may employ a chemical mechanical polishing (CMP) process or a recess etch process. Each remaining portion of the at least one conductive material filling a respective contact opening 29 constitutes a contact via structure that contacts a vertical cylindrical sidewall of a respective electrically conductive layer 46. As such, each contact via structure is referred to as a side-contact via structure 96. Each side-contact via structure 96 vertically extends through each layer within the at least one alternating stack (32, 46) and contacts a sidewall of one of the electrically conductive layers 46. In one embodiment, each side-contact via structure 96 can contact a cylindrical sidewall one of the electrically conductive layers 46, and may be electrically isolated from all other electrically conductive layers 46 by the annular dielectric spacers 82.

In one embodiment, each side-contact via structure 96 may comprise a metallic barrier layer 96A comprising a metallic barrier material, and a metallic fill material portion 96B comprising a metallic fill material. In one embodiment, one, a plurality, or each, of the side-contact via structures 96 may comprise an encapsulated cavity (i.e., air gap) 89 that is free of any solid phase material therein. Alternatively, at least one etch back process may be employed in conjunction with multiple deposition processes to prevent formation of, or to reduce the sizes of, the encapsulated cavities 89. Each contiguous combination of a side-contact via structure 96 and a vertical stack of annular dielectric spacers 82 is herein referred to as a layer contact assembly 28.

In one embodiment, an entirety of an interface between one, a plurality, and/or each, of the side-contact via structures 96 and a respective one of the electrically conductive layers 46 may be located within a respective cylindrical vertical plane. In one embodiment, the side-contact via structures 96 do not contact any horizontal surface of the electrically conductive layers 46.

In one embodiment, a vertical stack of annular dielectric spacers 82 may laterally surround each side-contact via structure 96. For each side-contact via structure 96, each electrically conductive layer 46 within the at least one alternating stack (32, 46) except a respective one of the electrically conductive layers 46 can be laterally spaced from, and can be electrically isolated from, the side-contact via structure 96 by a respective one of the annular dielectric spacers 82. In one embodiment, for each side-contact via structure 96, each of the annular dielectric spacers 82 comprises a respective outer cylindrical sidewall that is laterally offset outward from a respective inner cylindrical sidewall by a respective lateral offset distance that is independent of an azimuthal angle from a vertical axis VA passing through a geometrical center GC of the side-contact via structure 96. All lateral offset distances of the annular dielectric spacers 82 can be the same. A geometrical center of an element refers to the center of gravity of a hypothetical object occupying the same volume as the element and having a uniform density throughout.

In one embodiment, for each side-contact via structure 96, each of the insulating layers 32 within the at least one alternating stack (32, 46) comprises a respective cylindrical sidewall that contacts the side-contact via structure 96.

In one embodiment, backside blocking dielectric layers 44 can be located between each vertically neighboring pair of an insulating layer 32 and an electrically conductive layer 46 within the at least one alternating stack (32, 46). In one embodiment, each side-contact via structure 96 can be in contact with two cylindrical surface segments of horizontally extending backside blocking dielectric layers 44. Each of the two cylindrical surface segments may have a height that is the same as the thickness of the backside blocking dielectric layers 44.

In one embodiment, each of the electrically conductive layers 46 comprises a respective combination of a metallic barrier liner 46A and a metallic fill material portion 46B. In one embodiment, each side-contact via structure 96 may be in contact with a metallic barrier liner 46A of a respective one of the electrically conductive layers 46, and is laterally spaced from a metallic fill material portion 46B of the respective one of the electrically conductive layers 46 by the respective metallic barrier liner 46A.

Each side-contact via structure 96 may be laterally surrounded by a respective vertical stack of annular dielectric spacers 82. The side-contact via structure 96 is in contact with an inner cylindrical sidewall of each annular dielectric spacer 82 within the vertical stack of annular dielectric spacers 82.

Each side-contact via structure 96 can vertically extend through each layer within the at least one alternating stack (32, 46) and can contact a sidewall of one respective electrically conductive layer 46.

Figure 52A:
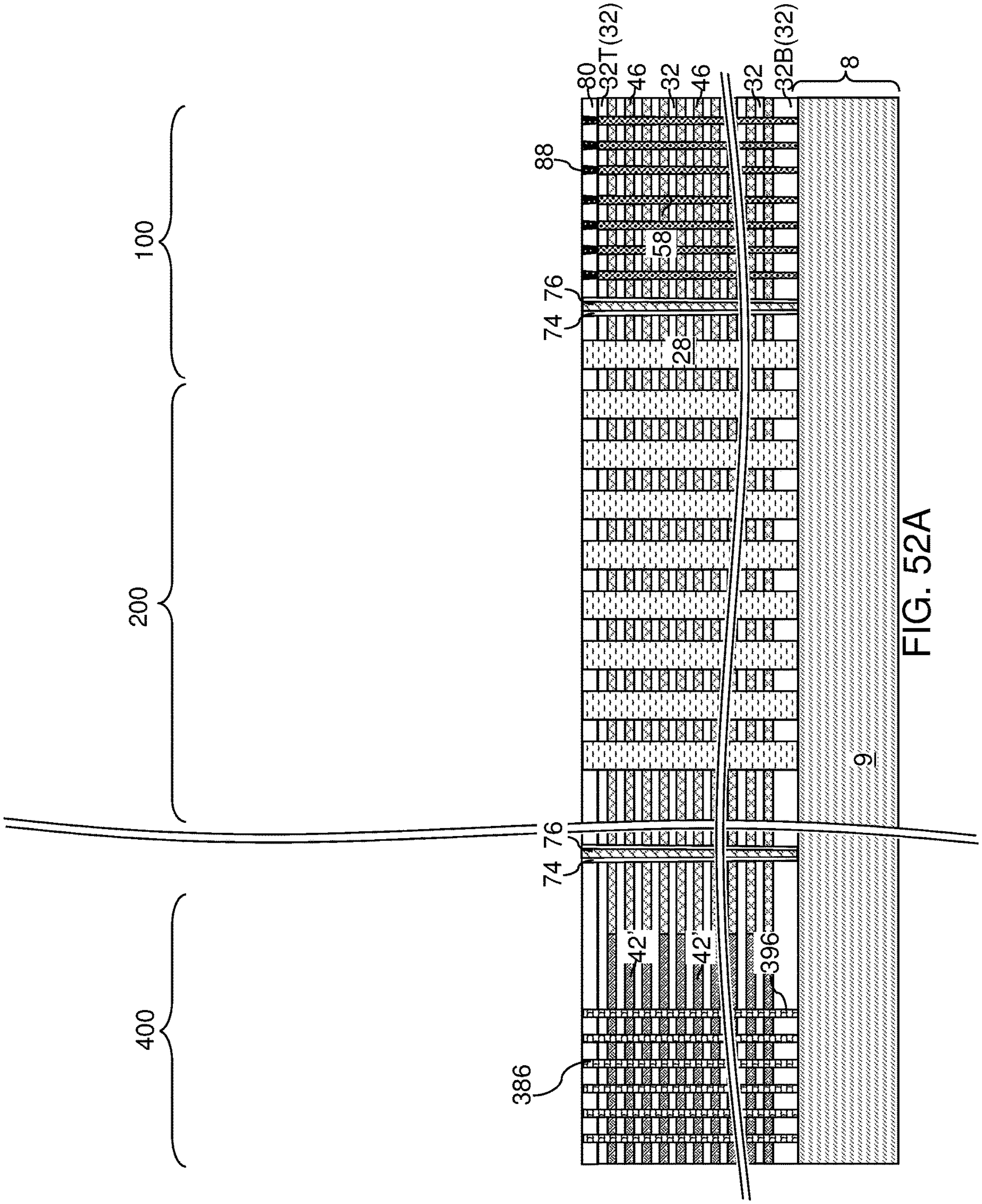
FIG. 52A is a vertical cross-sectional view of the second exemplary structure after formation of drain contact via structures according to an embodiment of the present disclosure.
Figure 52B:
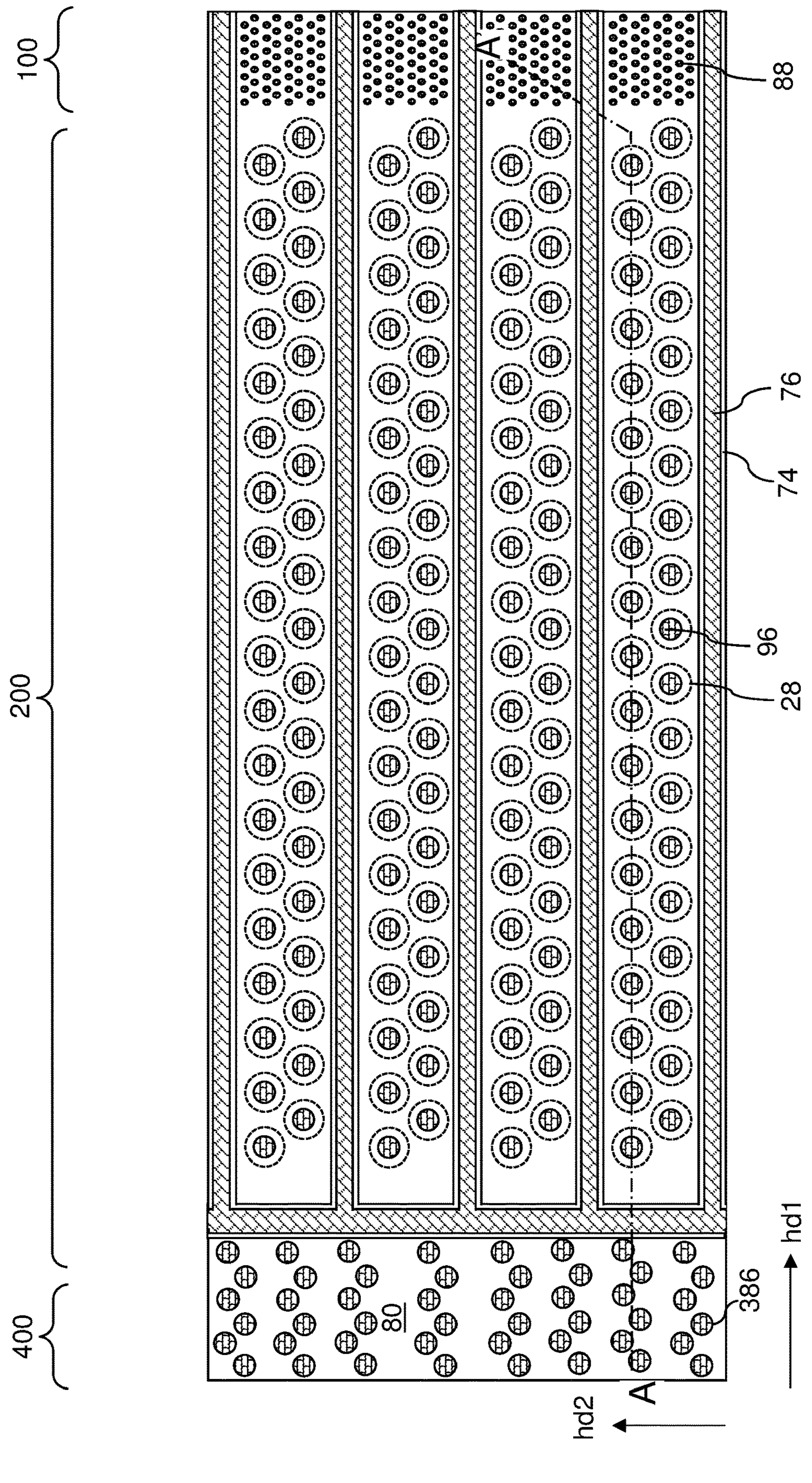
FIG. 52B is a top-down view of the second exemplary structure of FIG. 52A. The hinged vertical plane A-A' is a plane of the vertical cross-sectional view of FIG. 52A.

Referring to FIGS. 52A and 52B, additional conductive via structures (88, 386) can be formed. The additional conductive via structures (88, 386) may comprise, for example, drain contact via structures 88 that are formed through the contact-level dielectric layer 80 directly on a top surface of a respective one of the drain regions 63, and connection via structures 386 that may be formed in the peripheral region through as stack of dielectric material plates 42' (which are remaining portions of the sacrificial material layers 42) and through each of the insulating layers 32.

Figure 53:
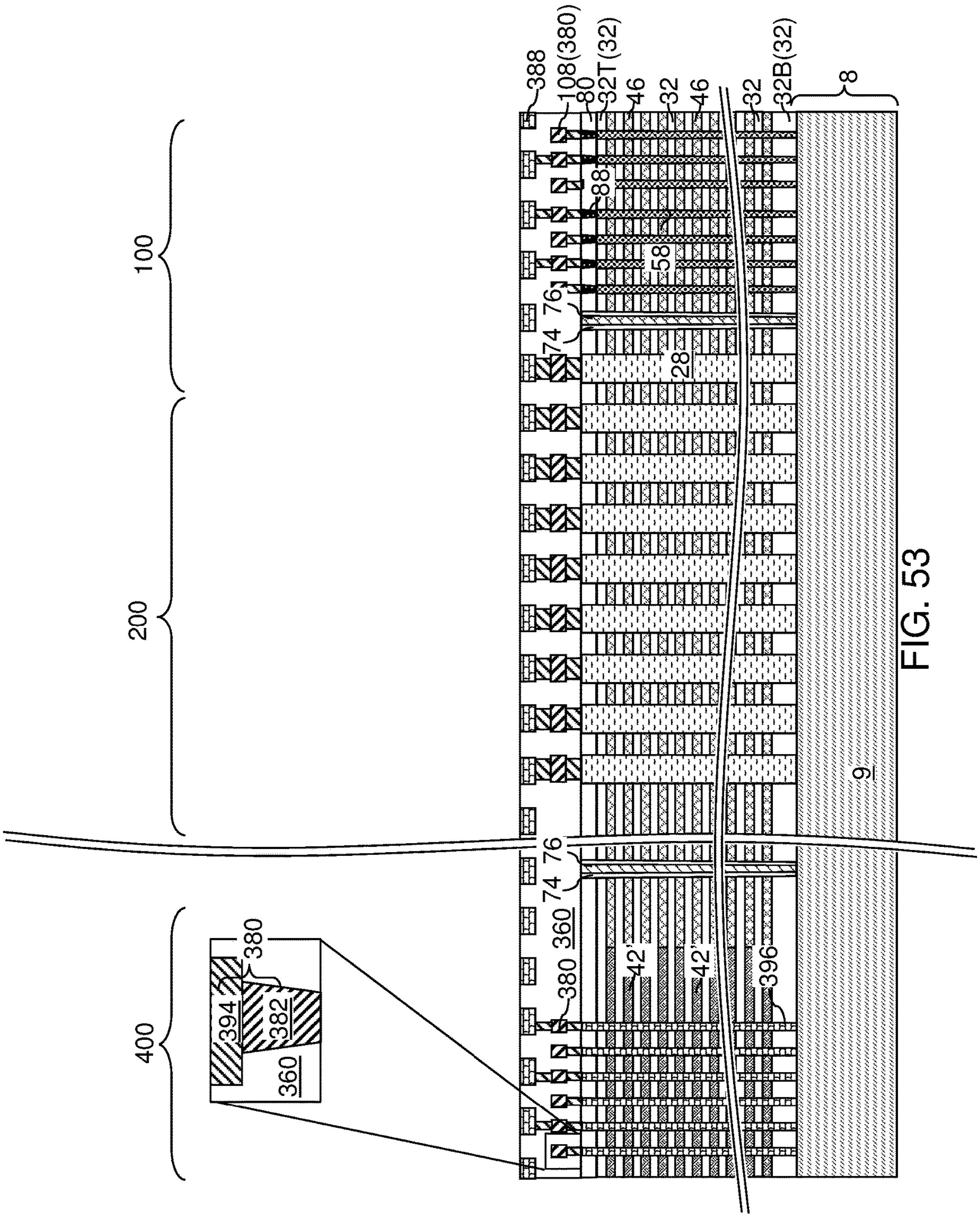
FIG. 53 is a vertical cross-sectional view of the second exemplary structure after formation of drain-side dielectric material layers, drain-side metal interconnect structures, and drain-side metal bonding pads according to an embodiment of the present disclosure.

Referring to FIG. 53, metal interconnect structures and dielectric material layers may be formed above the contact-level dielectric layer 80. The metal interconnect structures are formed on the side of the drain regions 63 with respect to the alternating stack of insulating layers 32 and electrically conductive layers 46, and are herein referred to as drain-side metal interconnect structures 380. The dielectric material layers that embed the drain-side metal interconnect structures 380 are herein referred to as drain-side dielectric material layers 360. The drain-side metal interconnect structures 380 comprise drain-side metal via structures 382 and drain-side metal line structures 384. In one embodiment, the drain-side metal via structures 382 may have a respective lateral extent that increases with a vertical distance from the alternating stack (32, 46). A portion of the drain-side metal line structures 384 which are electrically connected to the drain regions 63 may comprise bit lines 108. Each of the bit lines 108 may be electrically connected to a respective row of drain regions 63.

Generally, drain-side metal interconnect structures 380 can be configured to provide electrical connection to and/or between the various electrical nodes of the three-dimensional memory device including the electrically conductive layers 46 and the memory opening fill structures 58. Drain-side bonding pads 388 can be formed in the topmost level of the drain-side dielectric material layers 360. The drain-side bonding pads 388 can be formed on or within a topmost dielectric layer of the drain-side dielectric material layers 360. The drain-side bonding pads 388 are a first subset of memory-side bonding pads that are formed on the drain side. The memory-side bonding pads refer to bonding pads formed on a memory die.

Figure 54:
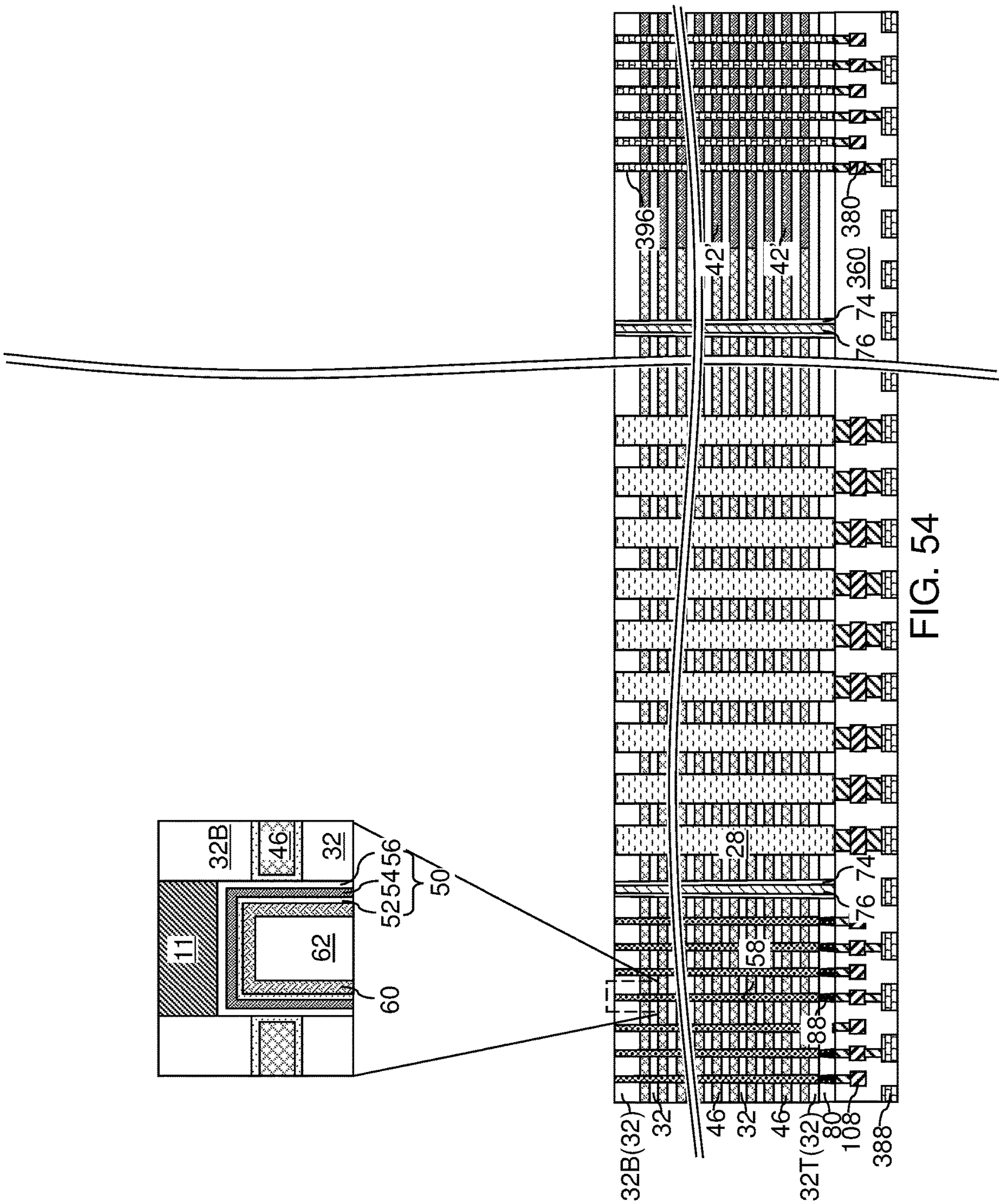
FIG. 54 is a vertical cross-sectional view of the second exemplary structure after removal of the carrier substrate according to an embodiment of the present disclosure.

Referring to FIG. 54, the substrate 8 (which can be a carrier substrate) including the substrate material layer 9 can be removed, for example, by grinding, polishing, an anisotropic etch process, and/or an isotropic etch process. Alternatively, the substrate 8 may be removed by cleaving. Horizontal bottom surfaces of the sacrificial via structures 11 can be physically exposed upon removal of the substrate 8.

Further, bottom surfaces of the side-contact via structures 96 can be physically exposed upon removal of the substrate 8. The second exemplary structure may be inverted, i.e., flipped, as needed.

Figure 55:
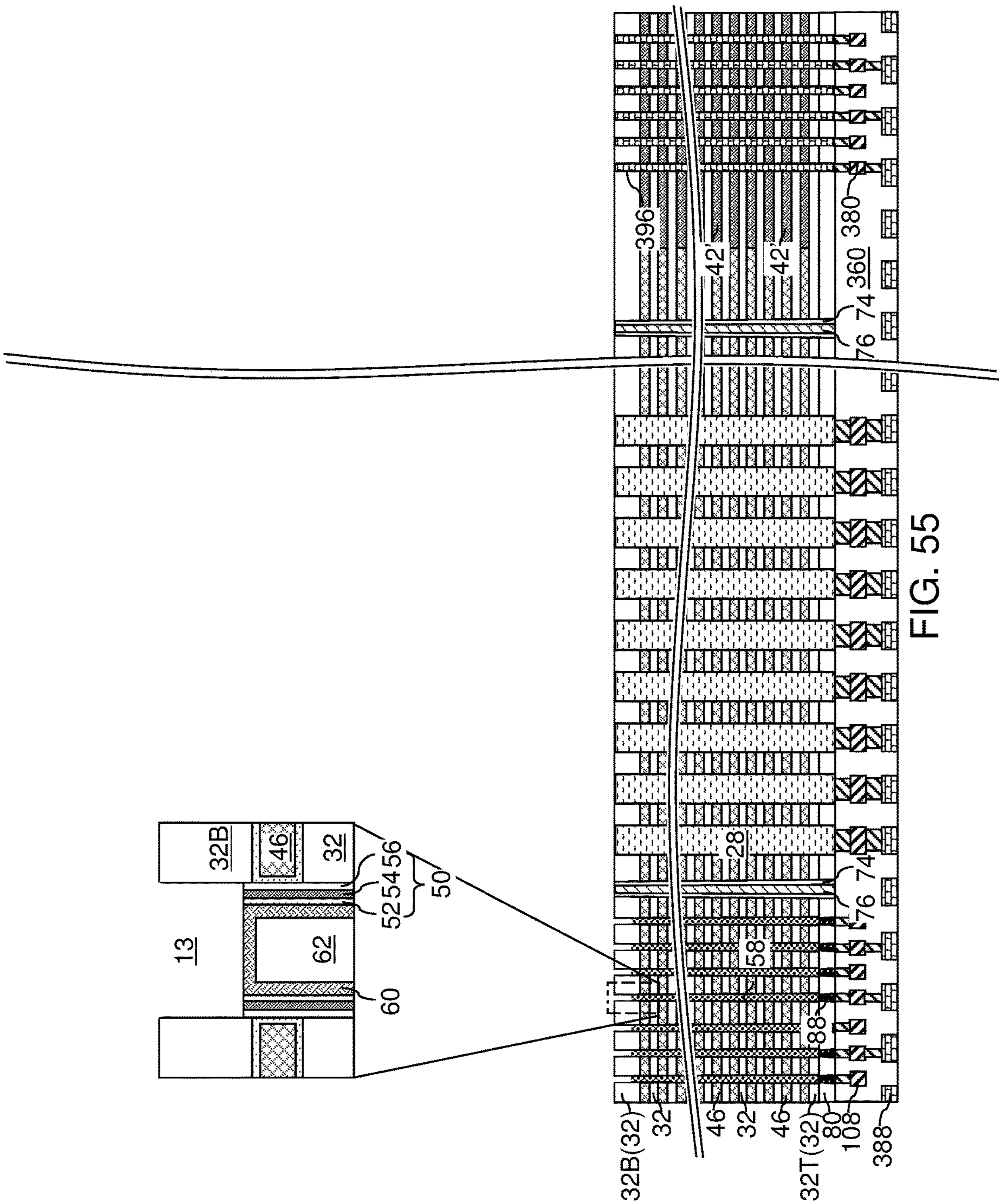
FIG. 55 is a vertical cross-sectional view of the second exemplary structure after removal of sacrificial via structures according to an embodiment of the present disclosure.

Referring to FIG. 55, a selective etch process can be performed to remove the sacrificial via structures 11 selective to the materials of the bottommost insulating layer 32B, the side-contact via structures 96, and the memory films 50. In an illustrative example, if the sacrificial via structures 11 comprise silicon, then a wet etch process employing hot trimethyl-2 hydroxyethyl ammonium hydroxide ("hot TMY") or tetramethyl ammonium hydroxide (TMAH) may be performed to remove the sacrificial via structures 11. Source cavities 13 can be formed in the volumes from which the sacrificial via structures 11 removed.

Subsequently, a sequence of etch processes can be performed to remove horizontally-extending portions of the memory films 50 that are more distal from the upper dielectric material layers 360 than the most distal portions of the vertical semiconductor channels 60 located within the alternating stack (32, 46). For example, portions of the dielectric liners 56, the memory material layers 54, and the blocking dielectric layers 52 that are proximal to the source cavities 13 can be sequentially removed by wet etch processes. Thus, end portions of the memory films 50 can be removed. A bottommost surface of each vertical semiconductor channel 60 (when viewed in an orientation of FIG. 53 in which the drain-side dielectric material layers 360 overlie the alternating stack (32, 46)) can be physically exposed.

Figure 56:
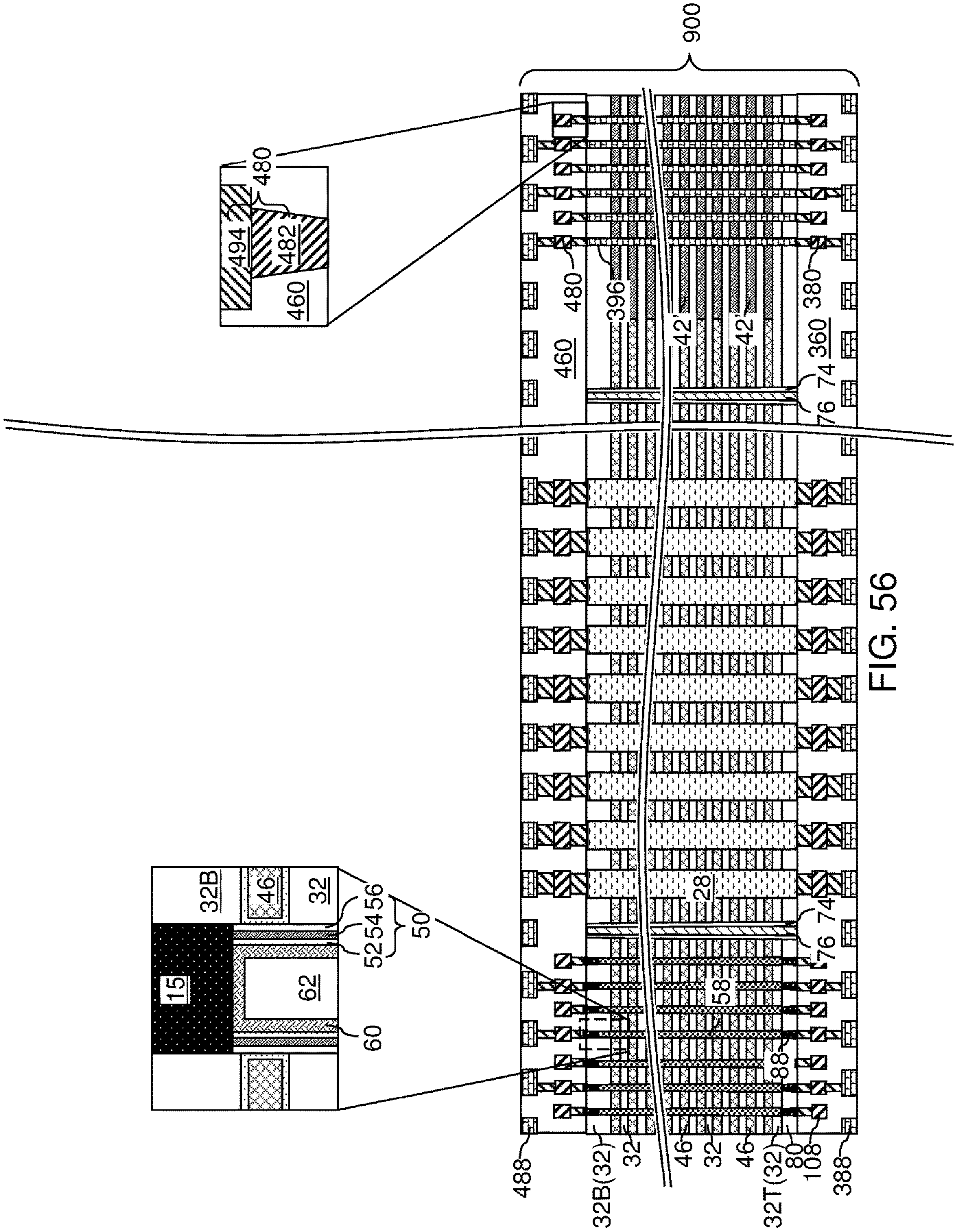
FIG. 56 is a vertical cross-sectional view of the second exemplary structure after formation of source regions, source-side dielectric material layers, source-side metal interconnect structures, and source-side metal bonding pads according to an embodiment of the present disclosure.

Referring to FIG. 56, a doped semiconductor material having a doping of the second conductivity type can be deposited in the source cavities 13. Excess portions of the doped semiconductor material can be removed from outside the source cavities 13 by a planarization process, which may employ a chemical mechanical polishing (CMP) process or a recess etch process. Each remaining portion of the doped semiconductor material filling a respective source cavity 13 constitutes a source region 15. A source region 15 can be formed on the bottommost surface of each vertical semiconductor channel 60. In one embodiment, the source regions 15 may have the same material composition as the drain regions 63.

In one embodiment, each source region 15 can be formed below a level of a bottommost electrically conductive strip 46. Each source region 15 contacts a bottom end portion of a respective vertical semiconductor channel 60. In one embodiment, each source region 15 may be in direct contact with an annular bottommost surface of a respective memory film 50. In one embodiment, each source region 15 contacts a bottommost horizontally-extending surface of a respective vertical semiconductor channel 60.

Source-side metal interconnect structures 480 and source-side dielectric material layers 460 may be formed over the bottommost insulating layer 32B and the source regions 15. A subset of the source-side metal interconnect structures 480 is electrically connected to the source regions 15. The source-side metal interconnect structures 480 underlie the alternating stack (32, 46) (when viewed in an orientation of FIG. 53 in which the drain-side dielectric material layers 360 overlie the alternating stack (32, 46)), and are embedded within the source-side dielectric material layers 460. The source-side metal interconnect structures 480 comprise source-side metal via structures 482 and source-side metal line structures 484. In one embodiment, the source-side metal via structures 482 may have a respective lateral extent that increases with a vertical distance from the alternating stack (32, 46).

Source-side bonding pads 488 may be formed within the source-side dielectric material layers 460. The source-side bonding pads 488 may be electrically connected to the source-side metal interconnect structures 480. A subset of the source-side bonding pads 488 can be electrically connected to the source regions 15. The second exemplary structure comprises a memory die 900, which comprises all structures between and including the drain-side bonding pads 388 and the source-side bonding pads 488.

In one embodiment, the connection via structures 388 vertically extend through the dielectric material plates 42' within the alternating stack (32, 46), and provide electrical connection between a respective one of the drain-side bonding pads 388 and one of the source-side bonding pads 488 through the respective one of the drain-side metal interconnect structures 380 and the respective one of the source-side metal interconnect structures 480.

Figure 57:
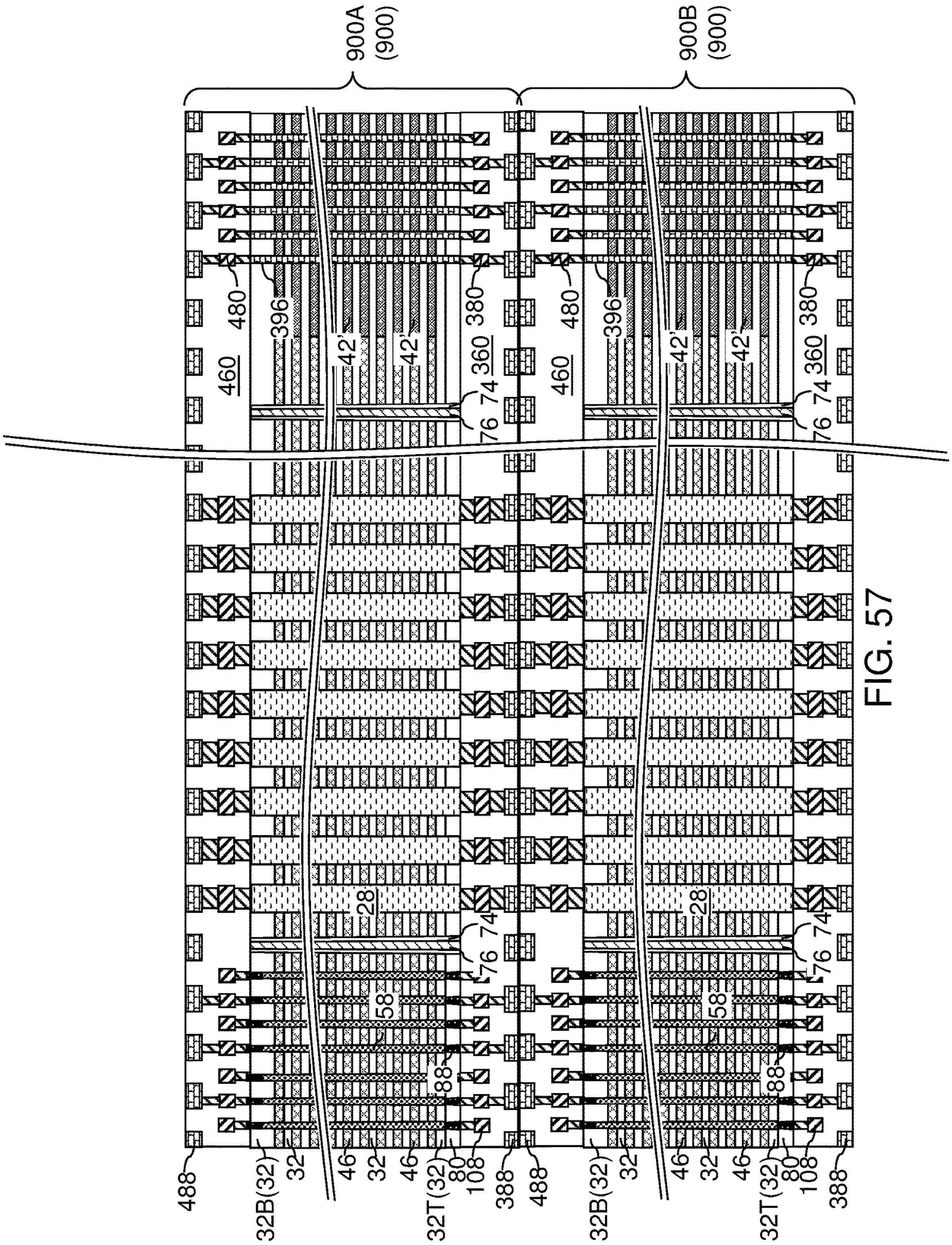
FIG. 57 is a vertical cross-sectional view of the second exemplary structure after bonding two memory dies according an embodiment of the present disclosure.

Referring to FIG. 57, multiple instances of the memory die (i.e., multiple memory dies) 900 illustrated in FIG. 56 may be bonded to each other. For example, the multiple instances of the memory die 900 may comprise a first memory die 900A and a second memory die 900B. The first memory die 900A and the second memory die 900B may be bonded to each other, for example, by metal-to-metal bonding, such as copper-to-copper bonding. Additionally, bonding-level dielectric layers (which are outermost dielectric material layers of the drain-side dielectric material layers 360 or source-side dielectric material layers 460) may be bonded to each other by dielectric-to-dielectric bonding (such as oxide-to-oxide bonding). The first memory die 900A and the second memory die 900B may be bonded to each other front-to-front, front-to-back, back-to-front, or back-to-back.

Generally, a first memory die 900A and a second memory die 900B can be provided. The first memory die 900A comprises a first alternating stack (32, 46) of first insulating layers 32 and first electrically conductive layers 46, first memory openings 49 vertically extending through the first alternating stack (32, 46), first memory opening fill structures 58 located within the first memory openings 49 and comprising a respective vertical stack of first memory elements (e.g., memory cells located in the memory film 50 at the levels of the first electrically conductive layers 46) and a first vertical semiconductor channel 60, first side-contact via structures 96 vertically extending through each layer within the first alternating stack (32, 46), and first memory-side bonding pads (388 or 488). A first subset of the first memory-side bonding pads (388 or 488) is electrically connected to the first side-contact via structures 96 through first metal interconnect structures (380 or 480). Each of the first side-contact via structures 96 contacts a sidewall of a respective first electrically conductive layer 46 of the first electrically conductive layers 46. The second memory die 900B comprises a second alternating stack (32, 46) of second insulating layers 32 and second electrically conductive layers 46, second memory openings 49 vertically extending through the second alternating stack (32, 46), second memory opening fill structures 58 located within the second memory openings 49 and comprising a respective vertical stack of second memory elements and a second vertical channel 60, second side-contact via structures 96 vertically extending through each layer within the second alternating stack (32, 46), and second memory-side bonding pads (388 or 488). A second subset of the second memory-side bonding pads (388 or 488) is electrically connected to the second side-contact via structures 96 through second metal interconnect structures (380 or 480). Each of the second side-contact via structures 96 contacts a sidewall of a respective second electrically conductive layer 46 of the second electrically conductive layers 46.

While an embodiment is described employing two memory dies 900 that are bonded to each other, embodiments are expressly contemplated herein in which three or more memory dies 900 are bonded to each other.

Figure 58:
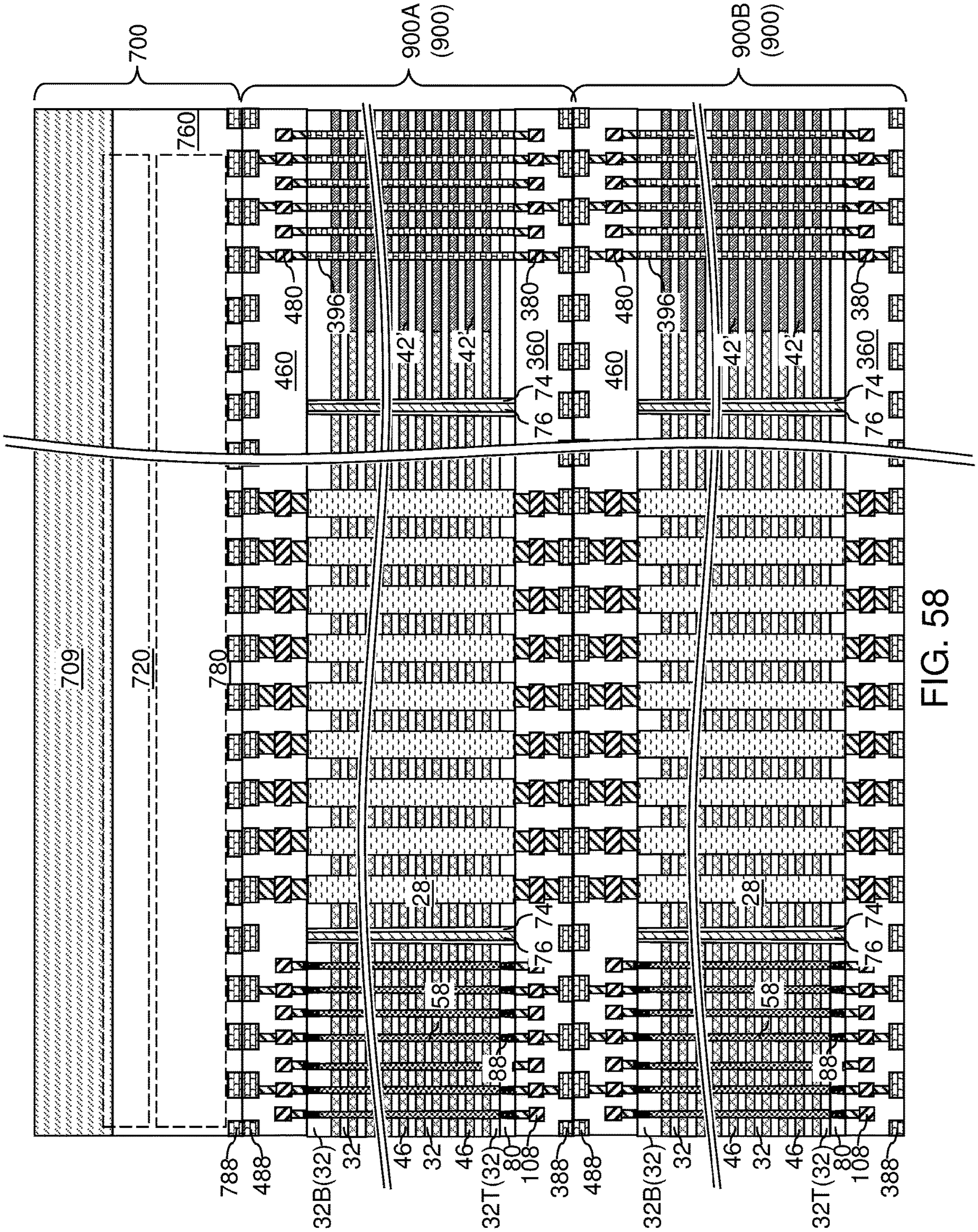
FIG. 58 is a vertical cross-sectional view of the second exemplary structure after bonding a logic die to a stack of two memory dies according to an embodiment of the present disclosure.

Referring to FIG. 58, a logic die 700 can be provided. The logic die 700 comprises a logic-side substrate 709 (which may be a semiconductor substrate, such as silicon wafer), logic-side semiconductor devices 720 which include a peripheral circuitry for controlling operation of the three-dimensional memory device within the memory dies 900, logic-side metal interconnect structures 780 embedded within logic-side dielectric material layers 760, and logic-side bonding pads 788 configured to be bonded to the memory-die bonding pads (which may be drain-side bonding pads 388 or source-side bonding pads 488). The logic-side metal interconnect structures 780 may comprise logic-side metal lines and logic-side metal via structures. The logic-side metal via structures may have a respective variable lateral extent that increases with a vertical distance from a horizontal plane including an interface between the logic-side substrate 709 and the logic-side dielectric material layers 760.

Generally, the logic-side semiconductor devices 720 comprise a control circuitry configured to control operation of the vertical stack of memory elements (e.g., memory cells) within each memory opening fill structure 58 in the memory die 900. The logic-side semiconductor devices 720 may be electrically connected to the logic-side bonding pads 788 through the logic-side metal interconnect structures 780. Thus, the logic-side bonding pads 788 are electrically connected to the logic-side semiconductor devices 720 through the logic-side metal interconnect structures 780.

The logic die 700 can be attached to a memory die 900 such as the first memory die 900A, for example, by bonding the memory-side bonding pads (which may be drain-side bonding pads 388 or source-side bonding pads 488) with the logic-side bonding pads 788. For example, the memory-side bonding pads (388 or 488) can be bonded with the logic-side bonding pads 788 by metal-to-metal bonding, such as copper-to-copper bonding. In some embodiments, hybrid bonding may be employed, in which contacting surfaces of the drain-side dielectric material layers 960 and the logic-side dielectric material layers 760 are bonded through dielectric-to-dielectric bonding (such as oxide-to-oxide bonding).

In the illustrated configuration of FIG. 58, the source-side bonding pads 488 of the first memory die 900A can be bonded to the logic-side bonding pads 788 of the logic die 700.

Figure 59:
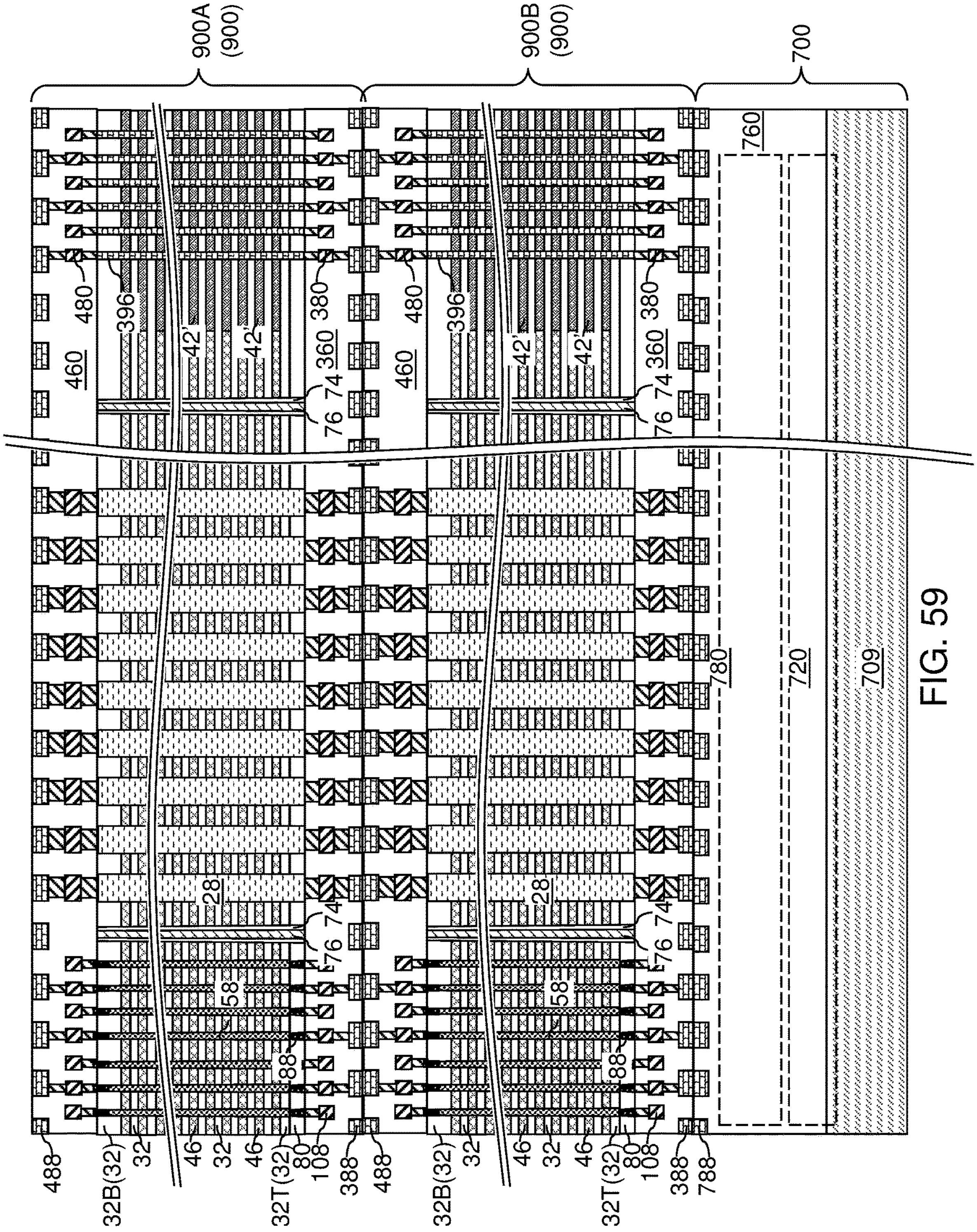
FIG. 59 is a vertical cross-sectional view of a first alternative configuration of the second exemplary structure according to an embodiment of the present disclosure.

Referring to FIG. 59, a first alternative configuration of the second exemplary structure can be derived from the second exemplary structure illustrated in FIG. 57 by bonding the drain-side bonding pads 388 of one of the memory dies 900 (e.g., the memory die 900B with the logic-side bonding pads 788. For example, the drain-side bonding pads 388 can be bonded with the logic-side bonding pads 788 by metal-to-metal bonding, such as copper-to-copper bonding. In some embodiments, hybrid bonding may be employed, in which contacting surfaces of the drain-side dielectric material layers 360 and the logic-side dielectric material layers 760 are bonded through dielectric-to-dielectric bonding (such as oxide-to-oxide bonding).

Figure 60:
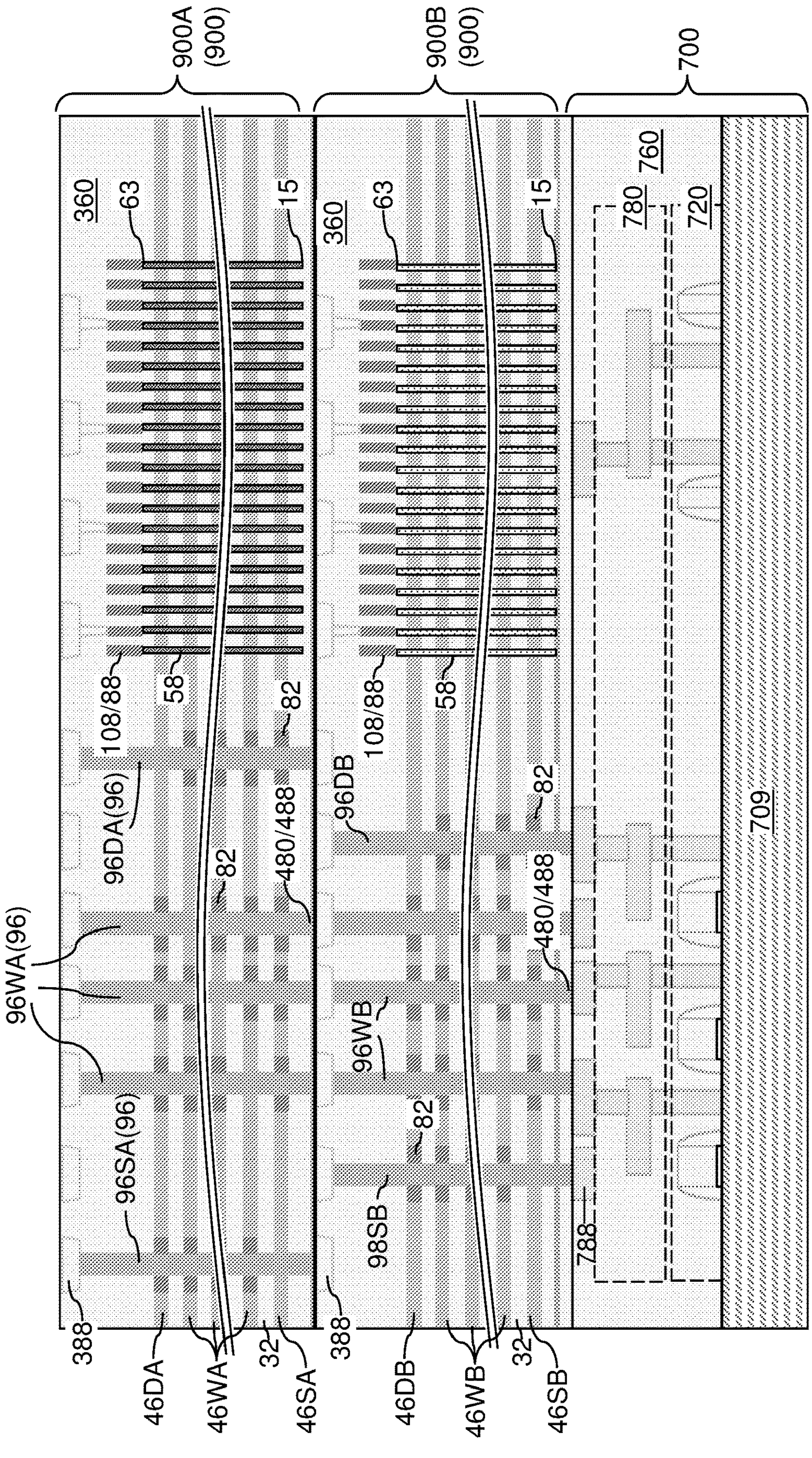
FIG. 60 is a vertical cross-sectional view of a second alternative configuration of the second exemplary structure according to an embodiment of the present disclosure.

Referring to FIG. 60, a second alternative configuration of the second exemplary structure can be derived from the second exemplary structure illustrated in FIG. 58 or from the alternative configuration of the second exemplary structure illustrated in FIG. 59 by electrically connecting respective word lines in plural memory dies to each other without connecting the select gate electrodes in plural memory dies to each other.

In the first memory die 900A, the first electrically conductive layers 46 comprise at least one first drain-side select gate electrode 46DA located closest to the drain regions 63, at least one first source-side select gate electrode 46SA located closest to the source regions 15, and a plurality of first word lines 46WA located between the first source-side and drain-side select gate electrodes (46SA, 46DA). In the second memory die 900B, the second electrically conductive layers 46 comprise at least one second drain-side select gate electrode 46DB located closest to the drain regions 63, at least one second source-side select gate electrode 46SB located closest to the source regions 15, and a plurality of second word lines 46WB located between the second source-side and drain-side select gate electrodes (46SB, 46DB).

A first subset 96WA of the first side-contact via structures 96 in the first memory die 900A is electrically connected to a first subset 96WB of the second side-contact via structures 96 in the second memory die 900B and to the peripheral circuitry 720, such that the peripheral circuitry 720 simultaneously controls pairs of a respective first word line 46WA in the first memory die 900A and a respective corresponding second word line 46WB in the second memory die 900B. The first and second word lines (46WA, 46WB) may be located at the same distance from the respective source-side select gate electrodes (46SA, 46SB) in the respective memory dies (900A, 900B) (i.e., they may be the same "numbered" from word lines).

Further, a second subset (96SA, 96DA) of the first side-contact via structures 96 in the first memory die 900A are electrically connected to and are configured to control the respective source-side and drain-side select gate electrodes (46SA, 46DA). Likewise, a second subset (96SB, 96DB) of the second side-contact via structures 96 in the second memory die 900B are electrically connected to and are configured to control the respective source-side and drain-side select gate electrodes (46SB, 46DB). The second subset (96SA, 96DA) of the first side-contact via structures 96 are not electrically connected to the second subset (96SB, 96DB) of the second side-contact via structures 96, such that the peripheral circuitry 720 is configured to control the first source-side and drain-side select gate electrodes (46SA, 46DA) separately from the second source-side and drain-side select gate electrodes (46SB, 46DB).

While an embodiment is described in which the logic die 700 is attached to an assembly of multiple memory dies 900, embodiments are expressly contemplated herein in which a logic die 700 is attached to a memory die (such as a first memory die 900A), and the assembly of the logic die 700 and the memory die 900 is subsequently attached to another memory die 900. Generally, the order of bonding among the various dies (700, 900) may be changed as needed.

Generally, a first memory die 900A is provided, which comprises a first alternating stack (32, 46) of first insulating layers 32 and first electrically conductive layers 46, first memory openings 49 vertically extending through the first alternating stack (32, 46), first memory opening fill structures 58 located within the first memory openings 49 and comprising a respective vertical stack of first memory elements and a vertical semiconductor channel 60, and first memory-side bonding pads (388 or 488). A logic die 700 can be provided, which comprises a peripheral circuitry 720 configurated to control operation of the first memory die 900A, logic-side metal interconnect structures 780, and logic-side bonding pads 788. A bonded assembly can be formed by bonding the logic-side bonding pads 788 to the first memory-side bonding pads (388 or 488).

A second memory die 900B is provided, which comprises a second alternating stack (32, 46) of second insulating layers 32 and second electrically conductive layers 46, second memory openings 49 vertically extending through the second alternating stack (32, 46), second memory opening fill structures 58 located within the second memory openings 49 and comprising a respective vertical stack of second memory elements and vertical semiconductor channel 60, and second memory-side bonding pads (388 or 488). The second memory die 900B can be attached to the first memory die 900A by bonding the second memory-side bonding pads (388 or 488) to the first backside bonding pads (488 or 388).

Referring to all drawings and according to various embodiments of the present disclosure, a bonded assembly comprises: a first memory die 900A comprising a first alternating stack (32, 46) of first insulating layers 32 and first electrically conductive layers 46, first memory openings 49 vertically extending through the first alternating stack (32, 46), first memory opening fill structures 58 located within the first memory openings 49 and comprising a respective vertical stack of first memory elements (e.g., portions of the memory film 50) and vertical semiconductor channel 60, first side-contact via structures 96 vertically extending through each layer within the first alternating stack (32, 46), and contacting sidewall of a respective one of the first electrically conductive layers 46, and first memory-side bonding pads (388 or 488); and a logic die 700 comprising a peripheral circuitry 720 configured to control operation of the first memory die 900A, logic-side metal interconnect structures 780, and logic-side bonding pads 788 that are bonded to the first memory-side bonding pads (388 or 488).

In one embodiment, each of the first side-contact via structures 96 is electrically isolated from all first electrically conductive layers 46 other than the respective one of the first electrically conductive layers 46.

In one embodiment, the first memory die 900A further comprises first vertical stacks of annular dielectric spacers 82, wherein each first vertical stack of annular dielectric spacers 82 laterally surrounds a respective one of the first side-contact via structures 96.

In one embodiment, each first vertical stack of annular dielectric spacers 82 contacts all of the first electrically conductive layers 46 other than a respective first one of the electrically conductive layers 46.

In one embodiment, a lateral offset distance between an inner cylindrical sidewall and an outer cylindrical sidewall is the same for each annular dielectric spacer 82 within the first vertical stacks of annular dielectric spacers 82.

In one embodiment, each of the first side-contact via structures 96 contacts each of the first insulating layers 32 within the first alternating stack (32, 46).

In one embodiment, first memory die 900A further comprises first backside blocking dielectric layers 44 located between each vertically neighboring pair of a first insulating layer 32 and a first electrically conductive layer 46 within the first alternating stack (32, 46), wherein each of the first backside blocking dielectric layers 44 comprises a respective pair of cylindrical surface segments in contact with a respective one of the first side-contact via structures 96.

In one embodiment, the first memory die 900A further comprises: a vertical stack of first dielectric material plates 42' located at levels of the first electrically conductive layers 46 and vertically interlaced with the first insulating layers 32; and connection via structures 386 vertically extending through the vertical stack of first dielectric material plates 42', wherein a subset of the first memory-side bonding pads (388 or 488) is electrically connected to the connection via structures 386.

In one embodiment, the bonded assembly comprises a second memory die 900B that is bonded to the first memory die 900A and comprising a second alternating stack (32, 46) of second insulating layers 32 and second electrically conductive layers 46, second memory openings 49 vertically extending through the second alternating stack (32, 46), second memory opening fill structures 58 located within the second memory openings 49 and comprising a respective vertical stack of second memory elements and a second vertical semiconductor channel 60, and second memory-side bonding pads (388 or 488), wherein the first memory die 900A further comprises first backside bonding pads (i.e., the other ones of the bonding pads 488 or 388) that are bonded to the second memory-side bonding pads (388 or 488).

In one embodiment, the second memory die 900B comprises second side-contact via structures 96 vertically extending through each layer within the second alternating stack (32, 46); each of the second side-contact via structures 96 contacts a sidewall of a respective one of the second electrically conductive layers 46.

In various embodiments of the present disclosure a common peripheral circuitry 720 located on a logic die 700 is shared between multiple three-dimensional memory arrays located in multiple memory dies 900. A first subset of the side-contact via structures 96 may be electrically connected across the multiple memory dies 900 to enable sharing of a word line driver between different corresponding word lines located in different memory dies. In contrast, a second subset of the side-contact via structures 96 which contact the select gate electrodes are not electrically connected across multiple memory dies 900, such that the select gate electrodes in each memory die are operated independently.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly, comprising:

a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads; and a logic die comprising a peripheral circuitry configured to control operation of the first memory die, logic-side metal interconnect structures, and logic-side bonding pads that are bonded to the first memory-side bonding pads;

wherein each of the first side-contact via structures is electrically isolated from all first electrically conductive layers other than the respective one of the first electrically conductive layers.

2. A bonded assembly, comprising:

a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads; and a logic die comprising a peripheral circuitry configured to control operation of the first memory die, logic-side metal interconnect structures, and logic-side bonding pads that are bonded to the first memory-side bonding pads;

wherein the first memory die further comprises first vertical stacks of annular dielectric spacers, wherein each first vertical stack of annular dielectric spacers laterally surrounds a respective one of the first side-contact via structures.

3. The bonded assembly of claim 1, wherein each first vertical stack of annular dielectric spacers contacts all of the first electrically conductive layers other than the respective one of the first electrically conductive layers.

4. The bonded assembly of claim 1, wherein a lateral offset distance between an inner cylindrical sidewall and an outer cylindrical sidewall is the same for each annular dielectric spacer within the first vertical stacks of annular dielectric spacers.

5. A bonded assembly, comprising:

a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads; and a logic die comprising a peripheral circuitry configured to control operation of the first memory die, logic-side metal interconnect structures, and logic-side bonding pads that are bonded to the first memory-side bonding pads;

wherein each of the first side-contact via structures contacts each of the first insulating layers within the first alternating stack.

6. A bonded assembly, comprising:

a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads; and a logic die comprising a peripheral circuitry configured to control operation of the first memory die, logic-side metal interconnect structures, and logic-side bonding pads that are bonded to the first memory-side bonding pads;

wherein the first memory die further comprises first backside blocking dielectric layers located between each vertically neighboring pair of a first insulating layer and a first electrically conductive layer within the first alternating stack, wherein each of the first backside blocking dielectric layers comprises a respective pair of cylindrical surface segments in contact with a respective one of the first side-contact via structures.

7. A bonded assembly, comprising:

a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads; and a logic die comprising a peripheral circuitry configured to control operation of the first memory die, logic-side metal interconnect structures, and logic-side bonding pads that are bonded to the first memory-side bonding pads;

wherein the first memory die further comprises:

a vertical stack of first dielectric material plates located at levels of the first electrically conductive layers and vertically interlaced with the first insulating layers; and connection via structures vertically extending through the vertical stack of first dielectric material plates, wherein a subset of the first memory-side bonding pads is electrically connected to the connection via structures.

8. A bonded assembly, comprising: a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads;

a logic die comprising a peripheral circuitry configured to control operation of the first memory die, logic-side metal interconnect structures, and logic-side bonding pads that are bonded to the first memory-side bonding pads; and a second memory die that is bonded to the first memory die and comprising a second alternating stack of second insulating layers and second electrically conductive layers, second memory openings vertically extending through the second alternating stack, second memory opening fill structures located within the second memory openings and comprising a respective vertical stack of second memory elements and a second vertical semiconductor channel, and second memory-side bonding pads, wherein the first memory die further comprises first backside bonding pads that are bonded to the second memory-side bonding pads;

wherein:

the second memory die further comprises electrically conductive second side-contact via structures vertically extending through each layer within the second alternating stack;

each of the second side-contact via structures contacts a sidewall of a respective one of the second electrically conductive layers;

the first electrically conductive layers comprise at least one first drain-side select gate electrode, at least one first source-side select gate electrode, and a plurality of first word lines located between the first source-side and drain-side select gate electrodes;

the second electrically conductive layers comprise at least one second drain-side select gate electrode, at least one second source-side select gate electrode, and a plurality of second word lines located between the second source-side and drain-side select gate electrodes; and a first subset of the first side-contact via structures is electrically connected to a first subset of the second side-contact via structures and to the peripheral circuitry such that the peripheral circuitry is configured to simultaneously controls pairs of a respective first word line in the first memory and a respective corresponding second word line in the second memory die.

9. The bonded assembly of claim 8, wherein:

a second subset of the first side-contact via structures are electrically connected to respective first source-side and drain-side select gate electrodes;

a second subset of the second side-contact via structures are electrically connected to respective second source-side and drain-side select gate electrodes; and the second subset of the first side-contact via structures are not electrically connected to the second subset of the second side-contact via structures, such that the peripheral circuitry is configured to control the first source-side and drain-side select gate electrodes separately from the second source-side and drain-side select gate electrodes.

10. A method of forming a bonded assembly, comprising:

providing a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads;

providing a logic die comprising a peripheral circuitry configured to control operation of the first memory die, logic-side metal interconnect structures, and logic-side bonding pads; and forming the bonded assembly by bonding the logic-side bonding pads to the first memory-side bonding pads;

wherein each of the first side-contact via structures is electrically isolated from all first electrically conductive layers other than the respective one of the first electrically conductive layers.

11. The method of claim 10, wherein the first memory die further comprises first vertical stacks of annular dielectric spacers, wherein each first vertical stack of annular dielectric spacers laterally surrounds a respective one of the first side-contact via structures.

12. A method of forming a bonded assembly, comprising:

providing a first memory die comprising a first alternating stack of first insulating layers and first electrically conductive layers, first memory openings vertically extending through the first alternating stack, first memory opening fill structures located within the first memory openings and comprising a respective vertical stack of first memory elements and a respective vertical semiconductor channel, electrically conductive first side-contact via structures vertically extending through each layer within the first alternating stack and contacting a sidewall of a respective one of the first electrically conductive layers, and first memory-side bonding pads;

providing a logic die comprising a peripheral circuitry configured to control operation of the first memory die, logic-side metal interconnect structures, and logic-side bonding pads;

forming the bonded assembly by bonding the logic-side bonding pads to the first memory-side bonding pads; and bonding a second memory die to the first memory die;

wherein:

the second memory die comprises a second alternating stack of second insulating layers and second electrically conductive layers, second memory openings vertically extending through the second alternating stack, second memory opening fill structures located within the second memory openings and comprising a respective vertical stack of second memory elements and a second vertical semiconductor channel, and second memory-side bonding pads;

the second memory die further comprises electrically conductive second side-contact via structures vertically extending through each layer within the second alternating stack;

each of the second side-contact via structures contacts a sidewall of a respective one of the second electrically conductive layers;

the first electrically conductive layers comprise at least one first drain-side select gate electrode, at least one first source-side select gate electrode, and a plurality of first word lines located between the first source-side and drain-side select gate electrodes;

the second electrically conductive layers comprise at least one second drain-side select gate electrode, at least one second source-side select gate electrode, and a plurality of second word lines located between the second source-side and drain-side select gate electrodes; and a first subset of the first side-contact via structures is electrically connected to a first subset of the second side-contact via structures and to the peripheral circuitry such that the peripheral circuitry is configured to simultaneously controls pairs of a respective first word line in the first memory and a respective corresponding second word line in the second memory die.

13. The method of claim 12, wherein:

a second subset of the first side-contact via structures are electrically connected to respective first source-side and drain-side select gate electrodes;

a second subset of the second side-contact via structures are electrically connected to respective second source-side and drain-side select gate electrodes; and the second subset of the first side-contact via structures are not electrically connected to the second subset of the second side-contact via structures, such that the peripheral circuitry is configured to control the first source-side and drain-side select gate electrodes separately from the second source-side and drain-side select gate electrodes.

* * * * *